US006799303B2

(12) United States Patent
Blumberg

(10) Patent No.: US 6,799,303 B2
(45) Date of Patent: Sep. 28, 2004

(54) SPEED TYPING APPARATUS AND METHOD

(76) Inventor: Marvin R. Blumberg, 7105 Broxburn Dr., Bethesda, MD (US) 20817

( * ) Notice: Subject to any disclaimer, the term of this patent is extended or adjusted under 35 U.S.C. 154(b) by 134 days.

(21) Appl. No.: 09/912,509

(22) Filed: Jul. 26, 2001

(65) Prior Publication Data

US 2003/0038735 A1 Feb. 27, 2003

Related U.S. Application Data

(63) Continuation-in-part of application No. PCT/US00/01890, filed on Jan. 26, 2000.

(60) Provisional application No. 60/117,246, filed on Jan. 26, 1999.

(51) Int. Cl.7 .......... G06F 17/21

(52) U.S. Cl. .......... 715/534

(58) Field of Search .......... 715/534, 531; 400/485, 91

(56) References Cited

U.S. PATENT DOCUMENTS

| | | | |
|---|---|---|---|
| 3,647,973 | A | 3/1972 | James et al. |
| 3,967,273 | A | 6/1976 | Knowlton |
| 4,191,854 | A | 3/1980 | Coles |
| 4,339,806 | A | 7/1982 | Yoshida |
| 4,360,892 | A | 11/1982 | Endfield |
| 4,381,502 | A | 4/1983 | Prame |
| 4,396,992 | A | 8/1983 | Hayashi et al. |
| 4,426,555 | A | 1/1984 | Underkoffler |
| 4,427,848 | A | 1/1984 | Tsakanikas |
| 4,442,506 | A | 4/1984 | Endfield |
| 4,459,049 | A | 7/1984 | Howell et al. |
| 4,464,070 | A | 8/1984 | Hanft et al. |
| 4,481,508 | A | 11/1984 | Kamei et al. |
| 4,549,279 | A | 10/1985 | Lapeyre |
| 4,566,065 | A | 1/1986 | Toth |
| 4,633,227 | A | 12/1986 | Menn |
| 4,649,563 | A | 3/1987 | Riskin |
| 4,650,349 | A | 3/1987 | Westreich |

(List continued on next page.)

FOREIGN PATENT DOCUMENTS

| | | |
|---|---|---|
| EP | 0 319 193 | 6/1989 |
| EP | 0 464 726 | 1/1992 |
| EP | 0 540 147 | 5/1993 |
| EP | 0 651 315 | 5/1995 |
| EP | 0 651 316 | 5/1995 |
| EP | 0 689 122 | 12/1995 |
| WO | WO 89/05745 | 6/1989 |
| WO | WO 90/07149 | 6/1990 |
| WO | WO 97/05541 | 2/1997 |

OTHER PUBLICATIONS

Principles of Computer Speech, I.H. Witten, Man–Machine Systems Laboratory, Department of Computer Science, University of Calgary, Canada, 1982 Academic Press, A subsidiary of Harcourt Brace Jovanovich, Publishers, pp. 246–253.

The Statistical Structure of Language, p. 86.

*Primary Examiner*—Stephen S. Hong
(74) *Attorney, Agent, or Firm*—Jacobson Holman PLLC

(57) ABSTRACT

A speed typing method and apparatus having multiple letters associated with each key of a keyboard. By utilizing multiple characters on each key, the number of keys would be fewer than the number of letters in the alphabet using this system. Each key on the keyboard is associated with a numerical code. The system uses the numerical code associated with a typed word to access a dictionary, table of words, or at least a beginning of words stored in memory at a memory location corresponding to the input numerical code. The system may display all of the possible words or beginnings of words available to the user in response to the input code.

53 Claims, 147 Drawing Sheets

U.S. PATENT DOCUMENTS

| | | | | | |
|---|---|---|---|---|---|
| 4,661,916 | A | | 4/1987 | Baker et al. | |
| 4,674,112 | A | | 6/1987 | Kondraske et al. | |
| 4,677,659 | A | | 6/1987 | Dargan | |
| 4,680,725 | A | | 7/1987 | Lapeyre | |
| 4,754,474 | A | | 6/1988 | Feinson | |
| 4,760,528 | A | | 7/1988 | Levin | |
| RE32,773 | E | | 10/1988 | Goldwasser et al. | |
| 4,791,408 | A | | 12/1988 | Heusinkveld | |
| 4,807,181 | A | | 2/1989 | Duncan, IV et al. | |
| 4,817,129 | A | | 3/1989 | Riskin | |
| 4,823,294 | A | | 4/1989 | Rouhani | |
| 4,842,428 | A | | 6/1989 | Suzuki | |
| 4,846,598 | A | | 7/1989 | Livits | |
| 4,849,732 | A | | 7/1989 | Dolenc | |
| 4,866,759 | A | | 9/1989 | Riskin | |
| 4,872,196 | A | | 10/1989 | Royer et al. | |
| 4,891,777 | A | | 1/1990 | Lapeyre | |
| 4,891,786 | A | | 1/1990 | Goldwasser | |
| 4,893,238 | A | | 1/1990 | Venema | |
| 4,924,431 | A | | 5/1990 | Lapeyre | |
| 4,969,097 | A | | 11/1990 | Levin | |
| 5,007,008 | A | | 4/1991 | Beers | |
| 5,031,206 | A | | 7/1991 | Riskin | |
| 5,062,070 | A | | 10/1991 | Lapeyre | |
| 5,063,376 | A | | 11/1991 | Chang | |
| 5,065,661 | A | | 11/1991 | Hacker | |
| 5,067,103 | A | | 11/1991 | Lapeyre | |
| 5,087,910 | A | | 2/1992 | Guyot-Sionnest | |
| 5,131,045 | A | | 7/1992 | Roth | |
| 5,156,475 | A | | 10/1992 | Zilberman | |
| 5,163,084 | A | | 11/1992 | Kim et al. | |
| 5,164,723 | A | | 11/1992 | Nebenzahl | |
| 5,200,988 | A | | 4/1993 | Riskin | |
| 5,214,689 | A | | 5/1993 | O'Sullivan | |
| 5,218,538 | A | | 6/1993 | Zhang | |
| RE34,304 | E | | 7/1993 | Goldwasser et al. | |
| 5,229,936 | A | | 7/1993 | Decker et al. | |
| 5,255,310 | A | | 10/1993 | Kim et al. | |
| 5,258,748 | A | | 11/1993 | Jones | |
| 5,281,966 | A | | 1/1994 | Walsh | |
| 5,289,394 | A | | 2/1994 | Lapeyre | |
| 5,305,205 | A | | 4/1994 | Weber et al. | |
| 5,317,647 | A | | 5/1994 | Pagallo | |
| 5,339,358 | A | | 8/1994 | Danish et al. | |
| 5,388,061 | A | | 2/1995 | Hankes | |
| 5,392,338 | A | | 2/1995 | Danish et al. | |
| 5,404,321 | A | | 4/1995 | Mattox | |
| 5,410,305 | A | | 4/1995 | Barrus et al. | |
| 5,577,188 | A | | 11/1996 | Zhu | |
| 5,621,641 | A | * | 4/1997 | Freeman | 715/534 |
| 5,649,223 | A | * | 7/1997 | Freeman | 715/534 |
| 5,664,896 | A | | 9/1997 | Blumberg | |
| 5,713,033 | A | * | 1/1998 | Sado | 715/534 |
| 5,734,749 | A | * | 3/1998 | Yamada et al. | 382/187 |
| 5,748,008 | A | | 5/1998 | Landreth | |
| 5,781,891 | A | * | 7/1998 | Dvorak et al. | 705/2 |
| 5,784,008 | A | * | 7/1998 | Raguseo | 341/20 |
| 5,786,776 | A | * | 7/1998 | Kisaichi et al. | 341/23 |
| 5,790,103 | A | | 8/1998 | Willner | |
| 5,805,911 | A | * | 9/1998 | Miller | 715/534 |
| 5,818,437 | A | | 10/1998 | Grover et al. | |
| 5,945,928 | A | * | 8/1999 | Kushler et al. | 341/28 |
| 5,953,541 | A | | 9/1999 | King et al. | |
| 5,959,629 | A | * | 9/1999 | Masui | 345/808 |
| 5,984,545 | A | | 11/1999 | Watanabe et al. | |
| 6,001,554 | A | | 12/1999 | Boyle et al. | |
| 6,114,978 | A | * | 9/2000 | Hoag | 341/23 |
| 6,278,384 | B1 | * | 8/2001 | Ide | 341/26 |
| 6,307,548 | B1 | * | 10/2001 | Flinchem et al. | 345/811 |
| 6,377,965 | B1 | * | 4/2002 | Hachamovitch et al. | 715/534 |

* cited by examiner

FIG. 22a

| | A | B | C | D | E | F | G | H | I | J | K | L |
|---|---|---|---|---|---|---|---|---|---|---|---|---|
| A | | 12 | 14 | 11 | 243 | 13 | 8 | 11 | 293 | 0 | 9 | 51 |
| B | 12 | | 104 | 104 | 32 | 99 | 105 | 67 | 1 | 33 | 15 | 91 |
| C | 14 | 104 | | 70 | 16 | 79 | 73 | 84 | 7 | 17 | 21 | 79 |
| D | 11 | 104 | 70 | | 53 | 68 | 88 | 65 | 6 | 18 | 69 | 128 |
| E | 243 | 32 | 16 | 53 | | 11 | 38 | 39 | 138 | 1 | 65 | 71 |
| F | 13 | 99 | 79 | 68 | 11 | | 49 | 55 | 1 | 23 | 26 | 88 |
| G | 8 | 105 | 73 | 88 | 38 | 49 | | 36 | 3 | 16 | 39 | 54 |
| H | 11 | 67 | 84 | 65 | 39 | 55 | 36 | | 3 | 21 | 35 | 108 |
| I | 293 | 1 | 7 | 6 | 138 | 1 | 3 | 3 | | 2 | 2 | 23 |
| J | 0 | 33 | 17 | 18 | 1 | 23 | 16 | 21 | 2 | | 1 | 23 |
| K | 9 | 15 | 21 | 69 | 65 | 26 | 39 | 35 | 2 | 1 | | 63 |
| L | 51 | 91 | 79 | 128 | 71 | 88 | 54 | 108 | 23 | 23 | 63 | |
| M | 10 | 122 | 79 | 111 | 28 | 23 | 73 | 78 | 0 | 19 | 47 | 117 |
| N | 24 | 63 | 97 | 120 | 60 | 65 | 66 | 42 | 15 | 13 | 50 | 160 |
| O | 314 | 14 | 16 | 14 | 223 | 7 | 14 | 17 | 190 | 3 | 5 | 37 |
| P | 15 | 145 | 116 | 122 | 46 | 100 | 84 | 101 | 4 | 24 | 53 | 128 |
| Q | 0 | 0 | 0 | 0 | 0 | 0 | 3 | 0 | 0 | 0 | 0 | 0 |
| R | 62 | 102 | 86 | 176 | 50 | 69 | 67 | 100 | 21 | 22 | 53 | 269 |
| S | 35 | 90 | 116 | 92 | 32 | 97 | 65 | 75 | 9 | 17 | 33 | 126 |
| T | 22 | 126 | 147 | 209 | 121 | 107 | 120 | 121 | 10 | 25 | 89 | 173 |
| U | 214 | 3 | 4 | 8 | 96 | 3 | 4 | 2 | 167 | 0 | 4 | 11 |
| V | 4 | 27 | 35 | 51 | 7 | 29 | 31 | 18 | 1 | 7 | 33 | 49 |
| W | 13 | 90 | 67 | 68 | 25 | 59 | 63 | 78 | 14 | 13 | 24 | 72 |
| X | 6 | 9 | 4 | 9 | 6 | 1 | 11 | 0 | 0 | 0 | 3 | 5 |
| Y | 18 | 30 | 13 | 43 | 109 | 13 | 31 | 23 | 17 | 7 | 9 | 24 |
| Z | 1 | 9 | 11 | 23 | 5 | 3 | 7 | 6 | 0 | 2 | 9 | 17 |

FIG. 22b

| | M | N | O | P | Q | R | S | T | U | V | W | X | Y | Z |
|---|---|---|---|---|---|---|---|---|---|---|---|---|---|---|
| A | 10 | 24 | 314 | 15 | 0 | 62 | 35 | 22 | 214 | 4 | 13 | 6 | 18 | 1 |
| B | 122 | 63 | 14 | 145 | 0 | 102 | 90 | 126 | 3 | 27 | 90 | 9 | 30 | 9 |
| C | 79 | 97 | 16 | 116 | 0 | 86 | 116 | 147 | 4 | 35 | 67 | 4 | 13 | 11 |
| D | 111 | 120 | 14 | 122 | 0 | 176 | 92 | 209 | 8 | 51 | 68 | 9 | 43 | 23 |
| E | 28 | 60 | 223 | 46 | 0 | 50 | 32 | 121 | 96 | 7 | 25 | 6 | 109 | 5 |
| F | 23 | 65 | 7 | 100 | 0 | 69 | 97 | 107 | 3 | 29 | 59 | 1 | 13 | 3 |
| G | 77 | 66 | 14 | 84 | 0 | 67 | 65 | 120 | 4 | 31 | 63 | 11 | 31 | 7 |
| H | 72 | 42 | 17 | 101 | 0 | 100 | 75 | 121 | 2 | 18 | 78 | 0 | 23 | 6 |
| I | 0 | 15 | 170 | 4 | 0 | 21 | 9 | 10 | 167 | 1 | 14 | 0 | 17 | 0 |
| J | 19 | 13 | 3 | 24 | 0 | 22 | 17 | 25 | 0 | 7 | 13 | 0 | 7 | 2 |
| K | 47 | 50 | 5 | 53 | 0 | 53 | 33 | 89 | 4 | 33 | 24 | 3 | 9 | 9 |
| L | 117 | 160 | 37 | 128 | 0 | 269 | 126 | 173 | 11 | 49 | 72 | 5 | 24 | 17 |
| M | | 78 | 11 | 154 | 0 | 114 | 83 | 129 | 3 | 48 | 71 | 6 | 36 | 12 |
| N | 78 | | 20 | 114 | 0 | 189 | 101 | 183 | 10 | 41 | 62 | 15 | 33 | 14 |
| O | 11 | 20 | | 19 | 0 | 48 | 9 | 17 | 128 | 1 | 12 | 1 | 23 | 2 |
| P | 154 | 114 | 19 | | 0 | 108 | 107 | 187 | 7 | 50 | 109 | 11 | 38 | 14 |
| Q | 0 | 0 | 0 | 0 | | | 2 | 0 | 0 | 0 | 0 | 0 | 0 | 0 |
| R | 114 | 189 | 46 | 108 | | | 119 | 164 | 24 | 57 | 68 | 9 | 27 | 18 |
| S | 83 | 101 | 9 | 107 | 2 | 119 | | 182 | 10 | 46 | 60 | 6 | 24 | 14 |
| T | 129 | 183 | 17 | 187 | 0 | 164 | 182 | | 8 | 60 | 137 | 19 | 58 | 26 |
| U | 3 | 10 | 128 | 7 | 0 | 25 | 10 | 8 | | 4 | 4 | 0 | 10 | 0 |
| V | 48 | 41 | 1 | 50 | 0 | 57 | 46 | 60 | 4 | | 22 | 2 | 4 | 14 |
| W | 71 | 62 | 12 | 109 | 0 | 68 | 60 | 137 | 4 | 22 | | 11 | 42 | 8 |
| X | 6 | 15 | 1 | 11 | 0 | 9 | 6 | 19 | 0 | 2 | 11 | | 7 | 0 |
| Y | 36 | 33 | 23 | 38 | 0 | 27 | 24 | 58 | 10 | 4 | 42 | 7 | | 1 |
| Z | 12 | 14 | 2 | 14 | 0 | 13 | 14 | 26 | 0 | 14 | 8 | 0 | 1 | |

FIG. 22c

| | | | | | | | | | | |
|---|---|---|---|---|---|---|---|---|---|---|
| 1 | AJ | AJ | AJ | AJK | AJK | AB | AB | AB | AB | AB |
| 2 | B | B | BU | BU | BU | C | CU | CD | CD | CD |
| 3 | C | C | C | C | C | D | D | EF | EF | EF |
| 4 | D | D | D | D | D | EF | EF | G | GHI | GHI |
| 5 | E | E | E | E | EF | G | G | HIX | JKX | JKL |
| 6 | F | F | F | F | G | HIX | HIX | JK | L | MO |
| 7 | G | G | G | G | HX | JK | JK | L | MO | N |
| 8 | H | H | HX | HX | L | L | L | MO | N | PQ |
| 9 | K | K | K | L | MI | M | MO | N | PQ | R |
| 10 | L | L | L | MI | N | NO | N | PQ | R | SYZ |
| 11 | MI | MI | MI | N | OV | PQ | PQ | R | SYZ | TU |
| 12 | N | N | N | OV | PQ | R | R | SYZ | TU | VWX |
| 13 | O | OV | OV | PQ | R | S | SYZ | TU | VW | |
| 14 | PQ | PQ | PQ | R | S | T | T | VW | | |
| 15 | R | R | R | S | T | WUZ | VW | | | |
| 16 | S | S | S | T | W | VY | | | | |
| 17 | T | T | T | W | YZ | | | | | |
| 18 | UXZ | UXZ | W | YZ | | | | | | |
| 19 | V | W | YZ | | | | | | | |
| 20 | W | Y | | | | | | | | |
| 21 | Y | | | | | | | | | |
| F#1 | 1 | 1 | 15 | 26 | 26 | 60 | 100 | 174 | 219 | 315 |
| F#2 | 1 | 1 | 6 | 15 | 26 | 125 | 177 | 251 | 275 | 362 |
| F#3 | 11 | 13 | 26 | 45 | 69 | 252 | 359 | 510 | 567 | 749 |
| Edit (line) | 1000 | 1000 | 200 | 100 | 60 | 15 | 10 | 6.5 | 6 | 4 |

FIG. 22d

| | | | | | | | |
|---|---|---|---|---|---|---|---|
| 1 | AB | AB | ABC | ABC | ABCD | ABCD | ABCD |
| 2 | CD | CD | DEF | DEF | EFVWX | EFVWX | EFRVWX |
| 3 | EF | EF | GHI | GHIV | GHIJKL | GHIJKL | GHIJKL |
| 4 | GHI | GHI | JKL | JKLW | MNO | MNO | MNOPQ |
| 5 | JKL | JKL | MNO | MNO | PQR | PQR | TUSYZ |
| 6 | MNO | MNO | PQR | PQR | SYZ | TUSYZ | |
| 7 | PQ | PQR | SYZ | SYZ | TU | | |
| 8 | R | SYZ | TU | TUX | | | |
| 9 | SYZ | TU | VWX | | | | |
| 10 | TU | VWX | | | | | |
| 11 | VWX | | | | | | |
| F#1 | 413 | 521 | 690 | 847 | 1094 | 1379 | 1711 |
| F#2 | 500 | 624 | 836 | 968 | 1257 | 1588 | 2086 |
| F#3 | 1053 | 1330 | 1870 | 2219 | 3091 | 4092 | 5918 |
| Edit (line) | 3 | 2.25 | 2.0 | 1.5 | 1.0 | 0.8 | 0.5 |

FIG. 22e

| | | | | | | | | |
|---|---|---|---|---|---|---|---|---|
| ABC | DEF | GHIZ | JKLY | | MNO | PQR | SVW | TUX |

FIG. 22f

| | | | | | | | | |
|---|---|---|---|---|---|---|---|---|
| AB | CD | EF | GHI | | MNO | PQR | SYZ | TU |
| | | | JKL | | VWX | | | |

FIG. 22g

| | | | | | | | | |
|---|---|---|---|---|---|---|---|---|
| AB | CD | EF | GHI | | MO | N | PQ | R |
| | | | JKL | | TU | SYZ | VWX | |

FIG. 22h

| | | | | | | | | |
|---|---|---|---|---|---|---|---|---|
| | | D | JK | | MO | | | |
| A | CU | EF | HIX | | N | PQ | R | SYZ |
| | | G | L | | T | VW | | |

FIG. 22i

| | | | | | | | | |
|---|---|---|---|---|---|---|---|---|
| | | D | JK | | M | | | |
| AB | C | EF | HIX | | NO | PQ | R | S |
| | | G | L | | T | VY | WUZ | |

FIG. 22j

| | | | | | |
|---|---|---|---|---|---|
| | | MNO | | JKL | |
| ABC | DEF | GHIZ | | PQR | SVWY |
| | | TUX | | | |

FIG. 22k

| | | | | | | |
|---|---|---|---|---|---|---|
| | | EF | | JKL | | |
| CD | AB | GHI | | PQR | SYZ | VWX |
| | MNO | TU | | | | |

FIG. 22l

| | | | | | | | |
|---|---|---|---|---|---|---|---|
| | | | JKL | | N | | |
| CD | AB | EF | GHI | | PQ | R | SYZ |
| | | MO | TU | | VWX | | |

FIG. 22m

| | | | | | | | | |
|---|---|---|---|---|---|---|---|---|
| C | D | EF | AB | | | | | |
| G | JK | L | HIX | | T | SYZ | R | PQ |
| | | M | NO | | WUZ | VY | | |

FIG. 22n

| | | | | | | | | |
|---|---|---|---|---|---|---|---|---|
| | | | | | MI | | | |
| AJ | B | C | D | | N | PQ | R | S |
| E | F | G | H | | OV | T | UXZ | W |
| | | K | L | | Y | | | |

FIG. 22o

| | | | | | | |
|---|---|---|---|---|---|---|
| CD | EF | AB | | N | | |
| JKL | MO | GHI | | SYZ | R | PQ |
| | | TU | | VWX | | |

FIG. 22p

| | | | | | | |
|---|---|---|---|---|---|---|
| CD | EF | AB | | JKX | VW | |
| L | MO | GHI | | SYZ | R | PQ |
| | N | TU | | | | |

FIG. 22q

| | | | | | | | | |
|---|---|---|---|---|---|---|---|---|
| D | C | B | AJ | | L | N | | |
| H | G | F | E | | T | S | R | PQ |
| | K | MI | OV | | UXZ | W | YZ | |

FIG. 22r

| | | |
|---|---|---|
| ABC | DEF | |
| GHIZ | MNO | JKL |
| TUX | SVWY | PQR |

FIG. 22s

| | | | |
|---|---|---|---|
| | AB | EF | CD |
| VWX | GHI | MNO | JKL |
| | TU | SYZ | PQR |

FIG. 22t

| | | | |
|---|---|---|---|
| CD | AB | EF | GHI |
| JKL | M | NO | TU |
| PQ | R | SYZ | VWX |

FIG. 22u

| | | | |
|---|---|---|---|
| AB | CD | EF | GHI |
| JKX | L | MNO | N |
| PQ | R | SYZ | TU |
| | | VW | |

FIG. 22v

| | | | | |
|---|---|---|---|---|
| AB | CU | D | EF | G |
| JK | L | N | MO | HIX |
| PQ | R | SYZ | T | VW |

FIG. 22w

| | | | | |
|---|---|---|---|---|
| AB | C | D | EF | G |
| JK | L | N | MI | HX |
| PQ | R | SO | TU | WX |
| | | VY | | |

FIG. 22x

| | | | | |
|---|---|---|---|---|
| B | K | D | E | AJ |
| L | N | MI | HX | JK |
| PQ | R | S | T | OV |
| F | G | W | Y | UXZ |

FIG. 26g

| | |
|---|---|
| DE<br>F | AB<br>C |
| JK | G<br>HI |

| | |
|---|---|
| MN<br>O | PQ<br>R |
| V to<br>Z | ST<br>U |

FIG. 26h

| | | | | | | |
|---|---|---|---|---|---|---|
| CD | EF | AB | | NO | SYZ | R |
| M | JKL | GHI | | TU | VWX | PQ |

FIG. 26i

| | | | | | | |
|---|---|---|---|---|---|---|
| | | | | N | | |
| CD | EF | AB | | MO | SYZ | R |
| JK | L | GHI | | TU | VWX | PQ |

FIG. 26j

| | | | | | | | |
|---|---|---|---|---|---|---|---|
| | | | | | M | | |
| | CD | EF | AB | | NO | SYZ | R |
| JK | L | G | HI | | TU | VWX | PQ |

FIG. 26k

| | | | | | | | |
|---|---|---|---|---|---|---|---|
| | | | | | M | | |
| D | C | EF | AB | | NO | SYZ | R |
| JK | L | HI | G | | TU | VWX | PQ |

FIG. 26l

| | | | | | | | | |
|---|---|---|---|---|---|---|---|---|
| | | | | | M | | | |
| D | C | EF | AB | | NO | S | R | PQ |
| JK | L | G | HI | | TU | VW | XYZ | |

FIG. 26m

| | | | | | | | | |
|---|---|---|---|---|---|---|---|---|
| | | | C | | M | | | |
| | B | EF | AB | | N | PQ | R | S |
| JK | L | G | HI | | TU | V | WX | YZ |

FIG. 26n

| | |
|---|---|
| DE<br>F | AB<br>C |
| JK<br>L | GH<br>I |

| | | |
|---|---|---|
| MN<br>O | PQ<br>R | S |
| U to<br>Z | T | |

FIG. 26o

| | | | |
|---|---|---|---|
| JK<br>L | GH<br>I | DE<br>F | AB<br>C |

<table>
<tr><td>MN<br>O</td><td>PQ<br>R</td><td>S</td><td>T</td></tr>
<tr><td colspan="4">U to Z</td></tr>
</table>

FIG. 26p

| | | | |
|---|---|---|---|
| JK<br>L | GH<br>I | DE<br>F | AB<br>C |

<table>
<tr><td>MN<br>O</td><td>PQ<br>R</td><td>S</td></tr>
<tr><td>T</td><td colspan="2">U to Z</td></tr>
</table>

FIG. 27u

| | | | |
|---|---|---|---|
| AB | EF | CD | JK |
| GHI | M O | N | L |
| TU | SY Z | R | PQ |
| | V W X | | |

FIG. 27v

| | | | |
|---|---|---|---|
| AB | EF | CD | |
| GH I | MO | N | JK L |
| T | S | R | PQ |
| | V to Z | | |

FIG. 27w

| | | | |
|---|---|---|---|
| AB | EF | CD | JK |
| GH I | M O | N | L |
| T | S | R | PQ |
| | V to Z | | |

FIG. 27x

| | | | | |
|---|---|---|---|---|
| AB | EF | CD | VW | G |
| HI X | MO | N | L | JK |
| TU | S YZ | R | P Q | |

FIG. 27y

| | | | | |
|---|---|---|---|---|
| A B | E F | C U | D | G |
| HI X | NO | M | L | JK |
| T | SY Z | R | P Q | VW |

FIG. 28j

| | | | | |
|---|---|---|---|---|
| AB | EF | C | D | G |
| HIX | OV | N | M | L |
| T | S | R | PQ | JK |
| YZ | UW | | | |

FIG. 28k

| | | | |
|---|---|---|---|
| A<br>B | E<br>F | C | D |
| GH<br>I | M | OV | N |
| T | S | R | P<br>Q |
| X<br>YZ | U<br>W | L | J<br>K |

FIG. 28l

| | | | | |
|---|---|---|---|---|
| A<br>B | E<br>F | C | D | G |
| H<br>I | O | N | M | L |
| T | S | R | P<br>Q | J<br>K |
| U<br>V | W | X<br>YZ | | |

FIG. 28m

| | | | | |
|---|---|---|---|---|
| A | E | D | C | B |
| HI | O | N | M | L |
| T | S | R | P<br>Q | JK |
| UV | W | X<br>YZ | F | G |

17 Key

16 Key

15 Key

15 Key

10 Key

17 Key

16 Key

15 Key

14 Key

12 Key

18 Key 16 key

15 Key

14 Key

Keys 12

Keys 14

Keys 10

Keys 12

Keys 11

Keys 10

Keys 12

Keys 11

Key 10

Keys 11

Keys 9

Keys 14

Keys 13

Keys 12

Keys 11

Keys 10

Keys 13

Keys 12

Keys 10

FIG. 38

| Col I | Col II | Col I | Col II | Col I | Col II |
|---|---|---|---|---|---|
| QWERTY keyboard letters (Standard) | Redefined letter assignments to Col I Based on Fig. 31a | QWERTY keyboard letters (Standard) | Redefined letter assignments to Col I Based on Fig. 31a | QWERTY keyboard letters (Standard) | Redefined letter assignments to Col I Based on Fig. 31a |
| Top row of keys | | Middle row of keys | | Bottom row of keys | |
| Q | | A | | Z | |
| W | C | S | AB | X | |
| E | D | D | EF | C | G |
| R | H | F | IJK | V | L |
| T | M | G | | B | |
| Y | | H | | N | R |
| U | N | J | OPQ | M | V |
| I | S | K | TU | | |
| O | W | L | XYZ | | |
| P | | | | | |

FIG. 39

Display #1 He is very E
F

Display #2 He is very ER
FR

Diaplay #3 He is very ERA
ERB
FRA

Display #4 He is very ERBI
FRAI

Display #5 He is very FRAIL

FIG. 49

FREQUENCY OF USE OF LETTERS ASSIGNED BELOW HOME LINE – FOR FIRST LETTERS OF WORDS

| BELOW HOME LINE | |
|---|---|
| B | 1211 words |
| E | 811 words |
| J | 179 " |
| V | 459 " |
| U | 606 " |
| X | 10 " |
| Z | 74 " |
| Q | 109 " |
| | |
| TOTAL | 3,464 WORDS |

Letters are redefined as shown in Fig. 1

| Case# | Word being entered | Display# | | | | | | | |
|---|---|---|---|---|---|---|---|---|---|
| | | 1st | 2nd | 3rd | 4th | 5th | 6th | 7th | 8th |
| 1 | GREAT | G | GR | GRE | GREA | GREAT | | | |
| | | | | | GREB | | | | |
| 2 | ABAFT | A | AA | | | | ABAFT | | |
| | | B | AB | ABA | ABAF | ABAFT | | | |
| | | | BA | BAB | BABE | | | | |
| 3 | RELAY | R | RE | REL | RELA | RELAY | RELAY | | |
| | | | | | | RELAX | | | |
| 4 | REVILE | R | RE | REV | REVI | REVIL | REVILE | | |
| 5 | FRIEND | E | ER | ERI | | | | FRIEND | |
| | | F | FR | FRI | FRIE | FRIEN | FRIEND | | |
| 6 | ERA | E | ER | ERA | ERA | | | | |
| | | F | FR | ERB | | | | | |
| | | | | FRA | | | | | |
| 7 | FRANK | E | ER | ERA | | | FRANK | | |
| | | F | FR | FRA | FRAN | FRANK | | | |
| | | | | ERB | | | | | |
| 8 | FRAIL | E | ER | ERA | | | FRAIL | | |
| | | F | FR | FRA | ERBI | | | | |
| | | | | FRA | FRAI | FRAIL | | | |
| 9 | FRAIL | E | ER | ERA | ERBI | FRAIL | | | |
| | | F | FR | ERB | FRAI | | | | |
| | | | | FRA | | | | | |
| 10 | ARID | A | AR | ARI | ARID | ARID | | | |
| | | B | BR | BRI | BRID | | | | |

FIG. 41

Dictionary file for Method II (Each letter is in ASCII code)

| Col I | Col II |
|---|---|
| WS | CB |
| WSK | CAT |
| WSKID | CAUSE |
| WJO | COW |
| EJC | DOG |
| MJKID | HOUSE |

FIG. 42

Dictionary file for Method III

| Column I | Column II |
|---|---|
| WS* | CB |
| WS*K* | CAT |
| WS*K**ID* | CAUSE |
| WJ*O | COW |
| EJ*C | DOG |
| MJ*K**ID* | HOUSE |

FIG. 43

| Col I | Col II |
|---|---|
| QWERTY keyboard letters used in Col I of the dictionary which when redefined match the letter on the same line in Col II | Letters expressed by ASCII code in Col II of the dictionary. Based in fig. 31a |
| W | C |
| E | D |
| R | H |
| T | M |
| U | N |
| I | S |
| O | W |
| C | G |
| V | L |
| N | R |
| M | V |
| S* | A |
| S** | B |
| D* | E |
| D** | F |
| F* | I |
| F** | J |
| F*** | K |
| J* | O |
| J** | P |
| J*** | Q |
| K* | T |
| K** | U |
| L* | X |
| L** | Y |
| L*** | Z |

FIG. 44

| Letters Entered | EF | R | IJK | E | N | D | | |
|---|---|---|---|---|---|---|---|---|
| Display # | I | II | III | IV | V | VI | VII | VIII |
| | E | ER | ERI | ERIE | ERIEN | ERIEND | FRIEND | |
| | F | FR | ERJ | EFJE | ERJEN | ERJEND | | |
| | | | ERK | ERKE | ERKEN | ERKEND | | |
| | | | FRI | ERIF | ERIFN | ERIFND | | |
| | | | FRJ | ERJF | ERJFN | ERJFND | | |
| | | | FRK | ERKF | ERKFN | ERKFND | | |
| | | | | FRIE | FRIEN | FRIEND | | |
| | | | | FRJE | FRJEN | FRJEND | | |
| | | | | FRKE | FRKEN | FRKEND | | |
| | | | | FRIF | FRIFN | FRIFND | | |
| | | | | FRJF | FRJFN | FRJEND | | |
| | | | | FRKF | FRKFN | FRRFND | | |
| | | | | | | | | |

FIG. 45

| DISPLAY # | 1 | 2 | 3 | 4 | 5 | 6 |
|---|---|---|---|---|---|---|
| | | | Method IV | | | |
| "desire" Homeline | d | De | Des | Desi<br>Desi j<br>Desi k | desir | desire |
| Method I with no selection key | | | | | | |
| "desire" Homeline | d | De | Des | Desi | desir | desire |
| Method IV | | | | | | |
| "fourth" Homeline | e<br>f<br>* | Fo<br>Fp<br>Fq | Fot<br>fou<br>* | Four | Fourt | fourth |
| Method I with no selection keys | | | | | | |
| "fourth" Homeline | E<br>F * | Eo<br>Fo | Fou | Four | fourt | Fourth |
| Method IV | | | | | | |
| "friend" Homeline | E<br>F * | FR | Fri | Frie<br>Frif | Frien | Friend |
| Method I with no select key | | | | | | |
| "friend" Homeline | E<br>F* | ER<br>FR | Eri<br>Fri | Frie | Frien | Friend |
| Method I and Method IV | | | | | | |
| "friend" Homeline | E<br>F | FR | Fri | Frie | Frien | Friend |

FIG. 46

BASED ON KEYBOARD ASSIGNMENT SHOWN ON FIG. 48A
AND FREQUENCY OF LETTER CHART – FIG. 47

| | | | | | | | | | | | | | | | | | |
|---|---|---|---|---|---|---|---|---|---|---|---|---|---|---|---|---|---|
| Letters in Home Line | A | C | D | E | G | H | I | L | M | N | O | P | R | S | T | U | Y |
| Letters Below Home Line | B | | | F | | | J | | | | V | Q | | X | | W | Z |

| The letters selected to be placed below home line and frequency of use in a sample of 1 million words. | |
|---|---|
| Letter | Freq. of Use |
| B | 1600 uses |
| F | 2500 uses |
| J | 400 uses |
| V | 1200 uses |
| Q | 400 uses |
| X | 500 uses |
| W | 1700 uses |
| Z | 200 uses |
| TOTAL | 8500 USER PER 106,400 USES = 8% |

FIG. 47

Frequency of use of letters for 15 categories of tests with over one million words

| LETTERS | NUMBER OF USES |
|---|---|
| E | 12,000 |
| T | 9,000 |
| A | 8,000 |
| O | 8,000 |
| I | 8,000 |
| N | 8,000 |
| S | 8,000 |
| R | 6,400 |
| H | 6,200 |
| L | 4,400 |
| D | 4,000 |
| C | 3,400 |
| U | 3,000 |
| M | 3,000 |
| F | 2,500 |
| P | 2,000 |
| G | 2,000 |
| W | 1,700 |
| Y | 1,700 |
| B | 1,600 |
| V | 1,200 |
| K | 800 |
| X | 500 |
| J | 400 |
| Q | 400 |
| Z | 200 |
| Total | 106,400 Uses |

Based on A. Zettersten, 1969, p. 61, and Cambridge Ency. of Language, pg. 86.

FIG. 48a

FREQUENCY OF USE FOR FIRST LETTER IN A DICTIONARY OF 21,084 WORDS

| First letter | Number of Words | Percentage |
|---|---|---|
| A | 1353 | 6.4 |
| B | 1211 | 5.7 |
| C | 2137 | 10.1 |
| D | 1229 | 5.8 |
| E | 811 | 4.0 |
| F | 974 | 4.6 |
| G | 672 | 3.2 |
| H | 819 | 3.9 |
| I | 983 | 4.7 |
| J | 179 | 0.8 |
| K | 147 | 0.7 |
| L | 681 | 3.2 |
| M | 1133 | 5.4 |
| N | 441 | 2.1 |
| O | 509 | 2.4 |
| P | 1772 | 8.4 |
| Q | 109 | 0.5 |
| R | 941 | 4.5 |
| S | 2011 | 9.5 |
| T | 1079 | 5.1 |
| U | 606 | 2.9 |
| V | 459 | 2.2 |
| W | 697 | 3.3 |
| X | 10 | 0.0 |
| Y | 79 | 0.4 |
| Z | 42 | 0.2 |
| Total | 21,084.00 Words | 100% |

FIG. 48b

KEYBOARD ASSIGNMENT FOR CALCULATIONS ON FIGURES 46 AND 48A

| | | | | | | | | | | | | | | | | | | | |
|---|---|---|---|---|---|---|---|---|---|---|---|---|---|---|---|---|---|---|---|
| Home line | A | C | D | E | G | H | I | K | L | M | N | O | P | R | S | T | W | Y | |
| Below home line | B | | | F | | | J | | | | | V | Q | | X | | U | Z | |

FIG. 50

| | | | | | | | | | |
|---|---|---|---|---|---|---|---|---|---|
| ESC | CTRL | F1<br>F6 | F2<br>F7 | F3<br>F8 | F4<br>F9 | F5<br>F10 | ALT | PAUSE BREAK<br>PRINT SCREEN | NUM LOCK |
| TAB<br>C | (<br>D | )<br>H | [ {<br>M | ] }<br>* | N<br>7 | S<br>8 | SCROLL LOCK<br>W<br>9 | FN<br>– | BACK SPACE |
| \ ~<br>AB | !<br>EF | ` @<br>IJK | #<br>* | $<br>* | %<br>OP<br>4 | ^<br>TU<br>5 | &<br>XYZ<br>6 | *<br>+ | SHIFT |
| SHIFT | G | / ?<br>L | \<br>* | : ;<br>*<br>0 | " '<br>QR<br>1 | <<br>V<br>2 | > .<br>3 | ENTER | CAP LOCK |
| DELETE | INSERT | HOME<br>PAGE DOWN | SPACE BAR | | PAGE UP | ▽ | △ | =<br>◁ | ▷ |

Keys 13

Keys 12

Keys 11

Keys 10

Keys 9

14 Keys

13 Keys

12 Keys

11 Keys

10 Keys

12 KEYS

15 KEYS

17 KEYS

12 KEYS

FIG. 55a
16 KEYS

| | | | | | | | | | | | | | | | |
|---|---|---|---|---|---|---|---|---|---|---|---|---|---|---|---|
| | | | AB | C | D | * | * | N | S | | | | | | |
| | | | EF | G | H ⊙ | * | * | OP ⊙ | TU | XYZ | | | | | |
| | | | IJK | L | M | * | * | RQ | VW | | | | | | |

FIG. 55b
17 KEYS

| | | | | | | | | | | | | | | | |
|---|---|---|---|---|---|---|---|---|---|---|---|---|---|---|---|
| | | | AB | C | D | * | * | N | OP | RQ | | | | | |
| | | | EF | G | H ⊙ | * | * | S ⊙ | TU | V | | | | | |
| | | | IJK | L | M | * | * | W | XYZ | | | | | | |

12 KEYS

17 KEYS

FIG. 57a
15 KEYS

| | | | | |
|---|---|---|---|---|
| AB | EF | IJK | NO | TM |
| C | g | LY | PQ | SZ |
| d | h | M | RX | VW |
| * | * | * | * | * |

FIG. 57b
15 KEYS

| | | | | |
|---|---|---|---|---|
| AB | EF | IJK | OP | TU |
| C | G | L | QR | VW |
| D | H | MN | S | XYZ |
| * | * | * | * | * |

FIG. 57c
12 KEYS

| | | | | |
|---|---|---|---|---|
| * | * | * | * | * |
| AB | EF | IJK | MN | RS |
| CD | GH | L | OPQ | TU |
| * | VW | XYZ | * | * |

FIG. 57d
15 KEYS

| | | | | |
|---|---|---|---|---|
| AB | CY | D | NB | PQ |
| EF | G | HX | R | SZ |
| IJK | L | M | TU | VW |
| * | * | * | * | * |

FIG. 57e
15 KEYS

| | | | | |
|---|---|---|---|---|
| C | G | LY | N | SZ |
| ab | ef | IJK | OPQ | TY |
| d | H | M | RX | VW |
| * | * | * | * | * |

FIG. 58a

9 KEYS

| | | | | | | | |
|---|---|---|---|---|---|---|---|
| | | * | ABC | DEF | GHI | JKL | |
| | | * | MNO ⊙ | PQR | SYZ | TUX | |
| | | | VW | * | * | * | |
| | | | | | | | |

FIG. 58b

15 KEYS

| | | | | | | | | | | |
|---|---|---|---|---|---|---|---|---|---|---|
| | | | | | * | AB | CY | D | EF | |
| | | | | | VW | GH ⊙ | IJK | LX | MZ | |
| | | | | | * | N | OPQ | RS | TU | |
| | | | | | | * | * | * | * | |

FIG. 58c

12 KEYS

| | | | | | | | | | | |
|---|---|---|---|---|---|---|---|---|---|---|
| | | | | * | AB | CD | EF | GH | IJK | |
| | | | | * | L | MN ⊙ | OPQ | RS | TU | |
| | | | | * | VW | XYZ | * | * | * | |
| | | | | | | | | | | |

FIG. 58d

10 KEYS

| | | | | |
|---|---|---|---|---|
| | | ABC | DEF | GHI |
| | * | JKL | MN | OPQ |
| | * | RS | TU | VW |
| | | * | XYZ | * |

FIG. 58e

9 KEYS

| | | | | |
|---|---|---|---|---|
| | ABC | JKL | SYZ | |
| | DEF | MNO | TUX | * |
| | GHI | PQR | VW | * |
| | * | * | * | |

FIG. 58f

10 KEYS

| | | | |
|---|---|---|---|
| ABC | JKL | RS | |
| DEF | MN | TU | * |
| GHI | OPQ | VW | * |
| * | XYZ | * | |

FIG. 58g

16 KEYS

| | | | | |
|---|---|---|---|---|
| AB | EF | L | OP | TU |
| CY | GH ⊙ | M | QR | V |
| D | IJK | N | S | W |
| * | * | XYZ | * | * |

FIG. 58h

10 KEYS

| | | | | |
|---|---|---|---|---|
| ABC | GHI | MNO | S | VW |
| DEF | JKL ⊙ | PQR | TU | XYZ |
| * | * | * | * | * |

* 2 HAND BASED ON QWERTY KEYBOARD ASSIGNMENTS

2 HAND

FIG. 62

| Keyboard Assignment | Number of unintended words displayed when entering intended words which result from the letter assignments in the left column |
| --- | --- |
| AB | 23 |
| CK | 13 |
| DJ | 39 |
| EF | 12 |
| GI | 7 |
| HO | 30 |
| LY | 27 |
| MX | 6 |
| NZ | 12 |
| PQ | 0 |
| R | 0 |
| S | 0 |
| TU | 8 |
| VW | 24 |
| | Total: 201 |

201÷41,790=.5%

001C-2

002B

003B

005B

SPEED TYPING APPARATUS AND METHOD

RELATED APPLICATIONS

This is a continuation-in-part of PCT/USOO/01890, filed Jan. 26, 2000 which claims priority from U.S. provisional application Serial No. 60/117,246, filed Jan. 26, 1999.

BACKGROUND OF THE INVENTION

1. Field of the Invention

The present invention relates to a method and apparatus which makes it easier to learn to type, improves the accuracy of typing, increases typing speed and reduces wear on the user. More particularly, the present invention relates to a system for the rapid entry of text into a microprocessor-controlled word processing system making use of a keyboard having multiple alphabet letter characters assigned to at least one to as many as all of the keys.

2. Description of the Related Art

Conventional typewriters make use of twenty-six (26) letter keys, one for each letter of the English alphabet. One of the initial keyboard layouts is the "QWERTY" keyboard, which today remains the industry standard. Other formats have been devised, such as the Dvorak keyboard, that position keys about the keyboard in an ergonomic fashion for ease of use and accessibility. These alternative formats primarily seek to increase speed of typing and accuracy, as well as to reduce wear on the user.

Generally, all of the traditional keyboards provide an individual key for each letter of the alphabet. In addition to the letter keys, function keys are provided, such as ALT, CTRL, SPACE BAR, ENTER, and so forth. Consequently, the keyboards are congested with numerous keys and require a great deal of space. Likewise, these conventional keyboards require the user to memorize or be able to locate a particular key for each character the user would like to select.

Other keyboard layouts assign more than one character to a key, usually referred to as multiple letter key or double-touch systems. These systems, however, require the user to operate multiple keys in order to select a single desired character. Systems that require concurrent or simultaneous operation of multiple keys, such as shown in U.S. Pat. No. 4,891,777, are sometimes referred to as chord systems. The chord systems require the user to expend twice the effort for each letter to be selected. In addition, these chord systems require the user to be able to remember 26 key combinations, one for each letter of the alphabet.

Other multiple key systems require the user to operate specific multiple keys in a successive manner. U.S. Pat. No. 5,062,070, for instance, shows a system in which multiple characters are provided for each key. However, in order to select the particular character desired, the user must make at least two successive keystrokes. Thus, the user must remember 26 different combinations of successive keystrokes, one for each letter of the alphabet. U.S. Pat. No. 5,007,008, on the other hand, provides a keyboard in which the user must scroll through each of multiple letters that are assigned to a single key by repeatedly depressing that key.

As a result of having to enter multiple keystrokes to select a single character, these double-actuation or multiple letter key systems are slow, tiresome, and prone to typographical errors. Accordingly, these systems are primarily used where a reduced keyboard size is of utmost importance, as opposed to speed and accuracy.

Another variation of typing, called abbreviated typing, involves only having to type part of a word. U.S. Pat. No.

4,459, 049, for instance, shows an abbreviated typing system in which the user only needs to enter four or less characters. The system will then search for the abbreviated word in memory. When the abbreviated word is located, the full word is entered from the memory into the document.

All of these keyboard systems are difficult to use and even more difficult to learn. Consequently, typing is slower and prone to mistakes. Moreover, these keyboards are all the more difficult to operate by persons that have not learned to use that particular type of keyboard. These "hunt and peck" typists must search for the desired characters, which are often arranged in a non-alphabetic order and amongst a great number of keys.

Another type of keyboard entry is encountered on telephones that are used to access remote systems, called automated response systems. Generally, these automated response systems will recognize alphabet characters associated with a key depressed on a remotely located telephone keypad. One such system, for instance, is employed by the U.S. Supreme Court, wherein users simply dial the Supreme Court phone number in order to locate the docket number or status of a pending case. The user may call into the system from any conventional remote phone location.

Once the Supreme court automated response system is accessed, the user is prompted by voice message to specify the name of the desired case by depressing keys on the remote telephone keypad. Pursuant to current instructions, the user then proceeds to enter up to ten alphabetic characters of the name of one of the parties to the desired case on the keypad of the remote telephone. The conventional telephone keypad consists of twelve keys, 0–9, *, and #. Multiple letters are associated with each of numerical keys 2–9, so that all 26 letters are accounted for except for Q and Z, which the system specifies as being assigned to numerical key 1. The user then depresses ten numerical keys corresponding to the name of one of the parties. Or, the user may enter less than ten digits followed by the * key or a four-second delay. Once the party name has been entered, the system then searches the clerk's office docket and provides a voice indication of the three closest cases that have been located by case number, parties, and status. If the user is not satisfied with any of those cases, the user may then speak with a docket clerk.

The automated response system described above is designed to accommodate conventional telephone keypads, with limited words in memory and is not implemented in a word processing environment. Consequently, the system is extremely slow and not readily adaptable for use as a speed typing arrangement. Moreover, the system is limited to use with voice or speech communication systems and with telephone keypads. Consequently, the automated response systems do not provide for editing memory, defining preferred terms, or defining new word variations. In addition, the telephone keypads are not designed for typing, much less speed typing.

As an alternative to the conventional keyboard, input devices have been mounted on the hand and fingers. Such devices are shown, for instance, in U.S. Pat. No. 5,581,484 to Prince, and U.S. Pat. No. 4,414,537 to Grimes. Basically, these systems place switches at various positions about the hand in order to simplify entry of information into a computer. However, these systems are not directed toward speed-typing.

SUMMARY OF THE INVENTION

The present invention relates to a system and method for rapid typing using a keyboard which has multiple characters assigned to at least one to as many as all of the keys, so that fewer than the number of letters in the alphabet using this system (e.g., fewer than 26 letter keys for the English alphabet or the 33 letters in the Russian alphabet). For example, all 26 letters of the alphabet may be assigned to 4, 6, 8, or 17 keys. Each such key on the keyboard is associated with a numerical digit whereby one or more series of digits form a code. The system uses the numerical code to access a dictionary or table of words stored in the computer's memory at a memory location corresponding to the numerical code. The system may display all of the words available to the user in response to the input code. If more than one word is responsive to the coded numerical sequence, the user then selects one of the available words to be placed in the document.

The user is further given the option of selecting a preferred word or words to be associated with any given numerical code. When that code is typed in, the computer will display all words, with the preferred words displayed in ranked order. The user, however, may optionally select to display only the preferred word or words.

In addition, the user may be given the option of having the words associated with any given numerical code displayed in different ways, such as (1) in accordance with an order or degree of preference which the user defines, (2) in accordance with a predefined preference list which gives a higher ranking to those words that are the most commonly used, (3) in alphabetical order, or (4) in accord with special predefined categories of usage, such as legal or scientific terminology. The user has the option of having the priority list adjusted automatically based upon the selection of words made by the user when designating the desired word from the group of words with the same numerical code.

A further feature of the invention is that the user may select between a range of keyboard configurations, such as 4, 6, 8, or 12 letter keys to which are assigned the 26 letters of the alphabet. Also, the system will complete and display lengthy words before the user has finished typing them on the keyboard. The invention is preferably implemented on a traditional QWERTY keyboard, wherein multiple letters are assigned to the row of number keys, 0–9, typically located along the top row of the keyboard, or to the rectangular grid of numerals commonly located to the right side of the keyboard or the horizontal rows of keys to which letters are conventionally assigned. In addition, a specially-designed keyboard, which plugs into a computer, is also shown to implement the invention. The provision of fewer keys makes the special keyboard particularly better suited for use by persons with physical disabilities, and may be used in place of, or in conjunction with, the traditional keyboard.

Accordingly, it is an object of the present invention to provide a system for faster typing using a keyboard easier to remember and having as few or as many keys as the user desires.

It is a further object of the invention to provide a speed typing system that may be utilized with a compact keyboard that is not congested with excessive keys, thereby reducing size and space requirements of the input device.

It is another object of the invention to provide a keyboard that has multiple letters per key, yet only requires a single touch to select a desired letter key.

It is still a further object of the invention to provide a keyboard for speed typing that is ergonomic, reduces wear on the user, and easy to learn, and increases accuracy and efficiency.

It is another object of the invention to provide a typing system that is easy to use for persons with disabilities, such as arthritis.

It is another object of the invention to implement a speed-typing system with a finger-mounted input device.

It is still yet another object of the invention to design contoured keys for a keyboard that enable a user to sense the relative position of his hand on the keyboard.

It is another object of the invention to provide a quick and easy method for entering information for editing and typing using a speech recognition system.

It is another object of the invention to provide a system to compress data to reduce memory required to store data and increase speed of transmission.

These together with other objects and advantages which will become subsequently apparent when reference is made to the drawings and description hereinbelow.

BRIEF DESCRIPTION OF THE DRAWINGS

FIG. 2(*b*) shows a 14-key configuration as implemented on the conventional character row of a standard QWERTY keyboard in accordance with the preferred embodiment of the invention.

FIG. 4(*b*) shows a flow chart in accordance with an alternative method of operation of the system.

FIGS. 22(*a*)–(*b*) are a table showing the number of word codes associated with more than one word when two letters of the alphabet are combined on the same key.

FIGS. 22(*c*)–(*d*) are a table of five- to twenty-one-key keyboard configurations generated based upon the table of FIG. 22(*a*), and showing the number of word codes associated with more than one word, and the total number of words associated with those word codes having more than one word, for each configuration.

FIGS. 22(*e*)–(*x*) are alternative keyboard configurations, based upon the table of FIG. 22(*b*).

FIG. 24(*b*) is a side view of the middle top, bottom and side keys shown in FIG. 24(*a*).

FIG. 24(*c*) is a perspective view of the four corner keys of FIG. 24(*a*).

DETAILED DESCRIPTION OF THE PREFERRED EMBODIMENTS

Figure 1:
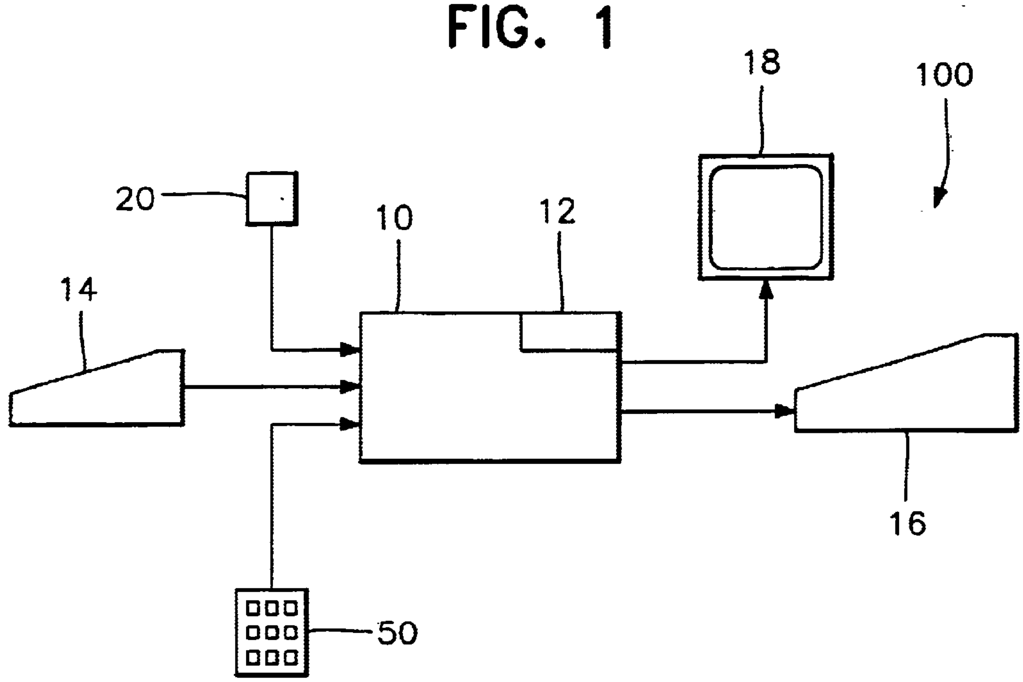
FIG. 1 shows an overall preferred embodiment of the word processing system of the invention in block-diagram format.

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents which operate in a similar manner to accomplish a similar purpose.

Turning to the drawings, FIG. 1 shows the speed typing system 100 in accordance with the preferred embodiment of the invention. Generally, the system 100 comprises a computer 10 having a microprocessor, internal memory 12, and associated input/output components well known in the word processing art. A conventional expanded keyboard 14, printer 16, and display 18 is provided in a conventional manner. In addition, a separate specially designed keypad or keyboard 50 may be optionally utilized in a manner to be described. The word-processing system is controlled by programmed instructions within the computer which recognize operator-initiated keystrokes and subsequently display and print the text. The software instructions will be modified from conventional instructions to perform the functions of the present invention. The software to perform the functions of the present invention may be within the pre-programmed instructions of the word processing system or stored on a disk, CD-ROM, or stored and retrieved remotely through the Internet or local network or other like systems, for input into the computer and may be linked by conventional interfacing techniques to all major word processors in a manner well known in the art, such as by Dynamic Database Enhancing or Object Linking and Abetting or Standard Interface.

Although system 100 is shown as consisting of separate components, the system 100 may be implemented in a variety of manners, such as in a hand-held computer 10 with memory 12 which is integrated with a keyboard 50 and a display 18. The hand-held computer, or portable input device, may be remotely located with its output either directly wired or transmitted wirelessly to the computer. Thus, the portable input device may be used to access the system remotely, such as through a remote telephone, over conventional telephone lines, or wirelessly, using tone signals or binary code signals that are generated by the input device.

The invention is designed so that the user may decide to use some of the lettered keys of a conventional keyboard or the numbered keys of a conventional keyboard, which are generally located along the top row of the keyboard or along the right hand side of the keyboard. Likewise, the invention may be implemented on a touch-screen monitor, by a toggle-type control lever resembling a joystick in appearance, or by other like input devices. The keys may be still further be mounted on a portable keyboard in which the finger keys press inward in one direction and a thumb-operated key is mounted on the side of the keyboard and is pressed inward by the user's thumb. The thumb is especially useful for function controls, spacing, backspacing, or for controlling the direction of cursor and for highlighting.

Figure 2A:
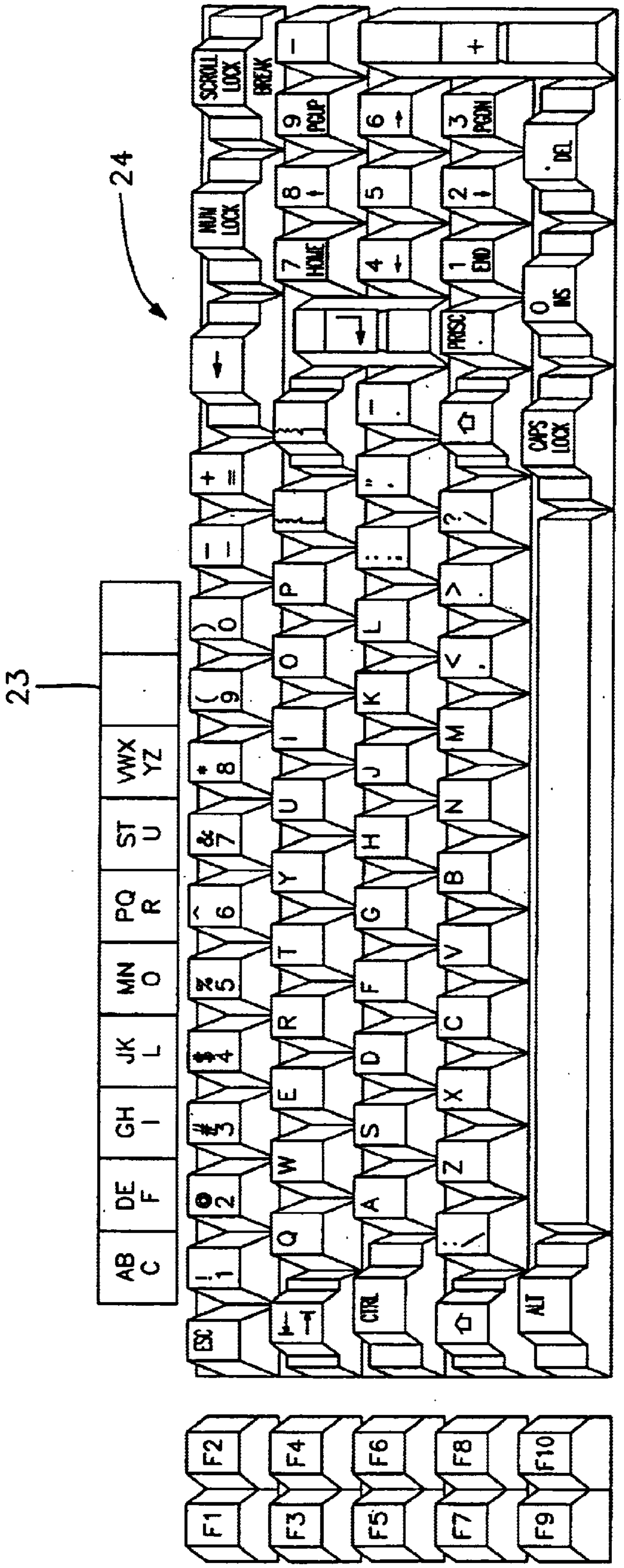
FIG. 2(*a*) shows an 8-key configuration as implemented on the top numeral row of a standard QWERTY keyboard in accordance with the preferred embodiment of the invention.
Figure 2B:
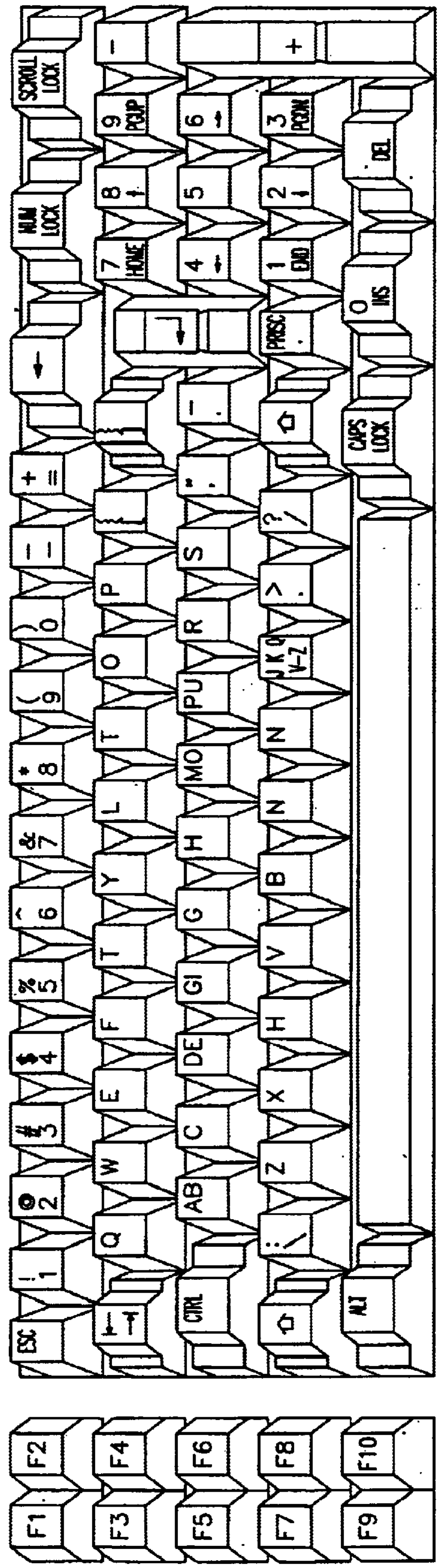

FIG. 2(*a*) shows a traditional expanded QWERTY keyboard 14 used to implement the present invention in accordance with the preferred embodiment of the invention. The examples of the present invention are provided for the English language. Keyboard 14 has 10 numeral keys along the top row and 10 numeral keys along the right hand side of keyboard 14, each labeled from 1–9 and 0. An overlay 23 is shown above the top row of numeral keys, indicating letter characters to be assigned to each of the corresponding numeral keys. In addition, stickers (not shown) having multiple letters may optionally be mounted to the numeral keys located on the right portion of keyboard 14 or on keys that are conventionally marked with a letter.

In one of the preferred embodiments, the standard keyboard is an 8-key configuration, wherein numeral keys 1–7 are each alphabetically assigned 3 letters, and numeral key 8 is assigned 5 letters, as shown by the overlay 23. The number assigned each numeral key is used as an input element code or numerical code that is associated with the corresponding letters.

Another embodiment, corresponding to a 14-key configuration, is shown in FIG. 2(*b*), where the conventional letter keys "a", "s", "d", "f", "r", "c", "j", "u", "n", "I", "k", ",", "l", and ";" are redefined as shown. The keys range from having a single letter, to as many as 8 letters for a single key. This embodiment preferably places a vowel with one or more consonants rather than a consonant with a consonant or a vowel with a vowel. Vowels and consonants are usually not interchangeable in a given sequence of letters which are arranged to form a word, so that the configuration results in a fewer incidence of words having the same code. In addition, the most commonly used letters are sometimes provided a separate key that is easy to reach. On the other hand, the least-used letters are preferably grouped on a key or keys which are generally not as conveniently positioned.

Figure 3:
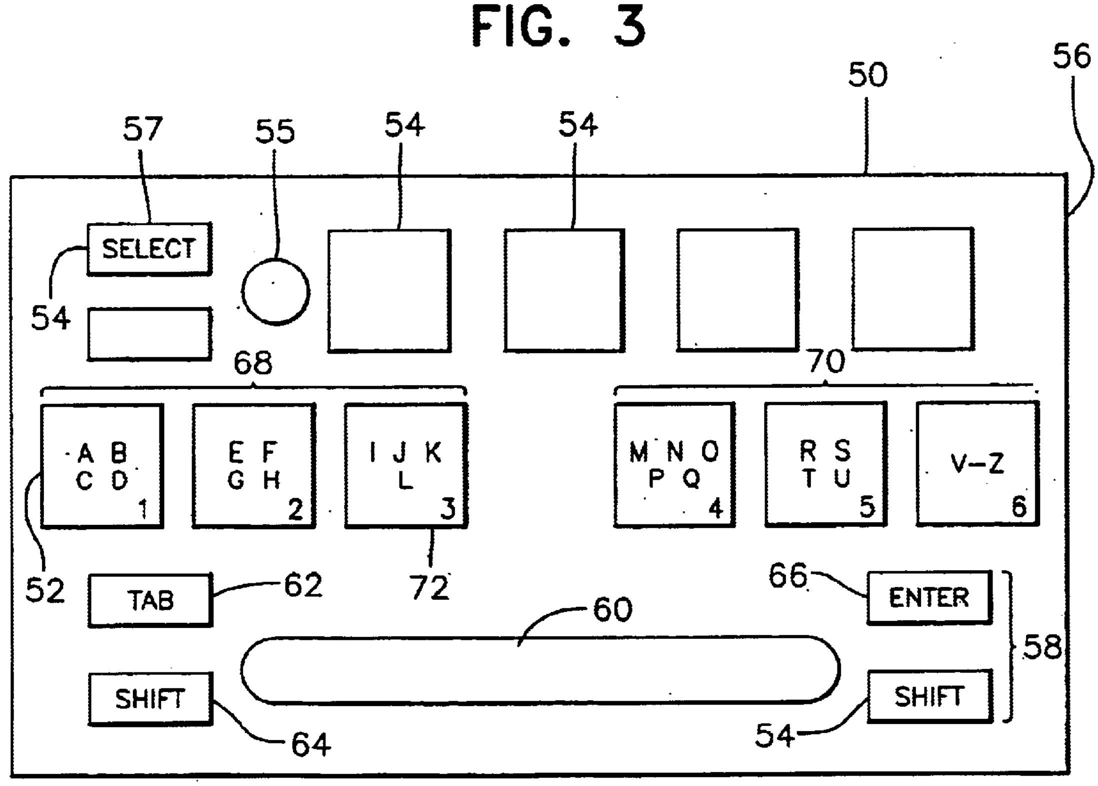
FIG. 3 shows a 6-key configuration of a specially designed keyboard in an alternative embodiment of the invention for use with the system of FIG. 1.

FIG. 3 shows one example of a specially designed keyboard 50 corresponding to a two-handed 6-key configuration. Keyboard 50 generally comprises alphabetic or letter character keys 52 and function keys 54. Letter character keys 52 are provided in the middle row of keyboard 50, while function keys 54 are provided along the top and bottom portions 56, 58, respectively, of keyboard 50. In addition, a cursor controller 55 and select button 57 are provided along the top portion 56 of keyboard 50. Keyboard 50 may be arranged in any manner suitable to other keyboards, such as the keys being aligned in an arcuate shape. Keyboard 50 interfaces with the word processing computer 10 in a conventional manner.

The function keys 54 may correspond to any suitable function to be performed. Preferably, however, the bottom row of function keys 54 comprise for instance, SPACE BAR 60, TAB key 62, SHIFT KEY 64, and ENTER key 66. The top row 56 of function keys 54 may correspond to numbers or characters, cursor movement keys, definable function keys, capitalization, backspace, or keys having other like operations. In addition, keyboard 50 may be used in conjunction with expanded keyboard 14. Expanded keyboard 14 would supply any of the numerical or function keys 54 not provided by keyboard 50. Accordingly, the expanded keyboard 14 is optional, although it complements special keyboard 50 by providing the full spectrum of traditional function and character keys.

Letter keys 52 are divided into two groups 68, 70, each group having three keys. Three characters are assigned to each of the keys 52 of the left group 68, which are preferably imprinted on the key, though may be located on a template or an overlay on a row above the keys, so that the user's fingers do not otherwise obstruct letters placed on the keys themselves (not shown). The left key 52 has letters A, B, C, D; the middle key 52 has E, F, G, H; and the right key 52 has I, J, K, L. The right group 70 of keys 52 each have from four to five characters: the left key 52 has M, N, O, P, Q; the middle key 52 has R, S, T, U; and, the right key 52 has V–Z.

Each letter key 52 is further assigned a numerical digit corresponding to a numerical or element code 72, which is imprinted on the bottom right side of the key 72. The purpose of the numerical code, or input element code, will become more apparent below. The left group 68 of keys 52 are designed to be used by a user's left hand and the right group 70 is for use by the right hand.

As depicted in each of FIGS. 2 and 3, the letters are generally arranged alphabetically along letter keys 52, from left to right. This configuration makes it easier for a user to learn and memorize the location of keys and for "hunt and peck" typists to find a desired key. However, the letters may be formatted in any suitable manner, such as based upon frequency of use, with less frequently used letters either grouped together or inter-dispersed with more frequently used letters. The letters may also be arranged partially alphabetically, such as placing the vowels on separate keys in an alphabetical order. The letters may also be arranged to reduce the number of words associated with a single word code. Also, the user or programmer may implement a program to locate the letters on the keys with as few or as many keys the user decides.

The computer may further be configured to maintain a tally of the word usage and determine the most frequently used letters and words for that user and the information may be further used to automatically place terms in rank order of priority in memory, as will become more apparent below. For instance, if the letters are to be arranged alphabetically, the letter "o" may be grouped with either "n" or "p". However, due to the often prolific use of the words "on" and "no", it would be preferable to place the letter "o" with the letter "p" or "m", which are close in alphabetical order. Still yet, letters may be grouped together which have similarities in appearance in order to assist recollection of location by the user. Also, additional keys can be concentrated about the index finger so that the keys are easy to reach.

In addition, the keyboard configurations may range in number of keys, such as from 5 or less to 21 letter keys or more (see, for instance, FIGS. 22(*c*), (*d*) and (*e*)), and the number of letters on each key may range from 1 to 8 or more letters per key. There are many other possibilities in addition to those shown in FIGS. 22(*c*)–(*e*) that are equally practical and may be designed by the user and integrated in the computer program. As will become more apparent below, the greater the number of keys, and with careful assignment of letters to the keys, the less editing or other interaction that will be required by the user. However, typing will be slower and more difficult to learn since there are more key locations. Likewise, the fewer the number of keys, the easier the system will be to learn and type, but the more editing that will be required of the user.

Now turning to FIG. 4(*a*), a functional flowchart of the invention as implemented by programmed instructions stored in the computer memory 12 or from a floppy diskette will now be described. The system 100 starts at block 102, where the system formats itself. In formatting, each key is preassigned a particular set of letters and a numerical digit or code 72 according to the designated keyboard configuration. For instance, the preferred default keyboard configuration is the 8-key configuration of FIG. 2(*a*), or a 10- or 12-key configuration. Accordingly, eight input elements, here keys 52, are assigned the digits 1–8, from left to right, respectively. In addition, each of letters A, B, C are assigned to numerical digit or input element code 1; letters D, E, F are assigned numerical code 2; and so forth. Thus, when a letter key 52 is depressed on keyboard 14, the equivalent numerical code 72 is recognized by the computer 10 at step 104.

The standard eight key format may be changed by the operator in accordance with the system design. That is, the system may display alternate format choices to the operator, such as using 4, 6, or 13 keys, which the operator may select and the operator may select the letters to be assigned each key. Each format may be accompanied by a corresponding template or overlay 23.

After format selection, typing may begin. The operator types out a word and the key depressions are read, step 104. A numeral associated with each key is read and stored as it is depressed until the operator strikes a key that indicates the user has reached the end of the word to be typed, step 106. For instance, if the character is a punctuation mark, space, or carriage return, the system will determine that the word is complete and proceed to step 108. Otherwise, the system returns to step 104, where the system awaits the next character to be entered.

Figure 5:
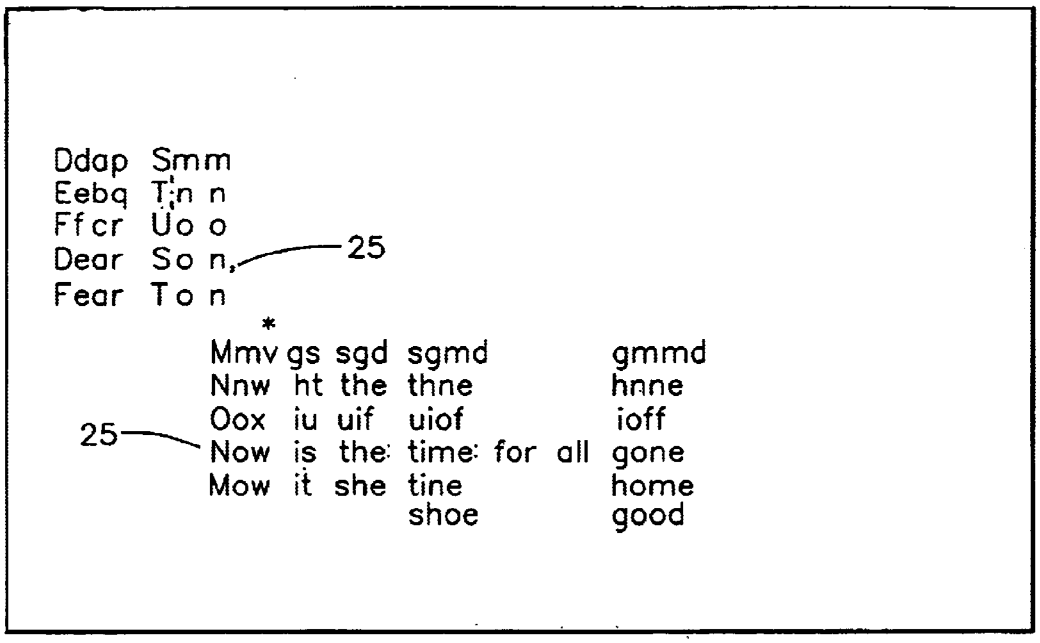
FIG. 5 shows the output of the invention for the monitor of FIG. 1 in accordance with the preferred embodiment of the invention.

As the word is typed, the display unit preferably displays each of the letters associated with each key that is depressed. For example, as shown in FIG. 5, if the key "1" is depressed a linear column or row displaying "ABC" is displayed. Alternatively, nothing may be displayed, or the numeral "1" may be displayed. Still further, only an asterisk or other symbol may be displayed. These display symbols will automatically be erased when the system determines that the typed word is accepted or when the user erases it so that he can enter another word.

Once the entire word has been received, step 106, the system will search the memory 12 by comparing the numerical value of the input code with a table of word codes stored in memory 12, step 108. An example of several numerical or word codes are shown, for instance, in Table 1 for the standard 8-key configuration of FIG. 2(*a*). As shown in Table 1, each word code is stored in a specific memory location, with each memory location having a list of one or more words. The word codes are formed from one or more numerical input element codes. Accordingly, every word in the dictionary is stored in the table memory as associated with a particular code. The memory may be configured from any standard word-processing dictionary or like system.

TABLE 1

| Code | Preferred Words | Words |
|---|---|---|
| 5-5 | | no<br>on |
| 5-5-8 | now | now<br>mow |
| 5-5-8-7 | | mows |

In addition, fewer than every word in the dictionary may be stored in the table memory. For instance, the user may select a limited category of information corresponding to a more finite vocabulary, such as for composing business letters or scientific papers, or addressing medicine, biology, physics, proper nouns, philosophy, and the like. The reduced dictionary diminishes the memory requirements, as well as the time needed for the computer to search the memory. Likewise, less interaction would be required by the user since there are fewer codes in memory, so that each code is further likely to be associated with fewer words, thereby increasing the speed of typing.

The user is able to select which dictionary is to be used, and any dictionary could be combined with any other dictionary, or used alone or with a basic dictionary of common words. Thus, if a word is not found in one dictionary, the user could expand the search to another dictionary. Such search could also be made automatic. The user may also define a dictionary of frequently used words, and may add or remove words from any of the dictionaries.

If the input numerical code is located or found in the memory table, step 108, the system proceeds to step 118. At step 118, the system will check the memory location to determine if more than one word, i.e. multiple words, are associated with the particular input code. If, however, no words are found in memory at step 108, the user will have the opportunity to correct any misspelling of the word, step 109. If the user determines that the code was entered incorrectly, step 109, the user may go back and re-enter the code, step 104. Correction of a misspelling is performed in accordance with the standard word processing operation, such as by erasing the typed code where necessary and entering the new text code. After making the correction, the system determines if a code has been found in memory for the corrected word, step 108.

Assuming, on the other hand, that there was not a typing error, the user may add words in memory, step 110, by adding a particular word to the dictionary memory corresponding to the numerical digits selected. The user selects the new word by highlighting the proper letters among the group of letters displayed above and/or below the home row being typed. Or, the letters may be displayed in a window elsewhere on the screen. As the letters are highlighted and selected from the window, they are then entered into the home row.

Once all the letters of the word are highlighted, the user hits ENTER, and the computer stores the new word in the memory location corresponding to the associated numerical code. If the user elects to add the word in memory, the memory is updated, step 112. The selected word is then displayed in the text of the document, step 114, and the system then returns to step 104, where it awaits the next key to be input, step 117.

If, on the other hand, the user does not add any word in memory, step 110, instructions are displayed, step 116, and the system returns to wait for the next key, steps 117, 104. The instructions may indicate, for instance, that no word has been located and the user should determine whether there was a typographical error or that the user should reconsider whether to define a new word. Thus, the message may read "check spelling" or "code not recognized". Or, the system may display words corresponding to the closest code that is located in memory and indicate that no exact match has been found.

If there is at least one word stored in memory that is associated with the input code at step 108, the system will proceed to step 118. At step 118, if only a single word is stored in the memory location associated with the input code, the word will be displayed, step 120. The user will have the opportunity to change (i.e. add or delete) the word stored in memory, step 122, if, for example, the word in memory is not the word desired to be displayed. As in step 110 above, the memory is updated to include, or omit, the changed word, step 124, the new word is displayed, step 126, in place of the originally displayed word, and the system, at step 127, returns to step 104. If no words are modified at step 122, indicating that the displayed word is correct, the system, at step 127, will return to step 104.

The process of changing the words in memory, steps 110, 122, 152 (as will be discussed below), allows the user to update the memory for specially defined words that are not normally included in a standard dictionary. For example, a proper noun might not be in a dictionary memory and thus the operator may want to change or add the proper noun to the memory for that particular code. Thus, the user may incorporate proper nouns, technical terms, abbreviations, and so forth, into the computer memory. This is done in any suitable programming manner, such as by simply appending the new word into the memory location associated with the given code. In addition, the user may modify the memory so as to later omit terms that were previously incorporated into the memory.

Assuming that there is more than one word in memory, step 118, all the words are displayed, step 142, with any preferred words being displayed at the top of the list of words. The user then has the option of selecting a word, step 144, creating preferred words, step 148, or including a new word in memory that corresponds to the code, step 152.

If the user selects a word among the words displayed, step 144, the selected word is displayed, step 146, and the system returns to await the next input character, steps 147, 104. However, if no word is selected, step 144, the user may wish to create preferred words, step 148. At step 148, the user may define a displayed word or words as being a preferred word to be listed at the top of the list, step 148, or in a certain rank order. If the preferred words are modified, step 148, the memory is updated, step 150, the word is displayed, step 146, and the system again returns to step 104, step 147.

The preferred words are those words that have previously been selected or designated by the user as terms that are most frequently used. The system may also be configured with the words pre-designated as being preferred words. Still yet, the system may be configured so that the preferred word is the word that was selected the last time the same code was entered by the user. As shown in Table 1, for instance, the term "now" is defined as the preferred term for code 5-5-8. Though the preferred terms are shown as a separate list in memory Table 1, they may simply be flagged as a preferred term and stored with the other words for that memory location.

Finally, if the user does not select a word, step 144, and does not change the list of preferred words, step 148, the user may change, i.e. add to or modify, the words in memory, step 152. For example, as discussed above, the desired word may be missing among the displayed words, or the user otherwise wants to include a new word to be associated with the input numerical code. If so, the memory is updated at step 150 to reflect the new information, and the new word is displayed, step 146. The system then returns to step 104, where the system awaits a new character to be input, step 147.

If the user does not select a word, step 144, create a preferred word, step 148, or change a word, step 152, an instruction message will be displayed, step 154. The system will then return to step 104, where it will wait for the next key to be typed, step 147. The message may indicate, for instance, for the user to "check spelling" or that the "word was skipped." Now turning to FIG. 4(*b*), an alternative embodiment of the flow chart of FIG. 4(*a*) will be discussed.

Figure 4A:
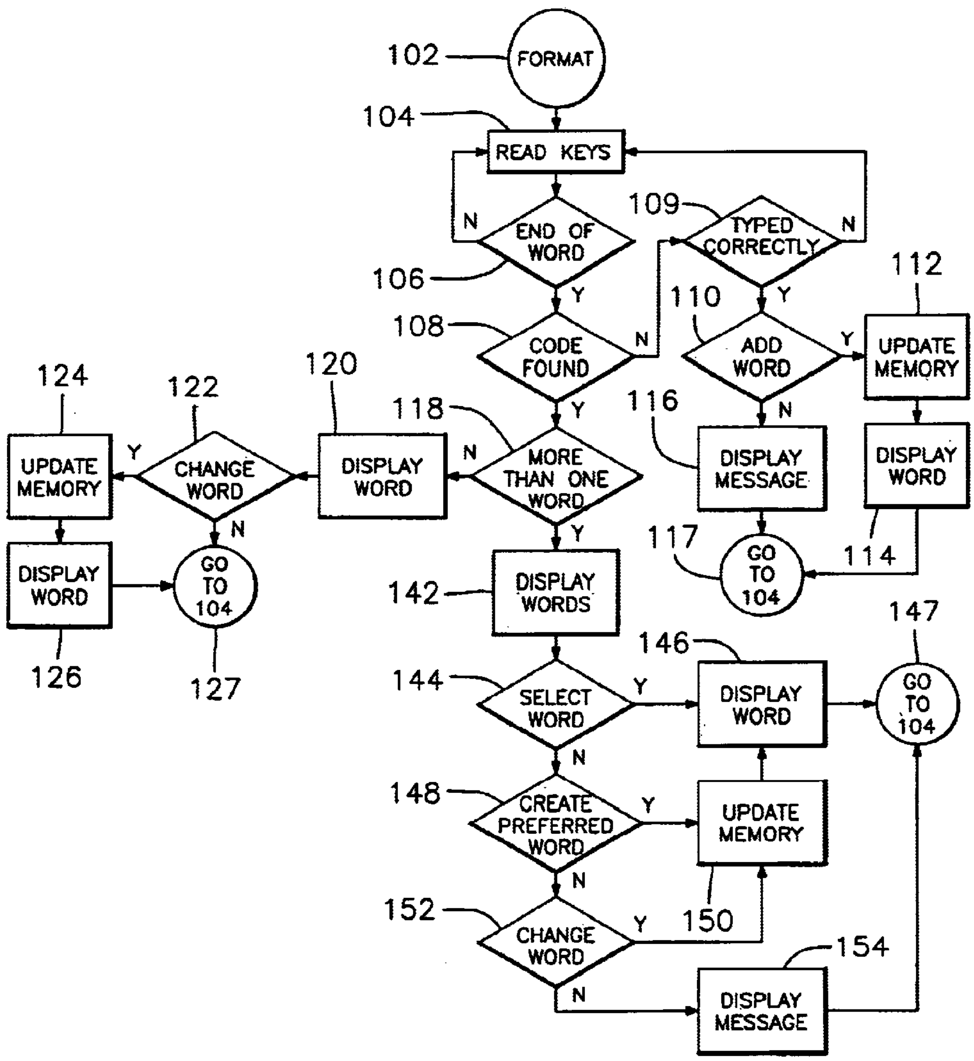
FIG. 4(*a*) shows a flow chart in accordance with the preferred method of operation of the system.
Figure 4B:
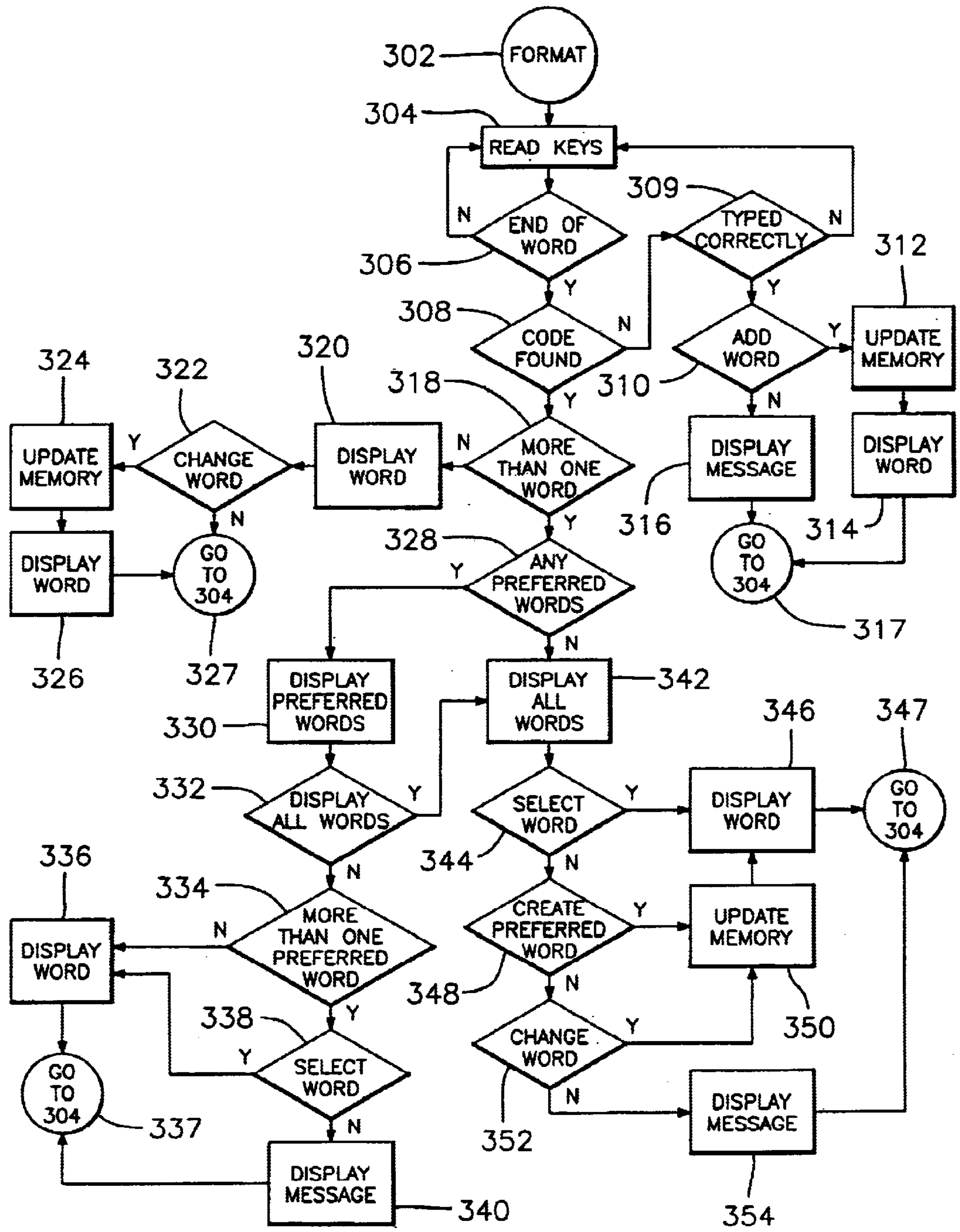

As a standard practice, the system will display all the words in the manner shown in FIG. 4(*a*), with the preferred words displayed at the top of the list of words. However, FIG. 4(*b*) now allows the user to first display a list of only the preferred words. If the desired word is not found among the preferred terms, the user may then decide to see a list of all the words.

Accordingly, steps 302–327 of FIG. 4(*b*) are similar to steps 102–127 of FIG. 4(*a*). Picking up at step 318, however, the user now has the election to first display a list of only the preferred words. Thus, if there is more than one word stored in the memory location associated with the input code, as verified at step 318, the system will next check for a list of preferred words, step 328. If preferred words are stored in memory, the system will display any preferred words associated with that input code, step 330. An asterisk or message will be displayed along with the preferred words so that the user knows that additional words are available aside from only the preferred terms displayed.

The user may, after reviewing the list of preferred terms, step 330, decide to see the entire list of words, step 332, after which all the words are displayed, block 342, offering the operator various choices as will be discussed below. If all the words are not to be displayed, the system then determines if there are multiple preferred words stored in memory, step 334, and, if so, the user may pick among the preferred words, step 338. If a word is selected, the selected word is displayed, step 336, and the system returns to await a new keystroke, steps 337 and 304. If no word is selected, a message is displayed, step 340, and the system returns to receive the next key, steps 337, 304.

Returning to step 332, if the user selects to display all the words stored in memory, step 332, or if there were no preferred words to begin with, step 328, all the words will be displayed, step 342. Accordingly, all words in the appropriate memory location are displayed on monitor 18, step 342. Once the words are displayed, step 342, the user then has the option of selecting a word, step 344, creating a list of preferred words, step 348, or including a new word in memory that corresponds to the code, step 352.

Steps 342 to 354 are essentially similar to steps 142 to 154 of FIG. 4(*a*). At step 348, however, the user may define a displayed word or words as being preferred words or otherwise view and modify the list of preferred words or create a new list of preferred words, step 348.

Referring now to FIG. 5, an example of the operation of the invention will now be described with reference to FIG. 4(*a*). The monitor 18 is generally shown as having a main screen 22 on which the output is displayed. Suppose, for instance, that the user desires to type the phrase "Dear Tom, Now is the time for all good men to come to the aid of their country.". After the computer formats, step 102, the user would begin typing the word "Dear" by striking the key sequence 2-2-1-5, which is recognized by the system at step 104. As each keystroke is made, the letters associated with each key are displayed on the screen 22.

The letters are preferably displayed vertically upward, above the home row 25, which is shown as the center row. The home row is the line that is being typed. It is the row in which the highest preferred word is displayed. If there are no preferred words, the word displayed in the home row may be the first alphabetically listed word, or the word that was selected the last time that code was entered. Below the home row is displayed the list of words with lesser priority, which may be listed alphabetically. When a word from below the home row is selected, it is moved into the home row. It may be preferable to display the letters and words horizontally, especially when there are fewer words to edit, such that most editing will only involve selecting between one of two words.

For a large number of letters assigned to a particular key, the user can elect that the system limit the letters displayed to the first three or four. An asterisk is then provided to indicate to the user that other letters are available to be scrolled. Referring to FIG. 5, for instance, when the user depresses key 8 for the letter "w", the letters "v", "w" and "x" are displayed. An asterisk is also displayed, indicating that additional letters, "y" and "z", have not been displayed. Of course, the user may elect not to display the letters, and have the option to display letters if a desired word is not displayed. Thus, for instance, the letters may only be displayed when no word code is found in memory. If a word code is found in memory, only the words will be displayed, and not the letters for the individual keys that are depressed.

Suppose now that the user has finished typing the word "Now", by striking codes 5-5-8. Once 5-5-8 is entered, the user would then depress space bar 60, indicating to the system that the word has come to an end, step 106. At that point, the system 100 would search the memory and recognize the input code 5-5-8 as corresponding to one of the codes in memory 12, as depicted in Table 1, step 108.

In an alternative preferred embodiment, the numerical code may be searched as the user strikes each key. Thus, when the user strikes 5 for "N", the memory will scroll past all numerical codes starting with a value less than 5. When the user next strikes 5 for "o", the memory will scroll to numerical code 5-5. (At this point, though the user hasn't completed typing that particular word, the currently available words "no" and "on" may be displayed on screen 22.) When the user next strikes 8 for "w", the system need only scroll down a short distance to locate the proper code, 5-5-8.

Continuing with our example at step 118, the system will recognize that there are two words, "now" and "mow", associated with code 5-5-8. At this point, the system may sound an audible beep to alert the user to edit the document.

In addition, the system will then determine that the word "now" has been marked as a preferred word. Thus, the word "Now" is displayed on screen 22 in the home row 25 and highlighted. In addition, the word "Mow" is displayed below "Now", as shown in FIG. 5. The user may display all words in any suitable manner, such as by selecting the function from a pull-down menu. The words associated with the input code are preferably displayed downward starting at the home row 25. The user may then scroll down to highlight one of the words displayed, such as "Mow" by using scrolling keys on keyboard 14 or 50, mouse 20, or cursor controller 55, step 144. Once the appropriate term is highlighted and the user depresses the ENTER key, the selected term is displayed on screen 22, step 146, and the system returns to wait for the next key, steps 147, 104.

An example of scrolling downward is shown in FIG. 5 for the code 3-5-5-2. After the full code is entered, the words "gone", "home", and "good" are displayed downward, with the term "gone" being positioned in the home row 25. At the point shown in FIG. 5, however, the user has scrolled downward to highlight the term "good". Once "good" is highlighted, and the ENTER key depressed, the words "gone" and "home", as well as the letters, are removed from the display. In addition, the term "good" would be displayed in home row 25, without being highlighted, as shown for the words "for all".

Of course, instead of highlighting the desired word, the system may underline the desired word, provide the displayed and/or selected words in brackets, or use any suited method or combination to distinguish selected words from the list of displayed words. Also, the word may be displayed side-by-side, as opposed to being vertically aligned, and the letters may be displayed in a window and may remain in the window until editing and placement of the desired word in the home row.

Still yet, the words may be selected by being scrolled into the home row 25 and hitting ENTER. Or, the user may select a number located next to the listed words that would put that word into the home row. Of course, the words may be displayed both above and below the home row. Where there are three words, such that one word is above the home row and one word below the home row, the user would have the option to hit the "+" and "−" keys to select the word above or below the home row, respectively. In addition, the user may hit a scroll key (which is preferably positioned between the "+" and "−" keys) to view a next group of three words that would then be displayed in the same fashion. In addition, the words may be displayed in a window elsewhere on the screen.

The user may further decide to add a new word (or, if no word code is located in memory due to a misspelling) to memory, step 152. Referring to FIG. 5, suppose the user inputs code 7-5-5 for his name, "Tom". A standard dictionary memory may not have the proper noun word Tom, but does have other words for that codes, including "Ton" and "Son". As described above, all letters for code 7-5-5 are displayed on screen 22 as the respective keys are depressed. In addition, in the absence of any preferred terms, the words "Ton" and "Son" are also displayed on screen 22. In order to define the new word, the user may then exercises the option to display all the letters by depressing a function key and then the user highlights the letters used to form the new word, "Tom", either by vertically scrolling the letters into the home row 25, or by moving the cursor and clicking, as shown in FIG. 5.

Once all of the letters are highlighted, the user hits the ENTER key and the word is displayed in the home row 25, step 114, and all the letters and remaining words are removed from the display. Of course, the user may, instead of highlighting each individual letter, change to a standard 26-key keyboard configuration (as will be described below), in order to directly type a word. Still yet, instead of highlighting, the system may underline a letter, provide letters in brackets, or use any suited method, including the combination of underlining and highlighting, to distinguish a selected letter. The letters may also be displayed side-by-side, as opposed to being vertically aligned.

Nevertheless, once the letters are selected, and a word is formed, the system then updates the memory, step 150, so that the new word "Tom" is stored in the memory location corresponding to numerical code 7-5-5 (or a message may be displayed indicating that the word was not in memory). The system then returns to step 104, where it waits for the next key to be depressed. Once the operator has completed typing, the operator may print the document on printer 16, save to document to disk, or perform any other function common to word processing systems.

Figure 6:
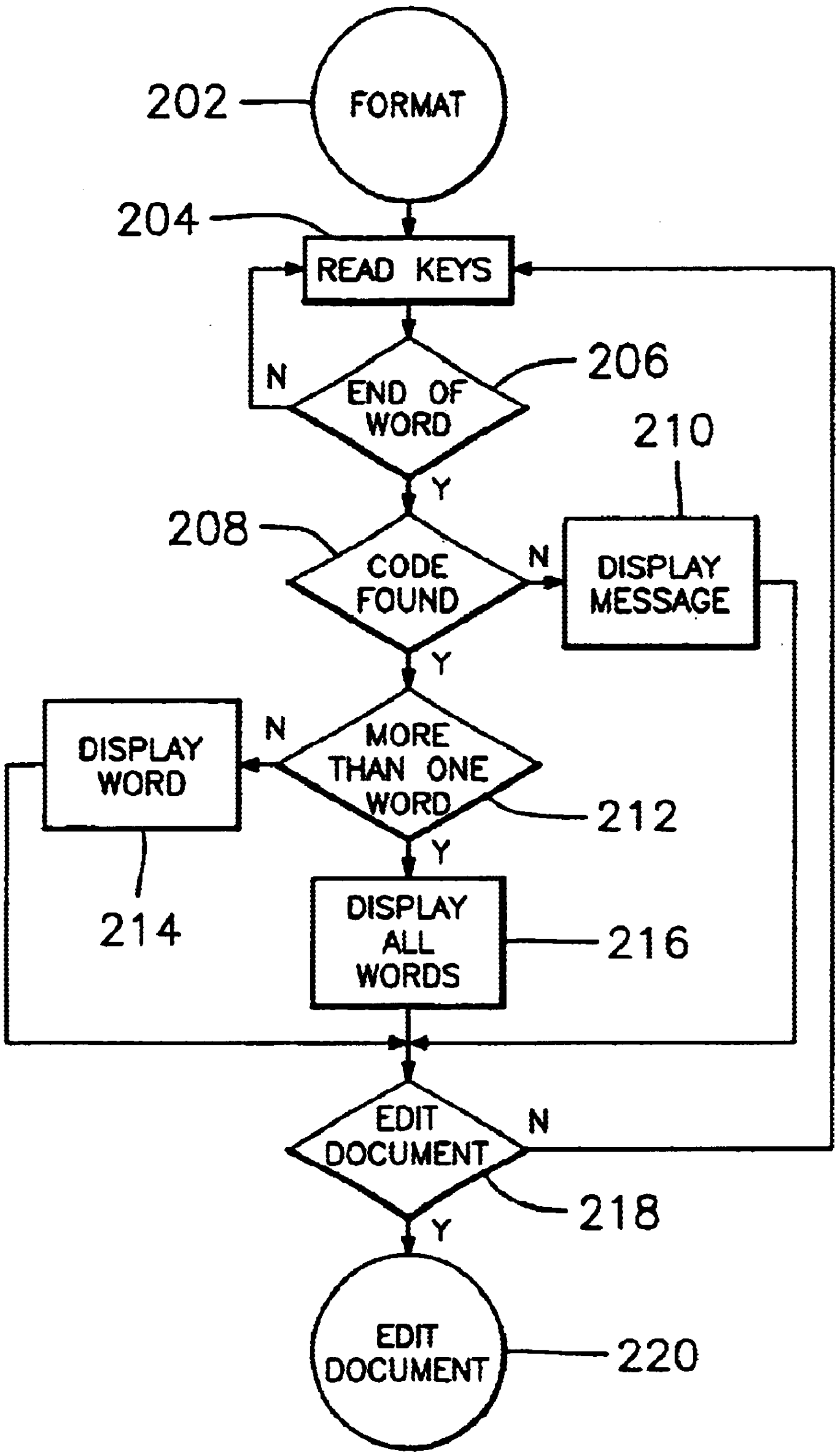
FIG. 6 is a flow diagram for an alternative embodiment of the invention.
Figure 8A:
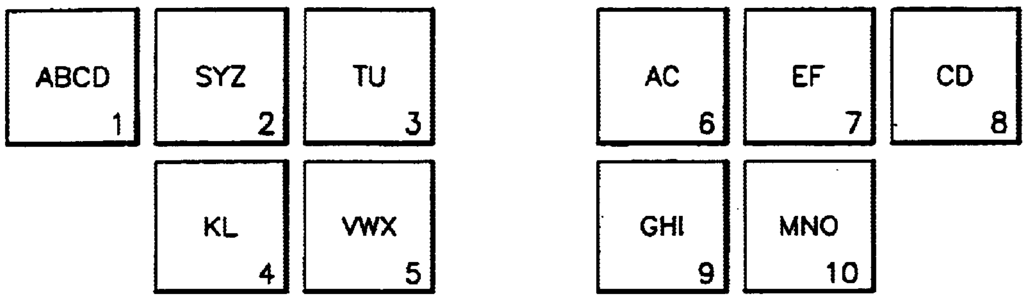
FIGS. 8(*a*)–8(*d*), 9, 10, 11, 12, 13, 14, 15, 16, 17(*a*)–17(*d*), 18, 19 and 20, show alternative keyboard configurations for use with the keyboard of FIG. 1.
Figure 8B:
Figure 8C:
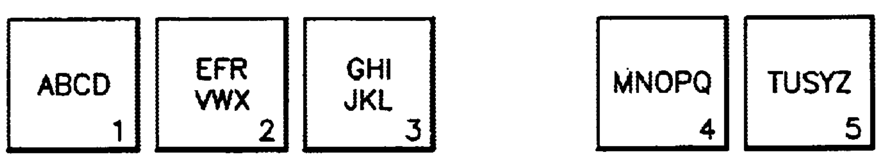
Figure 8D:
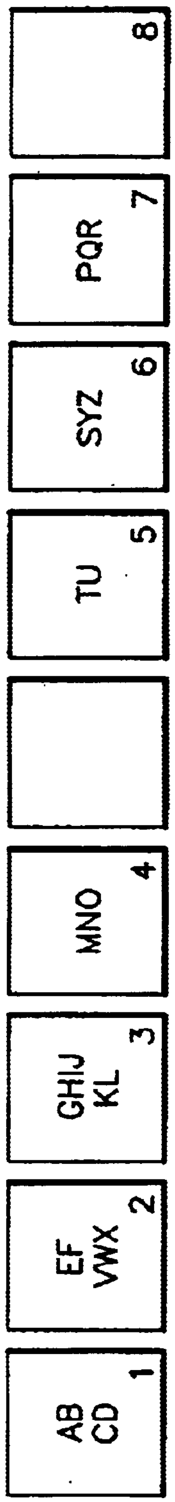

Now turning to FIG. 6, a flow chart is shown in accordance with yet another alternative embodiment of the invention. FIG. 6 differs from FIG. 4(*a*) by allowing the user to finish typing an entire sentence, paragraph, page, or document, prior to having to select the words to be finally displayed. In addition, the preferred words are now displayed in conjunction with the entire set of words, as in FIG. 4(*b*). Thus, instead of displaying the list of preferred words alone, the system now displays all the words, with the preferred words at the top of the list. Long lists may be scrolled in any suitable manner.

As in FIGS. 4(*a*) and 4(*b*), the system starts out by first formatting itself, step 202, and reading keys, step 204. After an entire word is input, step 206, the system will check for the code in memory, step 208. If the input code is not located in memory, step 208, a message will be displayed, or the code will be displayed, step 210, and highlighted, to indicate no word has been found. If the code is found, step 208, and there is only one word, step 212, that word is displayed, step 214. Assuming that there is more than one word in memory, the system will display all the words, step 216, with the highest ordered preferred word always displayed at the home row and other words above and/or below. Here, however, since there is only one word, the step of checking for more than one word, step 212, may be removed since the single word would necessarily be displayed at step 216.

After the code, word, or words have been displayed at steps 210, 214, or 216, the system will determine whether to edit or verify the document, step 218. Here, the user may select that the document is to be edited following the entry of a line of text, a paragraph, or a page and the system will remind the user at the appropriate intervals. Accordingly, after each line, sentence or paragraph of text is entered, the system will automatically prompt the user to go back and edit that line, though the user may continue typing and edit the document at a later time. Upon subsequently editing the document, the system may automatically proceed from one word to be edited to the next, skipping all word codes that only had one word in memory. Or, the system may allow the user to skip between words to be edited, by using a TAB key, a function key, or the like.

The user may also have the option of using "+""−" and "0" keys to select amongst a plurality of displayed letters and/or words. For instance, assume that the user must select from amongst 9 words that are displayed on the screen for the typed word code. The words are displayed both above and below the home row, so as to be centered about the home row (with any preferred word in the home row, and the remaining words listed alphabetically or in rank of priority). The user may then hit the "+" key in order to narrow the displayed words to those above the home row (here, the top five words) and the remaining words would be removed from the display. The five displayed words are then centered about the home row and the user may then hit the "−" key to select the words displayed below the home row, if that is the location of the desired word. Once the field is narrowed to only three words, the "+" and "−" keys would select the word above or below the home row, respectively. Of course, the word in the home row may always be selected by hitting an enter key, or by the user continuing to type.

In addition, the system may be configured so that only three of the nine words may be displayed at a time and the "+" and "−" keys would select the words above and below the home row, respectively, and the "0" may be used to scroll to the next set of three words. Also, the user may hit a number displayed next to the word to immediately enter that word or the user may use a cursor to select the desired word.

Still yet, the user may select to edit the document at any time during the entry of text. Unless the document is to be edited, the system will return to step 204, where it awaits entry of the next key. Accordingly, the system will display alternative words and letters up until the point the document is verified.

Once the document is to be edited, the system will advance to step 220. Here, the system will proceed through each input code for which there is more than one word in memory. Where there is only one word, that word is accepted and displayed in the text of the document. Where there is more than one word, the system will display the list of words with the preferred words being listed first. The system will then prompt the user to select a word, enter a new word into the dictionary, or select a word as being preferred. This process is similar to steps 118 to 147 of FIG. 4(*a*) as discussed above.

The highest preferred word is displayed at the home row and any remaining preferred words are displayed in the order of their priority. The order of priority may be defined by the user or pre-designated in the system. This is done by the user assigning a preferred order to the list of words. Or, a rank order may be predefined by the system. Any words that have not been ranked are also displayed in alphabetical order beneath words having a greater priority.

The term with the greatest priority is displayed in the home row 25. The user may then scroll down (or up, if the words are displayed above the home row) and highlight any term to be selected. If, however, the user does not select a word (such as by continuing to type), the word in the home line 25, here the preferred word, is displayed in the text of the document. The system may further be configured to permit the user to select all of the highlighted words at once. As discussed above, the first preferred word is highlighted by default, at the user's option, and the user may select a different word by scrolling downward or upward to highlight the desired word, without having to press ENTER for each individual word. If there is no preferred word, the first listed word, which is in the home row 25, is highlighted by default.

All the operational steps of the invention are implemented in accordance with well-known programming techniques. For instance, the steps of indicating a word is missing, steps 110, 122, 152, selecting a preferred word, step 148, or changing the keyboard configuration, are implemented by methods that are well-known in the programming art, such as by using a pop-up menu or display window.

In this manner, all the functions available to the user, such as to select a keyboard configuration, add a new word to memory, and so forth, may be implemented by a pull-down menu or in a display window that can be accessed at any time during operation of the invention or only at selected times. Other operations, such as updating the memory, steps 124 and 150, are also implemented by well-known programming methods, examples of which will be discussed below.

Figure 7:
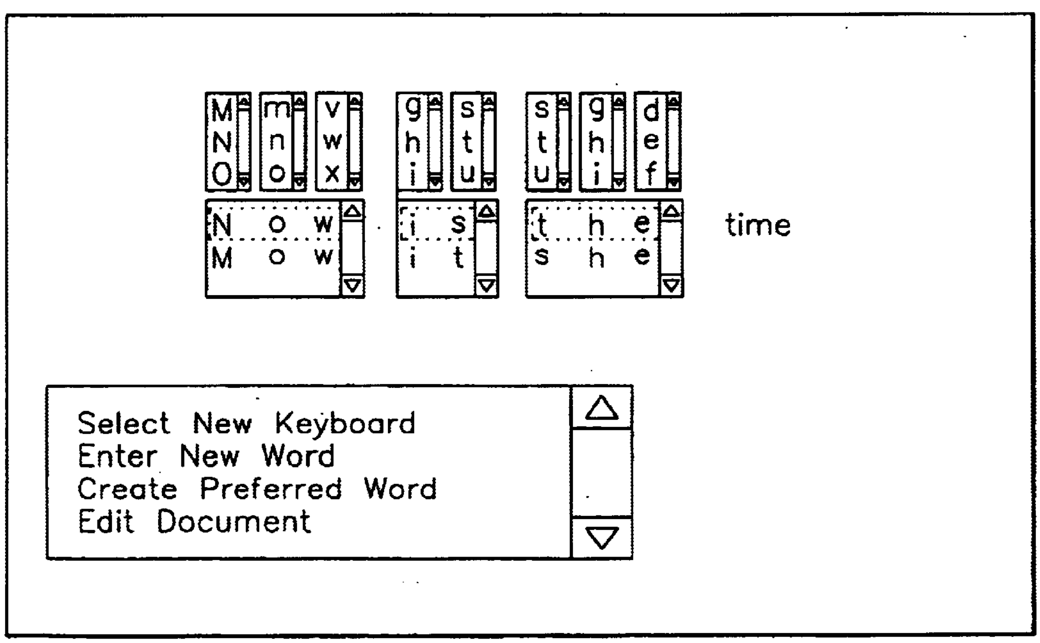
FIG. 7 shows the output of the invention for the monitor of FIG. 1 in accordance with an alternative embodiment of the invention.

An example of implementing the invention by the use of windows is shown, for instance, in FIG. 7, in accordance with the operation of FIG. 6. A function display window is provided for the user to select among available functions, such as to enter a new word not in memory, select a new keyboard configuration, create a preferred word, edit the document, create a preferred word, and so forth. In addition, the letters and words are also displayed in scrollable windows, with the most preferred term listed first and highlighted. The non-preferred or lesser prioritized words are then displayed below the most preferred word. The preferred term, however, need not necessarily be highlighted at the user's option.

Once a word is selected, the window disappears and the word is displayed in the text of the document, such as shown for "time" in FIG. 7. Still as an alternative method of selecting words, each word or letter (in the case of defining a new word) may be displayed adjacent a number (not shown). The user may then select the word or letter by depressing the number displayed adjacent the desired word. The user may then use one hand for typing and one hand for editing or selecting words and letters, or otherwise controlling operation of the system.

Figure 9:
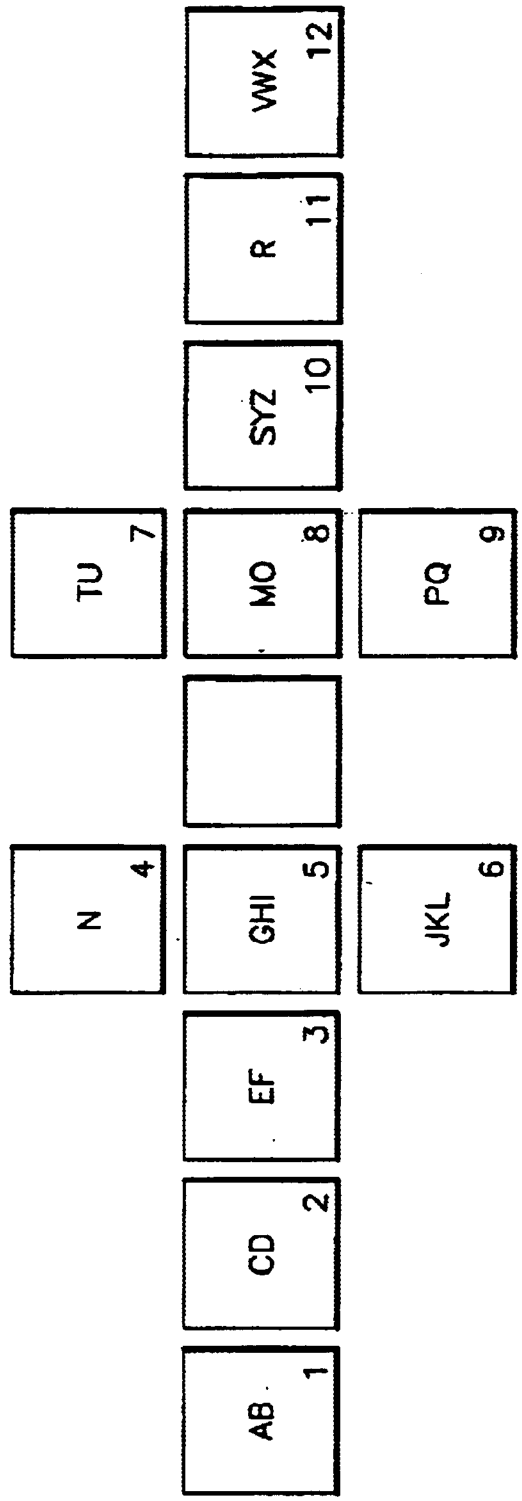
Figure 10:
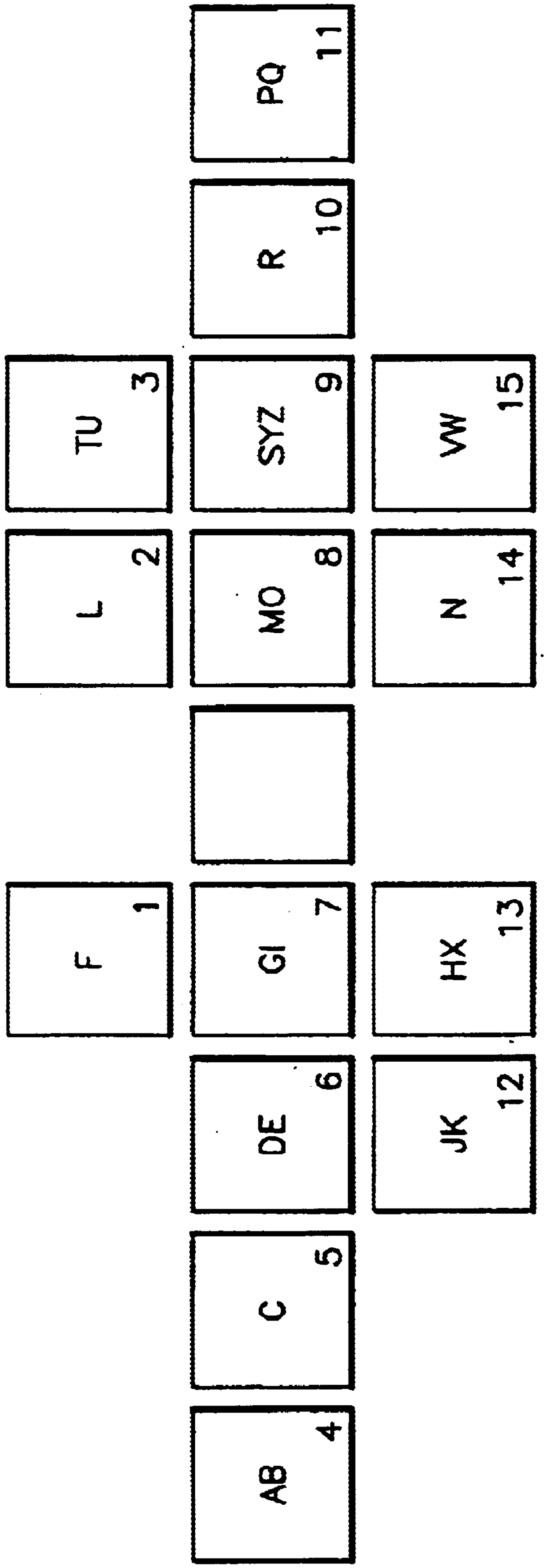
Figure 11:
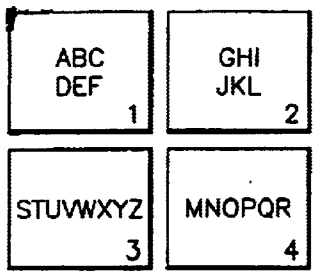

Now turning to FIGS. 8–20, various alternative embodiments of keyboard configurations are shown. These configurations may be pre-programmed into the system, or may be designated by the user. FIGS. 8–10 are examples of two-handed keyboard configurations and FIGS. 11–20 generally show examples of one-handed keyboard configurations. These embodiments have the user position his fingers over most of the respective keys, thereby reducing finger and hand movement and fatigue.

Figure 12:
Figure 13:
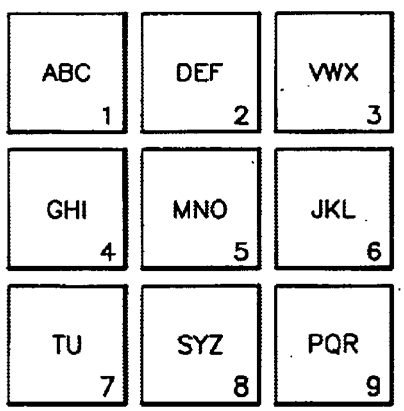
Figure 14:
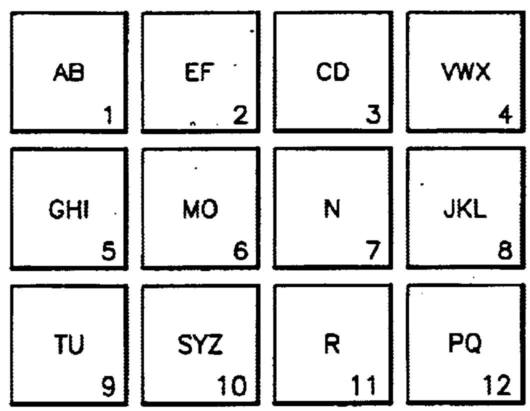
Figure 15:
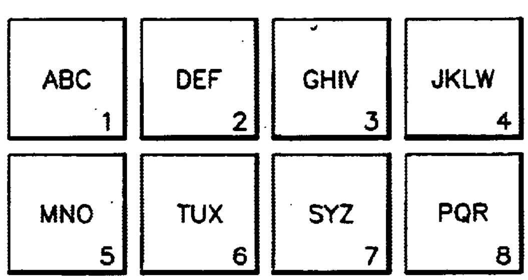
Figure 16:
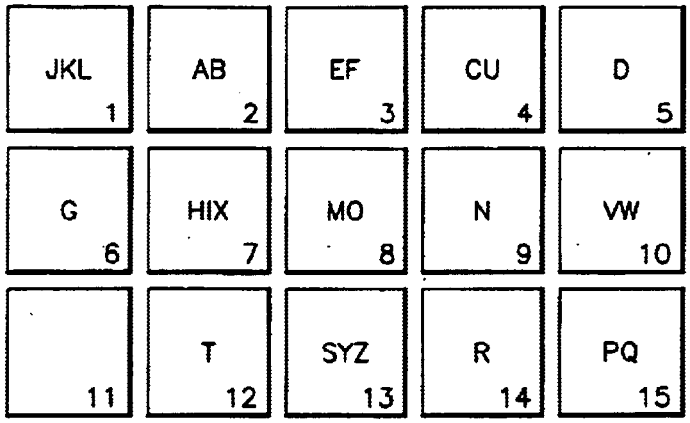
Figure 17A:
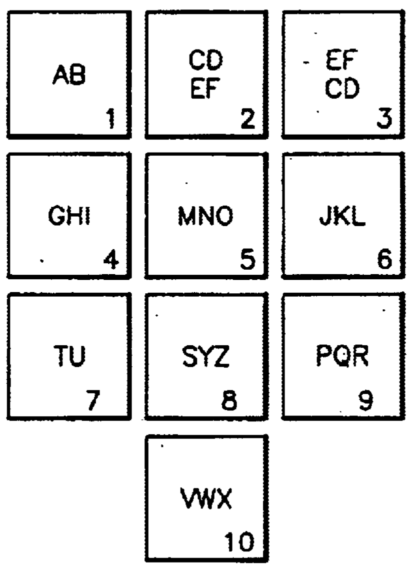
Figure 17B:
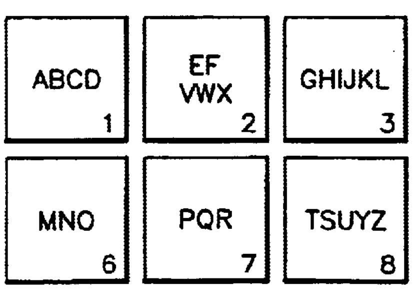
Figure 17C:
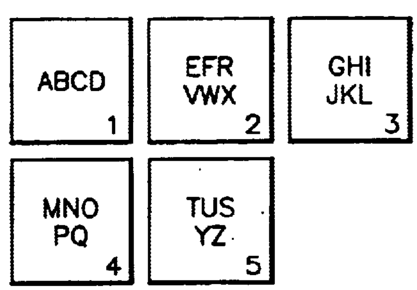
Figure 17D:
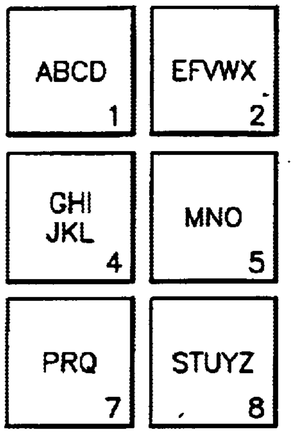
Figure 18:
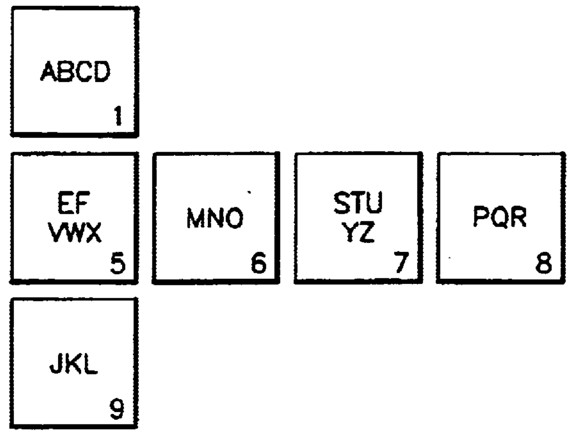
Figure 19:
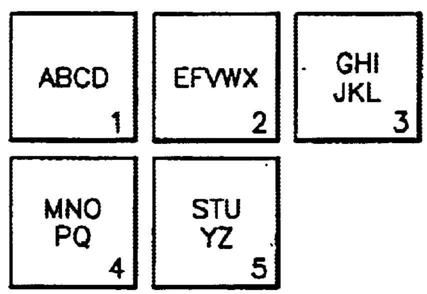
Figure 20:
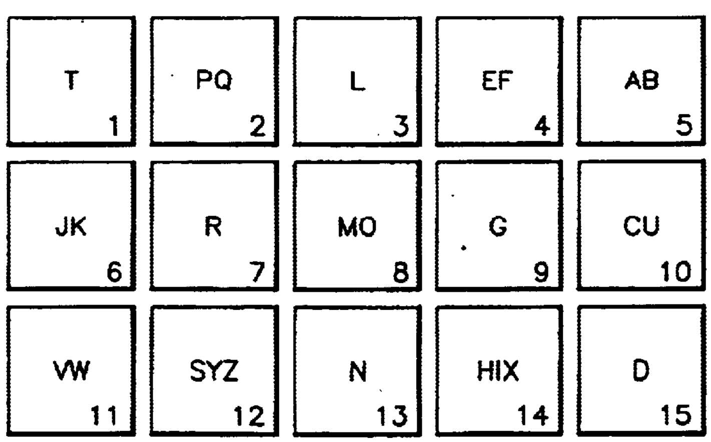

The configuration shown in FIG. 10, corresponding to a 14-key keyboard (since key 12 is repetitive), was tested with the phrase "Now is the time for all good men to come to the aid of their country." It was found that only the word "aid" required any editing by the user since all the remaining terms were the only words for the typed code. Thus, the number of keys is significantly reduced from the standard 26 keys, to 14 keys, with the amount of required editing being minimal.

Where there are four or fewer keys for one or both hands, the user may always keep four fingers positioned over the respective keys, such as for FIG. 12. Or, as with FIG. 11, the user may use two fingers, each finger assigned two keys. For five to nine keys, the user may choose to use 3 fingers of one hand by using two to three keys for each finger, such as for the configuration of FIG. 13. For twelve keys, such as with FIG. 13, the user may use four fingers of one hand. The keyboard is thus preferably configured to minimize fatigue on the user by reducing finger movement.

Figure 21:
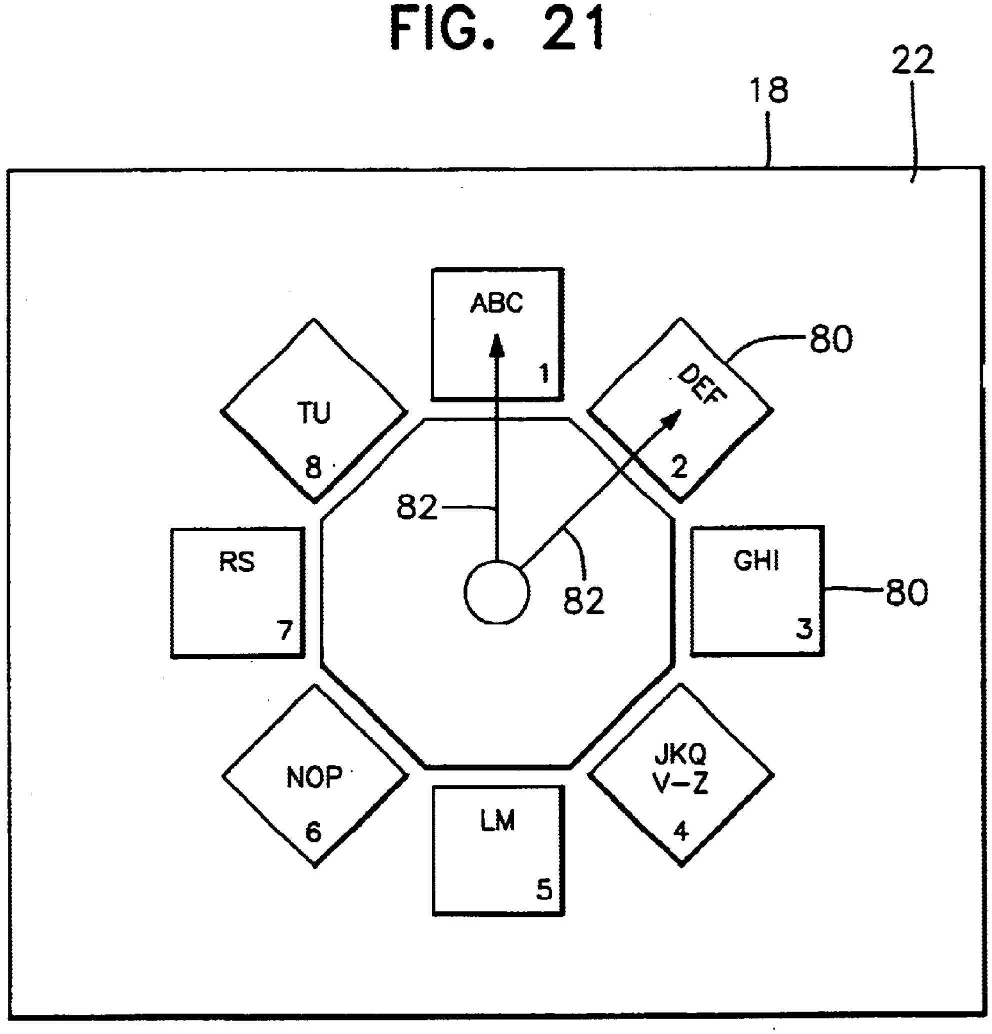
FIG. 21 shows an alternative keyboard configuration for use on the touch-screen monitor of FIG. 1.

FIG. 21 shows still yet another alternative embodiment of the invention, as implemented on a touch screen 22, such as found on a conventional computer monitor 18. Key representations 80 are displayed on the monitor 18 about a general octagonal pattern, though any suited shape may be used, including a circle or hexagon. Letters and numerical codes are assigned to each key representation as with the manual keyboards, such as shown.

The user positions a pointer (not shown) in the center of the octagon and slides the pointer outward along the screen 22 into one of the key representations 80. This movement is generally shown to correspond to arrows 82. As the pointer enters the key representation, the key is activated. The letters corresponding to the key are thereby selected and the user returns the pointer to the center position of the octagon. This touch-screen system is particularly suited for persons with disabilities, and may also be configured to recognize input from suitable input devices, such as being responsive to light emitted from a pointer.

With these "key" arrangements a "WRITING" technique can be used. There are well known techniques using a special writing instrument and/or tablet which can recognize the direction, the change in direction, and if desired the length of the stroke. The successive use of the same letter can be indicated by a circular movement, the length of the movement or depression of a key. With the 6 key keyboard the following methods can be used:

(a) The pen caused by the user to move in one of six direction and then lifted at the end of the stroke. These directions include:

(1) diagonally up to the left;

(2) diagonally up to the right;

(3) diagonally down to the left;

(4) diagonally down to the right;

(5) straight up; or (6) straight down.

At the end of the word a space bar may be hit.

(b) The pen stays in contact until the end of the word when it is lifted from the table which causes the space bar to be activated. The directions of the strokes are as indicated in (a) above.

It is necessary for the computer to realize whether the same key is "hit" two times or more in a row. There are several different methods of achieving this: (i) the user can hit a key located on the pen with his index finger to indicate a separated activation of that key; (ii) a button could be hit by a finger of the hand not holding the "pen". This key may be located on the tablet or elsewhere. If the next letter is in the same key the user could either stroke the pen as in (a) above or push the key (button) again. Or, (iii) the user could move the pen in a direction other than those listed in (a) above, e.g., it could always move horizontally to the left—for the first repeat of the key—if the next letter is also located in the same key the user could move the pen as in (a) above.

The input code may be optically-read handwritten symbols, each symbol representing a keystroke, or the input from such handwritten symbols may come from a stylus and/or tablet which conveys to the computer the shape of the symbols; that is, it can recognize the direction, change in direction, and length of the stroke. The grouping of the letters is preferably based upon a feature that the form of the letters have in common.

As shown in Table 2, the letters shown in the first column have a feature in common that is shown by the shape of the symbol in the second column, and therefore easy to remember. Table 2 is only for illustrative purposes, and other variations may be used.

TABLE 2a

| Column 1 | Column 2 | Column 3 |
|---|---|---|
| a, c, g, q | "⊂" | "⊂", "⊃" |
| b, d, h, I, k, t | "\|" | directions: "↑" and "↓" |
| e, p, r, s | "/" | directions: "↗" and "↙" |
| m, n | "∩" | "∩", "∪" |
| u, v, w, x, y | "\" | directions: "↘"and "↖" |
| o, z, f, j, l | "-" | directions: "→" and "←" |

TABLE 2b

| Symbols | Set 1 | Set 2 | Set 3 |
|---|---|---|---|
| "⊂", "⊃" | a, c, g, q | a, c, g, q, d | a, c, g, d |
| "\|", "↑" or "↓" | b, d, h, i, k, t | b, h, i, k, t | i, k, t |
| "/", "↗" or "↙" | e, r, s, p | e, r, s, p | e, r, s, p |
| "∩", "∪" | m, n | m, n, u, | m, n, u, h |
| "\", "↘" or "↖" | u, v, w, x, y, z | v, w, x, y | v, w, x, y |
| "-", "→" or "←" | o, z, f, j, l | o, z, f | o, z, b |
| "⌈", "⌊", "⌉", "⌋" | f, j, l | j, l | f, j, l |

In each case shown in Tables 2a and 2b, the symbols shown in columns 2 and 1 are simpler, shorter, and faster to write on the tablet then the symbols in column 1, and sets 1, 2, 3, respectively. Thus, the 26 letters of the alphabet can be represented by 6 to 16 symbols. Of course, there are many other possible choices for the symbols such as using the "–" for the letter "t", or the symbol "∩" for the letter "h" or the letter "d" may be represented by the symbol "⊂", or "⌈" for the letters f, j and l.

Also, other symbols may be chosen to represent the letters and fewer or more symbols may be used. The writer may either (1) raise the stylus from the tablet at the end of each letter, so that the end of a word is indicated by using a special symbol or depressing a key, or (2) the writer may keep the stylus in contact with the tablet until the end of the word and by raising the stylus a space is signaled to be made between the words. Also, if the stylus stays in contact with the tablet, in order to discern where one symbol ends and the next one begins, it is necessary to reverse the direction of the stroke for certain symbols that are used successively. Thus, the word "bit" is written by a stroke "|" downward, then it is retraced upward and then retraced downward. On the other hand, if the stylus is raised after each symbol, the word "bit" would be written "|||".

Also, a mirror image or an upside down position may be used for certain symbols, as in a word such as "fina". Thus, after an upward stroke, the "∩" would be made by a downward movement which results in a "∪" to represent the same set of letters. The same may be done for the "⌈" symbol which would become "⌊". Thus, the input from such handwritten symbols may come from a stylus and/or tablet which conveys to the computer the shape of the symbol. Symbols may be chosen that conform to general shapes of the associated letters, such as "⊂" for "abcd"; "\" for "efvwx"; "–" for "ghijkl"; "∩" for "mno"; "⊃" for "pqr"; "∪" for "tu"; and, "/" for "yzs". The grouping of these letters is based upon their alphabetical order and/or a feature that the form of the letters have in common. Column 3 shows that, when using different directions (shown in Table 2 by the arrows), and mirror images, at least 16 "symbols" are made available. For the symbol "⌈", other similar symbols are "⌊", "⌉", and "⌋".

The placement of more than one letter on the same key reduces the number of keys on the keyboard. This makes it easier to remember the location of the letters. Also, because there are fewer keys, they are all closer to each other. Therefore, the movement required by the hands and fingers to reach the keys is reduced, which makes typing faster and less fatiguing.

However, placing more than one letter on the same key may result in word codes that are associated with more than one word. For instance, if the letters B and M are assigned to the same key, the words "berry" and "merry" would have the same word code. The system would display both words, and the user must then "edit" the typed document by selecting the desired word. This editing step, which slows typing, can be minimized by a knowledgeable selection of the letters to be combined on the keyboard.

The number of word codes that are associated with more than one word when a combination of two letters are placed on one key and the remaining 24 keys each have one letter is referred to here as frequency #1, or F#1, for that combination of letters. The value of F#1 for each combination of letters provides the basic information that is needed to select which letters should be combined on the keyboard in order to minimize the amount of editing required. To obtain this information, the following procedure was used. Two letters were first assigned to a single key on a keyboard, and the remaining 24 keys were each assigned on of the 24 remaining letters. Each key was then assigned an input element code, so that 24 input element codes were associated with one letter each, and one input element code was associated with 2 letters. These input element codes were then assigned to the letters of each word in a 21,110 word dictionary and thereby word codes were formed which were associated with each word.

The word codes with two or more words assigned to it were then sorted in a numerical order with the words assigned that word code listed adjacent to their word code. A count of the number of word codes with two or more words assigned to it was then made, and the value is shown in the table of FIGS. 22(*a*) and (*b*) as F#1. This procedure was repeated for each combination of two letters in the alphabet, as represented by FIGS. 22(*a*), (*b*). Each letter of the alphabet is listed across the top horizontal row and down the left vertical column.

For example, the number of word codes with more than one word assigned to it is found for the combination of E and F on a single key by following the top row across until either the letter E is located, then scanning down that column until the corresponding letter F is found. As indicated, the study found that for the E–F combination, there are 11 word codes, each associated with two words, for a total of 22 words. These 22 words are: (1) ear, far, (2) east, fact, (3) eat, fat, (4) eight, fight, (5) fief, fife, (6) chafe, chaff, (7) hale, half, (8) lief, life, (9) sere, serf, (10) scare, scarf, (11) sure, surf.

It was also found that, of the word codes that have more than one word assigned to it, over 99% have two words, and only approximately 1% are associated with three or more words. Certain combinations of letters, such as "EJ" "OV", "BI", "AZ", and "FI" are associated with very few word codes that are associated with more than one word, that is, they have a low F#1 value. The selection of the combination of letters to the keys is preferably made from among those combinations of letters with the lowest F#1 value. The letter combinations with low F#1 values, between 0–32, may be organized in a single chart, according to F#1 value, to assist in the selection and arrangement of letters on keys.

It was also found that many combinations of letters with a low F#1 value were alphabetical or approximately in alphabetical order. Thus, an alphabetical arrangement of the letters on the keys is possible with a low F#1 value, so that an alphabetical order may be used without a significant increase in the amount of editing required. Such letter combinations include "AB", "EF", "HI", "IJ", "IJK", "JK", "MO ", "NO", "OP", "PQ", "QR", "SU", "TU", "UV", "UW", "UX", "VW", "WX", and "YZ". It is noted that most of these combinations comprise a vowel and a consonant. This result follows from the fact that vowels and consonants are usually not interchangeable in a given sequence of letters that are arranged to form a word. In addition, as indicated by the high F#1 values, certain combinations should be avoided, such as "NR", "RT", "RP", "LR", "TN", "NL", "DT", "TL", "PT", "TS", "RD", and "RL", which are each combinations of a consonant with a consonant.

From the information in FIGS. 22(*a*)–(*b*), various keyboard configurations, from 2 to 21 keys were generated. Those having between five and twenty-one keys are shown, for instance, in FIGS. 22(*c*)–(*d*). Each section of FIGS. 22(*c*)–(*d*) represents a key on a keyboard. Each key has from between one and six letters assigned to it. For instance, the eight-key keyboard has six keys with three letters each and two keys with four letters each. Each letter is assigned the input element code of the key to which it is assigned. The input element code of each letter was then assigned to the letters of each word in the dictionary. For instance, if the key with the letters ABC assigned to it has the code 1, then whenever A, B, or C appears in the dictionary, the code 1 is assigned to that letter. As a result, each word of the 21,110-word dictionary is assigned a word code. The word codes with two or more words assigned to it were then sorted in a numerical order with the words assigned to that word code adjacent to it.

A count of the number of word codes with two or more words assigned to it was then made, and shown in FIGS. 22(*c*)–(*d*) as frequency #2, or F#2. A count was also made of the number of words associated with each word code associated with more than one word for each keyboard configuration, as represented by frequency #3, or F#3. The number of keys to which letters are assigned in FIGS. 22(*c*)–(*d*) range from five to twenty-one keys. The keyboard with twenty keys has four keys with two letters each, one key with three letters, and sixteen keys with one letter each. F#2 is larger than F#1 since the value of F#1 is based on only two letters being combined on a single key and the remaining 24 letters each having one letter assigned to them. F#2, in contrast, is broader than F#1 in that F#2 includes any configuration having more than two letters assigned to the same key.

The increase in the number of words assigned the same word code, from F#1 to F#2, is demonstrated by the following example. Assume the following letter and code combinations: G-1, E-2, N-3, R-4, 0-5, 1-6. Then, the word code for "goner" is 15324 and the word code for "inner" is 63324. If the letter "I" is then assigned to the same key as the letter "G" (so that both letters have the code 1), then the word code for "inner" becomes 1:3324. Thus, both codes are still different for these two words. But, if the letter "N" is then also assigned to the same key as letter "O" (so that both letters have the code 3), then the word code for "goner" becomes 13324. Thus, both words now have the same word code, and F#2 is larger than F#1. F#1 give the minimum value of F#2 and is for that reason a good first indicator of the probable value of F#2. FIG. 22(*d*) shows the values of F#1 and F#2 for various keyboards.

For fourteen keys or more F#3 is approximately twice as large as F#2 since any editing will mostly be only two words for a given word code. As the number of keys is reduced, more keys will have two or more letters and the number of word codes with three or more words assigned to it increases. Thus, with the eight-key keyboard, there are on average of about 2.33 words per word code.

As shown in FIGS. 22(*c*)–(*d*), multiple keys were assigned two or more letters. Sixteen different keyboards were derived, having from 8 to 21 keys. As the number of keys having two or more letters increases, so does the number of word codes associated with two or more words. For instance, if C and D are combined on the same key, and all the other keys have one letter assigned to them, then the words "calf and "dale" would not have the same word code. Assuming, that A has input element code 1; C, D is 2, L is 3, E is 4 and F is 5, "calf" would then have the word code 2135, and "dale" would have the word code 2134. However, if the letters F and E were then both assigned the same input element code of 5, then-both words would have the same word code, namely 2135.

The keyboard configurations of FIGS. 22(*c*)–(*d*) are the preferred embodiments where it is important to substantially retain an alphabetical ordering of the letters. To have a keyboard with an arrangement that is substantially alphabetically ordered, each letter must be grouped on the same key or an adjacent key with letters that are near it alphabetically. Thus, for instance, the letter "J" is preferably on the same key, or on adjacent key, as the letters "K" and/or "L". By using an alphabetical order, or a partially alphabetical order, it is easier to remember the location of the letters. Other criteria in arranging letters on the keyboard is the number of word codes having more than one word, and the frequency of commonly used words or phrases with the same word code (such as "-tion", "-ing", and "the"). As less emphasis is placed on having an alphabetical order, various other keyboard configurations will readily become apparent.

For instance, consider the eleven-key configuration, which has a total F#1 of 412 word codes associated with more than one word. The first key contains the letters “A” and “B”, which was determined to have 12 instances of word codes associated with more than one word. Likewise down the table, the second key, “CD” has 70 word codes, “EF” has 11, “GHI” has 42, “JKL” has 87, “MNO” has 109, “PQR” has zero, “SYZ” has 38, “TU” has 8, and “VWX” has 35, for the total of 412 word codes associated with more than one word.

The F#1 value for each key is based upon the values derived in FIGS. 22(*a*)–(*b*), when there are two or more letters on a key. For instance, for the three-letter key “GHI”, the combined values are taken from the two-letter combinations (that is, “GH”=36; “GI”=3; “HI”=3; for a total of 42). Of course, as more than one key is assigned more than one letter, the number of word codes associated with more than one word may become larger than the number indicated in FIG. 22(*a*).

The totals indicated in FIG. 22(*a*) provide a good indication of the letter combinations that have the fewest number of word codes associated with more than one word. The number of words with the same word code is larger for the configurations with fewer keys since the fewer number of keys result in more keys having more than two letters. Of course, as the dictionary is reduced in size, such as a dictionary only having medical terms and the like, fewer word codes will be associated with more than one word.

FIGS. 22(*c*)–(*d*) (in the bottom row) further show the approximate average number of lines that are typed before a word needs to be edited when the system is implemented with a 21,110 word dictionary. The amount of editing is directly related to the number of keys on the keyboard and the placement of the letters on the keys. The small keyboard with eight keys, about ten percent of the words, or about 1.1 words per line, require editing. However, for a larger keyboard there is very little editing to be done, and in fact the twenty-one key keyboard only requires approximately one word to be edited for every thousand lines of typing. The editing is further reduced by the use of preferred words. In addition, where word codes are only associated with two or three words (which accounts for the majority of keyboard configurations), the desired word will be positioned in the home row 50% or 33⅓% of the time, respectively. In such cases, editing is not required and the desired word is selected by continued typing.

The keyboard configurations shown in FIGS. 22(*c*)–(*d*) were also implemented with a 230,000-word dictionary. It was determined that, for a ten-key keyboard, a user encounters roughly about one word code per line that is associated with more than one word. The amount of editing, however, drops significantly as the number of keys increase. For an eighteen-key keyboard, only about one word code per page is associated with more than one word. Of course, the amount of editing required is dependent upon the material being typed.

A new typist may start typing with a keyboard having fewer keys, and move toward a keyboard with more keys as typing skills progress. This graduated length method of learning to type makes it possible to progress from an eight-key keyboard or less to a twenty-key keyboard in a simplified manner, as desired. The assignment of letters to the keyboards in FIGS. 22(*c*)–(*d*) is such that someone learning to type starts with the five-key keyboard. After becoming proficient on that keyboard, the user may then proceed to use a larger keyboard. Each keyboard is substantially similar to the next larger keyboard so as to facilitate the learning process by making it easier to memorize the location of letters on the keys and the motion of the fingers to the keys.

FIGS. 22(*e*)–(*x*), 26(*a*)–(*y*), 27(*a*)–(*z*) and 28(*a*)–(*m*) show the arrangement of letters for several keyboard configurations, though not necessarily corresponding to the arrangements of FIGS. 22(*c*)–(*d*). FIGS. 22(*e*)–(*q*) and 26(*a*)–(*r*) are two-handed configurations, and FIGS. 22(*r*)–(*x*), 26(*s*)–(*y*), 27(*a*)–(*z*) and 28(*a*)–(*m*) are for single-handed operation. These configurations are exemplary only, and other suitable configurations may be used. For the two-handed configurations, the right and left sides may be interchanged, and the individual keys may also be moved around or otherwise exchanged. For the one-handed configurations, the position and location of the keys may also be moved around. In addition, the rows may be interchanged.

For the two-handed configurations, the left- and right-hand keys are shown as preferably being placed on a single keyboard. However, the left-hand keys may be arranged on a separate keyboard from the keys accessed by the user's right hand. These configurations generally maintain an alphabetical order, while also combining letters that minimize the amount of required editing.

Though other configurations are suitable, the vowels on the one-hand configurations preferably have the following general arrangement with respect to each other:

| | | | | | | | | | | | | | | |
|---|---|---|---|---|---|---|---|---|---|---|---|---|---|---|
| *A* | *E* | | *A* | *E* | *I* | | *A* | | | *A* | *E* | *I* |
| *I* | *O* | or | *O* | | | or | *E* | *O* | or | *O* | *U* | |
| *U* | | | *U* | | | | *I* | *U* | | | | |

For the two-handed configurations, all of the vowels are preferably accessed by one hand. In some keyboard arrangements, several letters may be placed in more than one location (i.e., placed on more than one key) in order to make them more accessible and, therefore, make for faster typing. The vowels are preferably positioned convenient to the middle and index fingers in order to make for faster typing since vowels are most frequently used. At the same time, the order of vowels is substantially alphabetical.

As an additional feature of the invention, when long words are being entered, the system would recognize before the typist has typed all the letters, that there is only one word that begins with the code that has thus far been entered. At this point, the word would be printed on screen 22 and a beep would sound. The user would then start typing the next word. The user would also be able to modify the word in the manners described above.

For instance, referring to Table 3, suppose the user enters the code 1-3-2. At that point, there are several possible words that the user may choose from, specifically “aid”, “age”, and “bid”. More importantly, however, the user may continue typing to further limit the word to numerous words that cannot be determined yet, such as “aged”, “ages”, “ageless”, “bids”, “bidding”, and so forth. However, if the user then strikes letter key 4, the only option left available is the word ageless. At that point, the word “ageless” may be displayed on screen 22. Accordingly, the user will not have to go to the trouble of having to entirely type the more lengthy words, such as “ageless”.

TABLE 3

| Code | Words |
|---|---|
| . . . | |
| 1 | a |
| 1-3-2 | age |
| | aid |
| | bid |
| 1-3-2-2 | chef |
| | aged |
| | bide |
| 1-3-2-4-2-7-7 | ageless |
| . . . | |

As shown in Table 3, to determine whether there are any other words beginning with the code 1-3-2, the computer 10 will have to search through codes having at least that numerical order. However, as shown in Table 4, each memory location of memory 12 may be configured so that all available options are stored at the base code, 1-3-2. Thus, once the user types 1-3-2, the limited number of options may all be displayed at that time. That is, the words “age”, “aid”, “bid” “chef”, “aged”, “bide”, “ageless”, and other variations such as “bidding”, “chefs” and so forth, are displayed on screen 22. This embodiment is quicker and reduces memory space requirements, but is only practical where there are a limited number of subsequent variations to the input code.

TABLE 4

| Code | Words |
|---|---|
| . . . | |
| 1 | a |
| 1-3-2 | age |
| | aid |
| | bid |
| | chef |
| | aged |
| | bide |
| | ageless |
| 1-3-2-2 | chef |
| | aged |
| | bide |
| 1-3-2-4-2-7-7 | ageless |
| . . . | |

As yet another feature of the invention, the user may at any time return to a word, such as by placing the cursor at any position within the word. When the user returns to the word, the numerical code associated with that word will be recalled. The user may then elect to display the preferred words, or all the words associated with that code. The user may also change the code to enter a new word.

Another feature of the invention, as mentioned above, is that the user may be provided with the option to switch between the different keyboard configurations, including the standard 26-key QWERTY format. Though not indicated in the flow chart, the user may select to change keyboard configuration at any point during operation of the system. Essentially, the user may select any suited number of keyboard configurations, such as a 4-key, 6-key, or 8-key configuration.

The memory 12 stores individual tables for each of the selectable keyboard configurations. One manner in which the proper memory location is accessed is by automatically and internally including a keyboard code as the first digit to the numerical code. For example, in order to identify the code as coming from the 6-keyboard configuration, the code “6” is automatically appended to the beginning of each word as each new word is begun, as shown in Table 5. The system would then be able to switch between keyboard configurations in the middle of a document, while still recognizing the input code as matching the particular keyboard configuration. Accordingly, the next time the system is operated, the system will default to the last-saved configuration when formatting, step 102.

TABLE 5

| Code | Words |
|---|---|
| . . . | |
| 6-1 | a |
| 6-1-3-2 | age |
| | aid |
| | bid |
| 6-1-3-2-2 | chef |
| | aged |
| | bide |
| 6-1-3-2-4-2-7-7 | ageless |
| . . . | |

In addition, the user may also choose to define his/her own keyboard arrangement of keys in addition to the standard arrangements that have been predefined. As described above, each numeral key is used as an input numerical code that is associated with the corresponding letters. The user selects the numerical code that is to be assigned to particular letters and keys. This information is then stored in memory, and the memory is further updated to reflect the new codes to be associated with the words in memory. The computer then sorts and stores all the words associated with the same numerical code in a single memory location associated with that particular numerical code.

However, the memory 12 shown by Table 5 would result in each word being stored several times, once for each keyboard configuration. In an alternative embodiment, the numerical code for each keyboard configuration is stored for each word, as shown in Table 6. The computer 10 would then search for the numerical code in accordance with the specified keyboard configuration.

TABLE 6

| Code | | |
|---|---|---|
| 6-Keys | 8-Keys | Words |
| 2-5-5-5 | 2-5-5-6 | door |
| 2-5-5-5 | 2-6-5-6 | drop |

As an additional feature of the invention, the user may at any time elect to display words in memory. At that time, the user may add, delete, or otherwise modify the words stored in memory or verify the correct spelling of a word. The user may also list all words in the database or memory that start with the first letters of a typed word. In other words, a typist could type the first 4, 5 or 6 letters of a word and then select for the system to generate a list of all of the words that start with those letters. The typist can select this option while typing or editing the word. In this manner, the system may be used to determine the correct spelling of a word.

Accordingly, the user need not finish typing long words, which may be displayed automatically after the user enters, for instance, the first 4, 5 or 6 letters of a word. The user then selects the desired word by highlighting the word and hitting ENTER. The word is then moved into the text of the document. As a further option, the system may be configured only to display the words corresponding to the number of letters the user depressed. That is, if the user pressed 7 letters, only 7 letter words having the first 4 keys will be displayed.

The speed typing method of the present invention is compatible with conventional word processing programs, such as "WORD PERFECT" and "WORD", and can be used for either DOS, WINDOWS or Macintosh environments. Furthermore, the database of words and numerical codes may be searched in any suited manner.

By providing multiple characters on a single key, the present invention simplifies learning how to type. Furthermore, less motion is required to type, thereby reducing wear on the user while increasing speed. In addition, the keyboard is not congested, making it easier to use for persons that have not learned to type. Also, there is more room on the keyboard so that the size of the keys may be made larger, thereby assisting persons with arthritis or other physical disabilities.

Since the keyboard 50 is significantly reduced in size, yet retains the full spectrum of characters, the invention has particular utility with lap-top computers and hand-held electronic devices, such as electronic diaries. Since there are fewer keys, the location of each key is easier to remember and all of the keys can be reached more easily and quickly and with greater certainty of accuracy.

Likewise, since the present invention reduces the number of keys required for typing, the conventional chord systems become more practical. Accordingly, the system may be configured so that the user depresses more than one key simultaneously or sequentially to select a particular code to which letters have been assigned. In a sequential system, a nine-key keyboard could be reduced to three keys, since there are nine combinations of keys that could be sequentially accessed (that is, 1-1, 1-2, 1-3, 2-1, 2-2, 2-3, 3-1, 3-2, and 3-3). Likewise, there are 16 combinations for a four-key keyboard using sequentially-operated keys. For a four-key keyboard using simultaneous selection of keys, there are ten possible combinations (namely, 1, 2, 3, 4, 1-2, 1-3, 1-4, 2-3, 2-4 and 3-4).

For purposes of illustration, a particular key may be associated with the letters "v", "w", "x". If the user then presses the key one time, the system may recognize "v" and "w". Upon a second sequential actuation of the same key within a set period of time (or upon actuation of a different key), the system may detect the same code "1" twice, which may be associated with a different set of letters, for instance, with letters "x", "y" and "z". Alternately, it may be that the first actuation of a key may be associated with code "1" for "v" and "w", and the second actuation associated with code "2" for "x", "y", and "z".

There is a variety of ways in which a single code or plural codes may be assigned to a single key, such as by sequential actuation of that key. Likewise, a single or plural codes may be assigned to plural keys, such as by a chord-type simultaneous actuation of the plural keys.

The invention may be configured in a variety of shapes and sizes and is not limited by the dimensions of the preferred embodiment. Likewise, the terms "key" and "keyboard" as used herein need not be limited to a group of mechanical components that are physically depressed by the operator. The input code may be optically-read handwritten symbols, each symbol representing a key-stroke.

The input could also be telekinetic, wherein the user focuses his eyes in a group of letters to activate that key. Still yet, the input code could be voice-initiated whereby a voice identifying system may translate a verbal "keystroke" into the coded input. Thus, the operator may verbally state "5", "5", "8" (or the desired letter), which symbols are detected converted into the 5-5-8 code and displayed as "now" or "mow" as discussed above. Or, the user may state the letter or word to be displayed. In addition, the memory tables of the invention may be integrated with dictionary information and other editing techniques currently existing in a word processing system. The dictionary need only be updated with the proper numerical codes.

In yet another embodiment of the invention, function keys may be provided (or the SHIFT keys may be used) to implement various functions. For instance, a function key can be provided to control a numeric keypad, such as the numeric keypad shown on the right hand side of the conventional keyboard of FIGS. 2(*a*) and (*b*). The function key would allow the user to toggle operation of the keypad to function either as a number pad, or as a letter pad. If the user designates the keypad to operate as a number pad, the function key could then also be used to display a selection of punctuation marks, such as when the function key and the number seven (from the keypad) are depressed. Likewise, the function key could be used to directionally operate a cursor. A mode indicator light or message may also be provided to indicate whether the keypad is being used as a number pad, or as a letter pad.

For purposes of further illustration, function keys can be used on a keypad similar to conventional telephone keypads. The telephone keypads typically have three rows of three keys each, all of which are numerical keys, and a bottom row having one numerical key, an asterisk key, and a pound sign key. The three rows of numerical keys may be assigned the letters of the alphabet, and the bottom row of keys may be associated with functions.

In the bottom row of the telephone keypad, the numerical key (which is usually zero) would be used to designate that a capital letter is to be typed. The asterisk key may be a space bar, and the pound key would be a backspace. The sequential actuation of the function keys may be associated with various additional functions.

For instance, depressing the asterisk key followed by the pound key might toggle the remaining keyboard between letters, numbers, and symbols (including punctuation). And, the sequential actuation of the number key twice, within a preset period of time (and/or prior to actuation of any other key), may operate as a cursor control.

In an alternative embodiment, the telephone keypad may be configured so that the keys 1, 2, 4, 5, 7 and 8 are assigned letters; the pound key and asterisk key are assigned the "−" and "+" characters, respectively (which are used for scrolling words during editing, as discussed above); and the zero key is used to shift to other keyboard configurations.

It is further noted that simultaneous actuation of two keys may further be used to implement various functions. Accordingly, there are numerous manners in which function keys may be used that are within the spirit and scope of the invention.

As indicated above, the system may be configured in a hand-held computer, or portable input device, that is remotely located with its output either directly wired or transmitted wirelessly to the computer.

A 3 bit binary code has 8 permutations, 001, 010, 011, 100, 101, 110, 111, 000. Six of these are assigned to the six keys on a 6 key keyboard configuration to which groups of letters are assigned. Such assignments may be as follows:

| Key # | | Binary Code Assigned |
|---|---|---|
| 1 | ABCD | 001 |
| 2 | EFGH | 010 |

-continued

| Key # | | Binary Code Assigned |
|---|---|---|
| 3 | IJKL | 011 |
| 4 | MNOPQ | 100 |
| 5 | RSTU | 101 |
| 6 | VWXYZ | 110 |

For the input of additional data (e.g., punctuation, numerical data, control of cursor and other functions) the system is configured to "shift" to another binary code which would make additional code available would occur upon the input of a specific 3 bit binary code (assume "000" for this purpose). For instance, the "shift" could be from a 3 bit binary code to an 8 bit binary code, which would make 256 eight bit binary codes available.

For word codes that are associated with more than one word (e.g., ACT, BAT and CAT have the binary codes 001, 001, 101, for each word) a select or identification code is necessary to distinguish the desired word. One method (discussed above) of selecting a desired word (e.g., ACT, BAT or CAT) is for the user to enter a number that appears next to the desired word above the "home row."

Thus, unless the user enters the number 1 for "BAT" or the number 2 to select "CAT" the word in the home row, here "ACT", is automatically entered. If the user enters the number 1, the word BAT is moved to the home line and is displayed and can be printed. In order to store in memory or transmit or apply additional compression techniques to the word codes made up of 3 binary codes, it is necessary that every word has a unique code. To accomplish this, an appendage, such as a identification code, is added to those words that do not have a unique word code.

The word code including the appendage must be checked against the other word codes listed in the dictionary to confirm that no other word has that code. For instance, if the 3 bit binary code 010 was appended to the word code for "BAT," the word code for the word "BATH" would also result. However, another 3 bit binary code, such as 110 (VWXYZ) might not cause any duplication. Wherever possible, one 3 bit binary code would be used to distinguish words having the same basic word code; however, the use of more than one 3 bit binary code could also be used. Such multiple 3 bit appendages would make possible a unique word code for every word. Another solution to creating a unique word code is to add a 3 bit binary code such as "000" to indicate a shift from the 3 bit binary code to the 8 bit binary code and then an 8 bit binary code is appended to distinguish that word code from other word codes. The 8 bit binary codes selected for this purpose would also indicate that it is the end of a word. Therefore, the space after that word would occur and that a shift back to the 3 bit code would occur next automatically.

The end of a word can be indicated by a specific 3 bit binary code designated for this purpose, e.g., "111" (or the binary code of more than 3 bits used as an appendage at the end of a word code, as discussed above). The indication of the end of a word minimizes the transmission error to one word being adversely affected.

With a 3 bit binary code for each letter, approximately 12.712 bits are required for a 4 letter word. An 8 bit binary code requires 32 bits for a 4 letter word.

The 12.712 bits is arrived at as follows: using a 21,100 word dictionary, a 6 key keyboard has 17,008 words assigned a unique word code and therefore do not require any appendage. The remaining words, 4,092 words, which have not been assigned a unique word code are assigned to a total of 1,588 word codes. One word on each of these word codes would not be assigned an appendage since they would be different from the other word codes which were assigned appendages. The remainder, 2,504 words, would be assigned an appendage. If an average of 6 bits are required for such appendages on the 2,504 words, then the appendages require an average of 0.712 bits per word in a 21,100 word dictionary ($6\times2504\div21,100$). If the average word is a 4 letter word then 12.712 bits are required per word [$(4\times3)+0.712$]. An 8 bit binary code would require 32 bits.

The 3 bit binary code has 8 binary codes available. The 4 bit binary code has 16 codes available. Of these, 14 codes can be assigned to keys to which letters are assigned, one code (e.g., 111) would be used to designate the space at the end of a word and one code (e.g., 0000) for a change to another binary code for coding numbers, punctuation, function keys, cursor control, etc. If a 4 bit binary code is used for each letter approximately 16 bits are required for a 4 letter word. An 8 bit binary code requires 32 bits for a 4 letter word.

The 14 bits is explained as follows: a 14 key keyboard has approximately 590 words assigned to 251 word codes. Therefore, an appendage is only needed on 259 to have a unique word code for each word ($590\div251=259$). A 4 bit binary code would add an average of 1/20 of a 4 bit binary code to each word in a dictionary of 21,101 words ($4\times259\div21,100\approx1/20$). If the average word is a 4 letter word, approximately 16.05 bits are required per word. An 8 bit binary code, in contrast, would require 32 bits. Thus, it is clear that the use of a 3 bit code, with a 6 key keyboard, and a 4 bit code, for keyboards with 7 keys to those with as many as 14 keys, require less code than an 8 bit binary code used to code letters.

As would be expected, the 3 and 4 bit binary codes for the word codes result in a significant reduction of required code. The word code made up of the 3 character binary code plus the appendages is transmitted to a receiver where the computer will compare the numerical value of the input code with a table of word codes in memory. The word stored in memory that is associated with the input code is then displayed.

The shift of codes can be accomplished by a special code sequence such as 000, 111, 000 to shift out of a 3 bit binary code (or 0000, 1111, 0000 to shift out a 4 bit binary code) and then to move out the 4 bit binary code back to a 3 bit binary code a shift code sequence of "0000" would be used. A shift code sequence of "100000" could be used to shift back to a 4 bit binary code. There are some other economies of input, such as when a punctuation is used (which comes at the end of a sentence, such as a period or question mark), a space between the words and capitalization of the next word would be automatic.

Each word in the dictionary would also be assigned a binary code made up of more than 3 binary characters so that each letter has a unique binary code (such as an 8 bit binary code). These two sets of binary codes (one with 3 and one with more than 3 binary characters for each input element) are placed adjacent to each other in the data base.

When data is received, the data is decoded so that the 3 bit binary code can be used to locate the 3 bit binary code on file in the memory of the computer which receives the data. Stored adjacent to that code is the binary code which has a unique binary code assigned to each letter. The text can then be displayed and/or printed at the receiver location.

When this word is received, the specific word which is desired is found next to the word code which is received in the transmission. Error in transmission is minimized by using the string of 3 ones, 111, which as discussed above, represents the space between the word and can at the same time be used as a re-sequencing key when the receiver sees the 3 ones. The use of the 3 character bit (111) minimizes the transmission error to one word being adversely affected.

Data may further be compressed by having the system automatically translate text into a format for using a 3 bit binary code. Three codes would be stored in memory for each word: (1) a 3 bit code (the most compressed code), (2) a binary code having a unique code for each letter (such as an 8 bit binary code), and (3) the word code for the keyboard format being used to input the text. The 3 bit binary code may be further compressed by using well known compression techniques.

In another embodiment of the invention, to further reduce the dictionary of words stored in memory, prefixes and suffixes may be stored separately. For instance, instead of saving "necessary", "unnecessary", "published" and "unpublished", only the words "necessary" and "published" need be saved. In addition, a common list of prefixes and suffixed would be separately stored in memory. When the user types "un", the system would recognize that a prefix was entered. When the remaining word is entered, the word would be located in memory and the prefix or suffix would then be appended to the located word. Similarly, plural, past, present and future tense of words may be stored in memory as common to a group of words.

The system 100 may further be configured as a translation device, by including a translated word with each word listed in memory 12. The memory 12 may be organized, for instance, as shown in Table 7, which is based upon the 8-key configuration of FIG. 2(*a*). Here, the user may display the translated word along with, or instead of, the English word.

TABLE 7

| Code | Preferred Words | Words | Translated Words |
|---|---|---|---|
| 3-5-7-7-2 | | house | casa |

Alternatively, a foreign dictionary may be stored in memory separate from the English words. The user may then instruct the system to use the foreign dictionary in order to type in a selected language. For instance, in order to type the word "casa", which is Spanish for house, the user would simply type 1-1-7-1 (from the keyboard configuration of FIG. 2(*a*)). The user then has the option of printing the typed document in one or all of the various languages.

In addition to storing foreign words in memory, a digitized or pre-recorded voice-signal may also be stored in association with each word in memory. Accordingly, the English word and/or the translated word, may be audibly played at the user's command. The word would be made audible through the use of a speaker or like device (not shown) in accordance with well-known techniques.

The system may further be combined with a speech-recognition system, whereby the system displays words on a screen that are spoken. This combined system has particular uses for persons that have impaired hearing or otherwise disabled. The words that are spoken by a third party can be displayed on a portable device that is carried by the disabled person.

In combination with the audible reproduction, the disabled person would then be able to respond to the displayed message by typing a message that is then audibly pronounced by the device to the third party. By using a reduced-size keyboard of the present invention, the typing would be significantly simplified, making the device easier to use, faster and more portable. The system could also be integrated into, or used in conjunction with, a conventional telephone. The speech-recognition system may include a microphone and may be implemented by conventional systems that are able to receive a voice signal and convert it into a recognized word for word-processing.

Figure 25:
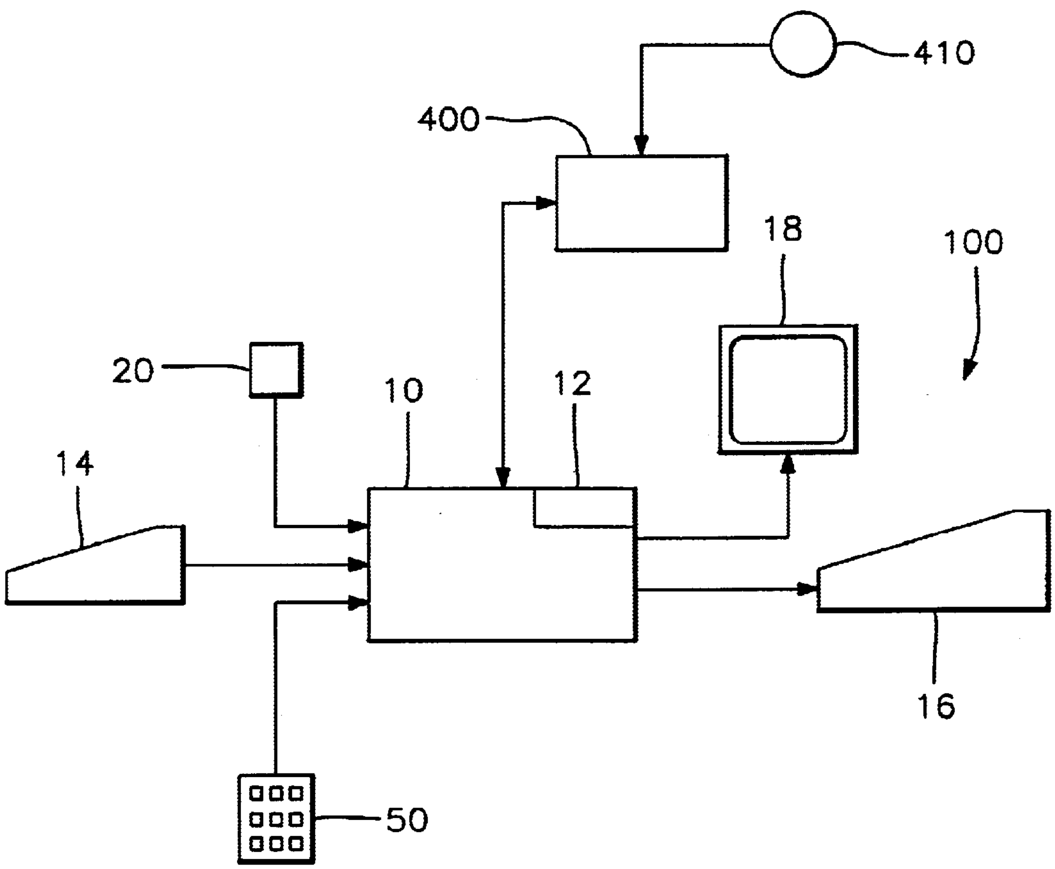
FIG. 25 is a block diagram of the word processing system in combination with a Speech Recognition System.
Figure 26A:
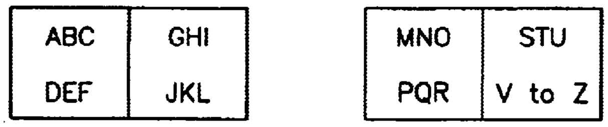
FIGS. 26(*a*)–(*y*), 27(*a*)–(*z*) and 28(*a*)–(*m*) show various alternative keyboard configurations.
Figure 26B:
Figure 26C:
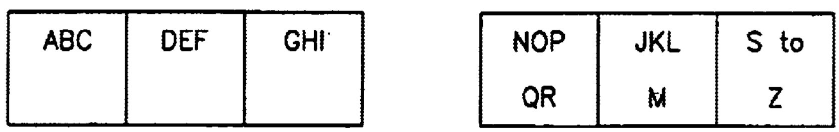
Figure 26D:
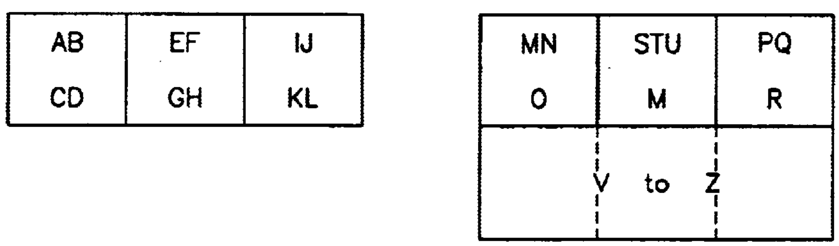
Figure 26E:
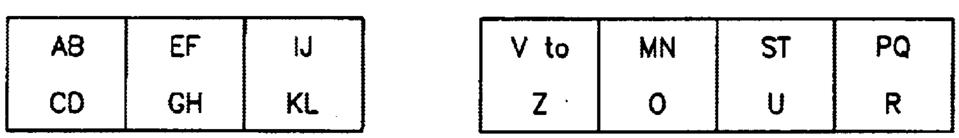
Figure 26F:
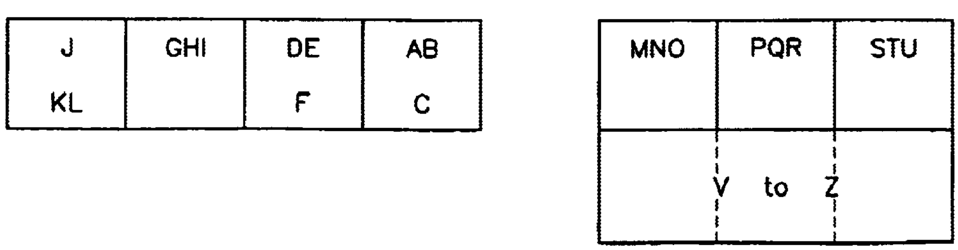
Figure 26Q:
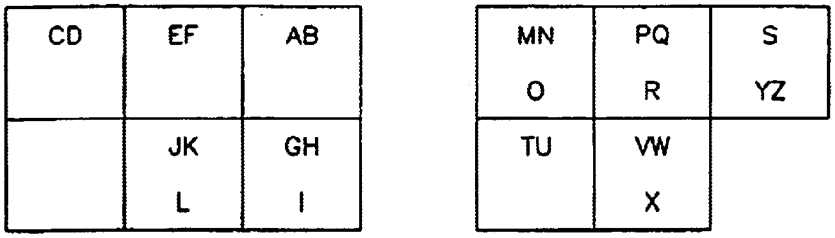
Figure 26R:
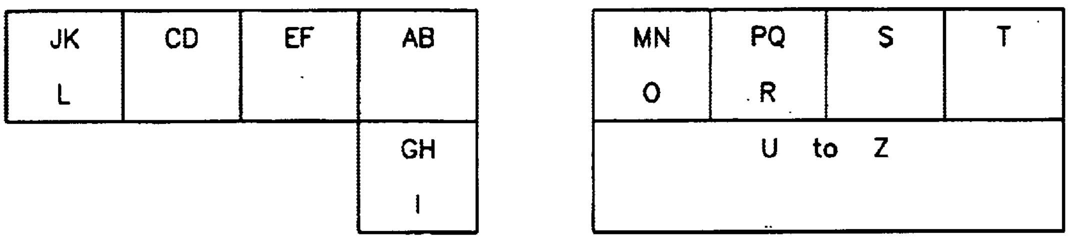
Figure 26S:
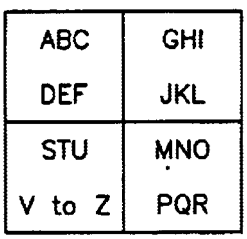
Figure 26T:
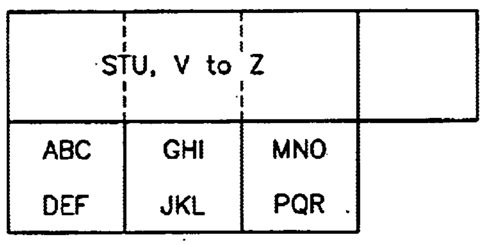
Figure 26U:
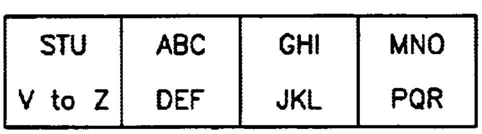
Figure 26V:
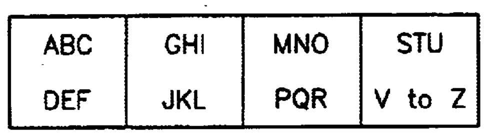
Figure 26W:
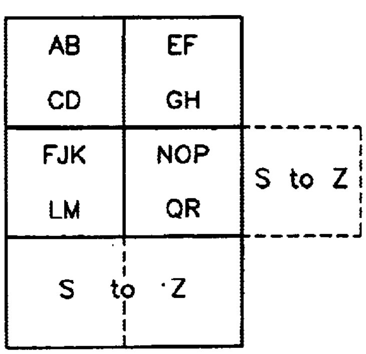
Figure 26X:
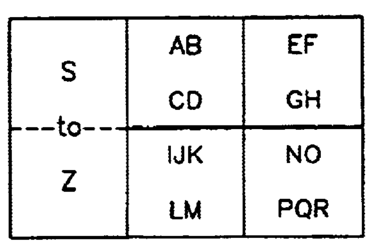
Figure 26Y:
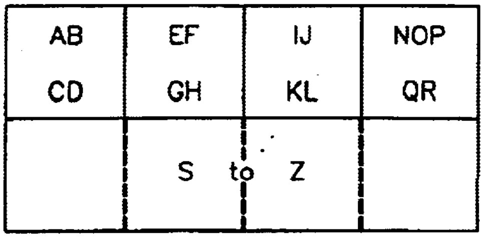
Figure 27A:
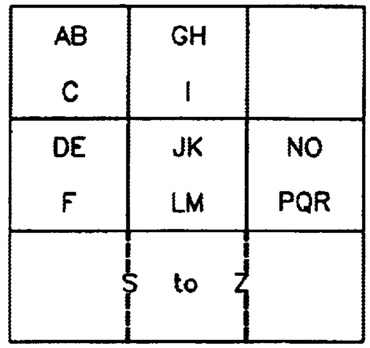
Figure 27B:
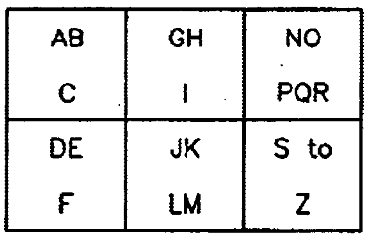
Figure 27C:
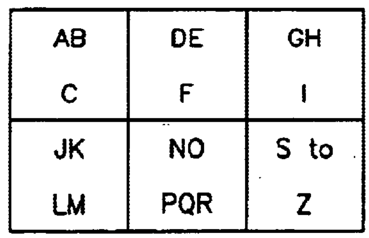
Figure 27D:
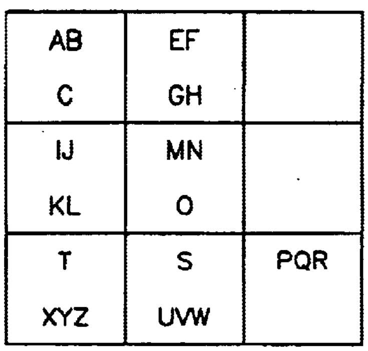
Figure 27E:
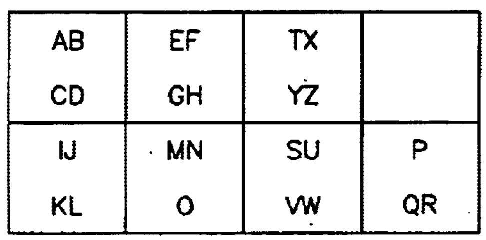
Figure 27F:
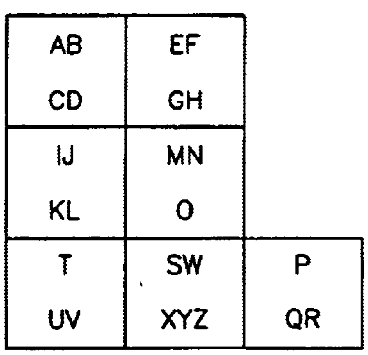
Figure 27G:
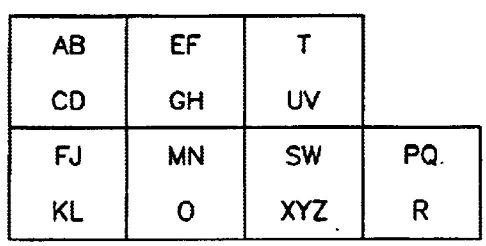
Figure 27H:
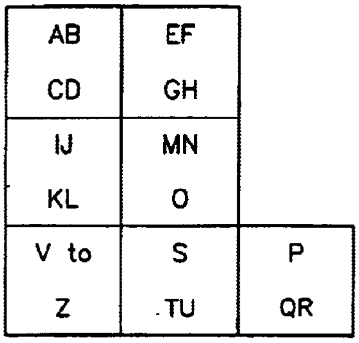
Figure 27I:
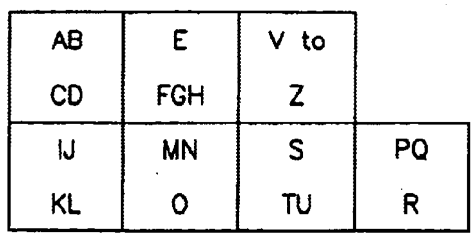
Figure 27J:
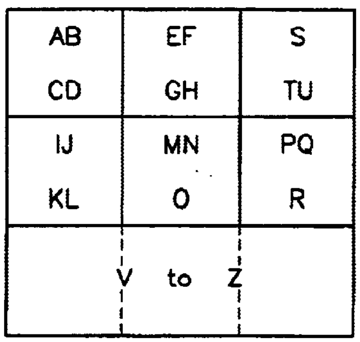
Figure 27K:
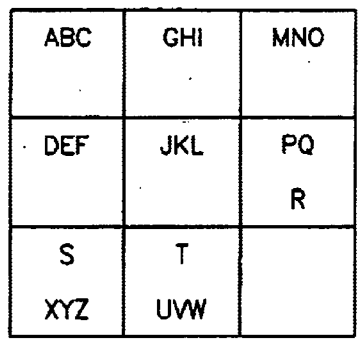
Figure 27L:
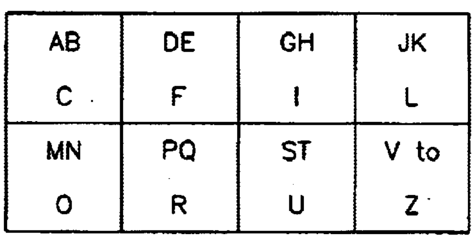
Figure 27M:
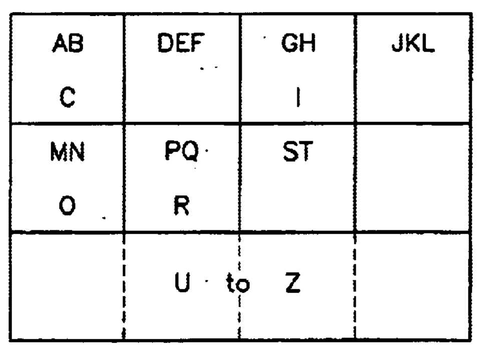
Figure 27N:
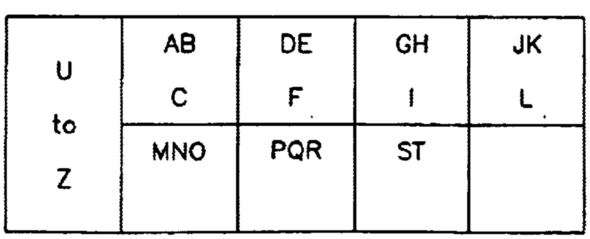
Figure 27O:
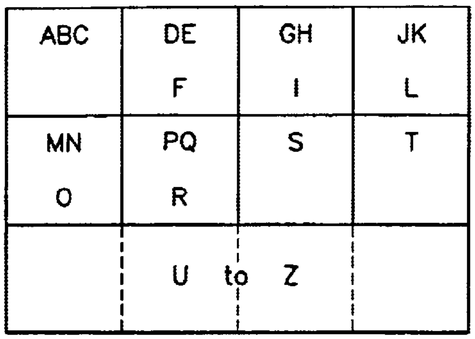
Figure 27P:
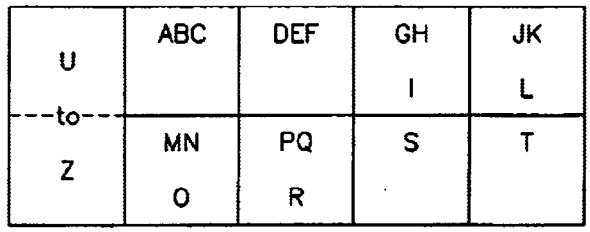
Figure 27Q:
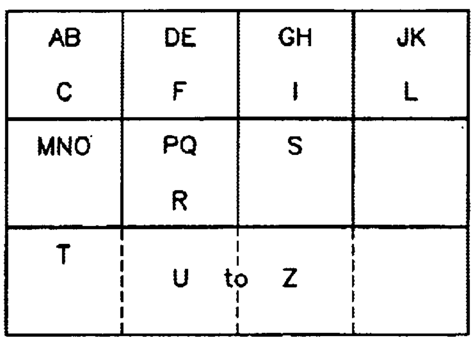
Figure 27R:
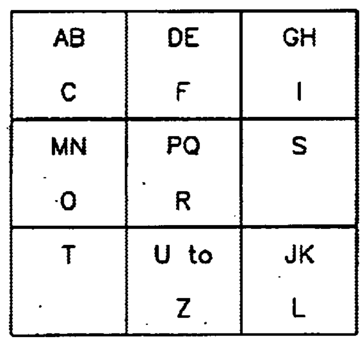
Figure 27S:
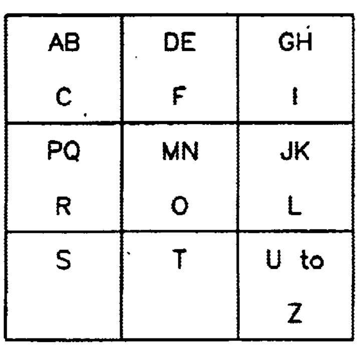
Figure 27T:
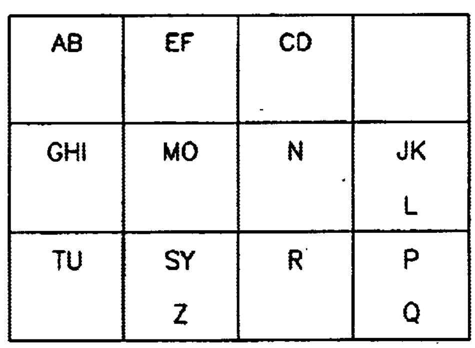
Figure 27Z:
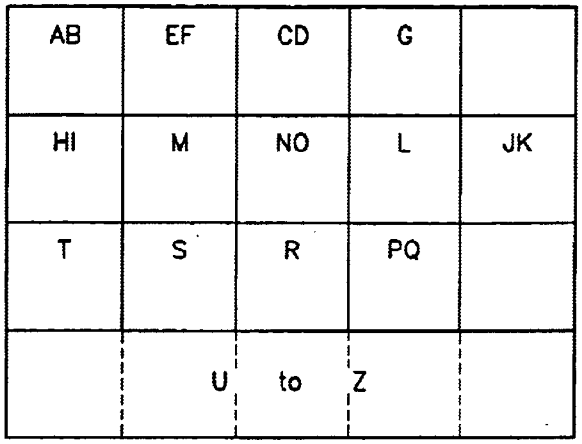
Figure 28A:
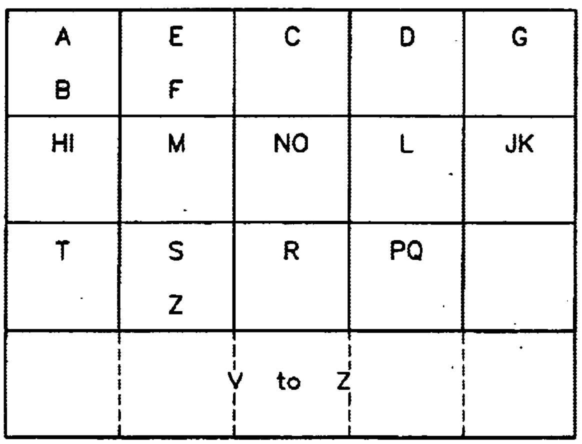
Figure 28B:
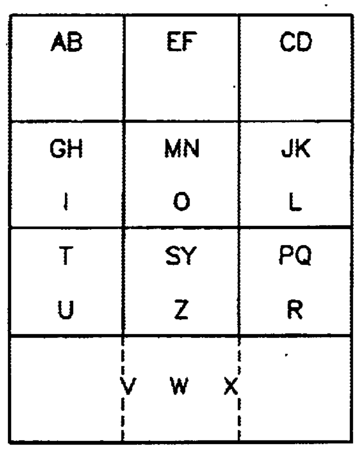
Figure 28C:
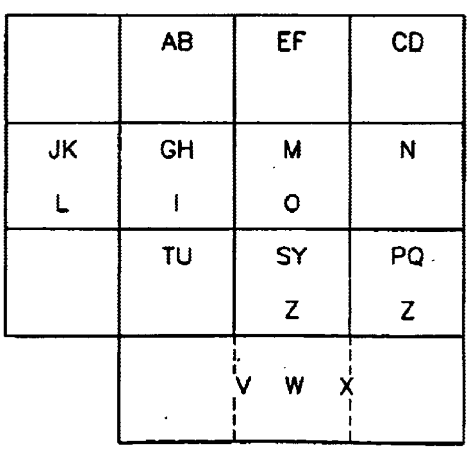
Figure 28D:
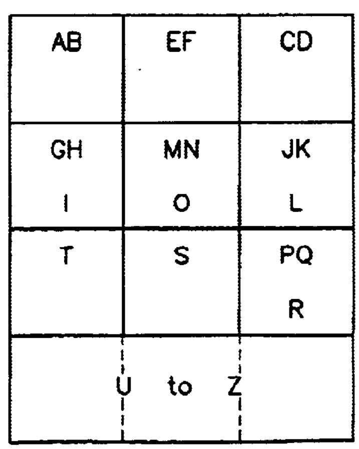
Figure 28E:
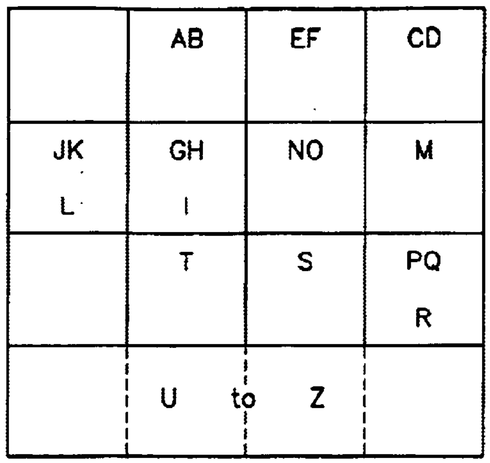
Figure 28F:
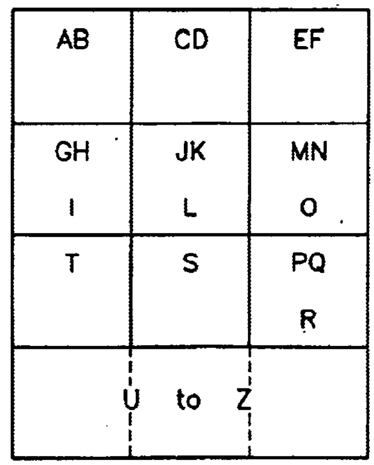
Figure 28G:
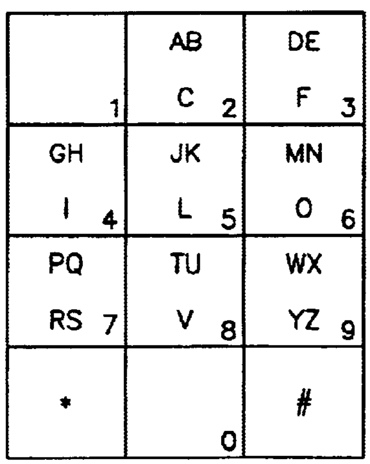
Figure 28H:
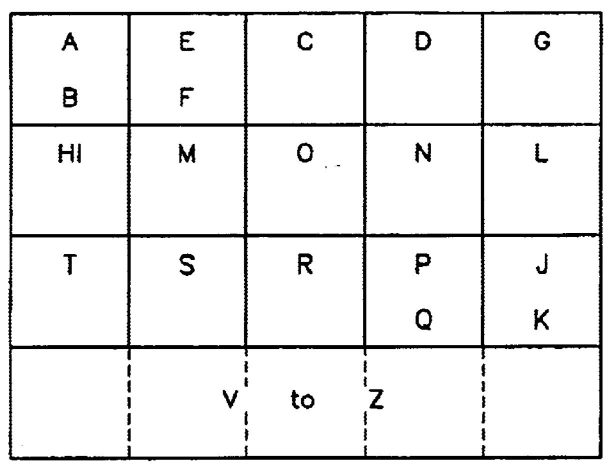
Figure 28I:
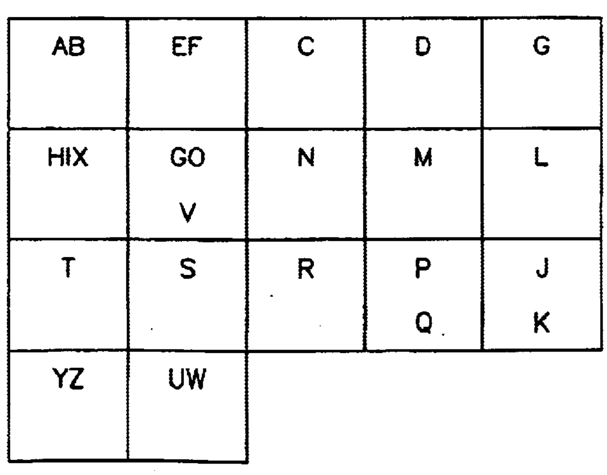
Figure 29A:
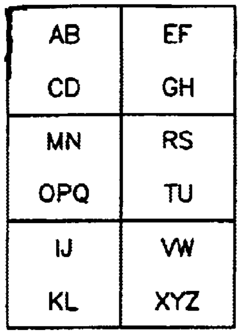
FIGS. 29(*a*)–29(*l*) are various alternative keyboard configurations.
Figure 29B:
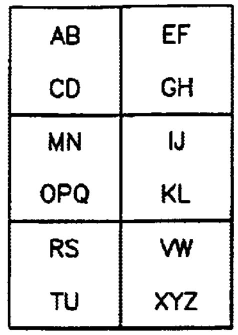
Figure 29C:
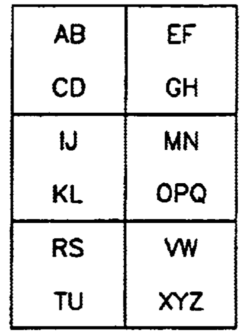
Figure 29D:
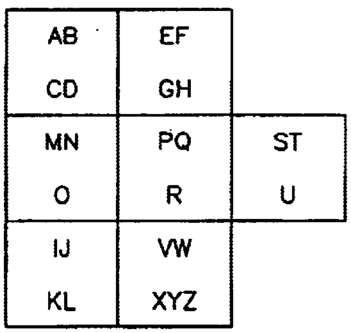
Figure 29E:
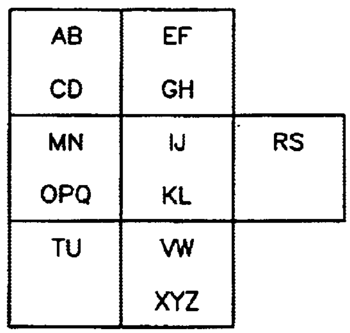
Figure 29F:
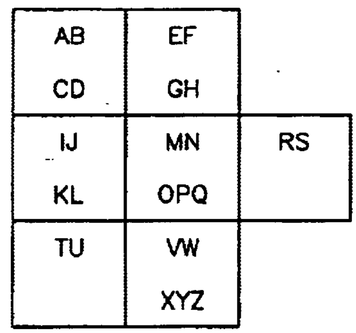
Figure 29G:
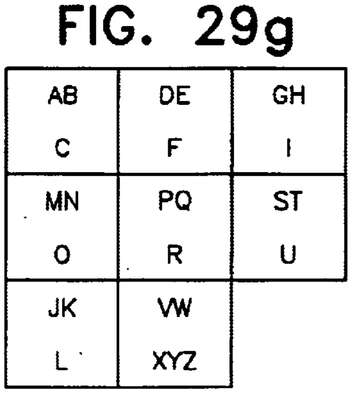
Figure 29H:
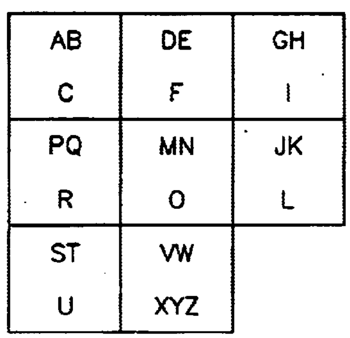
Figure 29I:
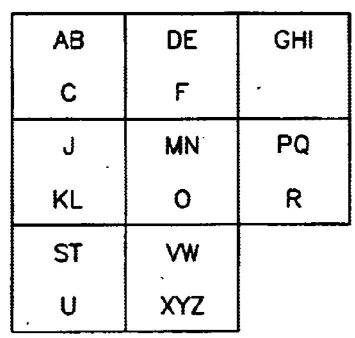
Figure 29J:
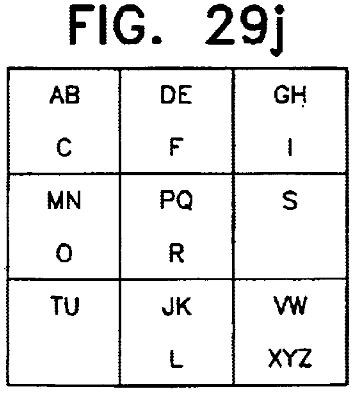
Figure 29K:
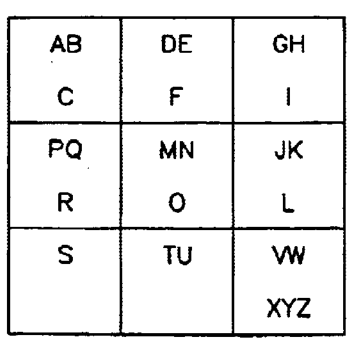
Figure 29L:
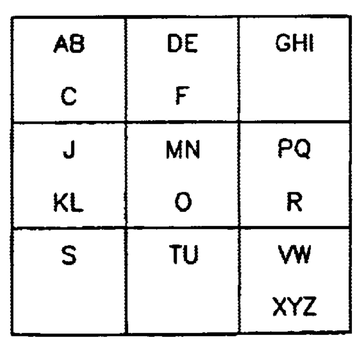
Figure 30A:
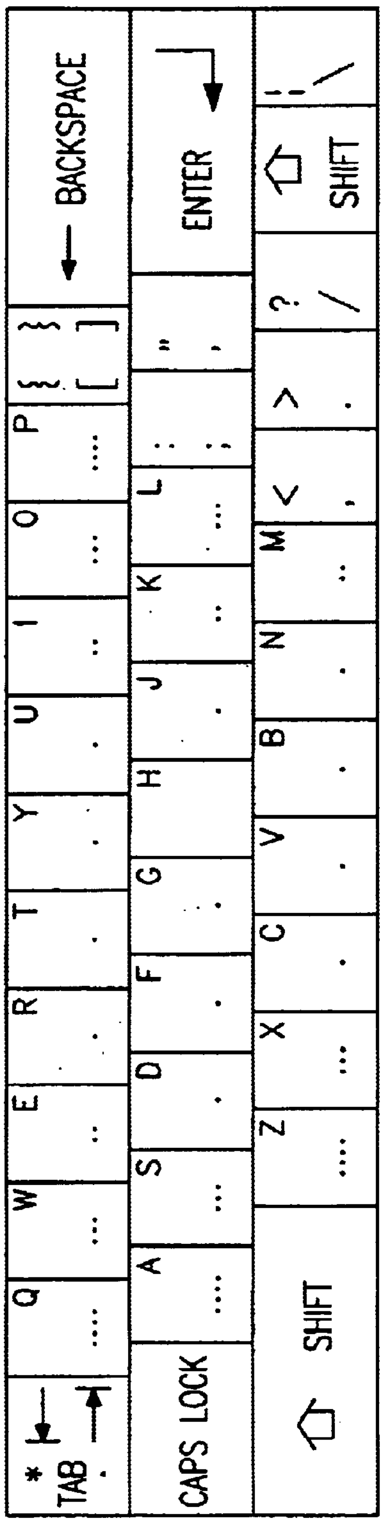
FIGS. 30(*a*)–154 are various configurations of the invention.
Figure 30B:
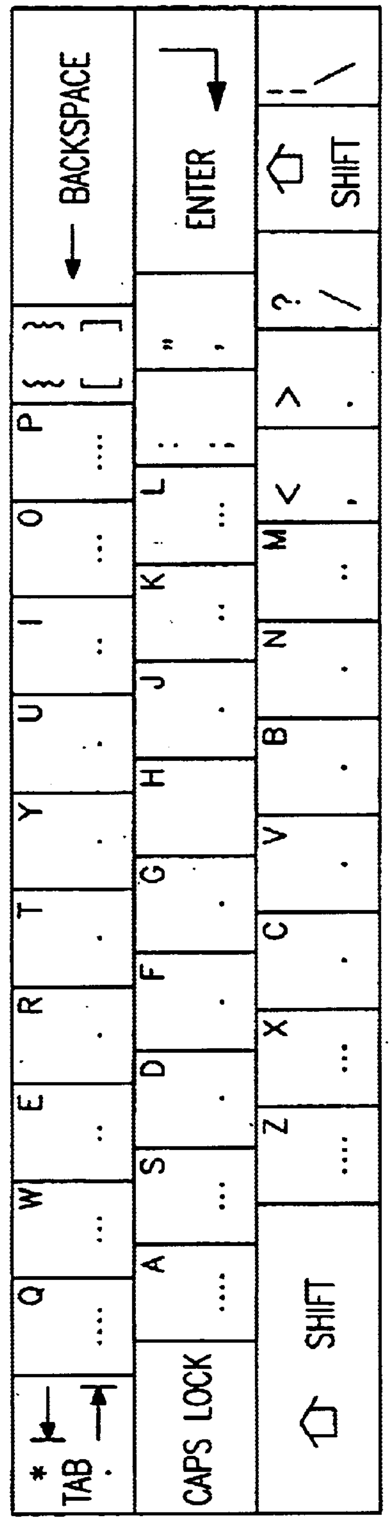

As shown in FIG. 25, the speed typing method of the present invention may include an automatic speech recognition system (ASR) 400, including a microphone 410, so that the editing required for the word code typing system (i.e. the requirement to choose the desired word when more than one word is associated with the same word code) could be done completely or partially by the speech recognition component. Though the ASR system 400 is shown separate from system 100, it may be configured integral with computer 10. Likewise, microphone 410 may be configured integral to the ASR system 400, or to one of the keyboards 14, or directly connected to computer 10.

When, during typing, the user is alerted by a distinctive beep that editing is required for the word code just entered (because there is more than one word associated with the typed word code) the user would speak the desired word into microphone 410. Alternatively, a user may return to a word to be edited, and place the cursor on the word to be edited, then speak the desired word. The system need only compare the spoken word to the words associated with the typed word code, and not to the entire dictionary of words.

In this regard, only a portion of the word need be typed in order to further increase speed of typing, even though the spoken word would have to be compared to more words in the dictionary. In relation to FIGS. 4(*a*) and (*b*), ASR comes into effect after steps 144 and 338, 344, respectively. That is, once the user desires to select a word, 144, 338, 344, the word may be selected by speaking the word. The system would then search those words in memory that correspond to the typed word for a word also having the information corresponding to the spoken word. Thus, by reducing the number of words that correspond to the spoken word, the ASR is made significantly faster and more accurate.

For some keyboard configurations, especially those with 2 or 3 keys, the user would vocalize every word as the word code is entered because 45% to 85% of those word codes would require editing. The 2 key keyboard would have, for instance, the letters on Key 1—A thru L and on Key 2—M thru Z. The 3 key keyboard would have, for instance, Key 1—A to H, Key 2—I to Q and Key 3—R to Z.

The average number of words on the word codes is:

2.8 words per word code on a 5 key keyboard 3.39 words per word code on a 4 key keyboard 4.52 words per word code on a 3 key keyboard 11.25 words per word code on a 2 key keyboard The amount of editing required and the time involved in editing increases as the number of words per word code increases. The number of words which would be needed in the ASR vocabulary if every word which does not have a unique word code is included in that vocabulary the value shown for F#3 shown in FIGS. 22(*c*) and (*d*), range from 5918 words for the 5 key keyboard, to 13 words for the 20 key keyboard.

With the 5 key keyboard the user may decide to use the ASR system only when there are more than 3 words per word code, which would result in the need to use the ASR system for one word per line. Of course, the user could decide to use the ASR system 100% of the time for editing. The user would be alerted by a distinctive beep wherever editing is required and the user would then vocalize the desired word.

The word code, the words assigned to that word code, and the speech patterns for those words are stored in the database, or a plurality of databases that may be connected to, or integrated with, the system. Access to the databases is by entry of the word code and/or by entry of the spoken word through the microphone 410. The word is selected by comparison of the word spoken into the microphone to the voice patterns in the database which are associated with the typed word code in accordance with well-known techniques. The selected word is then transmitted to the appropriate place in the underlying document.

If the system is not able to choose a word, a message is displayed which indicates this and the user then reverts to selecting the desired word in a manner previously described for the speed typing method. Also, if the user determines that a new word should be entered, the user would proceed to do this in a manner previously discussed for the speed typing method. In addition, if the new word has a word code which is not unique i.e. there are other words with the same word code the user would also enter this new word into the ASR vocabulary already associated with that word code.

The speech recognition component may be used with the speed typing device to do punctuation, capitalization, back-spacing and other types of functions. The voice command would be recognized and the desired command would be executed.

The process of analyzing the word spoken into the microphone is reduced in complexity by linking the ASR system with the speed typing-word code method of the present invention because the number of words in the ASR system which require analysis at any one time is limited to the number of words associated with the word code entered by the typist, when the typist spoke the word into the microphone. It is not necessary to try to identify the spoken word out of the entire vocabulary of the ASR system, and it is only necessary to distinguish the word from the other words which are assigned the same word code.

In addition, the input of the word code gives information as to the length of the word, information as to the beginning and ending of the word (by the user hitting the space bar or punctuation) and since each key stroke has only certain letters associated with it certain information as to the possible letters at each place on the word. The combination of the two systems can reduce the total amount of time needed for editing and with very few keys the speed of typing can be very fast. The speed typing-word code method can be used as an adjunct to the ASR system for the purpose of assisting the ASR system when the word spoken into the microphone could not be identified or to type in words that could not be identified, to type in new words to be entered in the ASR program, and to type text with a vocabulary not included in the ASR system.

In another embodiment of the invention, a keyboard may be configured having a set of 2 to 4 or more keys at a top row, and an identical set of keys on a bottom row, which is located immediately beneath the top row. Thus, each key on the top row is identical to each respective key on the bottom row, with each key being associated with the same letter or letters.

The user then switch between the rows to indicate that a new word is being started, and a space should be entered. That is, the user types a first word on the top row of keys, the second word on the bottom row of keys, and the third word on the top row of keys. Each time the user switches rows, the system would recognize that a new word is being entered and a space should precede the first typed letter. Clearly then, this type of keyboard may be designed to any suited configuration, and need not be limited in size, shape, or number of keys.

In another embodiment of the invention, the user may type without having to place a space between words. This eliminates the need to hit a space bar or key, which on the average accounts for approximately 25% of all typing. For most words and sentences, it is easy to decipher typed text in which the words are not separated by a space. For example, consider the phrase "the time for all". The system is designed to add a space as each complete word is typed. Thus, as the words "the time for" are entered, the system would recognize that each was a word, and would add a space.

However, it may often be the case that there the shortest word is not the desired word. For instance, in typing the phrase "now is the time", the shortest first word is "no". The "w" is then tested by adding one letter at a time to determine if there is a word code that fits such a sequence (i.e., the memory is searched for a matching word code).

Here, the word "wist" would be found in memory, so that the phrase might be entered as "no wist he time". However, the user need only enter a space after "w" for the entire phrase to correct itself. In addition, if the word "wist" was not located in memory, the "w" would be tested with the prior word "no", so that they system would recognize that the word "now" was to be entered. Thus, the user may have to perform some editing as typing proceeds.

The elimination of the "space bar" can be tested in the computer program and if there are no other decoding possibilities some "space bars" can be eliminated and the text stored or transmitted without those "space bars". For example, the words, "IN THE" followed by many words, such as the word "compaction", have no other possibilities. That is, the "space bar" can be eliminated between the words "IN" and "THE" but it could not be eliminated again until the end of the word compaction or the words would read "compact ion" which, of course, has a different meaning.

Also, when in the mode of typing text the user may elect to eliminate the space bar between words which the user could elect to be either a specific number of words or at random. This would require more editing. For that group of letters the computer would display all the possibilities and the user would make his selection accordingly. For example, if the words "IN THE COMPACTION MODE" did not have a space until after the word MODE, the following possibilities would be given the user:

"IN THE COMP ACT ION MODE"
"IN THE COMPACT ION MODE"
"IN THE COMP ACTION MODE"
"IN THE COMPACTION MODE".

The user would choose one of these 4 phrases or the program could be designed only to show the shortest words so long as all the letters are used and the user would then edit by moving the words together.

A 6 key keyboard would result in approximately 2,500 words which require editing (i.e., they would have to be moved to the home row). By the use of rules of syntax and statistical information regarding the frequency of the use of certain words with other words the amount of editing required would be reduced.

Certain characters, such as an apostrophe, colon, semicolon, and hyphen, are recognized as being associated with a neighboring letter. For instance, the apostrophe indicates that the previous and following letters are to be grouped together, with certain exceptions (such as when indicating possession of a pluralized word), whereas a colon or semicolon are to be appended to the prior letter and followed by a space. The space bar is most easily eliminated when implemented in a larger keyboards, such as 15–18 key configurations, since there are few word codes that are associated with more than one word.

Figure 23:
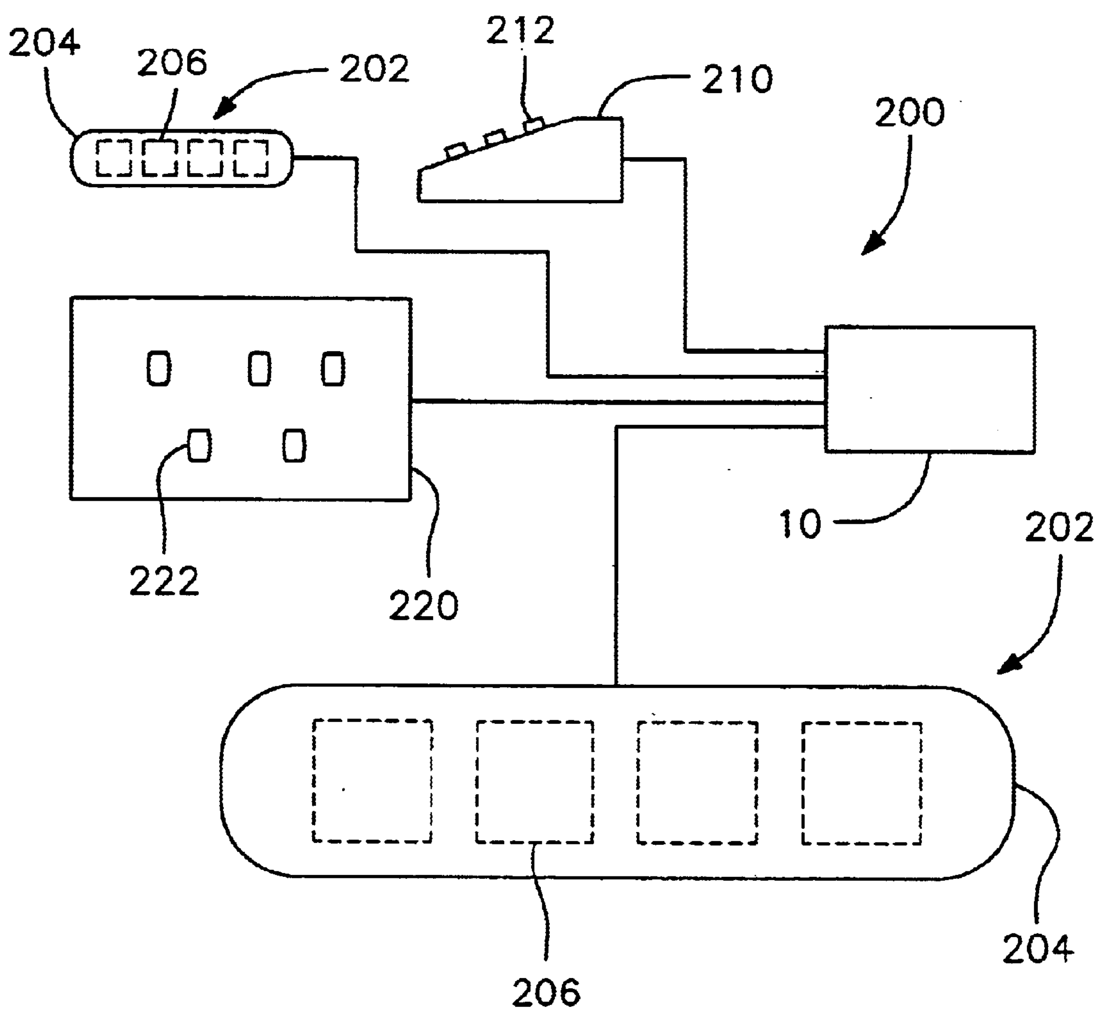
FIG. 23 shows a finger-mounted input device and input selection panels used in association with the speed-typing system of the present invention.

Turning to FIG. 23, the system 200 also has particular advantages for use with conventional hand- or finger-mounted computer input devices 220. The finger-mounted input device 220 is shown generally by block 220, which represents any suited finger-mounted device 220, such as those described in the Description of the Related Art section above. The input device 220 generally has switches 222 that are placed about the user's fingers or hand. The system 100 may also be provided with a keyboard 210, one or more input selection panels 202, and any other suitable components (such as a display device shown in FIG. 1). The input selection panel 202, as well as the finger-mounted input device 220 are connected to computer 10 in accordance with well known methods.

Preferably, two finger-mounted input devices 220 are provided, one for each of the user's hands. Of course, the system 200 may have a single finger-mounted input device 220, as shown, so that the user has one hand free to operate keyboard 210 and/or input selection panel 202. The system 200 may be operated with any suitable number of switches 222, such as only providing three or four switches 222 for each hand, or providing more than one switch 222 per finger.

One or more letters, characters, symbols, or commands are assigned to selected switches 222, keys 206, 212, combination of switches 222 or combination of switches 222 and keys 206, 212. In addition, one or more codes are associated with each switch 222 and each defined combination of switches 222 and keys 206.

The user, fitted with the finger-mounted input device 220, then strikes a switch 222 against one or more of the keys 206 of a selection panel 202, keys 212 of keyboard 210, and/or from a flat surface (not shown), such as a table or desk. Preferably, however, the finger-mounted input device 220 is used in association with one or more input selection devices or panels 202. The input selection panel 202 has a flexible pad 204 that covers several input keys 206 (shown generally in dashed lines).

For purposes of illustration, the user may depress a switch 222 of the finger-mounted input device 220 that is mounted on the user's right index finger, and preferably the user's fingertip, by pressing the switch 222 against a table. The sole actuation of that switch 222 may be assigned the input code eight. The code eight, in turn, may be associated with the letters "m", "n", and "o" However, if the user strikes that same switch against a first key 206 from a first input selection panel 202, that combination may, for instance, be associated with an input code nine. Input code nine, in turn, may be associated with the letter "m" (which is a subset of the letters associated with code eight), or the letter "q". On the other hand, the user may, instead, strike that same switch 222 against a first key 206 of a second input selection panel 202. That combination may be associated with an input code ten, which may be associated with an instruction command to move a displayed cursor up.

Of course, any suitable number of keys 206 and pads 202 may be utilized, and there are a vast combination of keys, and related characters or commands associated with any of the input codes, that may also be selected. The system may be configured to permit the user to select from a variety of finger-mounted switch 222 and key 206 configurations, or to permit the user to define a configuration. In addition, as mentioned above, the finger-mounted device 220 may be used in conjunction with keys 212 of a conventional keyboard 210. Here, for example, the actuation of a switch 222 of the input device 220 is associated with a different code in memory than if that same switch is depressed in conjunction with a key 212 of a conventional keyboard 210.

In the preferred embodiment, the input selection panel 202 has four input keys 206 that are positioned beneath pad 202. Two input panels 202 are provided, which the user may place side-by-side, one above the other, or in any suited arrangement. The input keys 206 may be any conventional pressure-actuated mechanical key, such as found on standard keyboards, a capacitance-actuated key, or any other well known key. Each pad 204 may also be fitted with an overlay (not shown) that identifies the characters or commands associated with the particular location on the input selection device 202.

Figure 24A:
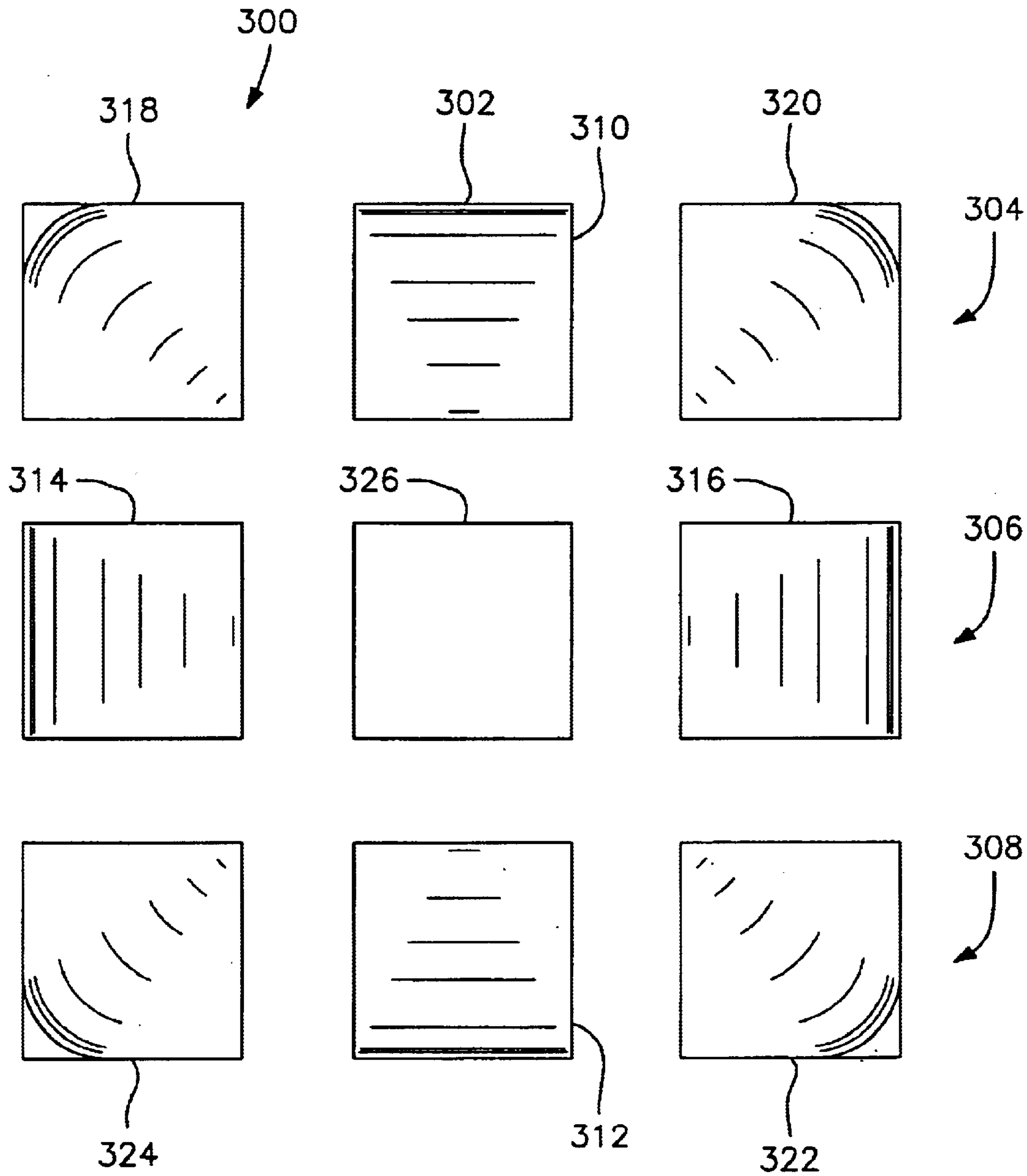
FIG. 24(*a*) is a top view showing the contoured keypad in accordance with the present invention.
Figure 24B:
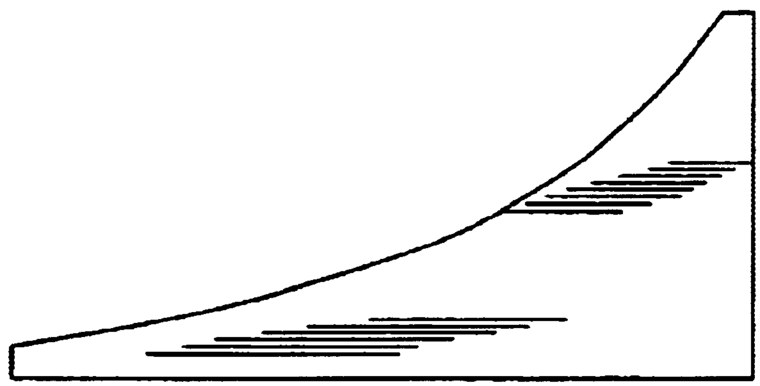
Figure 24C:
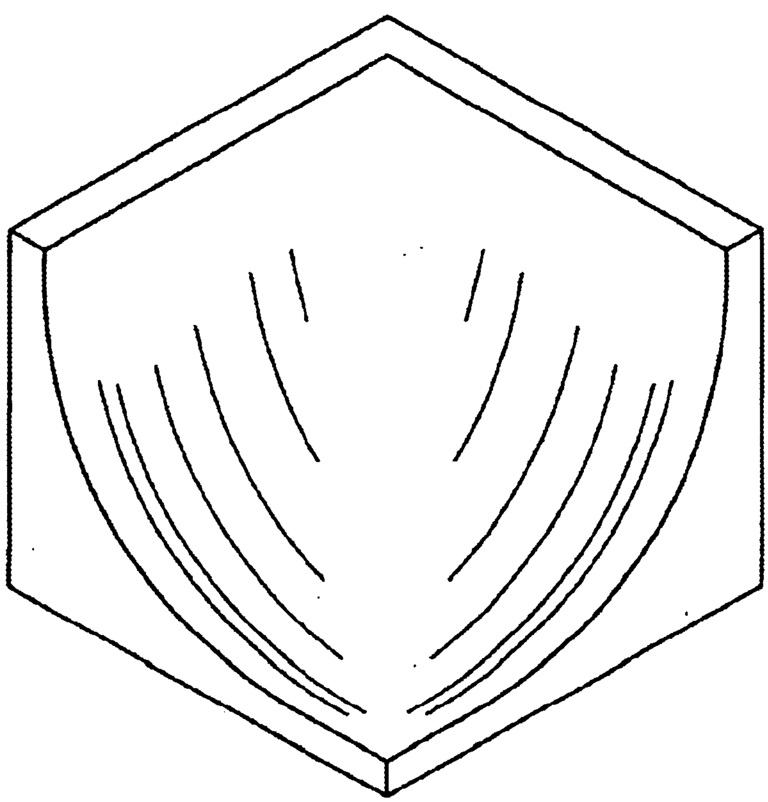

Turning to FIG. 24(*a*), another invention is shown, in which keys 302 are contoured to assist the user in the location of his hand amongst keys 302 of keypad 300. The keys 302 may be used as part of the speed-typing system described above, or with any device having keys. The contoured keys 302 are particularly useful with keyboards having a small number of keys, such as calculators, telephones (and especially car phones) and the like.

FIG. 24(*a*) shows the contoured keys 302 used with a specially-designed 9-key keyboard or keypad 300. The keypad 300 has a top row 304, middle row 306 and bottom row 308. The contour of the keys 302 is represented generally by the contour lines. As shown, the middle keys 310, 312 of top and bottom rows 304, 308, respectively, generally slope downward toward the center row 306 of keypad 300, as shown in FIG. 24(*b*). Likewise, the center side keys 314, 316 slope downward toward the middle column of keys. The middle keys 310, 312, 314, 316 preferably have a curved or parabolic slope, but may instead be linear.

Each of the corner keys 318, 320, 322, 324 also have a sloping face. The corner keys 318–324 generally slope inward and face toward the center of keypad 300. As shown in FIG. 24(*c*), the corner keys 318–324 preferably form a curved surface that is configured to the shape of a user's finger. However, the corner keys may instead be fashioned with a linear face. The center key 326 is flat.

The shape of the contoured keys 302 indicate the position of the user's hand on the keypad 300 by sense of touch. Each key 302 generally faces toward the center key 326, so that the user will be able to sense the relative position of his hand by touching any one key 302. The user will become familiar with the characters assigned each key 302, and will not have to look down at the keypad 300 in order to know which key has been depressed, or which characters selected. The contoured keys 302 have particular advantages when used with the present system 100, which provides a reduced keyboard.

Accordingly, there are numerous manners in which the keys may be contoured in order for the user to sense the relative position of the respective keys. The contours are preferably a function of the general shape, size and arrangement of the keys. The contoured keys may be implemented in any sized and shaped keyboard. For instance, in a keyboard that has four rows and columns, for a total of sixteen keys, the top row would be configured as in FIG. 24(*a*), with a center key 310 added between corner keys 318, 320. The bottom row, and left and right columns would be configured in a similar manner, and the four middle keys may be flat, as with center key 326.

The keys of pre-existing keyboards are typically fashioned with a downwardly extending tube that engages with a shaft extending upward from the keyboard. Thus, the pre-existing conventional (i.e., non-contoured) key may be easily removed by prying up on the key. Accordingly, the original keys of a keyboard may be removed and replaced with contoured keys. Alternatively, contoured inserts or pieces may be affixed to keys of a pre-existing keyboard in order to give shape to the keys. The inserts may be affixed by any suitable adhesive, or the like. In addition, the keys, or inserts, may be made of any material, such as rigid plastic, rubber, and other materials conventionally used to fashion keys. In addition, not every key need be contoured.

Other configurations for the keyboard are shown, in the attached Figures and Tables. These configurations have letters assigned, from 9 to 14 keys on those keyboards designed for an input using one hand, and 12 to 18 keys on the keyboards designed for an input using two hands. The other keys on the keyboard are used for punctuation direction, enter, control, shift bar, backspace, numbers, delete and selection of individual letters and sequences of letters and other purposes found on the standard keyboard. The system disclosed, herein, can be implemented on the standard keyboard. Also, a shift key may be designated to shift a set of keys from one group of uses to another and thereby reduce the number of keys required on a keyboard; for instance, such a keyboard with 50 keys, is shown in FIG. 50.

Figure 31A:
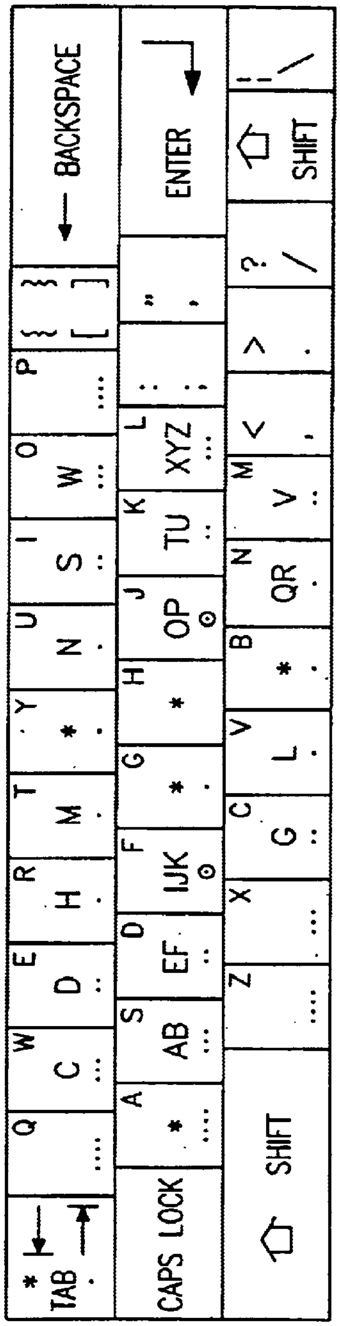
Figure 31B:
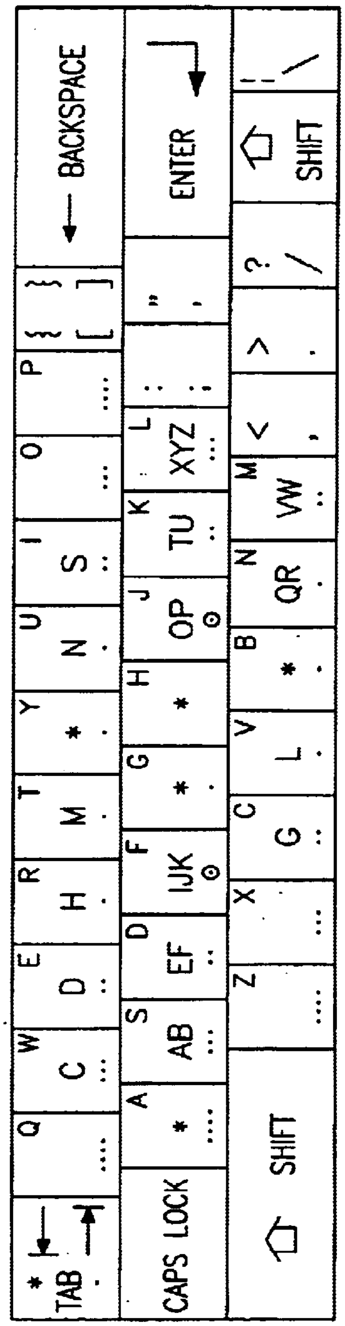
Figure 31C:
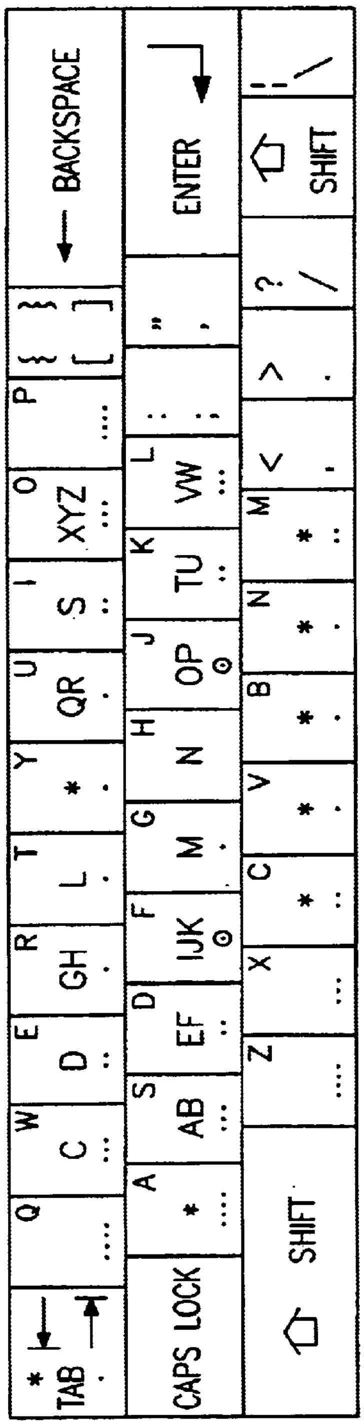
Figure 31D:
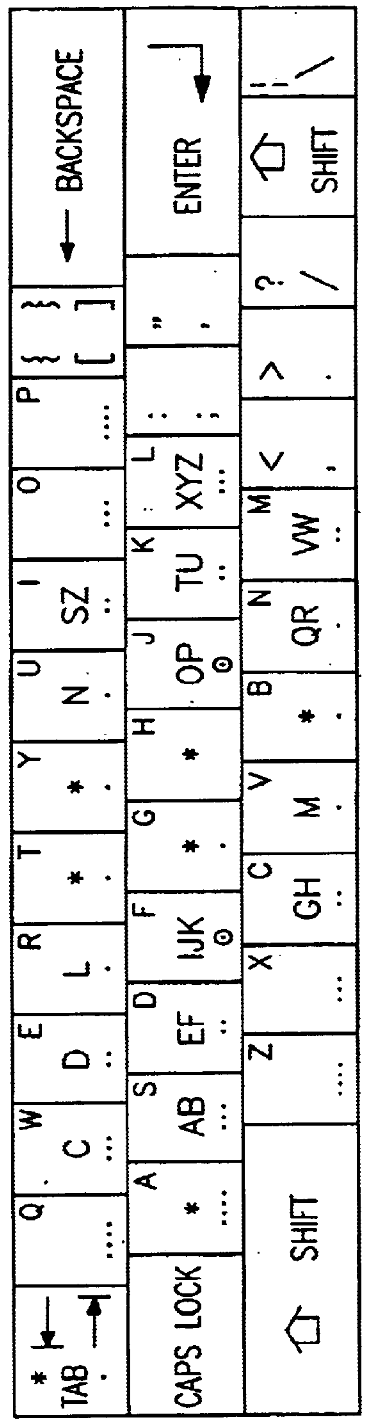
Figure 31E:
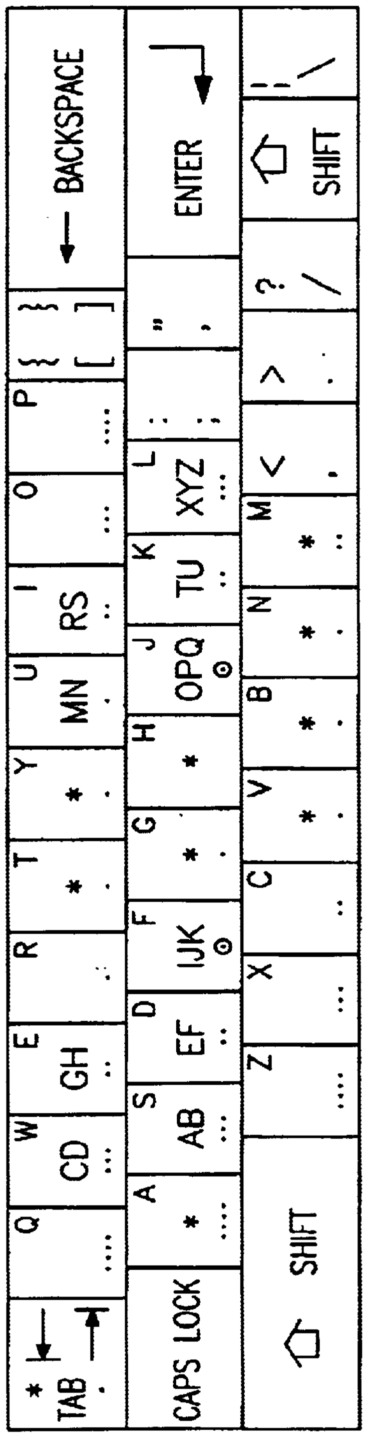
Figure 32A:
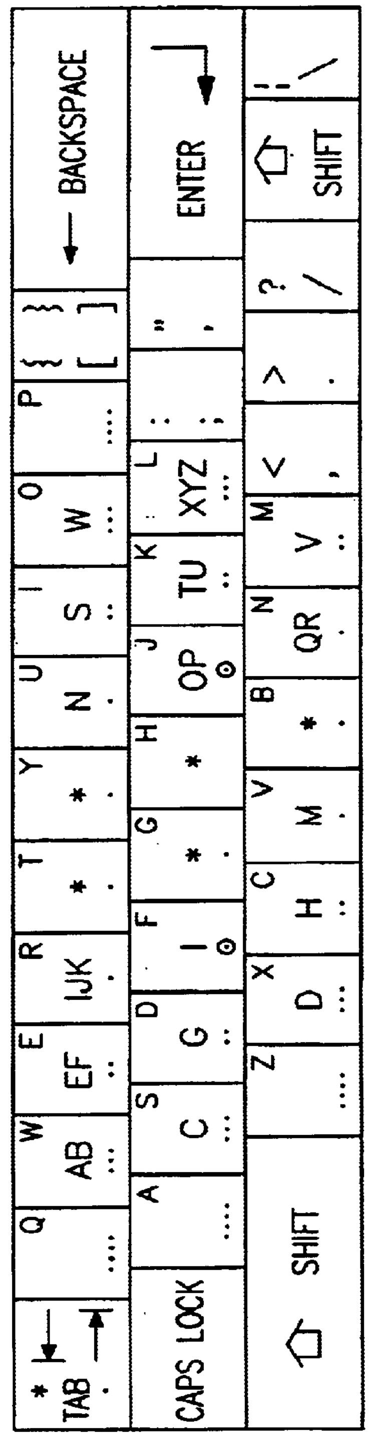
Figure 32B:
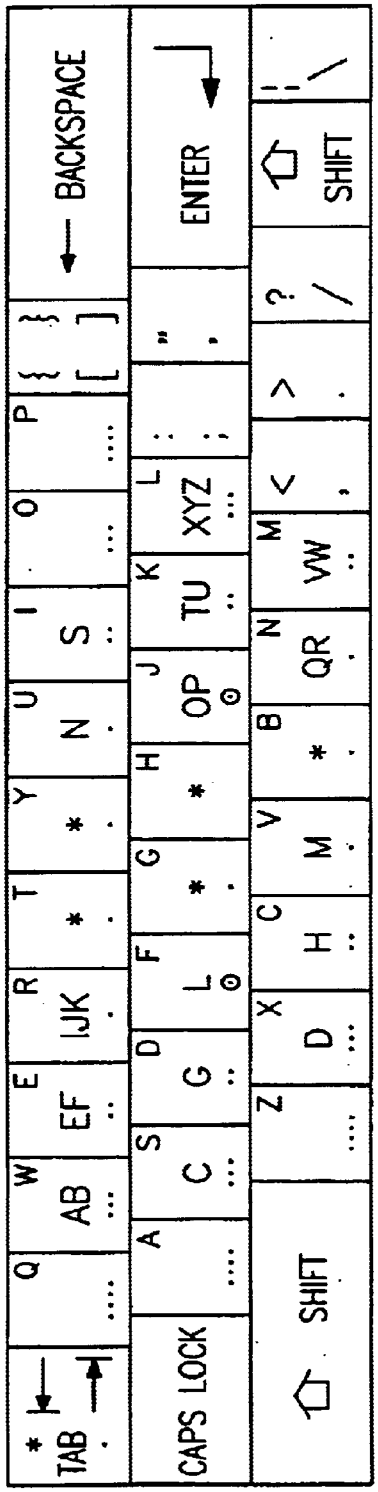
Figure 32C:
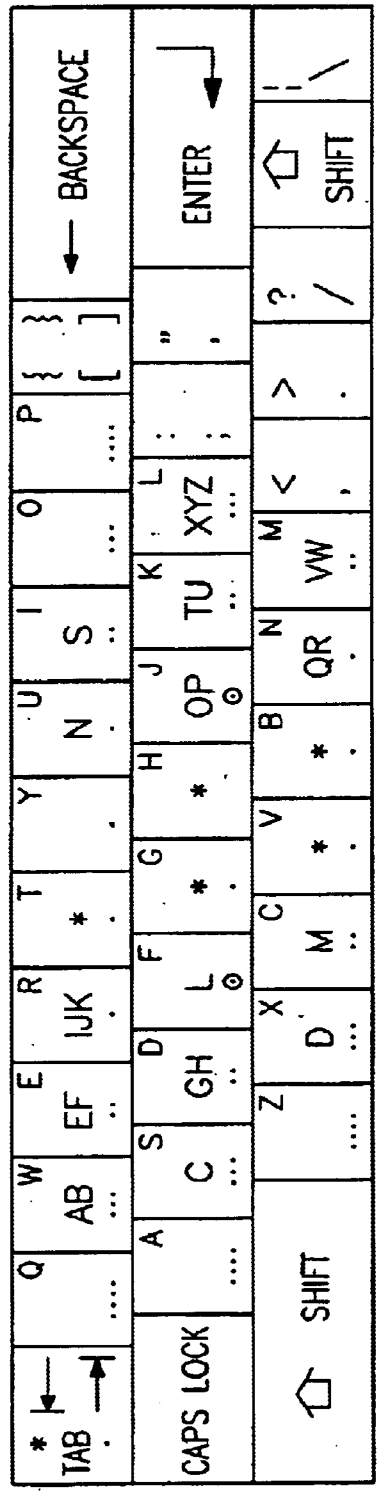
Figure 32D:
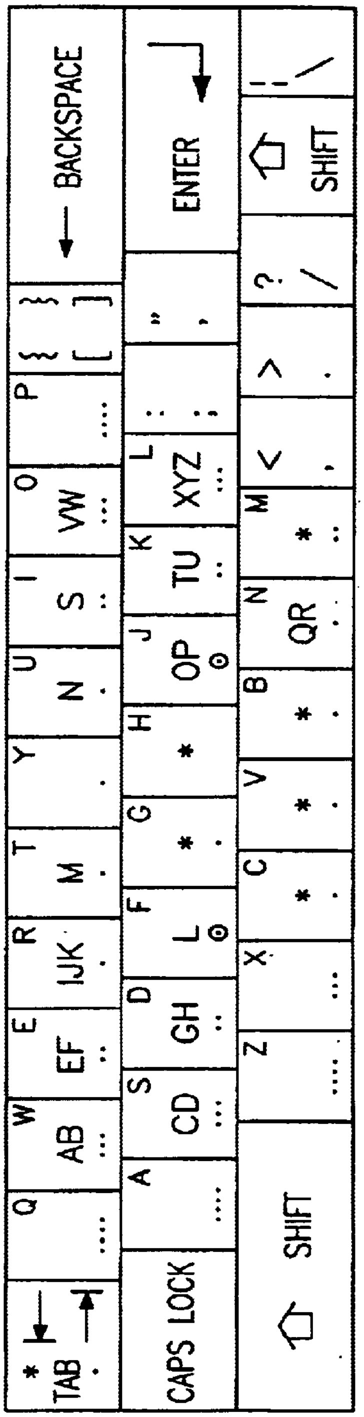
Figure 32E:
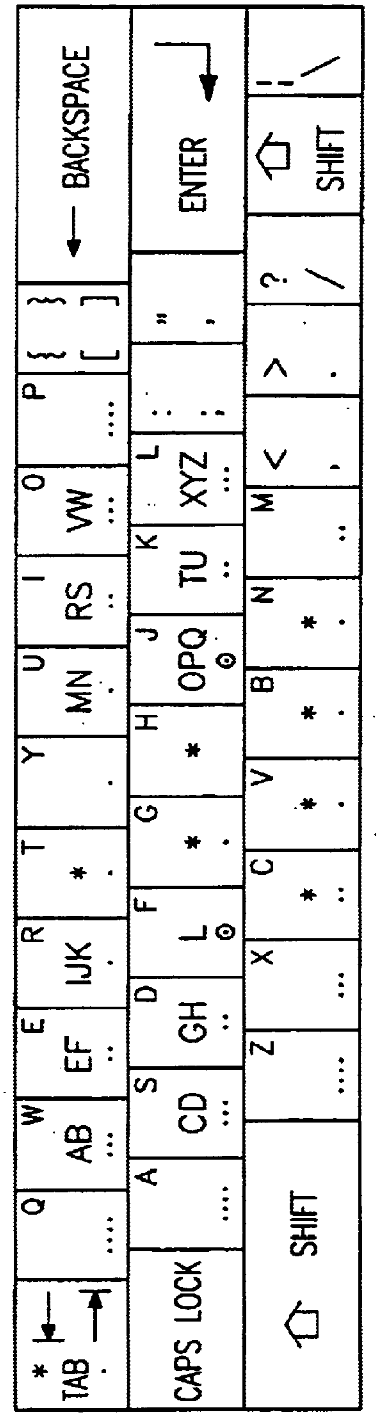

Many of the keyboards shown in the attached figures place the most frequently used letters in the middle row (also referred to as the home row or home line) above which the fingers are typically placed when starting to type. This results in the least amount of movement and contributes to faster and less fatiguing typing. For example, the middle row of the keyboard shown in FIG. 31*a*, is assigned the letters that are used 67% of the time. The selection of letters placed on the same key have been selected based on the information in FIGS. 22*a* and 22*b*, in order, to achieve a low frequency of unintended words associated with the input for-an intended word and a review of the words which result from the same input so that the number of commonly used words which result from the same keyboard input is minimized.

The arrangement of the letters on the keyboard and the number of keys to which the letters are assigned is such that their location is easy to remember. A test of an easy to remember keyboard is one that can easily be recalled by the user without looking at the letters placed on the keyboard. An alphabetical order for the vowels which fits into the overall alphabetical order of the entire alphabet can make the keyboard assignments easier to remember. (See FIG. 31*a*.) In the attached configurations, one or more consonants are assigned to the key to which a vowel is assigned and those consonants are generally in alphabetical order to the vowel. In most cases the assignments are "ab", "ef", "ijk", "opq" and "tu". When this set, from "ab" to "tu", are in the order shown above they are referred to, herein, as the "alphabetical vowel/consonant set".

The attached figures are divided into three groups based on a) the vertical or horizontal orientation of the alphabetical order of the "vowel/consonant set" and the location of that set (eg. top row or middle row) and b) the vertical or horizontal orientation of the alphabetical order of the entire alphabet of letters.

Pattern #1: In FIG. 31*a* to *e*, and FIG. 34*a* to *d*, the "alphabetical vowel/consonant set" is placed horizontally in the middle row of keys and above and/or below each of those keys are consonants in alphabetical order to the key in the middle row. The overall alphabetical arrangement is in a vertical pattern.

Pattern #2: In FIG. 32*a* to *e* and FIG. 35*a* to *e*, the alphabetical vowel/consonant set" moves horizontally across the top row of keys on the left side of the keyboard and then across the middle row on the right side of the keyboard. Overall, the alphabetical pattern of the entire alphabet is in a vertical pattern.

Figure 33A:
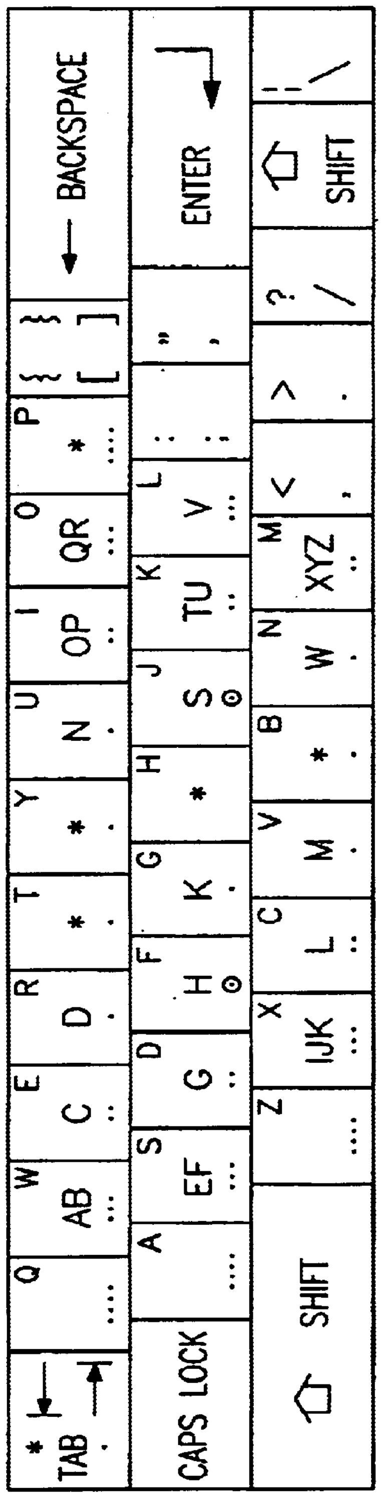
Figure 33B:
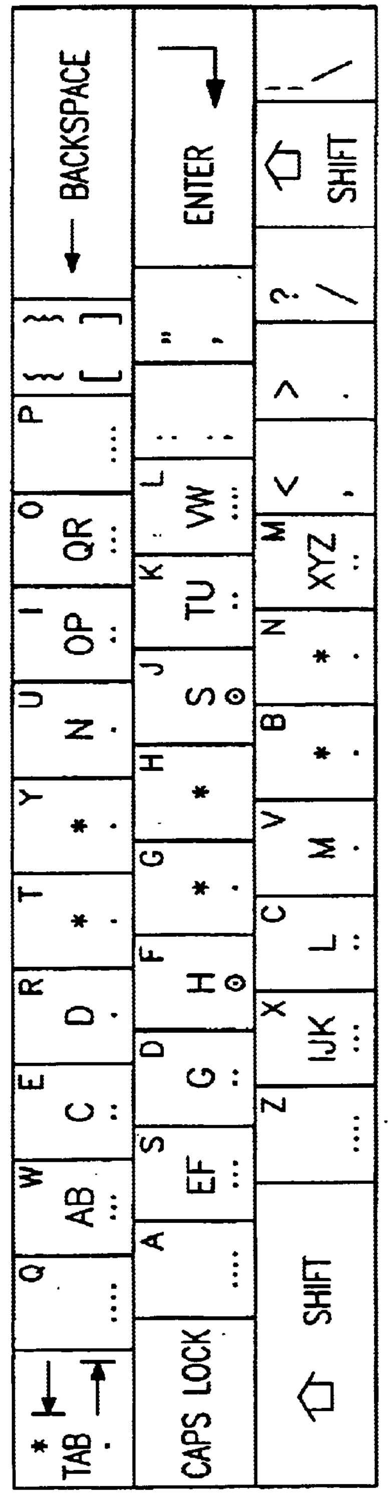
Figure 33C:
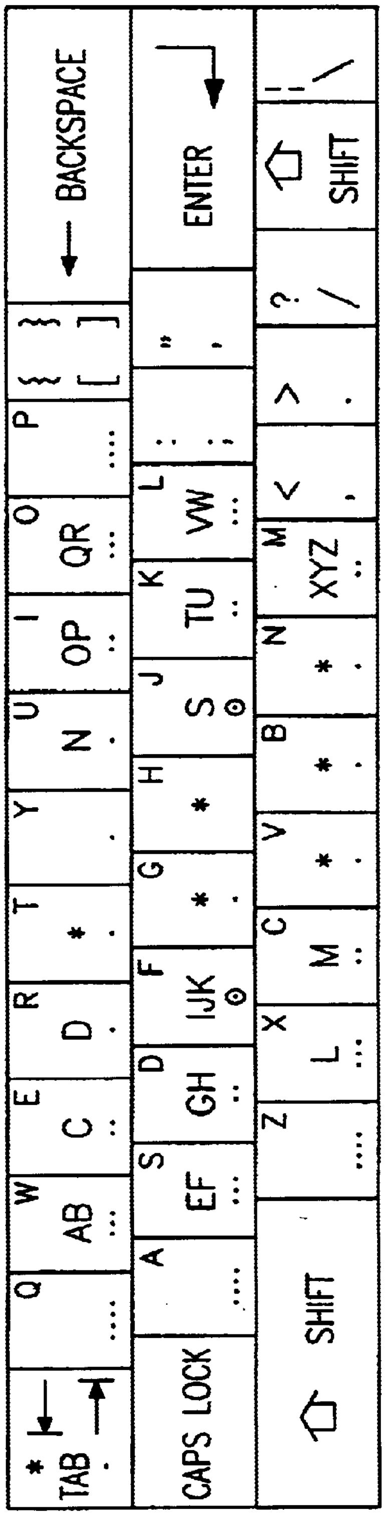
Figure 33D:
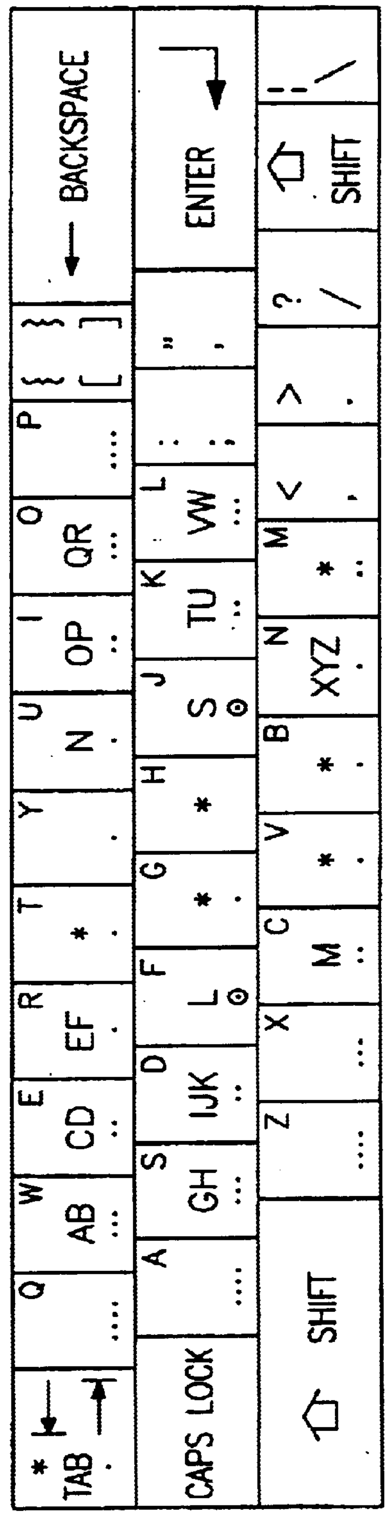
Figure 33E:
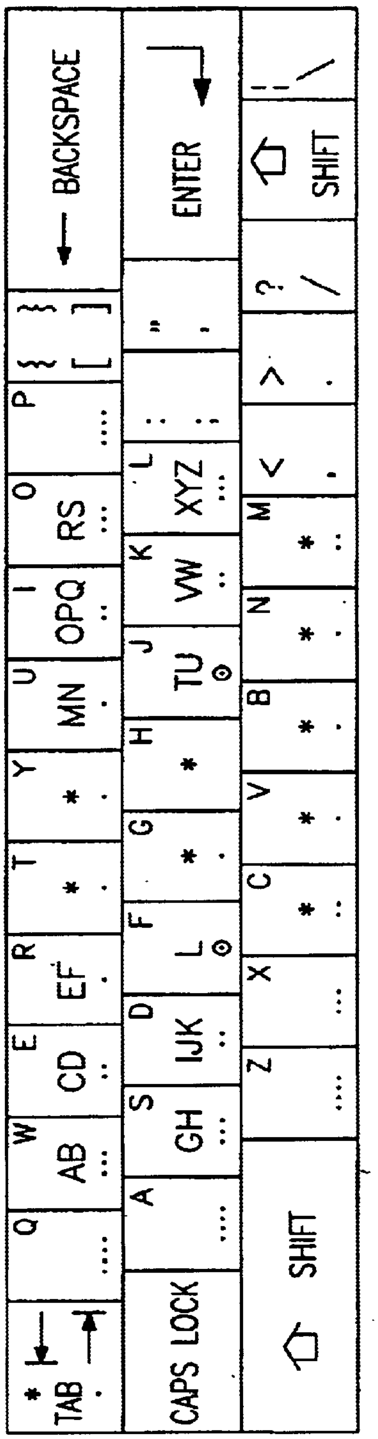
Figure 34A:
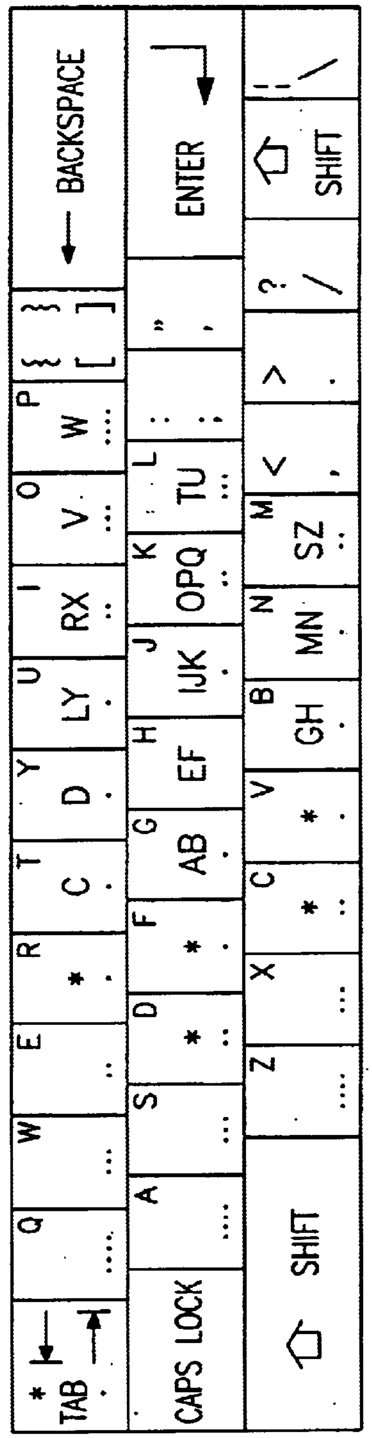
Figure 34B:
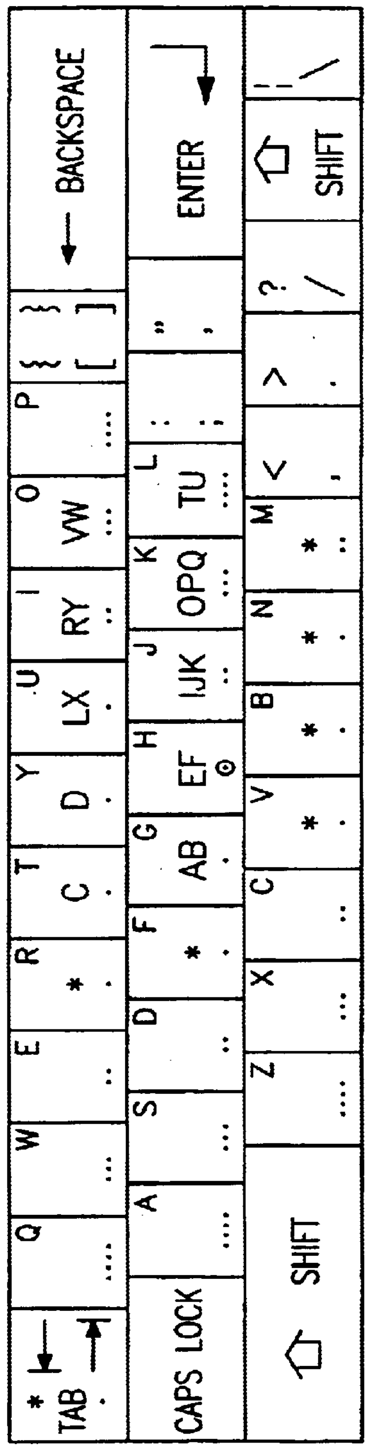
Figure 34C:
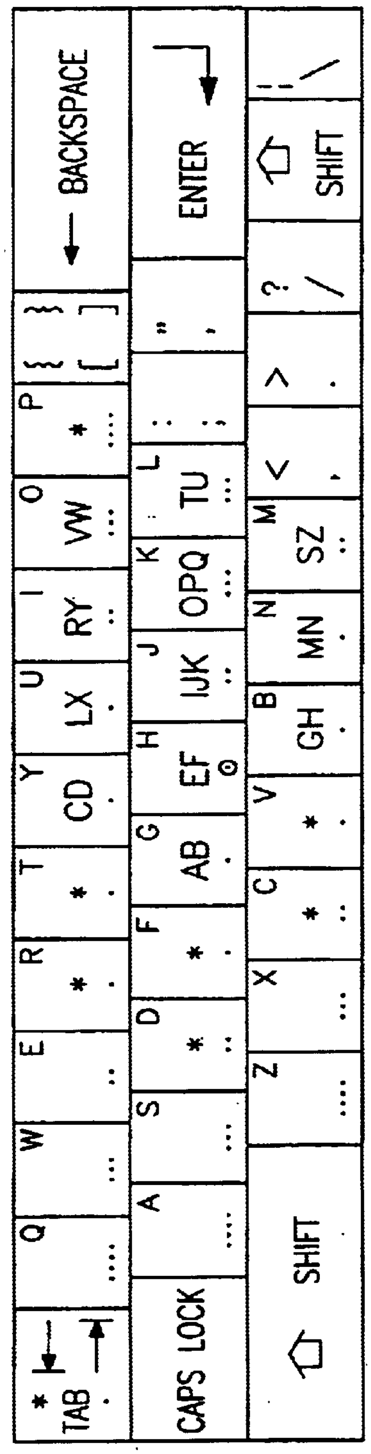
Figure 34D:
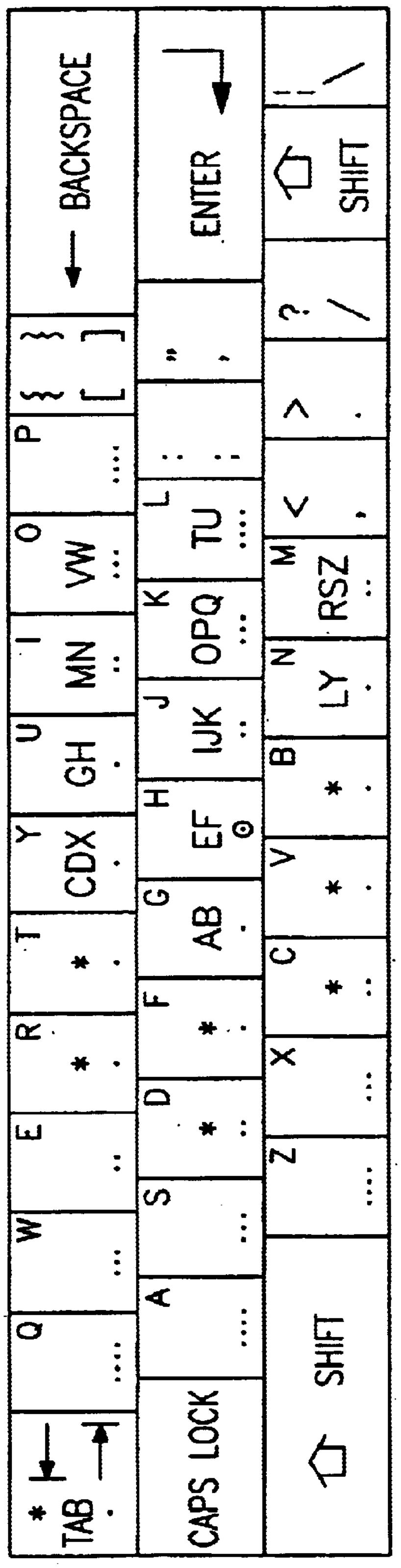
Figure 34E:
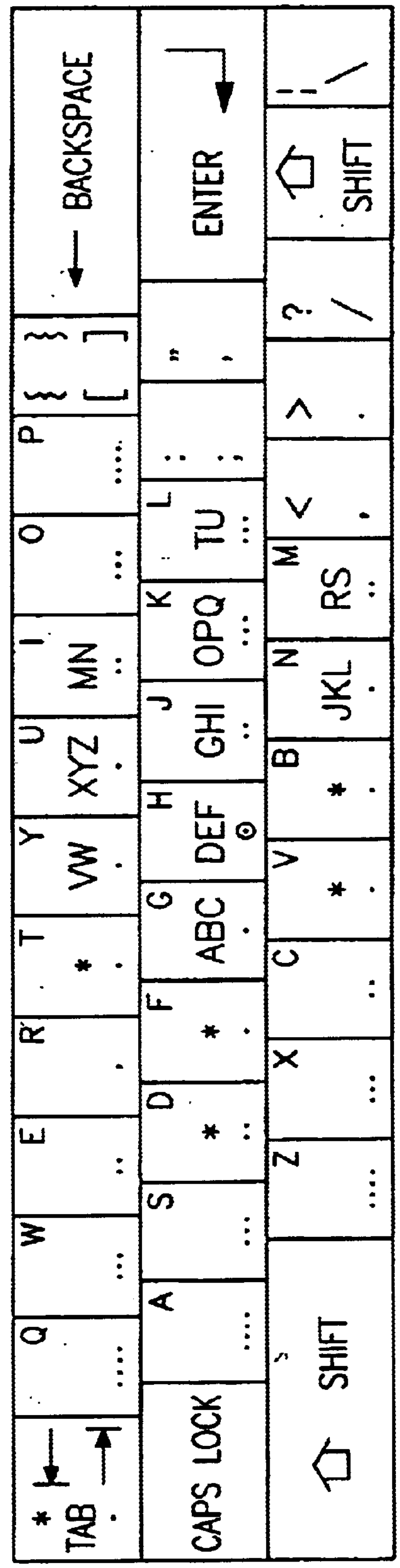
Figure 35A:
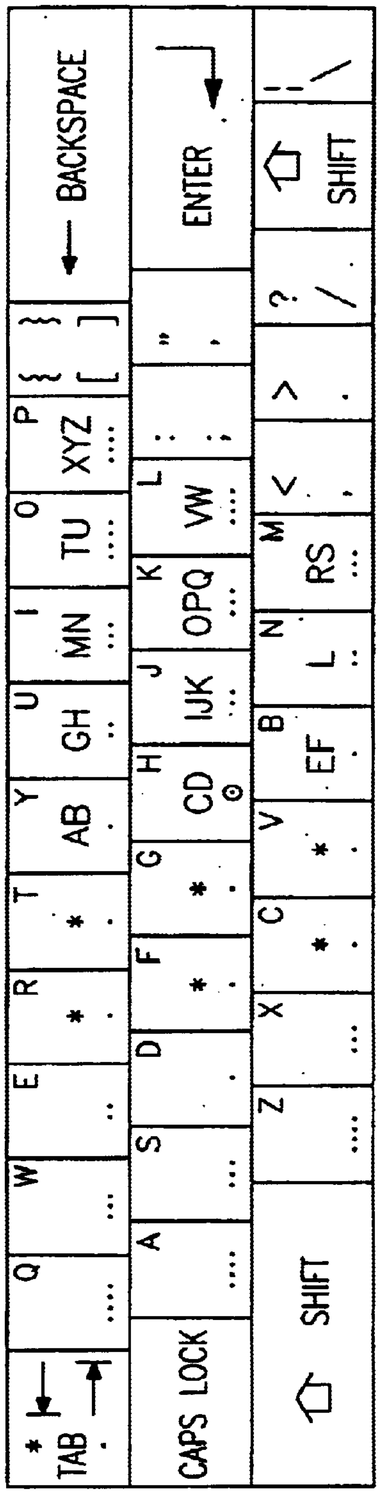
Figure 35B:
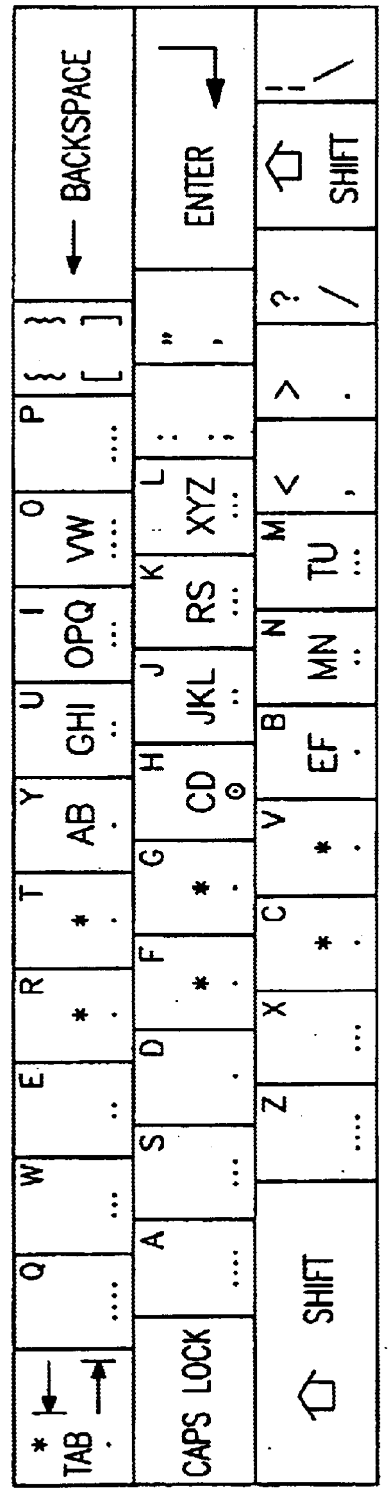
Figure 35C:
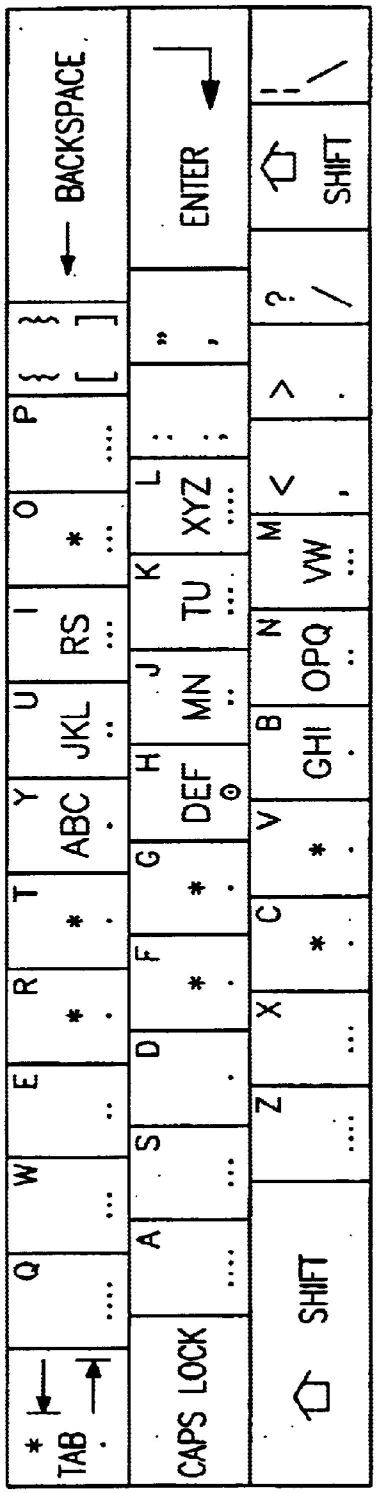
Figure 35D:
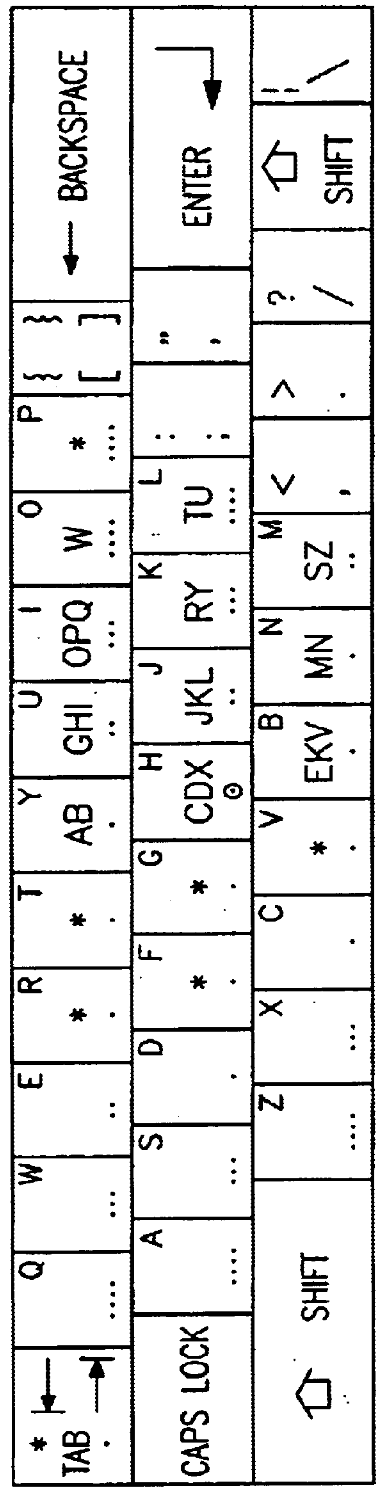
Figure 35E:
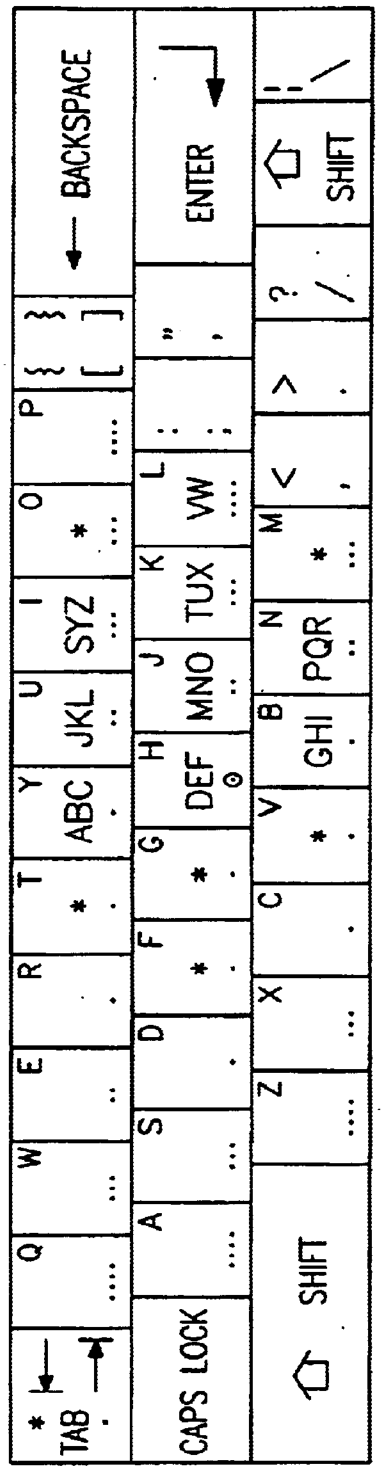
Figure 36A:
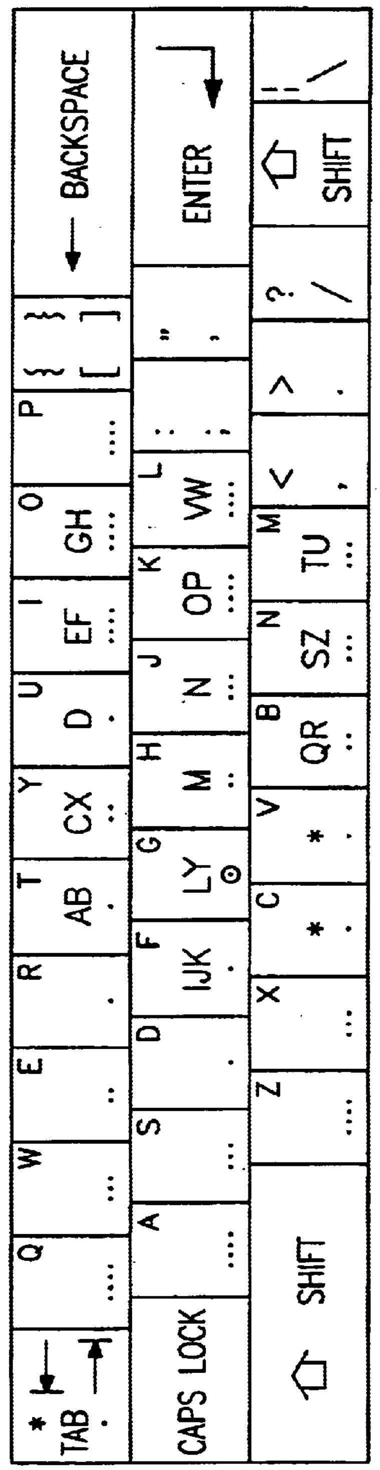
Figure 36B:
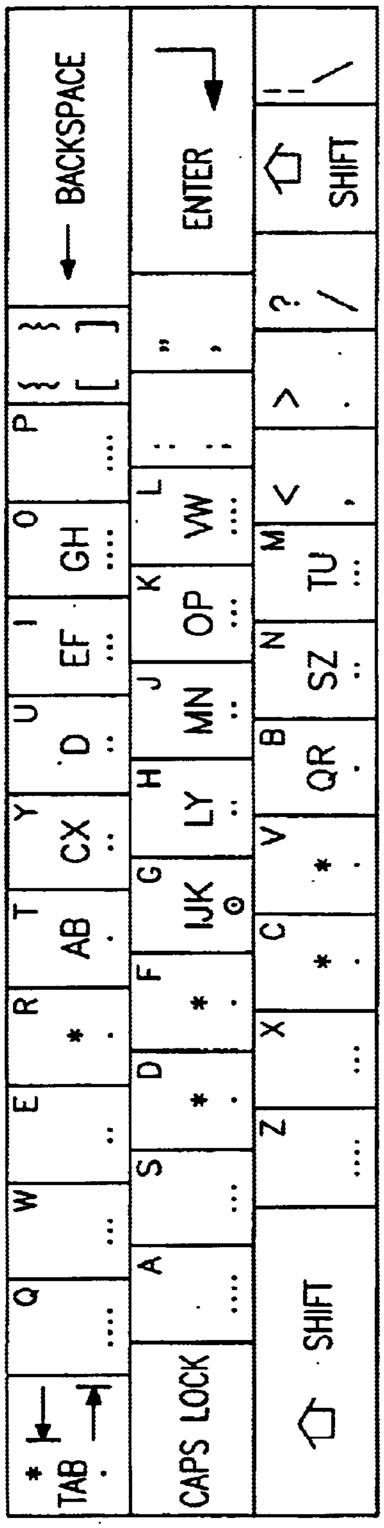
Figure 36C:
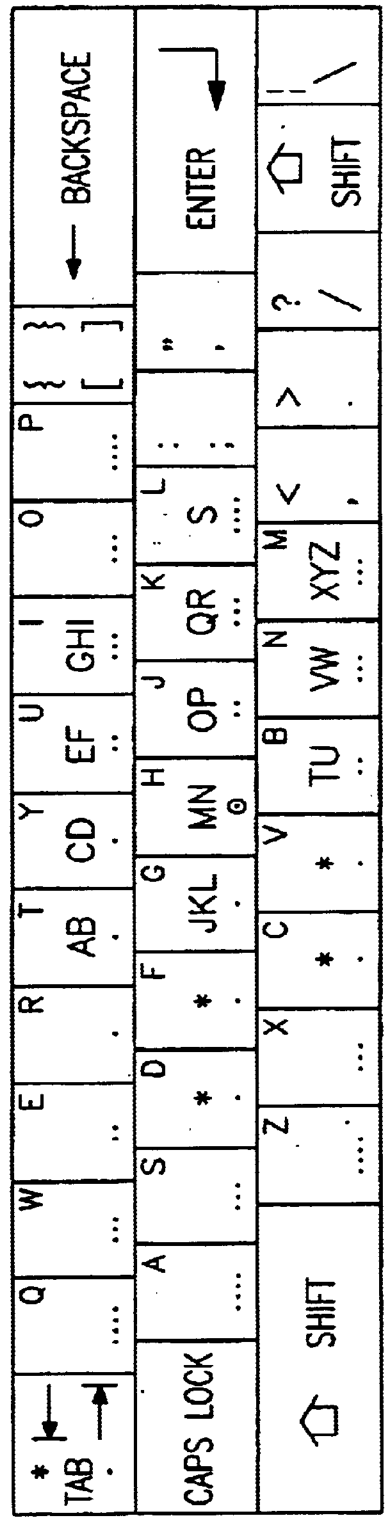
Figure 36D:
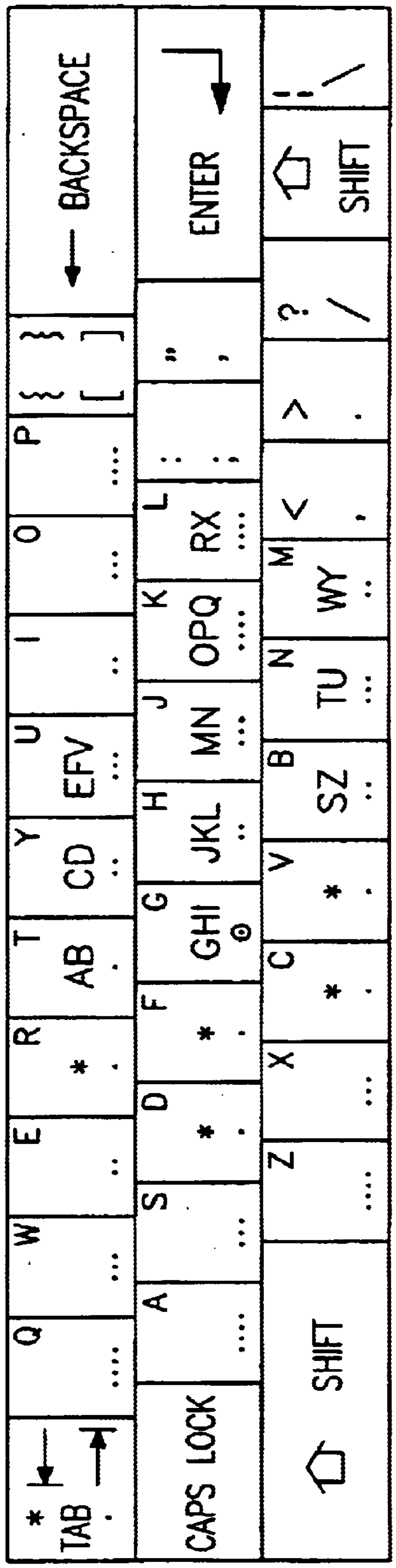
Figure 36E:
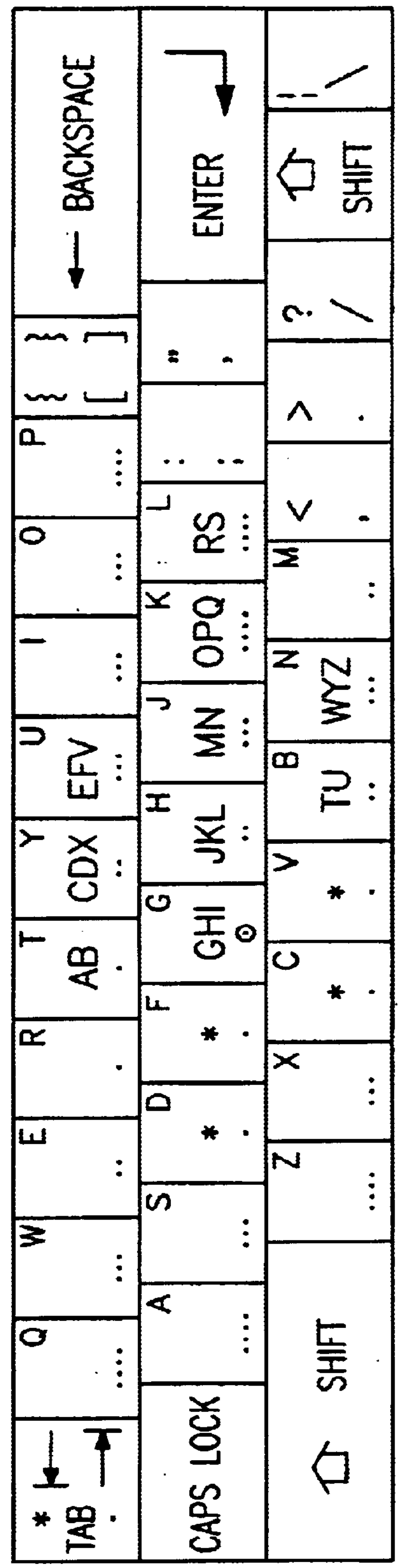
Figure 37A:
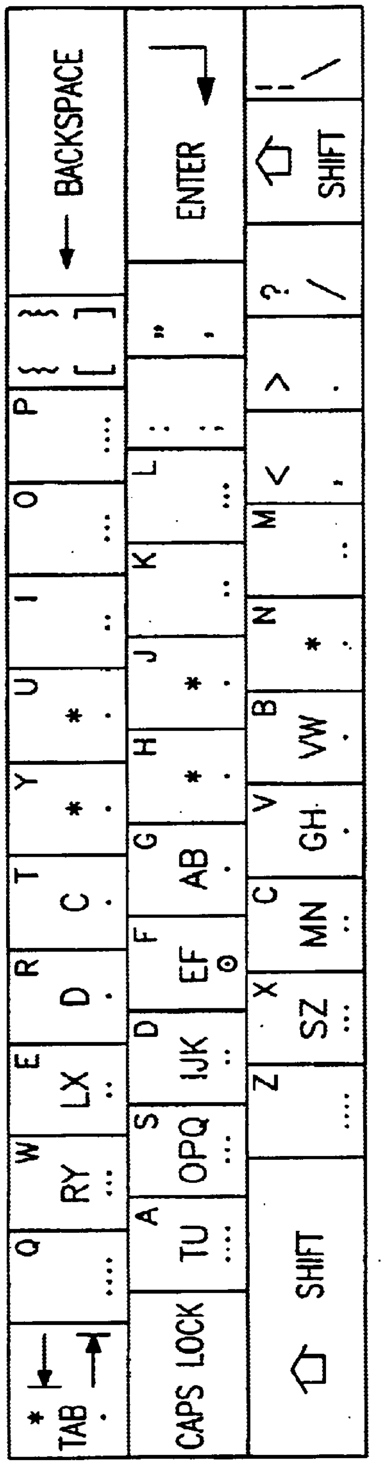
Figure 37B:
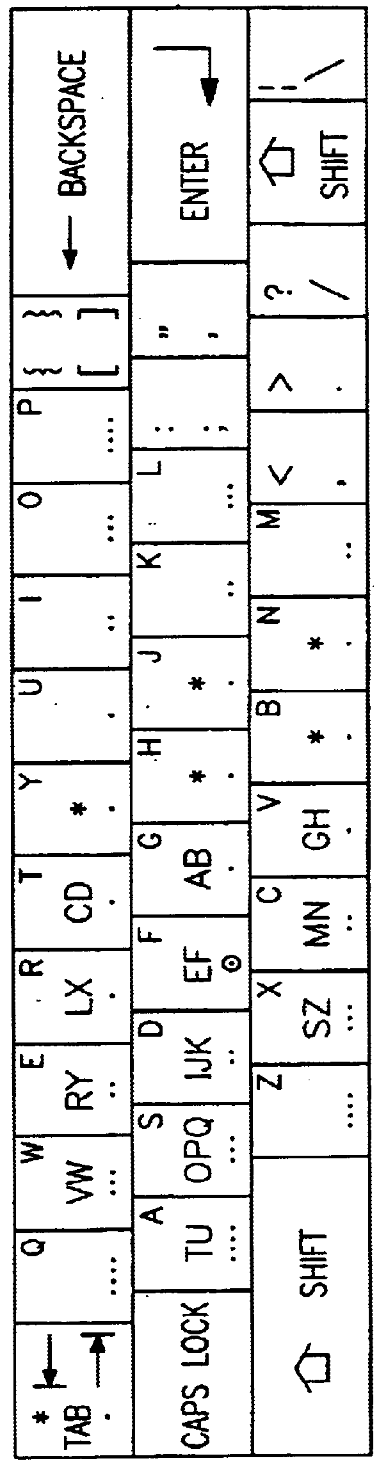
Figure 37C:
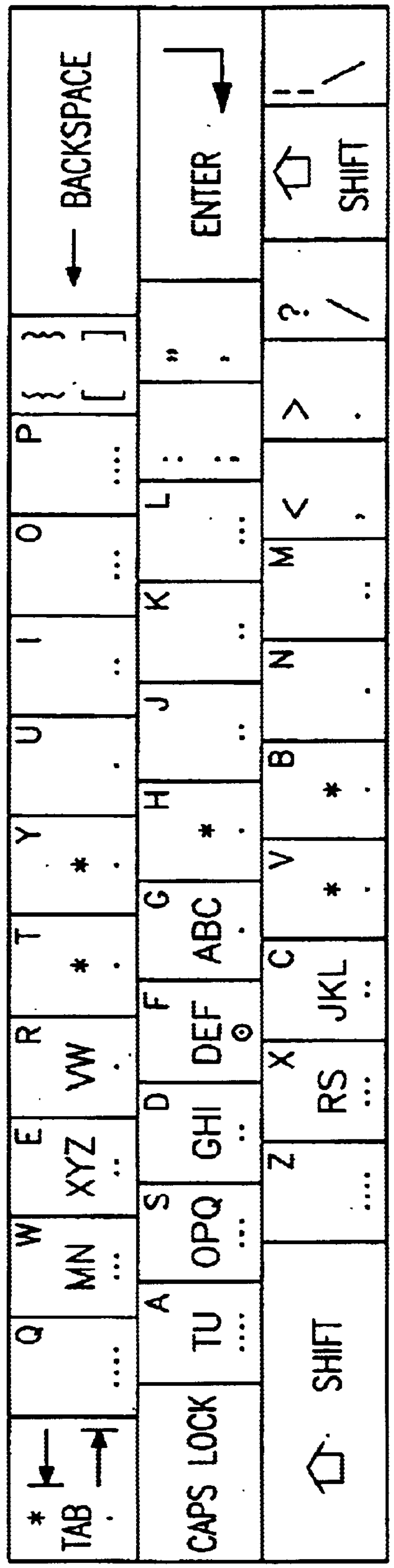
Figure 51A:
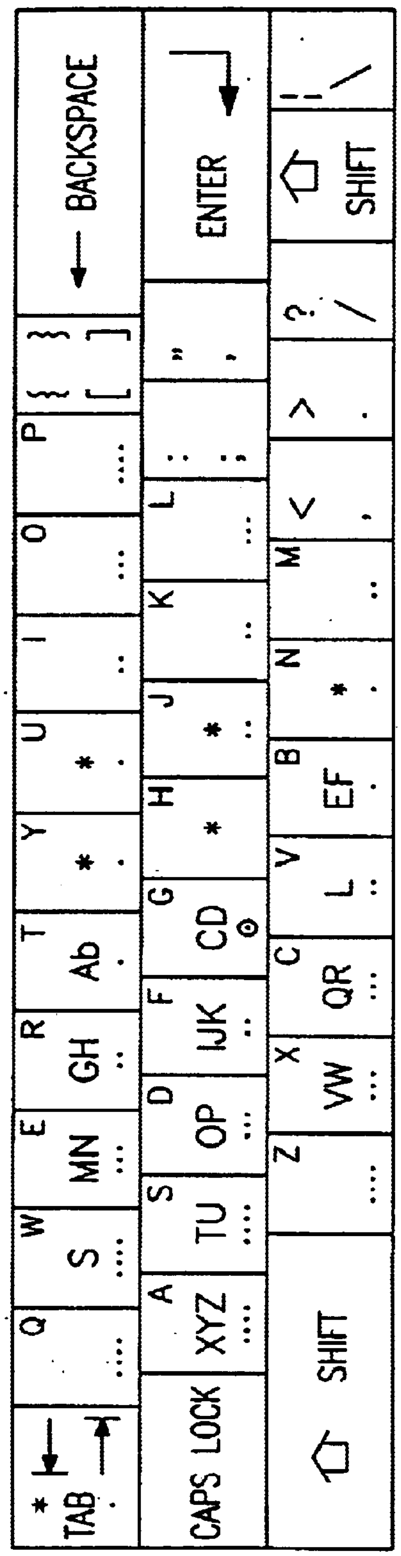
Figure 51B:
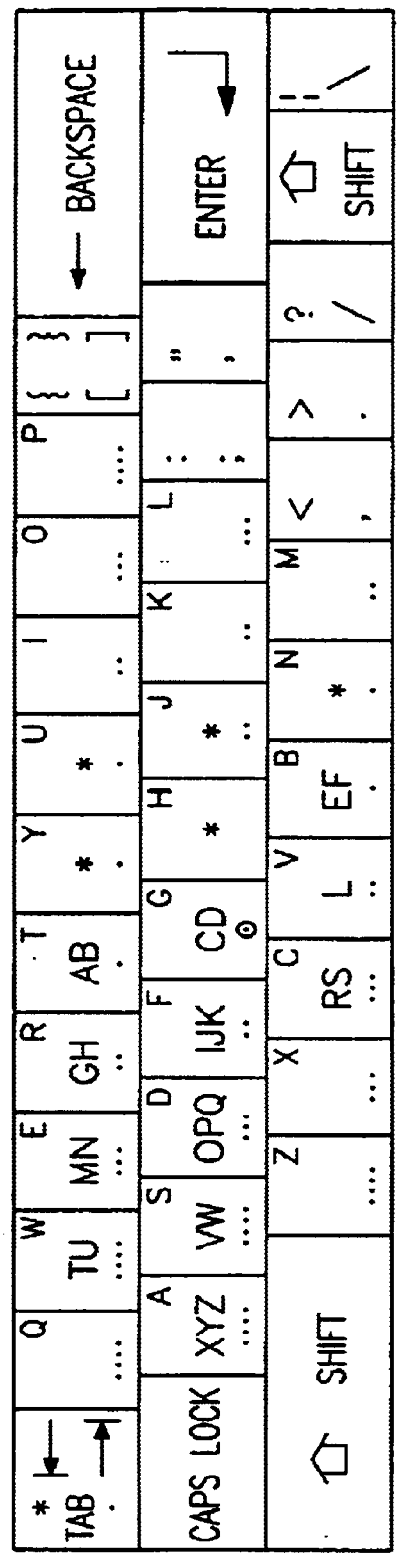
Figure 51C:
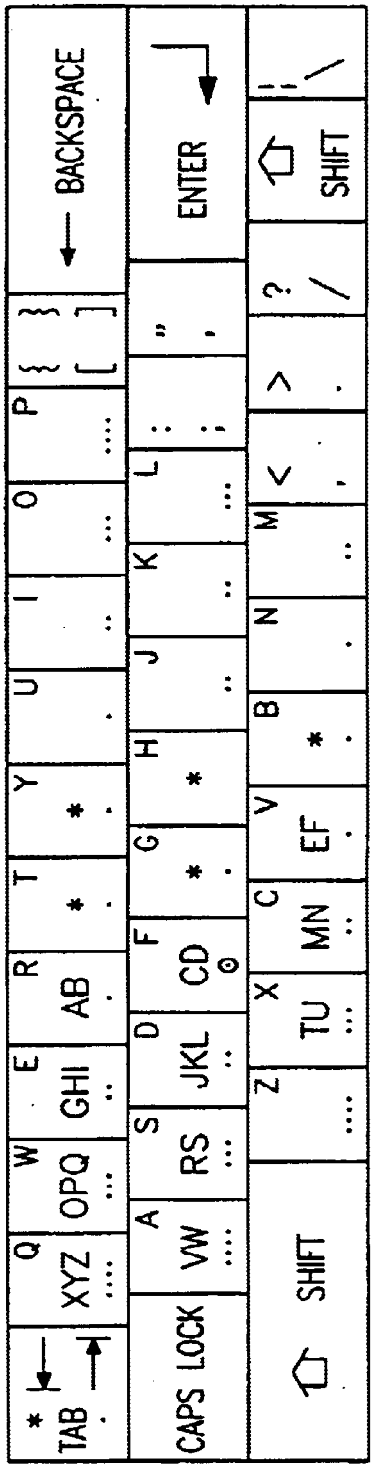
Figure 51D:
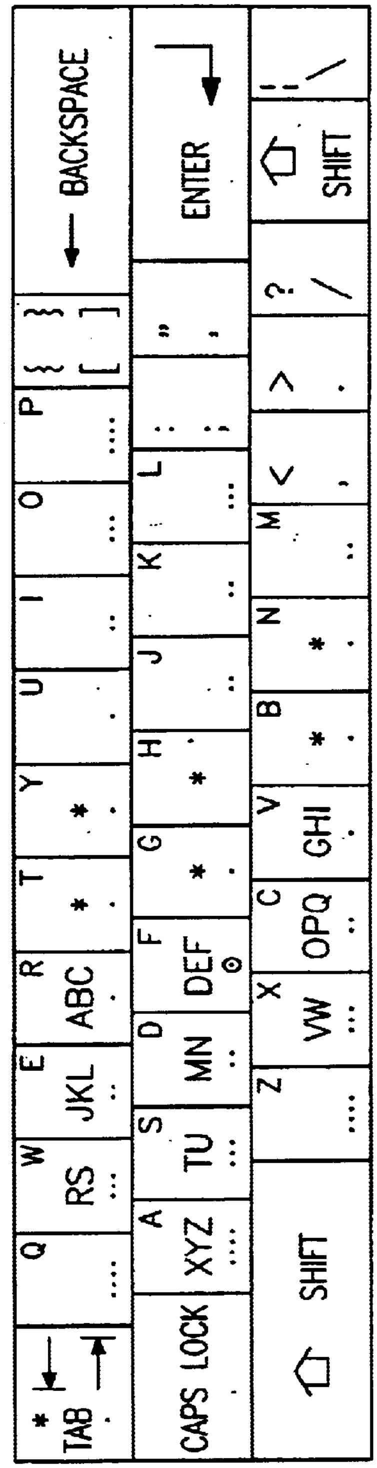
Figure 51E:
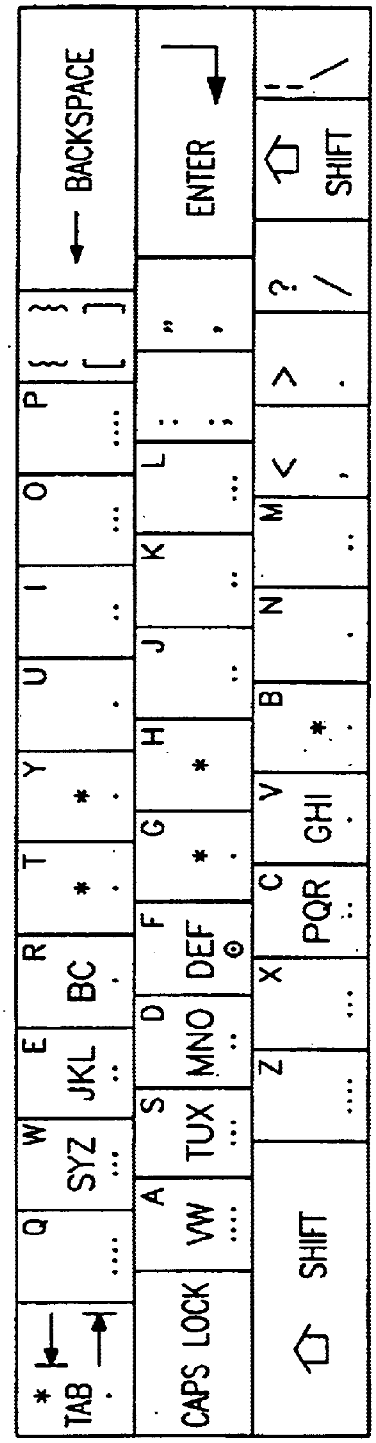
Figure 52A:
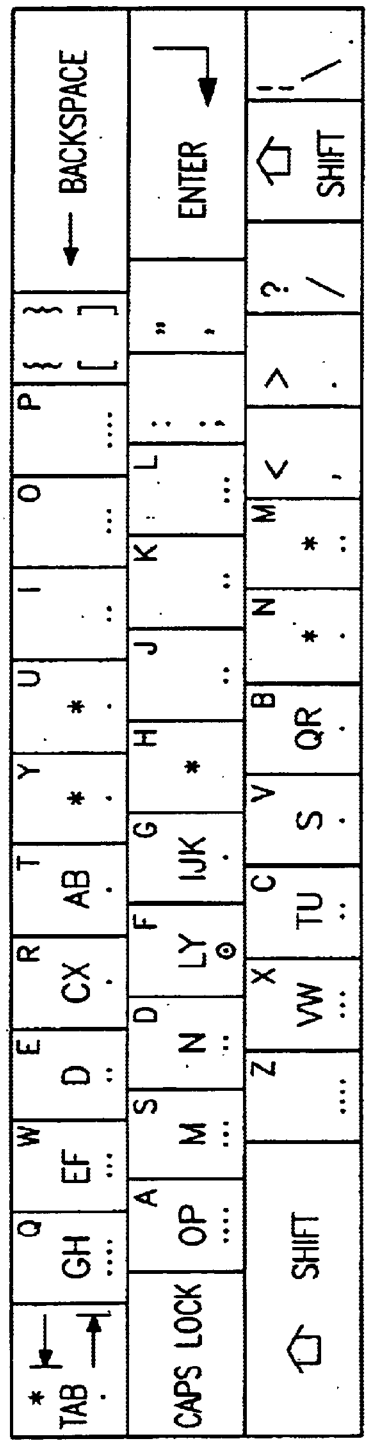
Figure 52B:
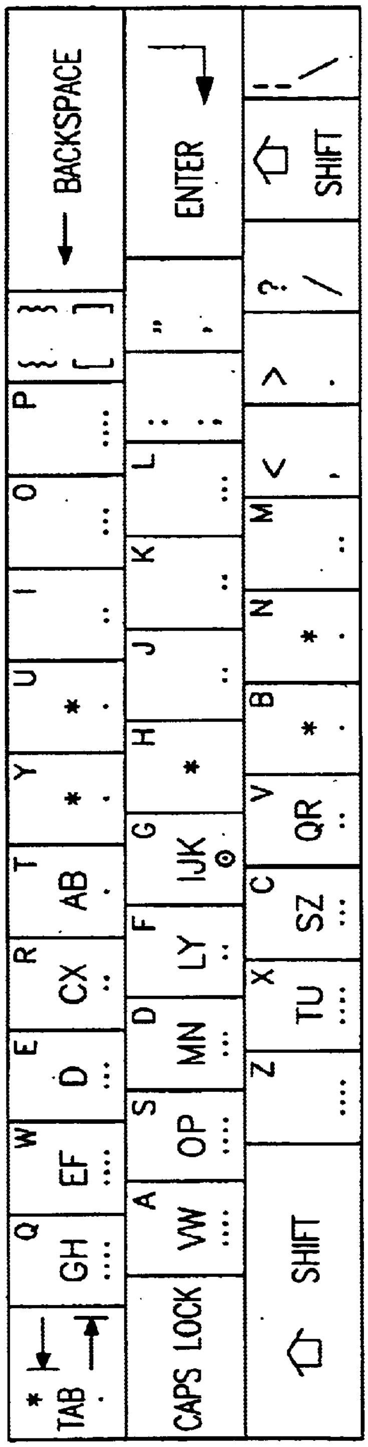
Figure 52C:
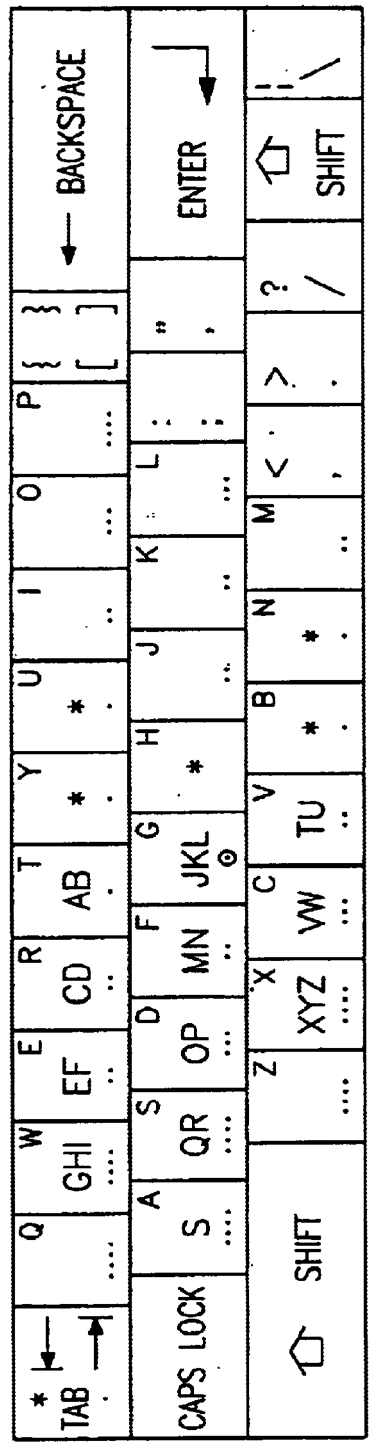
Figure 52D:
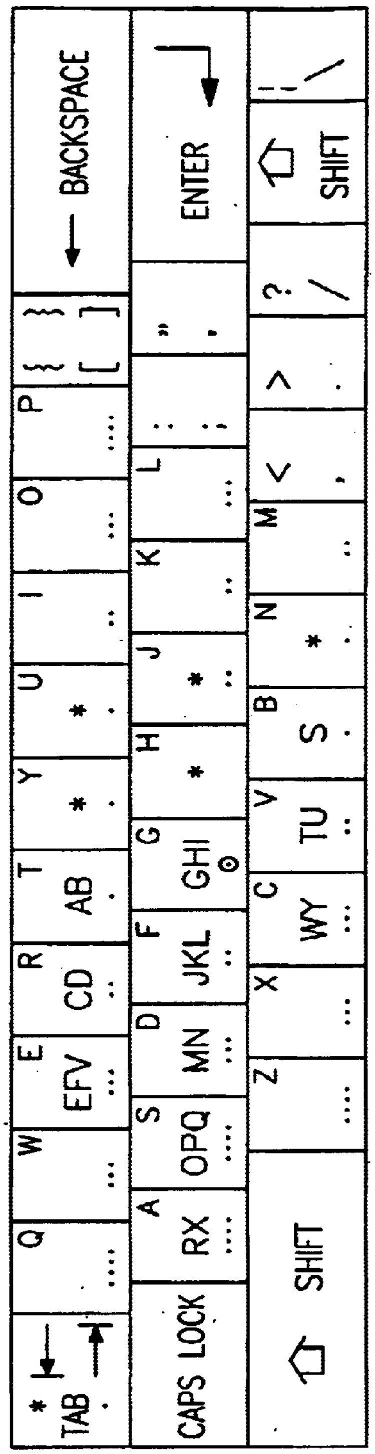
Figure 52E:
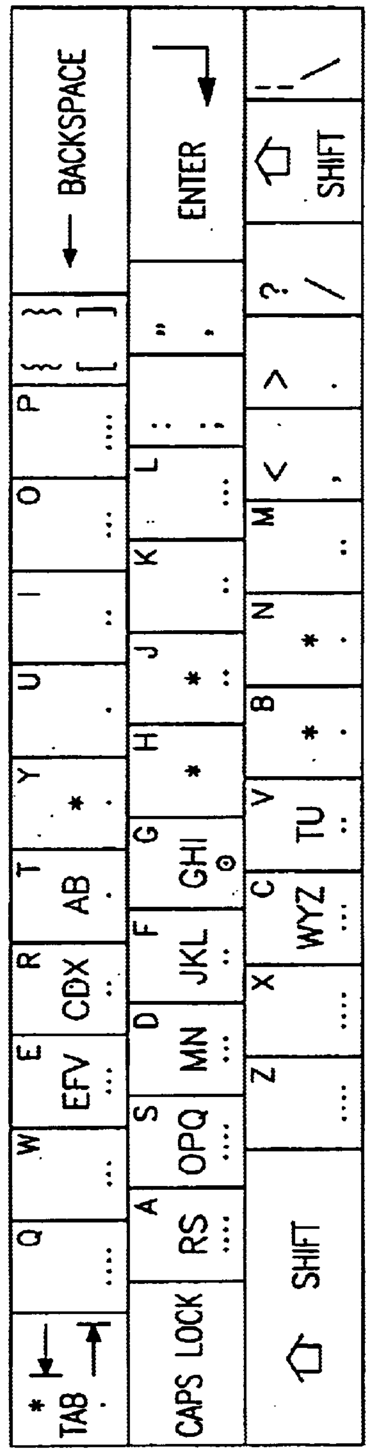
Figure 53:
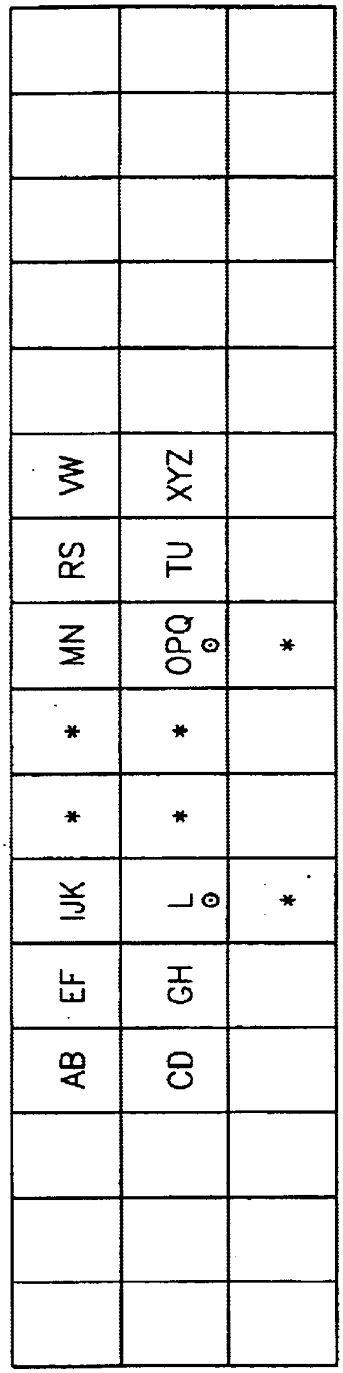
Figure 54A:
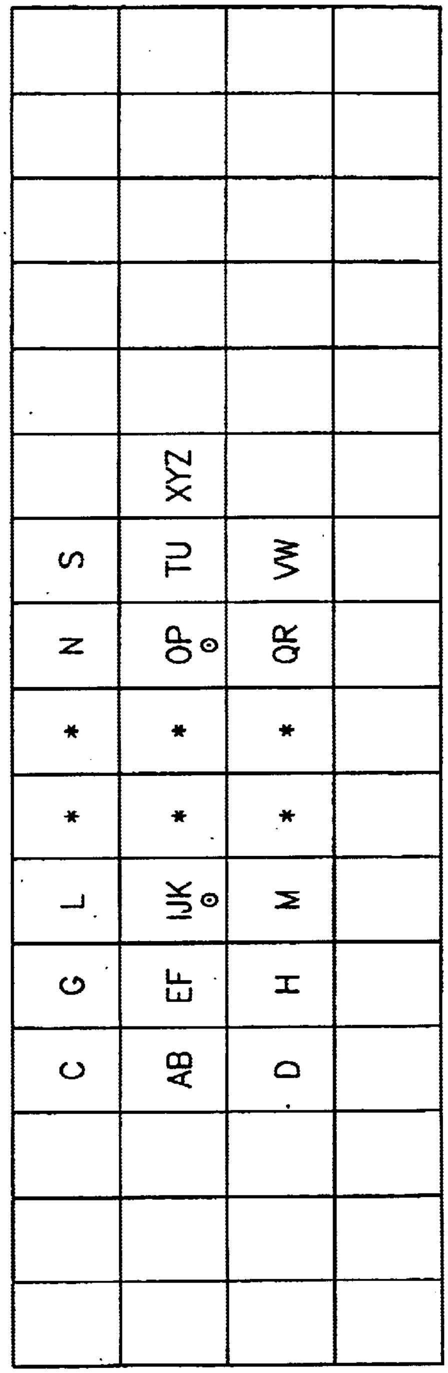
Figure 54B:
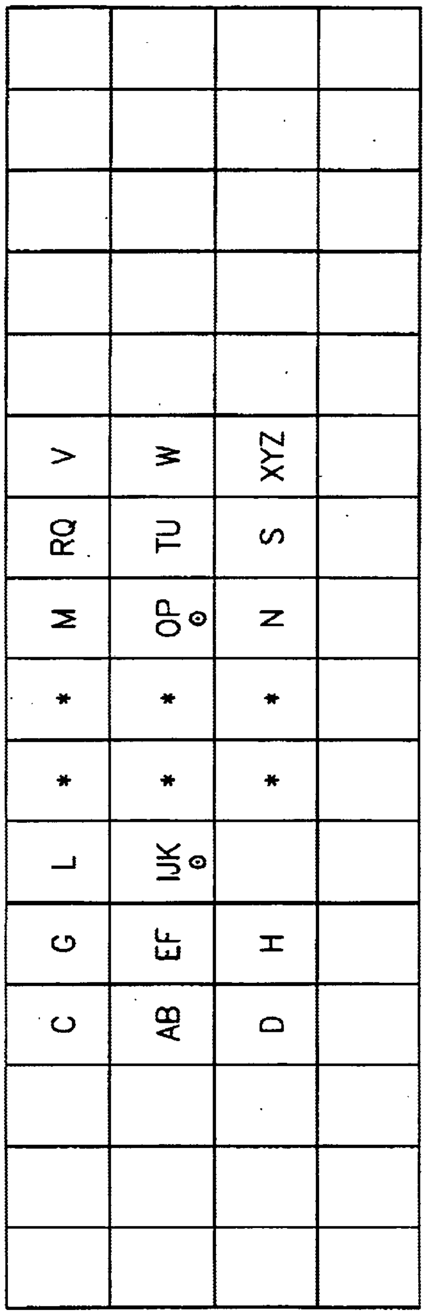
Figure 54C:
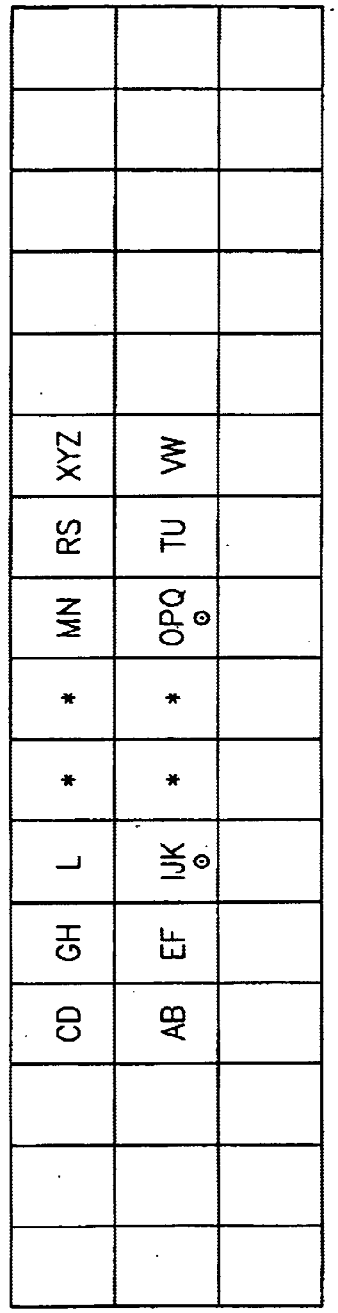
Figure 55C:
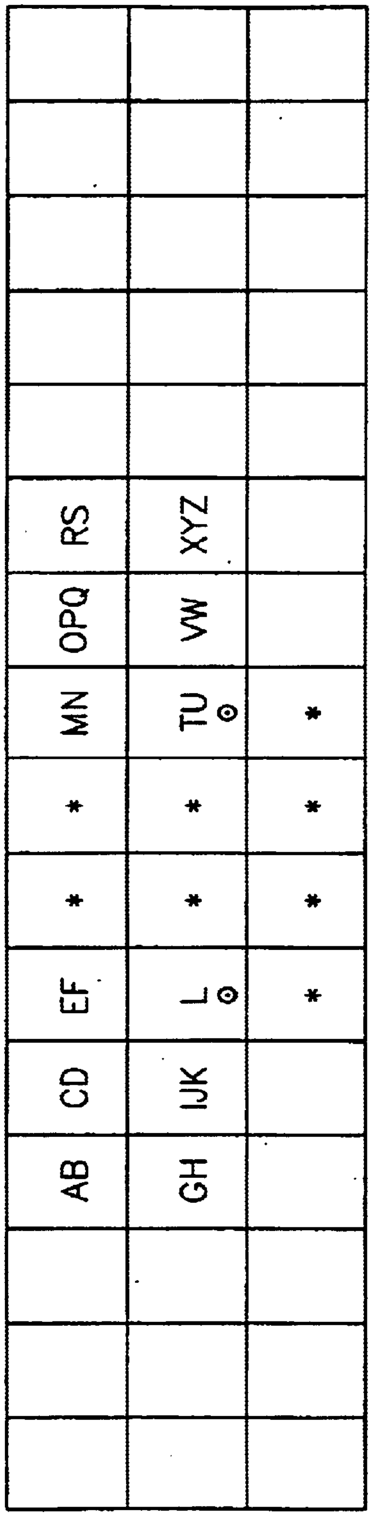
Figure 56:
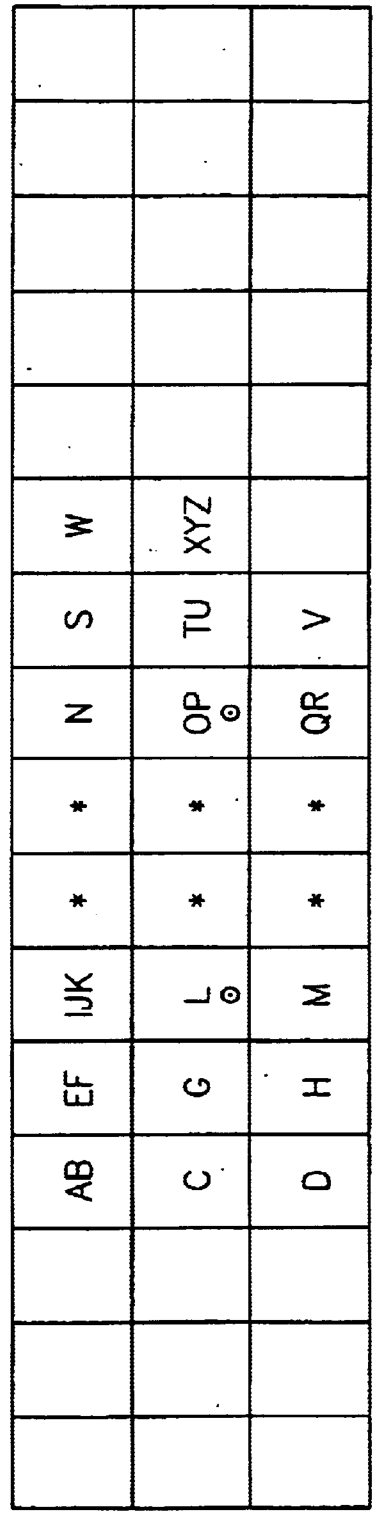

Pattern 3: In FIG. 33*a*, and 33*b*, the alphabetical, "vowel/consonant set" has a vertical pattern. Overall the entire alphabet is in a horizontal pattern.

With respect to being in a vertical or horizontal alphabetical placement on the keys, the alphabetical pattern of the "vowel/consonant set" and the overall alphabetical pattern of all the letters in the alphabet are in opposite directions in Patterns 1, 2 and 3, that is, when one is vertical the other is horizontal. This intertwining has an advantage in memorizing the keyboard. By recalling the location of the vowels the user can locate the consonants in alphabetical order to the vowel and vice versa.

All the attached figures do not have the relationship of the vowel/consonant set and the entire alphabet described above. However, they all have an overall alphabetical order. The letters chosen to be on the same key have been carefully chosen to maintain an alphabetical order and to minimize the number of unintended words.

The person using this system can select his preferred keyboard based on the following considerations:

1) The arrangement of the keys on the keyboard—a staggered pattern or a rectangular grid 2) The preference regarding typing with both hands or only the right hand or only the left hand 3) The arrangement of the letters on the keys, that is, the user's preference with respect to configurations 1, 2, or 3 preferred.

4) The number of keys to which the letters are assigned.

See FIG. 59 for a summary of the keyboard designs with respect to the above considerations.

The chart below describes the keyboard designs attached.

TABLE 9

| FIG. # | Staggered | Rectangular | Configuration | Pattern # | # Keys |
|---|---|---|---|---|---|
| 31a | X | | Both | 1 | 17 |
| 31b | X | | Both | 1 | 16 |
| 31c | X | | Both | 1 | 15 |
| 31d | X | | Both | 1 | 14 |
| 31e | X | | Both | 1 | 12 |
| 32a | X | | Both | 2 | 17 |
| 32b | X | | Both | 2 | 16 |
| 32c | X | | Both | 2 | 15 |
| 32d | X | | Both | 2 | 14 |
| 32e | X | | Both | 2 | 12 |
| 33a | X | | Both | 3 | 17 |
| 33b | X | | Both | 3 | 16 |
| 33c | X | | Both | Overall horizontal | 15 |
| 33d | X | | Both | Overall horizontal | 14 |
| 33e | X | | Both | Overall horizontal | 12 |
| 34a | X | | Left or right | 1 | 14 |
| 34b | X | | Left or right | 1 | 13 |
| 34c | X | | Left or right | 1 | 12 |
| 34d | X | | Left or right | 1 | 11 |
| 34e | X | | Left or right | 1 | 10 |
| 35a | X | | Left or right | Overall horizontal | 12 |
| 35b | X | | Left or right | Overall horizontal | 11 |
| 35c | X | | Left or right | Overall horizontal | 10 |
| 35d | X | | Left or right | Overall horizontal | 10 |
| 35e | X | | Left or right | Overall horizontal | 11 |
| 35f | X | | Left or right | Overall horizontal | 9 |
| 36a | X | | Left or right | Overall horizontal | 14 |
| 36b | X | | Left or right | Overall horizontal | 13 |
| 36c | X | | Left or right | Overall horizontal | 12 |
| 36d | X | | Left or right | Overall horizontal | 11 |
| 36e | X | | Left or right | Overall horizontal | 10 |

TABLE 9-continued

| FIG. # | Staggered | Rectangular | Con-figuration | Pattern # | # Keys |
|---|---|---|---|---|---|
| 37a | X | | Left only | 1 | 13 |
| 37b | X | | Left only | 1 | 12 |
| 37c | X | | Left only | 1 | 10 |
| 51a | X | | Left only | Overall vertical | 13 |
| 51b | X | | Left only | Overall vertical | 12 |
| 51c | X | | Left only | Overall vertical | 11 |
| 51d | X | | Left only | Overall vertical | 10 |
| 51e | X | | Left only | Overall vertical | 9 |
| 52a | X | | Left only | Overall horizontal | 14 |
| 52b | X | | Left only | Overall horizontal | 13 |
| 52c | X | | Left only | Overall horizontal | 12 |
| 52d | X | | Left only | Overall horizontal | 11 |
| 52e | X | | Left only | Overall horizontal | 10 |
| 53a | | X | Both | 2 | 12 |
| 54a | | X | Both | 1 | 15 |
| 54b | | X | Both | 1 | 17 |
| 57e | | X | Left or right | 3 | 15 |
| 57f | | X | Left or right | 1 | 15 |
| 58H | | X | Left or right | Overall vertical | 10 |
| 54c | | X | Both | 1 | 12 |
| 55a | | X | Both | 3 | 16 |
| 55b | | X | Both | 3 | 17 |
| 55c | | X | Both | 3 | 12 |
| 56a | | X | Both | 2 | 12 |
| 57a | | X | Left or right | 1 | 15 |
| 57b | | X | Left or right | 2 | 15 |
| 57c | | X | Left or right | 2 | 12 |
| 58G | | X | Left or right | Overall vertical | 16 |
| 58a | | X | Left or right | Overall horizontal | 9 |
| 58b | | X | Left or right | Overall horizontal | 15 |
| 58c | | X | Left or right | Overall horizontal | 12 |
| 56d | | X | Left or right | Overall horizontal | 10 |
| 58f | | X | Left or right | Overall vertical | 10 |
| 58e | | X | Left or right | Overall vertical | 9 |

The user will decide which design he prefers. The user may desire to start with a small keyboard and gradually advance to one with more keys.

For illustrative purposes, we provide the following example regarding the typing of a word and the display observed by the user. When the word "FRIEND" is entered using the keyboard shown in FIG. 31*a*, the keys with the letters shown in the middle of the key are depressed. The display would then read EF, R, IJK, EF, N, D. If the user saw on the display this sequence of letters he would have difficulty recognizing the word, FRIEND. Furthermore, if the display of the desired word appeared on the screen after all the letters were entered, the user would not know until after the word was typed if a spelling mistake was made.

However, if the user saw the series of displays shown in FIG. 40, Case 5, for the word "friend," the operator could focus on the line beginning with the letter, "f," and could see the word being formed as each letter was entered and then would have a better chance to catch an error. In addition, many typists may find it helpful to see the word being typed while it is being typed and not just when the word is completed.

Method I

The first of four methods is discussed below for the user to see the word being formed as each letter is entered even though more than one letter is assigned to some of the keys. The term sequence is used in this disclosure to describe a series of letters which may or may not be a word. The term sequence is used to emphasize that the user can enter any sequence of letters. In these explanations, it is assumed that the QWERTY keyboard is being used for the input of the letters. However, it could be a keyboard where the keys are not staggered but in a rectangular grid. Also, some code other than the ASCII code could be used.

In addition, the switches which are closed when the key on the QWERTY keyboard key is depressed could be closed by some other means, such as the focus of the eye; the principle features of this disclosure still apply. The QWERTY keyboard shown in FIG. 31*a*, is the standard layout for the letters of most typewriters and computer keyboards. The QWERTY keyboard letter assignments, referred to as the "QWERTY letters", are shown in the upper right corner of the keys on the keyboard in FIG. 31*a*.

Other letters may be assigned to the keys, for example, the letters printed in the middle of the keys in FIG. 31*a*. The letters shown in Col. I and Col. II of FIG. 38, are based on the letter assignments shown in FIG. 31*a*. The letters shown in the middle of the keys (as shown in FIG. 31*a*) are the letters assigned to implement the typing method in accordance with this disclosure and are referred to, herein, as the "redefined letters". When a key on the QWERTY keyboard is depressed, the SCAN code for that key, which is determined by its position on the keyboard, is transmitted to the computer, where a program would normally translate the SCAN code into the ASCII Code for the QWERTY letter.

In order for the "redefined letter" to be displayed, instead of the QWERTY letter, it is necessary to translate the SCAN code (or the ASCII code for the QWERTY letter) to the ASCII code for the "redefined letters".

In order for the word "friend" to appear on the screen, as each key is depressed, the program will (1) cause each redefined letter to be displayed as it is entered, (2) determine where each redefined letter should be displayed and (3) to determine which of certain letters or sequences previously entered should be eliminated so that there is space for the next line of text to be displayed.

FIG. 39 shows how the letters are displayed when a word is entered. This is shown in the sentence, "He is very frail." The letter assignments shown in FIG. 31*a*, are used in the examples used for explanation. The first key depressed to display the word FRAIL, is the key to which the letters "E" and "F" are assigned. The first letter ("E") is placed in the home line after the last word previously entered, (the word, "very"), and the letter "F" is displayed below the "E".

Every word in the dictionary is placed in memory using the ASCII code for each letter of the alphabet. When a key is depressed a program (such as a keyboard enhancer or keyboard driver or a macro program) monitors the SCAN code as it is received and translates it to the ASCII code for the "redefined letter" assigned to that key. Whenever such terms as keyboard enhancer or keyboard driver are used, these terms include similar software programs that can be used for such purpose.

The ASCII code is then used to search the dictionary to determine if there is a word in the dictionary with the same sequence of letters. However, the redefined letter(s) for the first letter(s) entered may be displayed without such a search because each letter of the alphabet is the first letter of some word. The ASCII code for the redefined letters matches the ASCII code used for the letters in the dictionary file.

As each key is depressed after the first entry, the ASCII code for the redefined letter(s) is used to determine if there is a word in the dictionary file with the same sequence of letters previously entered plus the current input.

The ASCII code which has been entered for the redefined letters, is matched to the ASCII code for the letters of the words in the dictionary. When a key with one or more redefined letters assigned to it is depressed, each redefined letter assigned to that key is tested separately to determine if there is a word in the dictionary which matches the sequences previously entered and the letter being tested. If a match is found, the letter being tested is displayed.

For example, if the word "friend" is being entered, the first letter "f" is entered without searching the dictionary for a match because every letter is the first letter of some word. A match for the second letter may be found in the word "fracas", and a match for the third letter, "I", may be found in the word, "friable". Thereafter, the matches for the remaining letters are found in the word "friend". Since, in this example, a match is found for each input, the sequence would be put on display as it was entered.

However, if a letter was entered and a match was not found, a message would be displayed on the screen, such as, "No MATCH Found". When this occurs the user should realize that either (1) a misspelling has occurred or (2) he is entering a sequence of letters not listed in the dictionary. The user may decide, in either case to continue typing. If the user then depressed a key to which one or more than one letter was assigned then each of those letters would be added to the sequence entered prior to the display, "NO MATCH FOUND". The user could at any time select a sequence, which is correct to that point and thereby eliminate any other sequences and continue to add letters to the sequence until it was complete. Methods for doing this are discussed more fully later in this disclosure.

After the user has completed the input for a "desired sequence",(Call this "sequence A"), there may be more than one sequence displayed. (Refer to these as "sequence A, A1, A2, - - - An".) The user would then select the desired sequence which would either be in (a) the home line or the "equivalent of being in the home line" or in (b) a row below the home line as shown in FIG. 40, case #3, if the desired word was "relax" and not the word "relay". The "equivalent of being in the home line" means that there is no other word in the home line and the sequence desired by the user is at the top of the list of any sequences below the home line. An example of the above is found in FIG. 40 case 8, $5^{th}$ col. The term, in the "home line", or "home row", hereafter, includes the sequences which are in the "equivalent" of being in the "home line."

If "sequence A" is in the "home line," the user would then depress the space bar. As a result, (1) the sequence(s) below the home line would then be eliminated and (2) the space (call this "Space X") required between "sequence A" and the first letter of the next sequence to be entered will be made. If "sequence A" is below the home line, "Input X," an input which results from depressing a key or other means describes below, causes: (1) "sequence A" to move to the home line and (2) the other sequences (above and below "sequence A") to be eliminated and (3) "space X" to be made. "Input X" may be initiated by any of the six methods listed below.

(1) By depressing "selection key #1": If "sequence A" is one row below the home line, and "selection key #1" is depressed one time. Each additional row that "sequence A" is below the home line would require and additional press on selection key #1.
(2) By depressing "selection Key #2": (a) If "sequence A" is two rows below the home line and "selection key #2" is depressed one time. (b) If "sequence A" is three rows below the home line, and selection key #2 is depressed two times. (c) Each additional row that "sequence A" is below the home line would require an additional press on "selection Key #2".
(3) By depressing a scroll key.
(4) By highlighting "sequence A" or by using a pointing device.
(5) By depressing a number listed next to each sequence or by speaking that number into a microphone.
(6) By voice recognition: the program would provide that when there is more than one sequence listed, an audible signal would be given so that the user is informed that a choice must be made. These words may be made audible. The user could select the word or letters by vocalizing it. The voice recognition system would identify the word or letters with the help of the confirmation provided by the letters that had been entered.

"INPUT X" causes a space to be made between "sequence A" and the first letter of the next sequence (space X). When a letter or a sequence is moved from below the home line to the home line, the user may desire to have it moved to the home line without "space X" being made, in order to do the following (1) form a "New Word", (2) Complete a word after the message on the display read "No Match Found" or (3) in order to focus better on the entry being made prior to completing it. The letter or sequence can be moved from below the home line to the home line without "space X" being made. The two methods to do this are referred to as "Input Y":

1) The user could first depress a designated function key, for purpose of explanation, call this "F(X)", and then use "selection keys #1 and #2". or
2) The user could use a different set of selection keys, "selection key #3" and "selection key #4." "Selection Keys #3 and #4" would function like "selection Keys #1, and #2" respectively, except they would not cause "Space X" to be made.

In addition, without first depressing F(X), the program may provide that "selection key #1 and #2" may be used to move the first letter of a sequence from below the home line to the home line without "space X" being made. For instance, "selection key #1", if depressed, could cause the letter "F", in the line below the home line in display #1, case 5, in FIG. 40, to move to the home line without space X being made. Selecting the first letter, significantly reduces the number of unintended sequences displayed.

If the user depressed "selection key #1 or #2", to move "sequence A", not yet completed, to the home line without first depressing F1, "space X" would be made. To correct this, the user could backspace, either before or immediately after the next letter was entered. The program would then recognize that "sequence A" was continuing.

If the user caused the letters or sequences below the home line to be eliminated and it was a mistake to do so, the user could place the insertion pointer so that it is located after the sequence entered into the home line by mistake, and then by depressing a designated function key, the sequence(s) eliminated would be displayed. The user would then select the desired sequence.

After the user has completed a desired sequence of letters, it is the preferred method to enter any desired punctuation mark before depressing the space bar, or INPUT X. However, if the user depressed the space bar and then entered the desired punctuation mark, the program would recognize this series of inputs and the program would provide that the desired spaces would be made between "sequence A", the punctuation mark and the first letter of the next sequence, without any additional input required by the user.

When the word "FRIEND" is entered FIG. 40, CASE #5, the following occurs. (Assume the keyboard shown in FIG. 31*a* is used). The user enters the first letter of the word "FRIEND" by depressing the key assigned the redefined letter "F". The redefined letter "E" is also assigned to that key (see FIG. 31*a*). The SCAN code for the key assigned the redefined letters "E" and "F" is sent to the keyboard enhancer. This code is redefined by the keyboard enhancer to the ASCII code for the letter "E" and the ASCII code for the letter "F". Since, the first letter of the word being entered might be either letter, they are both displayed. The program is so designed that the first letters entered are displayed as shown in FIG. 40 Case #5, and in FIG. 39. That is, the letter "e" is displayed in the "home" row and the letter "F" is displayed below the letter "E".

The user next depresses the key assigned the redefined letter "R". The SCAN code for that key is sent to the computer and is redefined by the keyboard enchancer to the ASCII code for the letter "R". The ASCII code in the dictionary is then searched for a match to the sequences "ER" and "FR". They are both found so the letter "R" is then displayed as shown in FIG. 39 and FIG. 40. The user next depresses the key assigned the redefined letters "I", "J", and "K". The SCAN code for that key is sent to the keyboard enhancer. This code is redefined to the ASCII code for the letter "I", the letter "J" and the letter "K".

The ASCII code in the dictionary file is then searched for the sequences "ERI", "ERJ", "ERK", "FRI", "FRJ" and "FRK"; and only the sequences "ERI" and "FRI" are found. The letter "I" is displayed as shown in the third column in FIG. 40. The sequences not found ("ERJ", "ERK", "FR", and "FRK") are not displayed.

The next entries, the redefined letter E and the redefined letter F, cause the sequence ERI to be eliminated because the sequences "ERIE" and "ERIF" are not found in the dictionary. However, the sequence "FRIE" is found to have a matching sequence in the dictionary. Also, when the subsequent keys are depressed, the entries are processed as described above and the matching sequences for these subsequent entries, the letters "N" and "D" are found in the dictionary and displayed.

Since the sequence, "FRIEND", is the only sequence displayed, the user can depress the space bar, and the system is ready for the next word. At any time, during the process described above, the user may select the first letter or a sequence below the home row and cause it to be moved to the home row and thereby cause the other letters or sequences to be eliminated. For instance, in case #5, FIG. 40, the user could have selected the letter "f" after the first letters "E" and "F" were displayed (see Col I).

Some words such as "revile" (FIG. 40, Case 4), are entered without displaying an unintended sequence, i.e., only one word is displayed after all the letters are entered. The entry of the word "revile" is described below.

The first input in the word "revile"—the redefined letter "r" can be entered without verification in the dictionary file that there is a "match", because each letter of the alphabet is the first letter of some word. Therefore, when the SCAN code is translated to the ASCII code for the first redefined letter, of a word, that letter is automatically displayed.

The second letter, the redefined letter, "e," is on the same key as the redefined letter "f". Therefore, the sequences, "re," and "rf," must be searched to verify that there are words in the dictionary with one or both of those sequences. In this case, only a sequence with "re" is found. The letters are then displayed (see FIG. 40, Case #4, 2$^{nd}$ column). The next letter entered is the redefined letter "V". The sequence "REV" is searched in the dictionary and a match is found. Therefore, the third column in FIG. 40, Case #4, shows the letters "REV". The fourth input in entering the word "revile" is the redefined letter "I". The redefined letters I, J and K are on the same key. The sequence "REVI" is found in the dictionary, but "REVJ" and REVK are not found.

The fourth column, of FIG. 40, Case #4, then shows revi". The redefined letter "L", the fifth input, has no other letter on the same key. So only the sequence "revil" is checked to verify the that there is a matching sequence in the dictionary. The sixth input, the redefined letter "e", has the redefined letter "f" on the same key. A matching sequence is found for the letter "e" but not for the letter "f". The display for the word "revile" is now completed. The user can visually verify that the entries made are correct.

Next, the user enters a punctuation mark, if one is desired, and depresses a space bar, and the system is ready for the first letter of the next sequence.

In FIG. 40, Cases 8 and 9, show the same sequences treated in two ways. In Case 8, each sequence remains in the same line until selected or eliminated. In Case 9, each sequence is moved up into the closest space to the home line and into the home line, if that space is available. The program can be written so that the user has the opportunity to select one of these two methods as the preferred method. The preferred method would always be used, unless, the user elects to change that choice.

As noted in FIG. 40, a keyboard entry which has more than one letter associated with it results in the requirement that each of the sequences of letters then displayed must be tested with each additional letter (separately) to determine which of those sequences results in a sequence for which a match is found in the dictionary. (If parallel processing is used, more than one letter may be tested at a time). If a match is found, the sequence with the letter tested is displayed. A match is found to a sequence if the dictionary word has the same letters in an identical order. The dictionary word may be longer but not shorter. The sequences to be displayed or eliminated are explained by the following example: If the letter "t" and the letter "u" are each tested (as in FIG. 40, Case #1) and a match is found for the sequence "grea" but not for the sequence "greb" then the sequence "great" is displayed and the sequence "greb" is eliminated. If no match were found for either sequence, then all possible sequences would be displayed as discussed later in this disclosure. FIG. 40, Case #10, the word in the home line, ARID, is selected, by depressing the space bar. The beginning of the word "bride" has been entered, but the sequence "BRID" is eliminated because the word "ARID" is selected by the user. If the user decided to enter the sequence "BRID", he could do so. In FIG. 40, Case #2, the sequence "babe" is eliminated because there was no match in the dictionary for "babe" plus the letter "t" or the letter "u".

The user may prefer not to make an immediate choice between sequences displayed (call this editing) but to do such editing later. When in this "delayed selection mode," each sequence listed below the home line is moved next to the sequence in the home line each time the end of a sequence is indicated by a "delay selection key input." These sequences ("a, a1, a2 - - - An") are placed in brackets or underlined or both and/or appear on the screen in color. The "delay selection key input" may be either:

1) a key dedicated to this use, i.e. it is not assigned any other function, and/or
2) a key that is not dedicated to this use, such as the space bar or "selection key #2", provided a designated function key, is first depressed. (For explanation purpose call this key F-3)

After F-3 is depressed all entries would be in the "delayed selection mode." If F3 has been depressed and the space bar is designated the "delay selection key," then "selection key #1 and #2" may continue to be used to make selections. If instead, "selection key #2" is designated the "delay selection key," then the space bar and "selection key #1" may continue to be used to make selections. The depression of a delay selection key indicates that "space X" should be made and the sequences in the home line and below the home line should be held in memory and displayed as required for the "delayed selection program."

When in the "delayed selection mode," it is required (as in the immediate selection program) that the sequence must match a word in the dictionary. This requirement may be changed to provide that the number of the letters in the sequence must match the number of letters in the dictionary word when the end of the sequence is indicated. For instance, in FIG. 40, Case 10, the word "arid" would be displayed and the sequence "brid" would be eliminated. If there was no matching word found for "arid" or "brid", then the display would show a symbol or display the message "word not found," and a beeper would sound. All possibilities for the sequence would be listed either in the text being typed or in a window at the bottom of the display.

When the operator desires to make a selection between such words listed in the home line, the insertion pointer would then be placed immediately after the word in the home line where editing was to begin. If the sequences which require selection are listed side by side, the user could select the desired sequence by using the "selection keys #1 and #2." The program would provide that the user could select the desired word by depressing "selection keys #1 or #2" or by the input of a number or highlighting or clicking on the desired word or any other method described above. At anytime, the user could come back to a place which requires editing, by placing the insertion pointer after (or before, if the program is so written) the word for which a choice of words is desired and then select the desired word. If a section of text is being edited for such selections, the insertion pointer would move automatically to the next group of letters or words, which require that a selection be made. By depressing a designated function key, the user can return to the preferred program which provides that the selection be made before entering the next sequence. This method of editing applies to all the programs described in this disclosure.

The letters assigned to the QWERTY keyboard (the standard keyboard), listed in Col I of FIG. 38, are referred to as the QWERTY letters. These letters are found in the upper right corner of each key in FIG. 31. In the methods described in this disclosure there are other letter assignments to the QWERTY keys which are shown in Col II of FIG. 38 and are shown in the middle of each key in FIG. 31*a*.

Methods II and III are the same as Method I, except as explained below.

Method II

Col II of FIG. 41 is a section of the list of words in the dictionary. That list is stored in the dictionary file in ASCII code. Col I of FIG. 41 is a list of the same words found in Col II. However, the binary code found in Col I is made up of code which would be received if the code for the QWERTY letter shown in the upper right corner of the key shown in FIG. 38*a* was sent to the computer as the code for the letter shown in the middle of the key in FIG. 38*a*. Thus, the word "cat" in Col I is stored in the ASCII code for the letters "wsk" because the letter "C" (shown in the middle of the key) was assigned to the key on the QWERTY keyboard which when depressed transmits a code to the computer which is translated as the letter "w." The letter "A" was assigned to a key (as shown in the middle of the key in FIG. 38*a*) on the QWERTY keyboard which when depressed transmits a code tot he computer which is translated as the letter "s." The letter "t" in the word "cat" is explained in a similar manner. Thus, Col I and II of FIG. 41 are formed.

The ASCII code is used to locate in Col I, of the dictionary file, FIG. 41, the matching letter. When the letter is found in Col I of the dictionary file (FIG. 41), the ASCII code for the letter on the same line, in the contiguous column of the dictionary file, Col II, is read and that letter is displayed. The position (i.e., $1^{st}$, $2^{nd}$, $3^{rd}$ . . . Nth letter) of the letter in the word in Col I is in the same position (i.e., $1^{st}$, $2^{nd}$, $3^{rd}$ . . . Nth letter) as the letter in the word in Col II.

If the user enters the word "CAT" the following occurs: the letter "c" would be entered and displayed as discussed above. However, since every letter is the first letter of some word, the first letter of a word may be determined by redefining it rather than searching the dictionary as described below for the subsequent letters. The information in FIG. 38, Col I and Col II, would be put into a memory. By searching Col I of FIG. 38 for the ASCII code which is received after a key is depressed, and then displaying the letter found in Col II of FIG. 38, the dictionary search is made unnecessary for the first letter.

The user then depresses the key assigned the letter "A". (as shown in the middle of the key in FIG. 31*a*). The letter "A" and the letter "B" are assigned to the same key as the QWERTY letter "S" (See Col I and Col II, FIG. 38). This results in the SCAN code for that key being transmitted to the computer and that code being translated to letter "S". Col I of the dictionary file is then searched for the ASCII code for the letter "S". The search is made in the dictionary file for a word with the second letter, "S", provided that such word starts with the ASCII code for the letter "W". This sequence is found for two cases (1) The sequence "CA" in Col I and the sequence "CB" in Col II (Assume that abbreviations are included in the dictionary). The user then depresses the key assigned the letter "T". (as shown in the middle of the key in FIG. 31*a*) The letter "T" and the letter "U" are assigned to the QWERTY letter "K". (See Col I and II, FIG. 38.)

In a manner similar to that described for the letters "A" and "B" a search is then made in Col I of the dictionary for the QWERTY sequence "WSK". (See FIG. 41.) The sequence "CB" is eliminated because neither "CBT" or "CBU" is found. However, the sequence is found for two cases (1) where the sequence in Col II (next to the WSK sequence in Col I) is "CAT" and (2) where the letter sequence is CAU (next to the WSK sequence in Col I). They are both displayed since "CAU" are the first letters of longer words, such as "CAUSE". The user selects "CAT" and "CAU" is eliminated.

Method III

The selection of the letters and the data sent from the keyboard to the computer is the same as that of Method II. However, as an additional method to implement the invention, the dictionary file in Col I (FIG. 42) has asterisks placed after the ASCII code for those letters assigned the same ASCII code. Thus, each letter has a unique code. The letter "A" and the letter "B" are assigned to the "S" key on the QWERTY keyboard. The letter "A" in the dictionary file is assigned the ASCII code for the letter "S" plus one asterisk, the letter "B" in the dictionary file is assigned the ASCII code for the letter "S" plus two asterisks. The assignments of the code and asterisks assigned to the format used in the examples below are shown in Col I and Col II of FIG. 43. A section of the dictionary file is shown in FIG. 42.

Method III is now described using the example of entering the word "CAT". The operator depresses the key assigned the letter "C" (as shown in the middle of the key in FIG. 31*a*) and the SCAN code for that key would be sent to the computer where it is translated to the ASCII code for the letter "W". The ASCII code for the letter "W" is found in Col I of the dictionary file. However, since, this is the first letter of a word, the ASCII Code for the letter "W", would be searched in Col I of FIG. 42 where it is found. The ASCII code in Col II, on the same line as the ASCII code for the "W" in Col I, is the ASCII code for the letter "C". The letter "C" would then be displayed.

Next, the key with the letter "A" in the middle of the key is depressed. The SCAN code for that key wold be sent to the computer where it is translated to the ASCII code for the letter "S", which would then be searched in Col I of the dictionary (Table 11). "S*" and "S**" would both be found in sequences that began with the letter "W". Those sequences are "WS*" and "WS**". The "S*" and "S" would then be redefined by using Col I and II of FIG. 43**, in a manner similar to that used for the letter "W" and the letters "CA" and "CB" would be displayed. The key assigned the letter "T" would then be depressed and the ASCII code for the letter "K" would be sent to the computer and searched in Col I of the dictionary file for sequences that begin with the ASCII code for "WS*" and "WS**". The sequences WS*K* and WS*K** would be found. The K* and K** would be redefined as described above for the letter "A" and the letters "CAT" and "CAU" would be displayed. The operator would then depress the space bar and the word "CAT" would be selected and the sequence "CAU" would be eliminated. The program is ready for the next word.

This same program would enable the user to substitute a different keyboard format, including any of the formats shown in the Figures attached and the variations in these formats described in this disclosure. This would result in Col I and Col II of FIG. 42, being changed accordingly.

Method III includes a program to process the dictionary words in order to create a word code list for Col I of the dictionary. To do this, each letter of the words in Col II of the dictionary, FIG. 42, is redefined in accordance with the assignments made for each letter such as those shown, for example, in FIG. 43. If a new format is defined the dictionary list must be adjusted to that format.

Method II includes a program to process the dictionary words in order to create a word list for Col I of the dictionary. To do this, each letter of the words in Col II of the dictionary, FIG. 42, is redefined in accordance with the letter assignments such as those shown, for example, in FIG. 43.

It is to be noted that sequences of letters are entered whether or not a matching sequence is found for a word in the dictionary. If the user depressed a key to add a letter to a sequence, for example, to add the letter "R" to the sequence "REL", and no match in the dictionary for that additional entry is found, an audible warning (a beep) would be given and/or a message on the screen would read "No Match Found". The cause of this would either be (a) a misspelling or (b) a word not listed in the dictionary (a "new" word) was being entered.

To determine the cause, the user may find it useful to access the dictionary to check the spelling and to examine the words listed. The user would then depress a designated function key and highlight the sequence of letters, "relr", on the display. The list of words in the dictionary, starting with the last matching sequence found in the dictionary for the sequence entered, in this case "REL", would be displayed in the rows below and directly beneath the sequence of letters "relr" (or in a window at the bottom of the display). The dictionary words may be scrolled. The user can select the desired word from that list so that it would moved to the home line.

If one of the words on the display is highlighted and the specified designated function key is depressed, a list of synonyms or antonyms of the word highlighted would be displayed.

The user can correct spelling mistakes in the usual manner. If there are sequences of letters displayed, then a correction of the letter would be made at the top of the list of such sequences. Then all sequences below that line would also be corrected.

The user can depress a designated function key FX, which changes the program from the format being used to the 26 letter keyboard format, that is, one letter per key. The word can then be entered without any ambiguity. The user can move in and out of this format at any time.

When using Method I, II or III, if a match for an entry is not found in the dictionary, all the possible combinations of the inputs subsequent to not finding a match are appended to the sequence then displayed and a message to the user is displayed, such as, "Word Not Found". FIG. 44 shows the display that would appear if the sequence "FRIEND" was not found and all possible sequences of the letters entered are displayed. (Note: The display shows 12 sequences after the input of the last letter.) After the last letter is entered in the sequence, the user can enter a punctuation mark, if one is desired, and then if the desired sequence is in the home line, depress the space bar, or if the desired sequence is below the home line, the user would then depress a selection key, or use some other selection method, to move the desired sequence to the home line. The sequences below the home line would be eliminated, the space required between "sequence A" and the first letter of the next sequence would be made and the user can enter the first letter of the next sequence.

If the user depressed "selection key #3 or #4" or if the user depressed the designated function key, F1, and the "selection key #1 or #2", the user could select a sequence before it is complete and cause it to move to the home line. The other sequences would be eliminated and the user could continue to type and the subsequent entries would be added to the sequence moved to the home line. The process described above could continue until the desired sequence was selected.

An example of selecting a sequence before completion, is shown using the example shown in FIG. 44, where all possible combinations of the sequence "FRIEND" was displayed. Table 8 shows the display if after the third display, in FIG. 44, the sequence "FRI", was moved to the home line by depressing a selection key. The displays after that input would be as shown below in Table 8. (By the input of the last letter there are two sequences displayed.)

TABLE 8

| Display # | IV | V | VI | VII | VIII |
|---|---|---|---|---|---|
| | FRI | FRIE<br>FRIF | FRIEN<br>FRIFN | FRIEND<br>FRIFND | FRIEND |

The word "FRIEND" is displayed in the home line in display VII. If the user then depressed the space bar, the sequences below the home line would be eliminated and the program would be ready for the first letter of the next sequence. In this example, all the remaining desired inputs, were displayed immediately in the home line. If this had not been the case, and the sequence desired by the user was displayed below the home line, the desired sequence would then have been moved to the home line by depressing the appropriate selection key and the other sequences above and below the home line, if any, would have been eliminated. The program is then ready for the first letter of the next sequence.

Method IV

The following rules are followed to enter a desired sequence of letters in accordance with this Method referred to as Method IV. This Method may be used independently or in conjunction with Methods I, II or III. If Method IV is used, for instance, with Method I, then the process of searching for a matching sequence in the dictionary is, also, used. See FIG. 45, for example of words being displayed using Method IV by itself, Method I by itself and a combination of Methods I and IV.

Method IV, is particularly useful when entering a "New" Word. The number of times that the selection key must be used with this method depends on (1) the number of keys to which letters are assigned (2) the selection of letters assigned to those keys and (3) the use of statistical information, discussed below, regarding which sequence should be placed in the home line. A selection key must be used approximately one time every two words with the letters assigned to the keyboard as shown in FIG. 48. (Based on FIGS. 46, 47 and 48*a* and *b*.)

The following explanation refers to using Method IV without using Method I, II, or III (that is, without searching for a matching sequence) Method IV is explained in the six "Rules" below and with reference to FIG. 45.

(1) A designated function key, F-2 is depressed, to implement the program for this method. If the user then depresses a key with one letter assigned to it, that letter will be displayed in the home line. If the user depresses a key with two or more letters assigned to it, those letters would be displayed vertically, one in the home line and the other(s) in Row(s) beneath it. See FIG. 45, Col 3, Method IV, for the word "Fourth". If the desired letter is displayed in a row below the home line, a selection key or one of the other methods described previously, herein, would be used to move it to the home line. Since function key F2 was depressed, "Selection keys, 1 and 2" are available for this purpose. However, F2 would not be depressed if a key dedicated to this program, selection key #5 was used instead of "selection keys 1 and 2".

(2) If the desired letter is displayed in the home line, as in display #1 thru 6, FIG. 45, in the sequence "desire", and in display 2, 4, 5 and 6 for the sequence "fourth", no input by a selection key is necessary.

(3) In this program, Method IV, if the desired letter is displayed below the home line, it is required to select that letter (such selection is shown by an asterisk in FIG. 45) before entering the next letter. If it is not selected, it will be eliminated when the next key is depressed. For example, if the user is entering the word "FOURTH", the letter "f", which is below the home line in the first display must be selected, otherwise, the program will assume that the letter "E" (which is displayed above the letter "F") in the home line is correct and when the next input is made, the letter, "f", below the home line would be eliminated. If the letter, "f", has not been selected the input of the next letter(s), confirms that the selection of a line below the home line will not be made and any sequences displayed below the home line should be eliminated.

(4) If a single letter is entered, it is displayed only in the home line because before that letter is entered the sequences below the home line have been eliminated or moved to the home line. For instance, for the word "fourth," after the input of the letters "t" and "u" in the 3rd display, the selection key is depressed and "FOU" is selected. Therefore, before the single letter "R" was entered in the fifth display, the home line was already determined to be "fou". If the desired sequence, when completed, is in the home line, the user may enter any desired punctuation mark, and then depress the space bar and the system is then rady for the first letter of the next sequence. If the desired sequence is below the home line, it is moved to the home line by use of the selection key assigned that line or one of the other methods previously described.

After a sequence has been entered the program would automatically move the user back one level in the menu structure to Method I, II, or III. However, if the user desired to stay in the program for Method IV, the user could do so by depressing another designated function key.

The above method can also be used for entering text. This selection method can apply to one handed or two-handed keyboards. An asterisk has been used in the attached figures, which show the keyboard designs, to designate the location of the selection keys and/or the designated function keys, F1 and F2.

The location of these selection keys is important if method IV is to be efficient in entering text. If method IV is used for entering text, no more than two selection keys would be needed if no more than two letters are assigned to each key. Certain keys which can be easily reached can be designated as the selection keys. For example, the keyboard shown in FIG. 31*a*, the keys assigned the QWERTY letters "G" and "H" may be designated as "Selection Keys #1 and #2", respectively, and the keys assigned the QWERTY letter "Y" and "B" may be the designated function keys, F1 and F2, respectively. If a letter is assigned to a key which is depressed with the right hand, the QWERTY lettered "G" key could be depressed with the left hand, either simultaneously or sequentially with the input of the lettered key.

The letters assigned to certain keys, may have an alphabetical order. However, the order which the letters are displayed on the screen may be placed in a non-alphabetical order to improve the likelihood that the desired word will be placed in the home line in Methods I thru IV. For instance, even though the letters K and L are on the same key, when that key is depressed, the letter "L" may be displayed above the letter "K" because of its higher frequency of use and, therefore, it is more likely that the desired word would occur in the home line. Also, the letter "S" is the first letter of words approximately twice as often as the letter "R" and the letter "S" is used about twenty-five percent more than the letter "R." Therefore, the sequences with the letter "S" should be displayed in the home line rather than the sequences with the letter "R" when they are on the same key. (See FIGS. 47 and 48*a*). The sequence with the highest frequency of use may be determined as each key is depressed.

As noted, the decision as to which sequence should be placed in the home line or closest to it may be based on certain statistical information regarding the letters that have been entered. The goal is to get the most likely sequence in the home line and the next most likely sequence on the line below the home line. Each letter and each sequence can be given a rank as to the likelihood of being used based upon the number of words which have that sequence. (Call this the "rank.") When a key is depressed with two or more letters assigned to it and a search is made in the dictionary for a matching sequence, and there is more than one matching sequence, the search may include not only verifying that a match is found, but the "rank" of both sequences. The user may play a role in determining the rank thru a program that would permit the user to give a "weight" to competing words which would result from the same input, e.g, sucn words as "aid and bid", "care and dare" and "might and "night".

The "rank" would determine the order of the words displayed. However, if the user prefers an alphabetical order of the display, he can set the program to do so.

FIG. 48 shows the frequency of use of each letter of the alphabet for the first letter of words in a dictionary. The letters I, J, and K are placed on the same key in most of the keyboard designs attached. The letters "I" is the first letter of 983 words, the letter "J" is the first letter of 179 words, the "K" is the first letter of 147 words. Also, based on a dictionary of 21,110 words, out of 106,000 letters, the letter I is used 8,000 times, the letter "J" is used 400 times, the letter "K" is used 800 times. It is clear that the letter "I" should be given priority over the letter j and K for the first letter of a sequence and elsewhere in the sequence.

The letters "O" and "P" may be located on the same key. The letter "P" is used as the first letter on 1772 words while the "O" is the first letter on 509 words, out of 21,110 words. Therefore, if the first key depressed of a sequence is assigned the letters "O" and "P" the letter "P" should be placed in the home line because it is more likely that the desired word begins with a "P". However, for letters, other than the first letter the more likely letter would be the letter "O". Out of 106,400 letters the letter "O" is expected to occur 8000 times and the letter "P," 2000 times. (see FIG. 47) This generality will not apply if the proceeding letter is a vowel.

The statistical evidence regarding the use of letters and sequences must also be weighed by the frequency of use of the words with which they are associated; such as for the sequences "ste", "sue" and "suf." There are approximately 70 words beginning with the letters "ste" and 3 words beginning with the letters "sue" and 13 words beginning with the letters "suf." A word beginning with the letters "ste" has a better likelihood of being the desired word than the words beginning with "sue" or "suf."

At the beginning of words or syllables, vowels usually follow consonants and vice versa. This factor would also be a determining factor in choosing which sequence should be placed in the home line. For instance, if the first and second inputs are "aa," or "ab," the "ab" sequence would be placed in the home line. There is one word which begins "aa", but there are many words which begin "ab."

The use of statistical information regarding the frequency that letters and sequences are used, combined with using the select key for the beginning entries of the words; can reduce the number of unintended words and thereby make keyboards with only eight to ten keys more acceptable.

A keyboard could be hard wired to send the SCAN code to the computer for the letters referred to as the redefined letters assigned to those keys (that is, the letters in Col II, Table 8) instead of the QWERTY letters. Also, the keyboard need not be separate from the computer but can be integrated with it such as with laptop, notebook or hand held computers.

In the attached figures, the letter on the top right hand corner on each key is the letter assigned to that key by the QWERTY keyboard format. In the middle of each key is the letter of the alphabet assigned to that key (i.e., the redefined letter). FIG. 31*a* also indicates which finger is to be used and the starting position for the index finger.

| | | |
|---|---|---|
| . | One dot | index finger |
| . . | Two dots | middle finger |
| . . . | Three dots | ring finger |
| . . . . | Four dots | little finger |

The symbol ○, indicates the starting position of the index finger. The single dot in the middle of the circle indicates that the key is assigned to the index finger and that this is the "starting position" of the index finger.

The Keyboard Letter Assignments Can be displayed for Review and Selection by the User The user indicates, by depressing a designated function key, that the user wishes to see the display showing the keyboard assignments that are available. The current keyboard assignment is also displayed. Next to each assignment is a Keyboard number. The user can click on that number (or enter that number) and the letter assignments of the designated keyboard are then entered into the typing program.

Assigning Letters to the Keys of the QWERTY Keyboard

A function key may be defined to cause the following message to be displayed as-follows: "This program enables the user to assign letters to each key of the QWERTY keyboard." This may be implemented in a variety of ways. For instance, the letters of the alphabet are listed in alphabetical order. When the cursor is placed next to a letter the user then depresses a key he wishes to assign to that that letter.

Dynamic Window

The letters being entered to form a word can be displayed in a dynamic window. The top row of this window is on line with the line being typed (i.e., the home row). The left side begins at the point where the next letter in the text would be entered. The bottom and right side of the window expands as needed. The window starts at a size and shape sufficient to accommodate at least four letters wide and two lines vertically and expands as needed. The dynamic window can be moved to any location on the screen by movement-of the insertion pointer. If the user depresses a designated function key, the letters can also be displayed one space after the last letter entered without being in a window.

Use of Blank Space

While typing a word, the user can insert "blank" spaces either to increase his typing speed or because the user is not certain of the spelling. The word(s) in the dictionary which are candidates for that input are displayed. The input for the blank spaces is either 1) a key designated for that purpose or 2) a space bar. If the space bar is used the sequences are displayed at the bottom of the display. Example—the word "kaleidoscope" is desired. The user enters KAL______ SCOPE or KAL________ ___PE and KALEIDOSCOPE is displayed. If the user entered KAL___ __________ (the number of spaces over four spaces does not need to be exact) then the words "KALASHNIKOV" and "KALEIDOSCOPE" would appear. The user would select the desired word, KALEIDOSCOPE, and KALASHNIKOV would be erased.

Adding a Word to the Dictionary

After a new word is selected by one of the methods described herein the user can elect to add it to the dictionary. The code letters are held in memory and the selection of each letter associated with that code is also held in memory. The word is entered into the dictionary unless the user elects otherwise by selecting the option "do not add to memory" which appears on the screen after completion of the selection of each letter associated with the word code.

In another embodiment of the invention, the keyboard can be integrated with a mouse. Since the keyboard can be small, e.g. 12 to 15 keys, there would be space on a mouse for all the keys. Thus, a user can type and control the mouse with one hand. The shift keys may be used to bring on punctuations and other functions. That is, if the shift key is used the keys assigned letters may instead input numbers or punctuation marks, or direction, or enter or cap lock, or other functions found on the keyboard.

In this disclosure, designated functions keys are used of calling up various programs. The escape key or another function key would be used to exit such programs.

When the user is entering a sequence of letters the program may detect that there is only one word base that satisfies the sequence thus far entered. The program could then cause the words that have that base to be listed automatically in rows directly below the sequence being entered in the home line. The user can then select the desired word. An example of his are the words; prefer, preferable, preferably, preference, preferential.

FIG. 38 is an assignment of letters to the keyboard as shown in FIG. 31*a* for Method I and II.

FIG. 39 is examples of the method of displaying words as letter entry is made.

FIG. 40 shows displays when sequences are entered for Methods I, II and III.

FIG. 41 is a sample of the dictionary file for Method II.

FIG. 42 is a sample of the dictionary file for Method III.

FIG. 43 is an-assignment of the letters to the keyboard for Method III.

FIG. 44 displays showing all possibilities for input of a "New" word.

FIG. 45 Examples of Method IV, Method I and Method I and Method IV combined.

FIG. 46 frequency of requirement for selection keys for Method IV.

FIG. 47 Frequency of use of letters in words.

FIG. 48A Frequency of use of letters for the first letter of words.

FIG. 48B Keyboard assignment for calculations.

FIG. 49 Letter assignments to keyboard with 9 to 17 keys. This invention applies to the method of typing with a keyboard, which has more than one Letter assigned to some or all of the keys yet the user to requires only one keystroke to select the desired letter. In addition, the user is able to see the word(s) being formed as each letter is entered and if an error in typing is made he can correct it immediately in a similar manner as in conventional typing, i.e. by backspacing and typing the correct letter(s) as well as some other methods. With the preferred assignment of letters to fourteen keys, when the input of the letters is complete and only using the space bar to enter the word, the desired word will be displayed on the top line of the window in over 98% of the words when using a dictionary of 84,532 words and only the input of the space bar is required to enter those words into the word document. Eighty percent of the remaining two percent will be displayed on the second line of the window and they can also be entered into the word document with a total of one keystroke. Using one of the preferred keyboards with 13 or 14 keys the user can select the letters for words not in the dictionary with an average of less than one and one-quarter keystrokes per letter. In other systems when more than one letter is assigned to the keys the user presses a delimit key to indicate that the word is complete. The word or words, which match the input are then displayed and those below the top line would require an additional input There is no opportunity to see the word while it is being entered and for that reason, correction of errors must await the completion of the word code or a careful evaluation of each series of letters to determine if an error was made. If the groups of letters associated with each input are displayed side by side or vertically it is very difficult to pick out the letters entered to verify that it is correct. With that system it is more likely that a typo error would be realized after the entry was complete and the intended word was not displayed. The system described in this disclosure has the advantage of the user having the opportunity to see the actual word being formed as each letter(s) is entered. Therefore, when he presses the space bar he can move on to the first letter of the next word without hesitating. On the other hand the person who is typing and cannot see the words entered until after the space bar is pressed, may tend to hesitate after pressing the spacebar to verify that the word entered is correct before proceeding with the next word and this would slow down the input.

With the system described in this disclosure the user can in one display, because of the way the letters and sequences are displayed, relate the letters to the sequences which facilitates the input required for corrections. Also, selections can be made by scrolling a desired letter or sequence into the top line This invention applies to the method of typing with a keyboard, which has more than one Letter assigned to some or all of the keys yet the user to requires only one keystroke to select the desired letter. In addition, the user is able to see the word(s) being formed as each letter is entered and if an error in typing is made he can correct it immediately in a similar manner as in conventional typing, i.e. by backspacing and typing the correct letter(s) as well as some other methods. With the preferred assignment of letters to fourteen keys, when the input of the letters is complete and only using the space bar to enter the word, the desired word will be displayed on the top line of the window in over 98% of the words when using a dictionary of 84,532 words and only the input of the space bar is required to enter those words into the word document. Eighty percent of the remaining two percent will be displayed on the second line of the window and they can also be entered into the word document with a total of one keystroke. Using one of the preferred keyboards with 13 or 14 keys the user can select the letters for words not in the dictionary with an average of less than one and one-quarter keystrokes per letter. In other systems when more than one letter is assigned to the keys the user presses a delimit key to indicate that the word is complete. The word or words, which match the input are then displayed and those below the top line would require an additional input. There is no opportunity to see the word while it is being entered and for that reason, correction of errors must await the completion of the word code or a careful evaluation of each series of letters to determine if an error was made. If the groups of letters associated with each input are displayed side by side or vertically it is very difficult to pick out the letters entered to verify that it is correct. With that system it is more likely that a typo error would be realized after the entry was complete and the intended word was not displayed. The system described in this disclosure has the advantage of the user having the opportunity to see the actual word being formed as each letter(s) is entered. Therefore, when he presses the space bar he can move on to the first letter of the next word without hesitating. On the other hand the person who is typing and cannot see the words entered until after the space bar is pressed, may tend to hesitate after pressing the spacebar to verify that the word entered is correct before proceeding with the next word and this word would slow down the input.

With the system described in this disclosure the user can in one display, because of the way the letters and sequences are displayed, relate the letters to the sequences which facilitates the input required for corrections. Also, selections can be made by scrolling a desired letter or sequence into the top line before it is completed, which eliminates sequences not desired and puts the desired sequence at or near the top line while the typing continues. The system described herein is very similar to conventional typing because the user has the opportunity to see the letters forming the desired word. When the user presses the space bar in this system, it indicates the acceptance of the letters that are displayed as well as the completion of the word. To further facilitate the typing process, a section of the dictionary is displayed starting with words that are in alphabetical order to the desired word. (displayed on the top line of the letter lines). These words can be displayed, in the bottom section of the dynamic window. This enables the user to verify the spelling or enter long words by typing the beginning of a word and then selecting the word from the dictionary list and causing it to be entered directly from that list into the word document. These advantages along with typing with fewer keys make the typing process faster and easier.

Figure 59A:
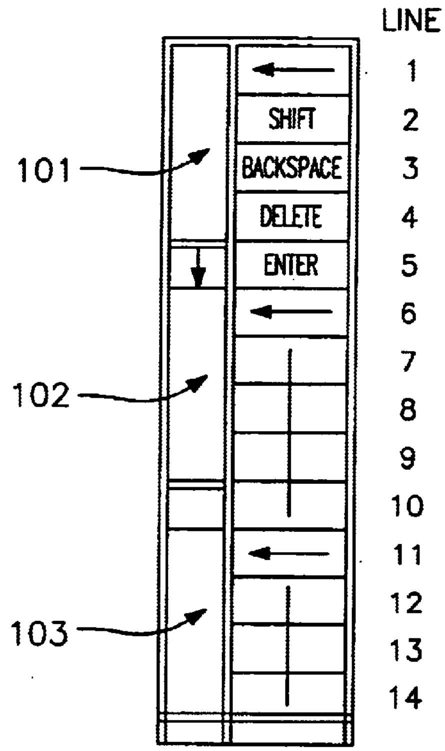
Figure 59B:
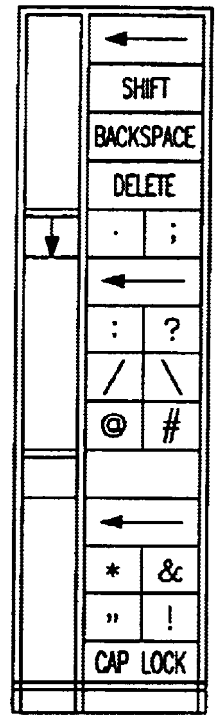

In this invention, a dynamic window is used to display the sequences for which matching words in the dictionary are found. When the user starts the process of entering text he uses the cursor controls to move the cursor to the location on the screen where he wants the next letter(s) or words to be displayed on the screen. The user next clicks onto an icon or depresses a function key which causes the window shown in FIG. 59*a*, to be displayed. FIG. 59*a* shows the dynamic window before any letters have been entered. In this figure, arrows in lines 1, 6, & 11 are each pointing to a rectangular space, 101, 102, & 103 in FIG. 59*a*, referred to as the "grid area" (the area for the sequence lines, the letter lines and the dictionary lines, respectively). When the first letter of a word is entered by pressing a key, the letter(s) assigned to that key will be displayed in two sections of the grid area, the sequence lines and the letter lines described below. As letters are entered in the grid area, the window becomes larger by expanding to the right a sufficient space for the letters associated with that input to be displayed in the grid area. Each letter that is entered will be displayed in a small square. This helps the user to see the alignment of the sequence lines, the letter lines and the dictionary lines.

Figure 59F:
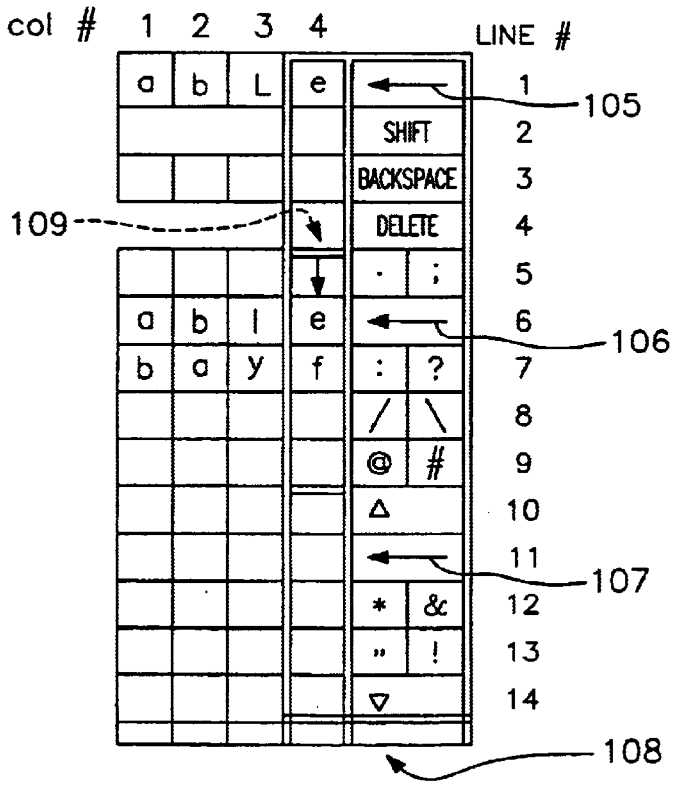
Figure 60A:
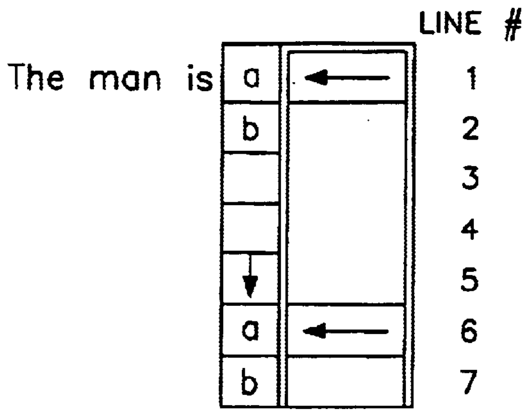
Figure 60B:
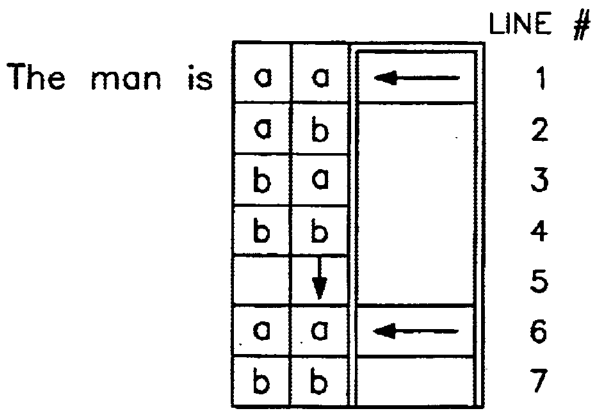
Figure 60C:
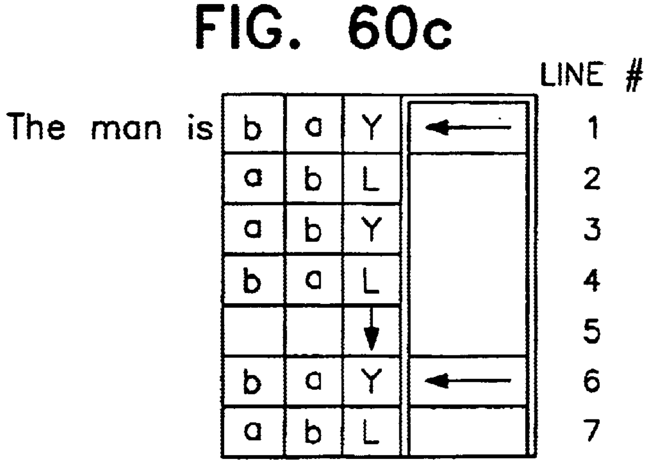
Figure 60D:
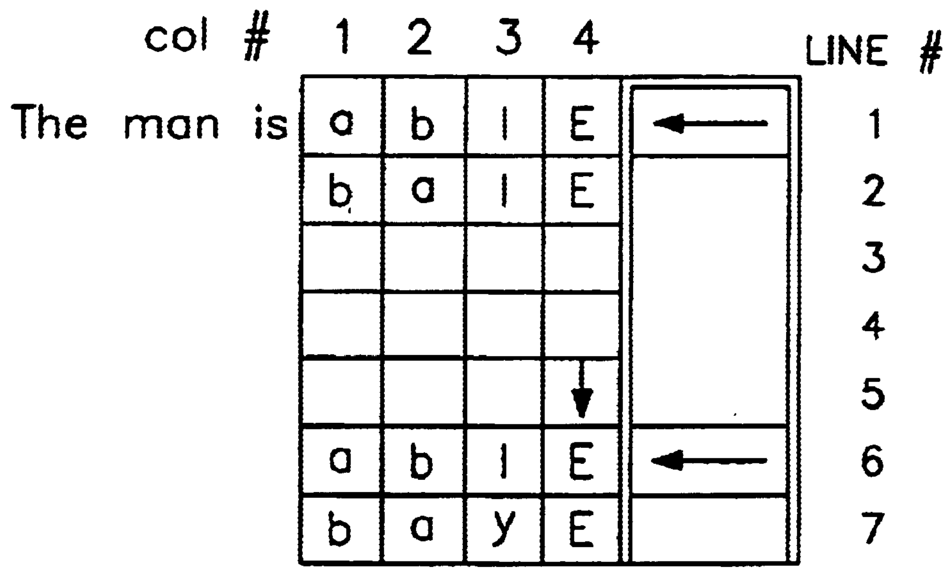
Figure 60E:
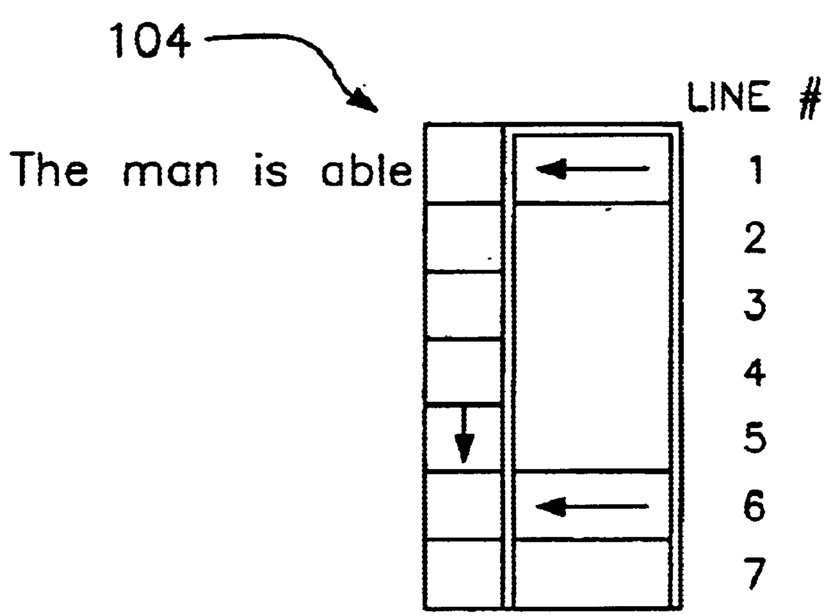

FIGS. 60*a, b, c, d* & *e* show the changes in the grid as each letter is entered. (The dictionary lines are not shown in FIG. 60.) It may be noted that the words "The man is" stays in their same position as each letter is added to the word, "able", being entered. Also, the left side of the window remains in the same position until the complete word has been entered in the window. As each letter is added, the grid area in the window becomes wider. After the word has been completed the user clicks on the desired word or presses a key which causes the desired word to move from the window to the word document. FIG. 60E, shows the word "able" has moved to the word document to a position to the left of the cursor, (104 in FIG. 60E). The cursor continues to be adjacent to the outside left edge of the window, and the window has moved to the right the required space for the letters and symbols to be entered into the word document. The grid area is then reduced to the width required for the first letter of the next word to be entered, (See FIG. 59*a*). The top four lines (Lines 1 thru 4 FIG. 59F) of the window to the left of the horizontal Arrow, 105 in FIG. 1F in line 1 are use to display sequences and are referred to as the "Sequence Lines" or the "S" lines. When the control keys are focused on these lines, it is referred to as the "Sequence Mode". Lines 6, 7, 8, & 9, to the left of the horizontal arrow in line 6, are used to display the letters associated with each input and are referred to as the "Letter Lines" or "L" lines. When the control keys are focused on these lines, it is referred to as the "Letter Mode". Lines 11, 12, 13, & 14, to the left of the horizontal arrow in line 11 are used to display the dictionary words in alphabetical order to the sequence displayed in line one. These lines are referred to as the "Dictionary Lines" or "D" Lines and when the control keys are focused on these lines, it is referred to as the "Dictionary Mode". After the word has been typed into the window, there may be words displayed on lines 1, 2, 3, & 4. When in the sequence mode, the letters entered in the sequence lines are letters that form sequence(s) for which matching sequences of letters were found in the dictionary (which is in memory) beginning with the initial letters entered (See FIGS. 60A to 60E Lines 1 through 4). The letters associated with this input are shown on Lines 6 & 7 of FIGS. 60A–60E. As each input element is entered the series of letters for which a matching sequence was found in the dictionary are displayed on the sequence lines. The letters displayed in FIG. 60B in Line 1, 2, 3, & 4 could be for such words as, aardvark or able, bale, or BBC and in FIG. 60C for such words as bay, able, abyss, bale. As each letter(s) is entered the number of words found in the dictionary that match the input is reduced.

For example, when the fourth input element is entered with the letters, E and F, assigned to it, all the words except "able" and "bale" are deleted as possible candidates for the word being entered. By pressing the space bar, "able" is entered into the word document ("Bale" would have required the input of select key #1 or that the user scrolls the word to the top line and press the space bar). In FIG. 60C it is noted that the shortest word (in this case the word "bay") is placed at the top of the Sequence Lines. The program will provide that the sequences which are completed are given top priority, those sequences which show the highest statistical likelihood of being the desired sequence are given the next highest order of priority to be in or near the top line. Among words of the same length the most often used words are given the highest priority. This requirement increases the opportunity to enter more words with only one input.

If more than one match in the dictionary is found for a sequence they are displayed in the sequence lines. If a letter(s) is entered, and at least one matching sequence is found, those sequences for which a match is found after a letter associated with that input is appended to it, will remain displayed and the sequencers) for which no match was found will be eliminated. If no match is found for any of the sequences for which a match was found prior to the last input, then such sequences will remain displayed and will continue to be displayed in black type up to but not including the last input. The last input and any additional letters will appear in red. If the user presses the space bar, the sequence then in the top line of the sequence lines will move from the window to the word document and will be displayed in black if a matching sequence was found in the dictionary and in red if a matching sequence was not found. If the user presses select key #1, the sequence one line below the top line will move from the window to the word document. If the desired sequence is more than one row below the top line, the user can scroll it to the top line and then press the space bar. Sequences moved to the word document from lines below the top line will also be displayed in red or black in the word document depending upon whether a matching sequence was found. Also, it is noted that the letters associated with each input are displayed in the letter lines and these letters and the other sequences are removed from the window display when the space bar or select key #1 is pressed.

Thus, the user could enter a "new word", such as "balf", when it does not appear in the sequence lines. (See FIG. 60D) by either (1) clicking on the letter "F", in the letter line #7 which causes it to scroll in the letter lines and appear in the sequence lines or (2 by causing the letters "E" and "F" to scroll by pressing the Scroll Key #2. Also, it is noted that the letters entered in the Sequence Lines when in the Sequence Mode, cause the order of the top line of the letter lines to change so that the top lines of the sequence lines and letter lines match. Similarly, the letters entered in the letter lines will cause the letter displayed in the top line of the sequence lines to change so that the top lines of each will match. For example, FIG. 60 shows the displays when the word "able" is entered. By the third input of that word, FIG. 60C, the word "Bay" is found to be a matching word for the input thus far entered.

As a result, the letter in Line 6, column #3, FIG. 60C is a "Y." The "L" is normally placed above the letter "Y" because the "L" is used more often. By keeping the top line of the Sequence Lines and the Letter Lines the same, the user can look at the top line of either mode and have confidence that if he presses the space bar he will enter the correct word regardless of whether the controls are focused on the Letter Lines or Sequence Lines. If one matching sequence is found, it is displayed in the top line of the sequence lines. If more than one matching sequence is found, they are displayed in an order based on certain statistical information (this will be explained below). In FIG. 59A, four lines are shown in area 101, the Sequence Line area. More lines can be allocated to the sequences on a fixed basis, or the window could be made to be dynamic vertically as well as horizontally so that lines and columns can be added or deleted.

The user can select the desired word and move it to the word document by clicking on it. This enables the user to move the word from lines 1, 2, 3, or 4 to the word document with one input.

The number of lines required for the letters depends upon the most number of letters assigned to any one key.

If no more than two letters are assigned to a key then only two lines would be required for the "letter lines", and not 4 lines as shown in FIGS. 59*a* to 59*f*.

By pressing select key #1, the word one line below the top line on the sequence lines will move to the word document and desired sequences below that line can be scrolled to the top lines and moved to the word document by pressing the space bar.

If sequences are scrolled to the top line of the Sequence Lines before it is complete, the entry of the next letter, after such scrolling will confirm that, the correct sequence was now in the top line and the sequences below the top line would be eliminated from the display. If the user realized a mistake was made and desired to again show the previous display the user could press the backspace key and delete the last letter entered. The previous display would then be displayed on the screen. The ability to recapture previous displays by backspacing is always available to the user. This capability makes it possible to correct an entry by backspacing and thereby erasing letters from the display starting at the end of a word. The user could then enter the correct letters. Also, the balance of the word previously typed could be entered automatically by pressing a function key.

The space bar, scroll key #1 and select key #1 can have their focus shifted to the dictionary lines by pressing the sequence/dictionary mode key (S/D Key), which functions as a toggle switch. After pressing the S/D Mode Key, the space bar (which may be a key) if pressed, will cause the word in the top line of the dictionary lines to move to the word document. Pressing scroll Key #1 will cause the words in the dictionary lines to scroll downward in a circular scroll and select key #1 will cause those words to circular scroll in the opposite direction.

Figure 59C:
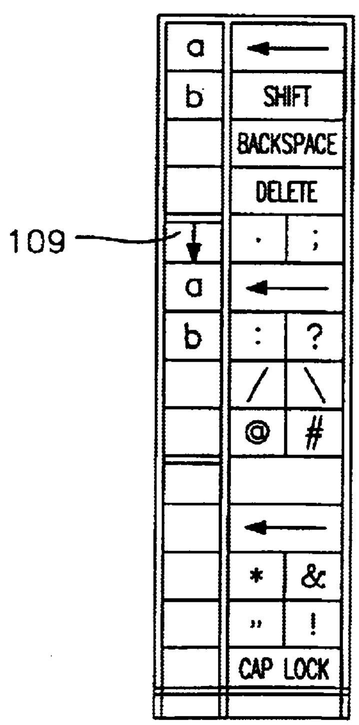
Figure 59D:
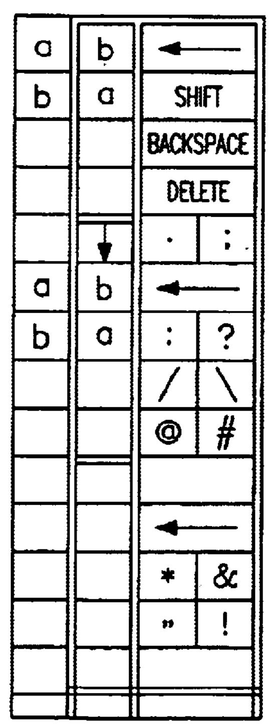
Figure 59E:
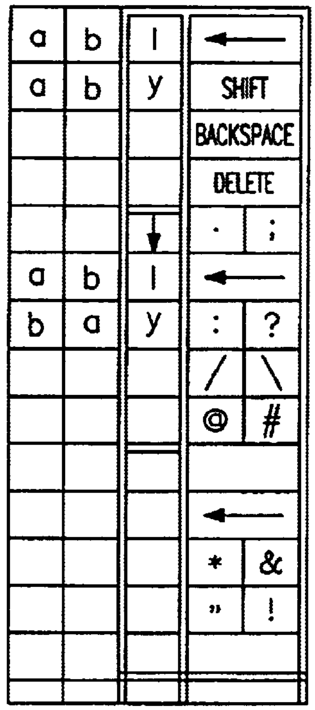
Figure 109:
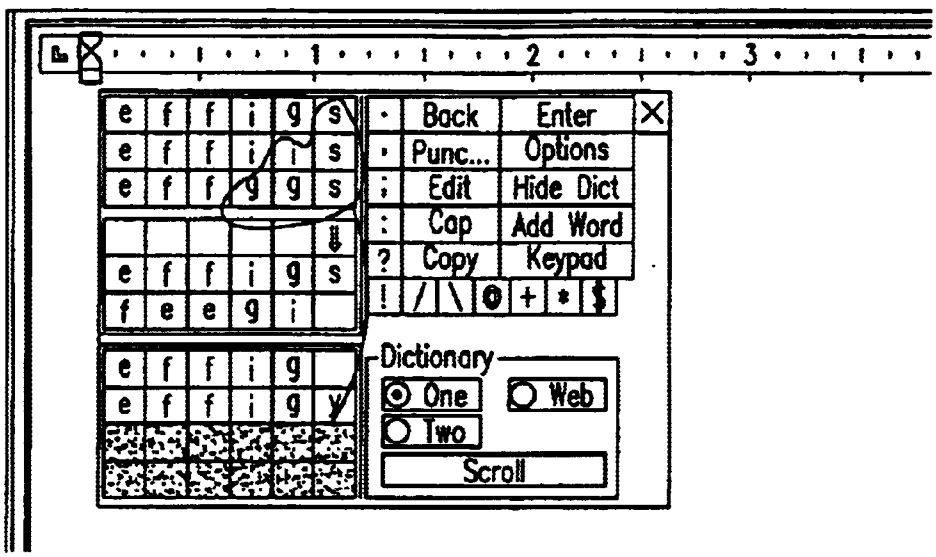

The fifth line of the grid area, FIG. 59F, to the left of Section 108, shows a Vertical Arrow, FIG. 59C, 109, when this arrow is placed over a column, the letters in that column will scroll if scroll key #2 is pressed. The Vertical Arrow Key, if pressed, will cause the Vertical Arrow to move above the column selected by the user. The Vertical Arrow will remain over whatever grid is adjacent to Section 108 on FIG. 59F until the Vertical Arrow Key is pressed. As letters are entered a column of grids is added to the left of section 108 (Call this location #1) If the Vertical Arrow was moved during the input of a word, it will move back to location #1 when that word is entered or deleted.

When a series of letters are entered, the arrow will remain in Line 5, adjacent to Section 108 FIG. 59F. It is then above the column of grids in which letter(s) are being entered. Thus, it moves form left to right as each letter is pressed. The user may select a letter displayed immediately after it is entered, at location #1, by pressing scroll key #2 which causes the desired letter to move to the top letter line. When entering a sequence, if a letter is ever selected to be in the top line of the letter lines by scrolling, or insertion of a letter or by default in the selection process, it remains the selected letter for the letter lines and the sequence lines, unless it is changed by the user selecting another letter to be in the top line of the letter lines or elminated. This can be done by using Scroll key #2 or inserting another letter. Such selected letter(s) will be displayed in a distinctive color until the word is completed and moved to the word document or the sequence is erased. The Vertical Arrow will remain in Location #1, see FIG. 59F, 109, unless the user presses the Vertical Arrow Key. The first press on that key will cause the Vertical Arrow to move on Line 5, so that it is above the grid of the first letter entered of that sequence. It is the grid column farthest to the left and identified as Column 1 on FIG. 59F. Starting from that position, each press on the Vertical Arrow Key will cause the arrow to move one column to the right. The arrow is then moving from left to right, which is the natural direction for reviewing and correcting spelling. If the desired letter is not on the top line of a column of letters the user would press the Vertical Arrow key so that the Vertical Arrow moves to the top of the next column which requires editing and then he would scroll the desired letter to the top line. When all the letters are in the top line the user would press the space bar and the word would move to the Word Document.

The following program will enable the user to enter a word not in the dictionary by using scroll key #2 while it is in location #1. If the user is entering a word not in the dictionary, the letters would be displayed in either the top line or below the top line of the letter lines. Whenever, the desired letter is in the top line the user would enter the next input element. Since the user did not press scroll key #2 it is confirmed, by default, that the desired letter is in the top line.

As described above, the vertical arrow would be in Location #1, above the letters associated with the second input element. If the desired letter associated with the second input element was below the top line the user would scroll the letter to the top line and then enter the next input element and again the Vertical Arrow would move so that it would be above the letter(s) as the letter(s) were displayed. The only input required to select the correct letters is (1) the selection of the key associated with the letter and (2) if the desired letter is below the top line, the scrolling of scroll key #2 to move the letter to the top line.

With the preferred keyboard assignment, using fourteen keys, the desired letter will be on the top line approximately eighty percent of time.(see discussion below) Also, with this keyboard format no more than two letters are assigned to each key. Thus, only one press would be required on the scroll key approximately twenty percent of the time. If the user used the mouse to cause the letters to scroll, only one click would be required on the mouse. The input of the next letter or pressing the space bar confirms that the scrolling is complete, thus, this method can be used when there are more than two letters assigned to a key.

The letter that appears in the top line of the letter lines also appears in the top line of the sequence lines. When the desired word is in the top line and the space bar is pressed the word would move from the window to the word document.

If letter(s) have been deleted from a column of letters the user can place the Arrow Key over that grid column and press a key to which letters are assigned and there by cause those letters to be entered in the column where letters have been deleted. The letter(s) may have been deleted by right clicking on that grid or by pressing a function key when the vertical arrow was above that column.

The horizontal arrows in lines 1 & 11 are used as icons to cause the control keys to focus on the "S" line or "D" lines, respectively, if the user clicks on one of these arrows the mode changes as described below and the color of the arrow changes to bring attention to the mode in use. (The Horizontal Arrow in line 6 would be used if a S/L mode key were used as described on page 13)

When the Vertical Arrow Key is above a column the user can manipulate the letters in that column as follows: (1) the user can cause the letters to scroll to the top line by pressing the scroll key. (2) the user can cause the letters in a column to be deleted by pressing a designated function key.

The program can provide a procedure for inserting letters within a sequence. For example, the word "Glazer" could be corrected to "Glazier" by inserting the letter "I" after the letter "Z." To do this, the vertical arrow is placed above the column of letters, immediately after the last correct letter (in this case, after the letter "Z") the user next presses a designated function key and then presses the key assigned the letter to be inserted.

If a sequence has been entered and the user determines that the letters displayed in the top line of the window require changes, in some or all of the letters, he can do this by the method described on the bottom of page 8 and top of page 9, or he can use the following alternate method which he begins by pressing a designated function key. This input causes the sequences and letters to be eliminated from the display. The computer program would then cause the letters associated with the first input element to be displayed. The user then proceeds to scroll the desired letter to the top line of the letter lines or insert another letter. When that change is completed the user then presses the same function key and the second letter is displayed. This process continues until the user either moves the word into the word document or eliminates the sequence from the display.

When the user desires to scroll the letters by left clicking on a column it is not necessary for the vertical arrow to be above that column. When the user deletes letters by right clicking on a column of letters the vertical arrow is moved above that column of letters by the computer program and letters are then inserted in that column by pressing an input element assigned the desired letter(s).

The program for the dynamic window can be implemented using only the sequence lines, (lines 1, 2, 3 & 4) that is, the letter lines can be eliminated and their function can be substantially achieved by using only the sequence lines. In that case, the vertical arrow key, in line 5, would point up toward the sequence lines. If the user used scroll key #2, the letters in the sequence lines would scroll and any such letters would include letters that were eliminated from the display because no match was found. For instance, when the fourth input in the word, "able", was entered (see FIG. 60) the letter "Y" was deleted. If the fourth column containing the letter "L" was scrolled, the letter "Y" (assigned to the key with the letter "L") would appear.

If a letter is scrolled to the top line of the sequence lines it shows that the letter was selected. It would then be displayed in a distinctive color. Also, any letters that preceded it would also be considered "firmly selected". The user can change a letter previously considered firmly selected by scrolling it with scroll key #2, or eliminating it and/or replacing it with another letter. The Vertical Arrow key would control the vertical arrow location in the same manner as described for its use in the letter lines. The function if scroll key #1, select key #1 and the space bar would remain the same.

When in the Dictionary Mode there are three Control Keys: 1) the space bar, if pressed causes the sequence displayed in the top line of the Dictionary Lines to the word document, 2) scroll key #1, if pressed, will cause the words stored in the dictionary to be scrolled in the downward direction so they can be so displayed in the Dictionary Lines, 3) the key used as Select Key #1 in the Sequence Mode, if pressed, will cause the dictionary in Memory to be scrolled in an upward direction. The Dictionary Lines may be programmed to display all words of more than "x" letters without the requirement that the user first press the S/D Mode Key.

Any control which the user can access in this invention can also be controlled or activated by the use of the mouse pointer and mouse buttons ("clicking on it"). Clicking on the Up and Down Arrow keys on lines 10 & 11 FIG. **59*f*** will cause scrolling of the Dictionary lines.

Dictionary words may be programmed to be displayed in the dictionary lines without the user pressing the change in mode key, provided there has been a delay of "x" amount from the time the last letter was entered. The program may provide that the user can adjust this time interval.

If the user changed to the "D" mode, the program would automatically switch back to the "S" Mode upon the entry of the word then being selected if the user had not already shifted back by pressing the appropriate Mode Control Key or by use of the mouse. The words displayed in the dictionary lines may be displayed in strictly alphabetical order or in alphabetical order but at the same time based on the number of letters in each word, i.e. all words of the same length would be in separate alphabetical groups. By pressing a designated function key, synonyms on antonyms, related to the word in the top line of the dictionary lines will be displayed in the dictionary lines. The user may cause (by pressing f(x)) the definition of the word in the top line of the dictionary lines to be displayed in a "pop up" window in the word document.

The dictionary list may be organized in sections such as, 1) the words which are commonly used (call this Dictionary #1), and 2) all the other words (call this Dictionary #2). The search for matching words in the dictionary may be made in different ways and the method used may be at the user's option. Such methods are: 1) the words in dictionary #1 are searched and if a matching sequence is found the matching sequences are displayed but if a matching sequence is not found the words in Dictionary #2 are searched and if a matching sequence(s) are found, they are displayed, or 2) if the matching word(s) are not found in Dictionary #1 the user would press a function key to cause the words in Dictionary #2 to be searched or 3) The search is made in Dictionary #1 & #2 simultaneously, i.e. they are treated as one dictionary.

The display of words in the dictionary lines, (lines 11, 12, 13 and 14 FIG. 59F) may be either 1) part of the standard program, or 2) available at user's option or 3) eliminated. In the method of control of the sequence lines and the letter lines described above, no change in mode was used to change the focus of one set of controls from the sequence lines to the letter lines. Instead, Scroll Key #1 and Select Key #1 were used for the sequence lines and scroll key #2 and the Vertical Arrow Key were used for the letter lines. If a mode key was used, two keys could be assigned to the controls assigned to the four keys listed above. More keys may be required if the required input is accomplished without the mode key. However, by having separate keys assigned to the sequence lines and the letter lines the user can cause the change he wants with less input. For instance, if no mode key is used a letter can be scrolled in the letter lines by pressing scroll key #2 but if a change in mode was required then the user would have to press the S/L Mode key and then the scroll key.

The change in mode may be designed with either: 1) one mode key which would circular scroll between the sequence mode, the letter mode and the dictionary mode or 2) two mode keys could be used: one key to toggle between the sequence mode and the letter mode and the other to toggle between the sequence mode and the dictionary mode. If the user desires to enter a punctuation mark, he can cause the word displayed in line one to be entered by entering the punctuation mark or if the desired word is one line below the top line, the user could, either (a) scroll the desired word from below the top line into the top line and then enter it by entering the punctuation mark or (b) he could move the word from the window to the word document by pressing Select Key #1, and then enter the punctuation mark directly into the word document; i.e. without being entered through the window and without the necessity of switching out of the dynamic window program.

In FIG. 59F in section 108 are icons which the user can click on to enter punctuation and various functions. In addition if the user clicks on the shift icon additional punctuation and functions are made available. The user then can enter text by using only the keys assigned the letters, and only those control keys that he desires.

Typing with one hand and using the mouse with the other hand is made possible with this typing system.

The user may elect to edit the document as entries are made or edit the document later. "Edit" here refers to (1) making certain that the desired word was selected when more than one word was listed in the window for the same input, (2) correcting spelling and (3) making other changes in the text, such as inserting additional words.

If a sequence is entered and "no match" is found in the dictionary, the letters that were entered for which a match was not found will appear in red or another color in the window. If that word is entered in the word document it would appear in red or have a squiggly red line under it, or some other distinctive color to indicate that no match was found. Also, the user may see some words not in red, that require editing.

The user would proceed to edit by placing the insertion pointer after the word which requires editing. The user would then click the mouse button and then enter the "Edit Mode", by clicking on a designated function key.

This input causes the word selected for editing (call this "word x") to be highlighted and the word which was highlighted to appear in the dynamic window on the top line of the sequence lines, the other sequences which were displayed in the window when "word x" was entered into the word document, would be displayed below the top line of the sequence lines and the letters associated with the input elements which were typed when the word was entered would appear in the letter lines.

The user would proceed to edit the word using the methods available and described in this disclosure e.g. the user can scroll the letters or add letters or select sequence in the sequence lines. The user can then cause the desired entry to move from the dynamic window to the word document.

The user may, when copying text, or at other times prefer to do all the editing after entering a section of text. To do this he would first press a function key so that he is in the "Delay Edit Mode." While in this mode the user may either (1) choose the sequence in the top line of the sequence lines by pressing the space bar or (2) he may elect to delay the choice of the sequences displayed and press the select key #1 after the last letter is entered for any sequence. This would cause all words which the user entered by pressing the select key #1 to appear in a designated color e.g. green. Also, if any letters were in red in the top line of the sequence lines or letter lines (which would occur because of misspelling or the word did not find a match in the dictionary) they would appear in red in the word document. When the user was ready to edit the text he would press the "Text Edit" key.

He would then move the insertion pointer to the first word he desired to edit and after editing that word, the program would provide that the insertion pointer would move to the next word which required editing, cause it to be highlighted and that word and the other words and letters associated with that entry would appear in the window. After editing that word, this automatic process of moving to the next word to be edited would continue until that section of text was completed, unless the user decided to interrupt that editing process.

If more than one sequence was in the sequence lines when the user pressed select key #1, the program may provide that only the top sequence line would be displayed in the word document. However, the user could have the option that the top two sequences in the window when "sequence x" was entered into the word document would be displayed in color in the word document. The user could then edit such words either in the window or in the word document. The user could use the QWERTY keyboard, the mouse, the delete key and the backspace key in the usual manner to edit in the word document. While in the "Delay Edit Mode" the user could place the insertion pointer after any word and edit it. After such editing the automatic movement to the next word requiring editing would resume.

The concept of displaying the possible sequences as they are being entered and displayed using a keyboard with more than one letter assigned to some or all of the keys can be implemented without the dynamic window. Instead, the display of a certain number (perhaps, not to exceed four at any one time) of the sequences which were entered for which matching sequence(s) were found in the dictionary would be displayed directly in the word document either one above the other or horizontally. If the sequences are displayed horizontally, the insertion pointer must move in such a way that more than one possible sequence can be displayed as each input element is selected. For example, if the letters "a" & "b" are on the same key and "r" and "u" are on the same key and the letter "t" is the only letter assigned to a key, then the words "art" & "but" would result from the same input. The display would show "a", "b" after the first input with a coma between the "a" and "b". The display would show au, ak, bu, br, after the 2nd input and after the 3rd input the display would show art, but, aut. The sequences which are complete words, such as "art" & "but" are placed ahead of sequences such as "aut" which are the first letters of a longer word (e.g. author). The order of sequences presented is based on the statistical approach discussed in the disclosure. The user could choose the desired sequence by pressing the space bar for the sequence farthest to the left; pressing select key #1 for the second sequence and by pressing the scroll key one time, if there are only three sequences displayed. If more than three sequences are displayed then the scroll key would be pressed that number of times for it to move to the position of the first sequence presented. The number of sequences displayed at any time would be limited, with the preference being not more than four. Pressing the scroll key would cause the other sequences to be displayed. After a sequence is selected the others are eliminated and the space is closed, automatically. If the sequences are displayed vertically or horizontally the letters could be the same size as the other letters displayed in the word document or they could be displayed in larger size and when the space bar or select key #1 or punctuation mark is entered, the letters could be reduced in size. The insertion pointer would be programmed to move as required to enter the letter in the top line associated with the input element just entered and then the letter in the next row down.

This would continue till each letter associated with that input element is displayed. After the letter is entered in the bottom row the next letters associated with the next input element would be entered, starting in the top line. The user could select one of these rows by using the space bar, select key #1 or by scrolling the desired row to the top line and then pressing the space bar or punctuation mark. Sequences for which a match was found would be displayed in black and the balance in some other color (or in the alternative, the entire word would be displayed in color). Letters can be deleted or other letters added by placing the insertion pointer at the place where such a change should occur in one of the sequences displayed and then pressing either the delete key, the backspace key or a key assigned letter(s). The user would select the sequence in which to make such changes and the other sequences would be removed from the display. If more then one letter was assigned to the input element when letters were inserted then the other possibilities resulting from that input would also be displayed; provided a matching word was found in the dictionary for that sequence. If the user knew that he was entering a word not in the dictionary he could select the desired letter from each group of letters associated with the same input element by the same method described for such selection when using the dynamic window, That is after the letters are displayed, if the desired letter is in the top line, it is selected by the user entering the next letter. If it is below the top line it is then scrolled to the top line and the next letter is then entered. When the space bar is pressed the letters below the top line are eliminated.

If the user desired to edit the words later he could press a function key, then only the top sequence associated with each sequence entered and that sequence would be displayed in a designated color.

If the user returned to that word letter for editing, the user could place the insertion pointer after the sequence, click on it and then press a function key. The display would show the choice that would have been presented if the user had not selected the Delay Edit Mode. The user would the select the desired letters. The same program for the delay in editing mode would apply to the sequences displayed horizontally. Other aspects discussed for the method using the dynamic window would apply to the method without the window.

The determination of which matching sequence should be displayed on the top line can be explained by the following example. Assume the user is entering the Word "FACE" and that the combination of letters assigned to the keys is the following: ab, ef, ck, dj, gx, hz, im, ly, n, ot, pq, ru, s, vw.

The first letters entered for the word "face" are "e" & "f", FIG. 48*a* shows that the "F" is the first letter for the words 46 percent of the time while the "E" is used for the first letter 40 percent of the time. For that reason, the first display would show the "F" on the top line and the "E" on the second line.

The second group of letters entered are the letters "a" & "b". The possibilities for the letters entered are "FA", "EA", "EB", "FB". The number of words in the dictionary for each of these is approximately: for "FA" 300 words; "EA" 70 words; "EB" 7 words; "FB" 2 words (abbreviated). Based on this, the order of the words listed should be "FA", "EA", "EB", and "FB". The third input has the letters "C", "K". The number of words in the dictionary for each possible combination (after that input) is approximately as follows: "FAC" 37; "FAK" 3; "EAC" 1; "EA" 0; "K"; "EBC" 0; "EBK" 0; "FBC" 0; "FBK" 0.

The sequence "FAC" has a much greater chance of being the desired sequence then "FAK" or "EAC" because, there are more words beginning with "FAC" and they include such words as face, facing, fact, facility, factor, factory, factual, faculty, (the only word(s) beginning with the letters "fak" are the words "Fake", "Fakery" and "Fakir"; and the only word with the letters "EAC" is the word "EACH".) "EAC" would be given priority over "FAK" because "EACH" has a higher frequency of use than "FAKE" and "FAKERY" combined.

The order of the sequences displayed would then be: "FAC", "EAC" and "FAK". A program would be available to the user to change the order of priority. This type of analysis would be done for all combination of letters and that analysis would determine the order that the sequences are displayed.

Several preferred keyboards disclosed here are designed for one hand typing with the left hand, one hand with the right hand and for typing with two hands. The keys which have more than one letter assigned to them have substantially the same set of letters. Also, the assignment of the letters to the keys are substantially in alphabetical order for vowels consonants (except for one keyboard described below). The vowels are mostly assigned to the middle row of keys and are, also, to a large extent in alphabetical order.

The selection of letters which are assigned to the same key is so chosen that the frequency of unintended words which will be displayed when the user selects intended words is low in number. The letter assignments were largely based on keeping this number low. No more than two letters are assigned to the same key which reduces the number of unintended words and reduces scrolling when selecting letters. Frequently used letters are located on the same key with infrequently used letters. Frequently used letters are placed above the infrequently used letters in the letter lines. This reduces the amount of scrolling required in the letter lines.

This system applies to keyboards of any length. A person with limited use of his fingers might find this method useful with only 6 keys or a person might only want to eliminate 6 if the most difficult to reach keys on the qwerty keyboard. Also, this system could be used for some purpose with a very limited dictionary list. There may then be very few unintended words even with only six keys on the keyboard.

Figure 61A:
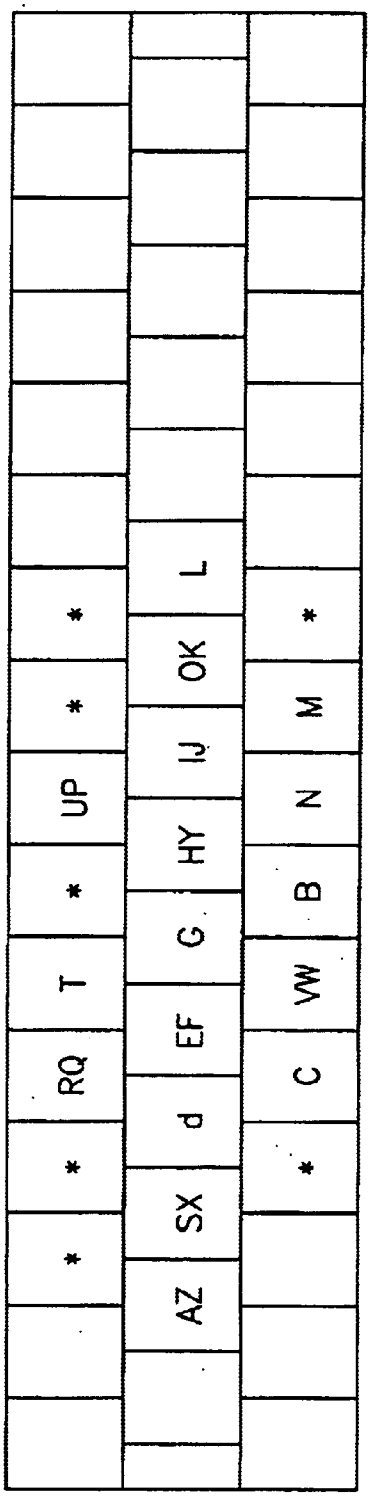

A keyboard is attached, FIG. 61A, which shows an assignment of the letters to 17 keys. The nine keys which were eliminated were some of the difficult to reach keys on the QWERTY keyboard. Seventeen assignments of letters to keys on the QWERTY keyboard remained unchanged. The nine letters were each reassigned to one of the seventeen QWERTY keys that remained unchanged. In most cases, they were adjacent to the key to which they were reassigned. Such a keyboard could also, be used in the process of learning the full QWERTY keyboard.

Figure 61B:
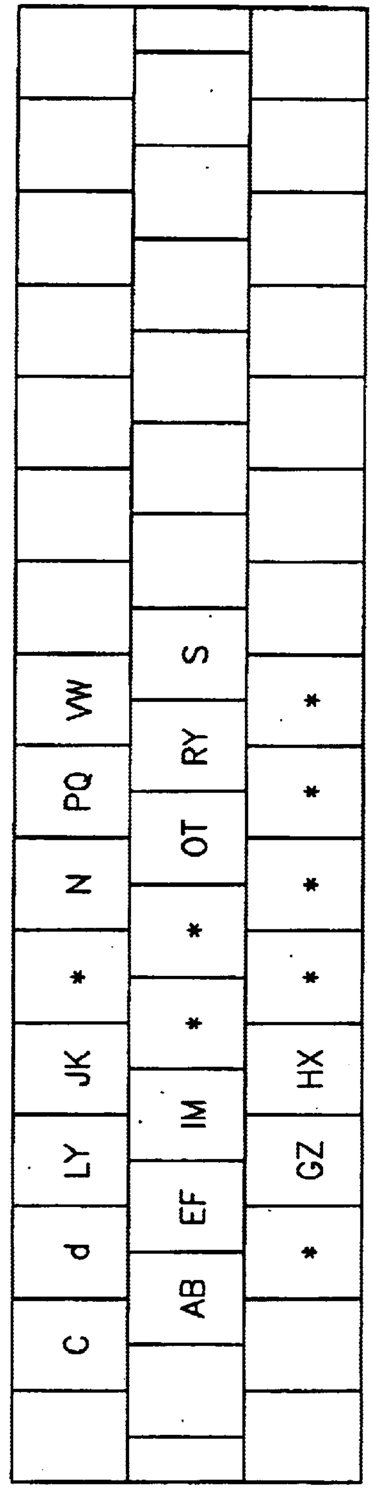

FIG. 61B is a two hand keyboard with 15 keys.

Figure 61C:
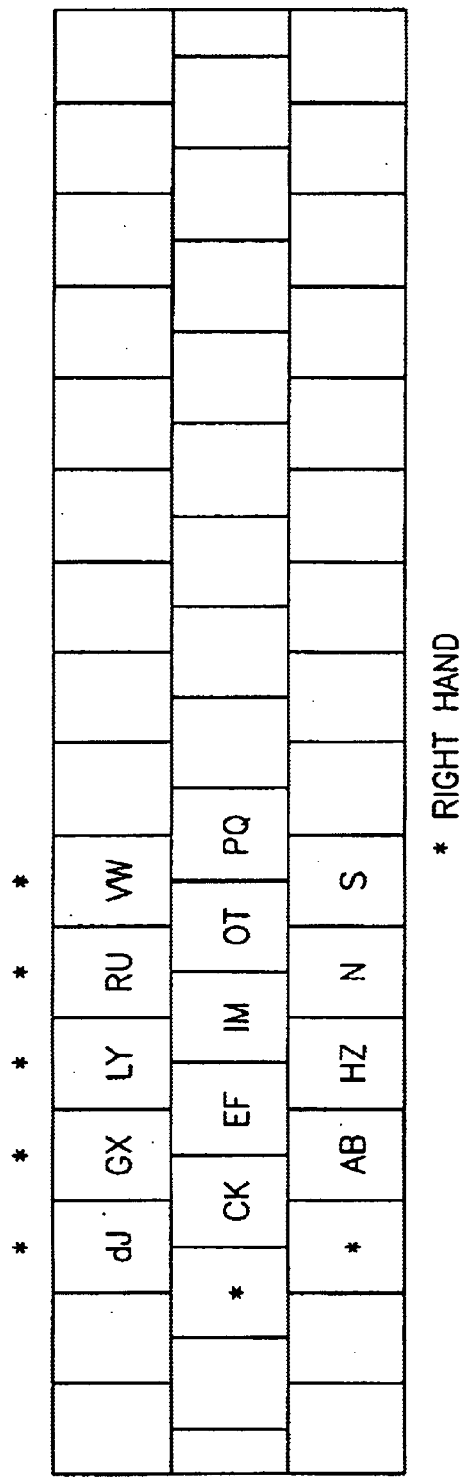

FIG. 61C is a right hand keyboard with 14 keys.

Figure 61D:
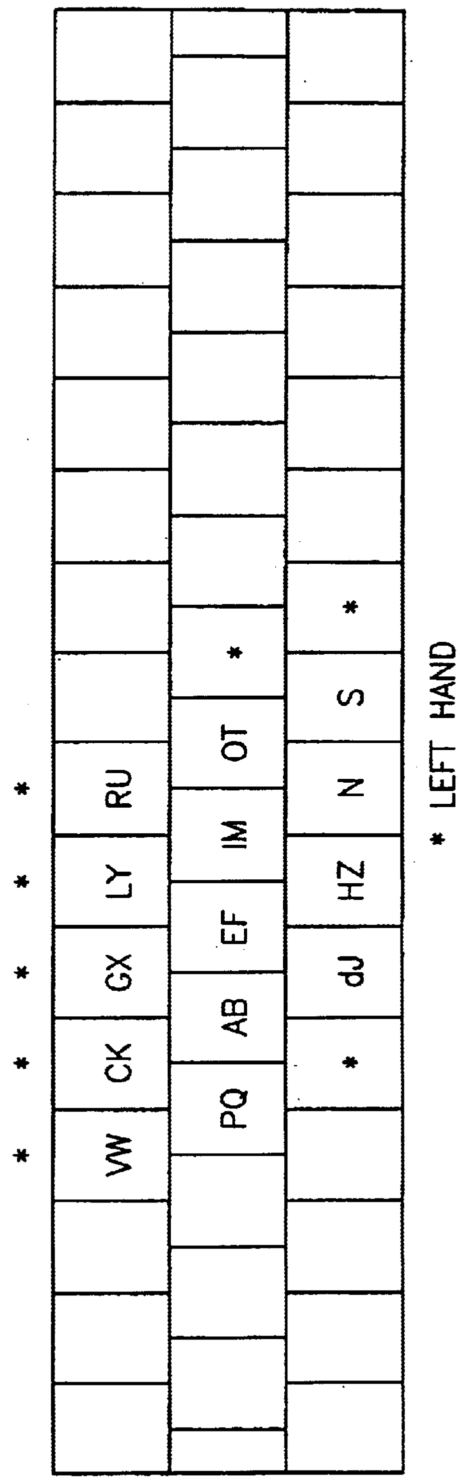

FIG. 61DC is a left hand keyboard with 14 keys.

Figure 61E:
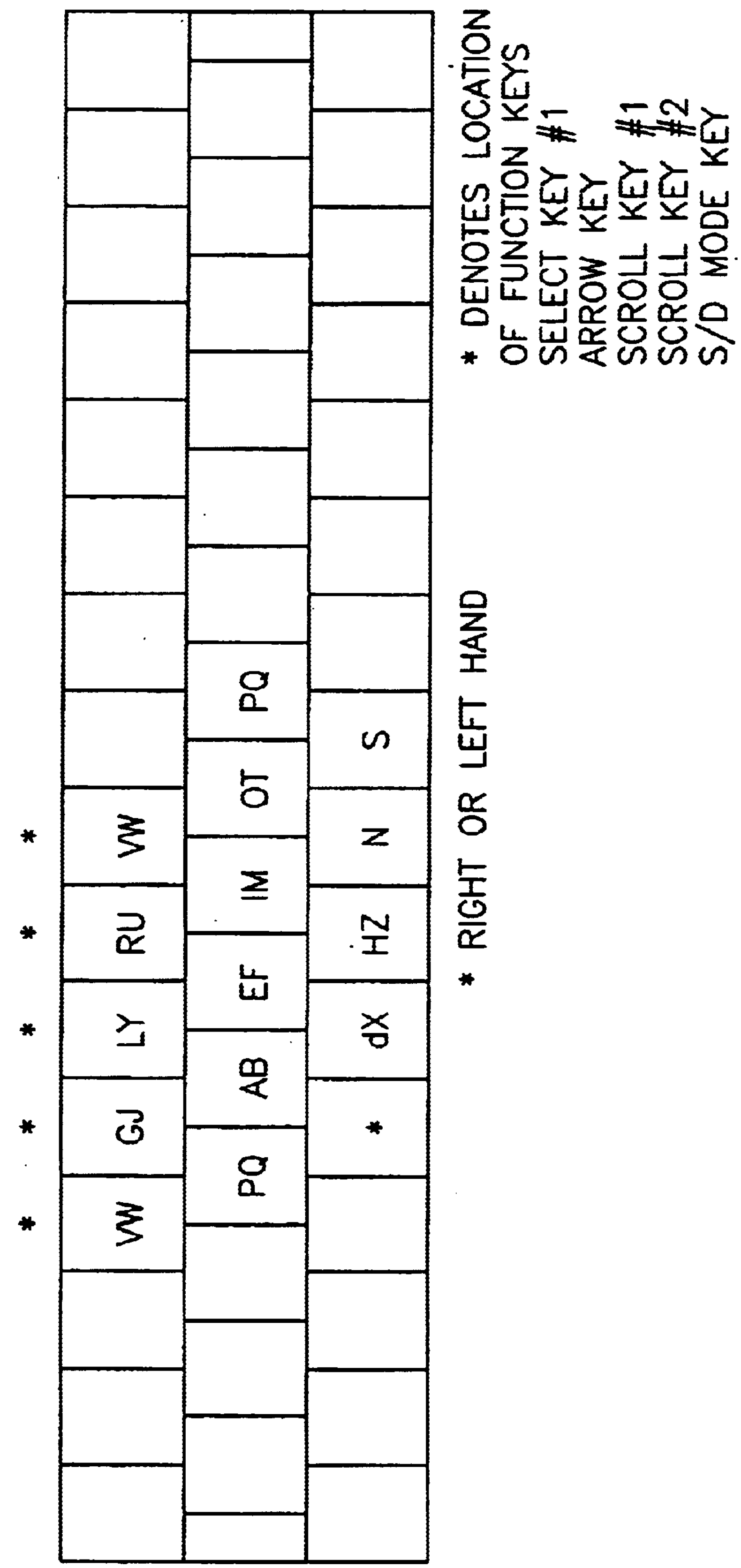

FIG. 61E is a right or left hand keyboard with 14 keys if used with right and left hand, 14 keys if used with left hand.

* denotes location of function keys:
Vertical arrow key
scroll key #1
Scroll key #2
select key #1
s/d mode key
space bar FIGS. 70 to 81 of this disclosure show an alternative design for that window.

Figure 70:
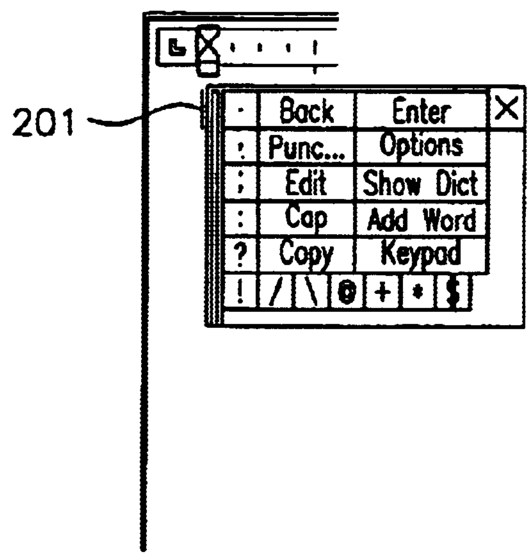
Figure 71:
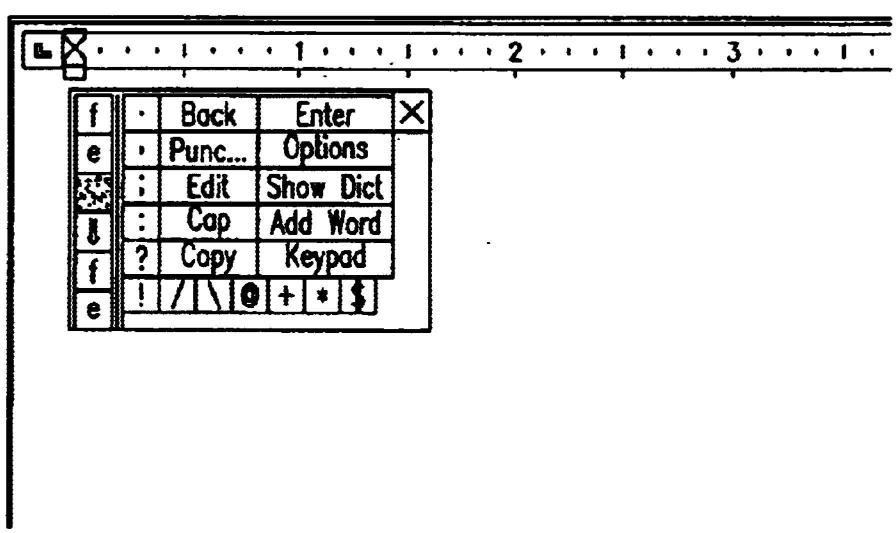

FIG. 70 shows the dynamic window before any letters have been entered and without the Dictionary area displayed. When the user activates the program to enter words through the dynamic window, the window appears automatically adjacent to the insertion point 201. As each letter is entered, the grid area becomes wider, as shown in FIGS. 71 thru 74, for the word "FAST." FIGS. 77 to 80, show the same word being entered with the dictionary lines also displayed. The user has the option to have the dictionary sections displayed. It is noted, in FIGS. 77 thru 82, that the dictionary lines require more grids to display the worlds than are required for the sequence or letter lines. The program is preferably designed to provide that the letters associated with each input are displayed in the same column for the three sections (the sequence lines, the letter lines, and the dictionary lines), as shown in FIGS. 77 through 82. Alternatively, or the display for the sequence and letter lines could be as shown in FIGS. 71 through 74 and the dictionary lines could be the width required for the number of letters in the longest word displayed as shown in Section 205, FIGS. 77–82. In the preferred arrangement, the words in the dictionary lines are listed with the shortest words listed first and each group of words with the same number of letters listed in alphabetical order. The program can also be designed to provide that the dictionary command section 204, FIG. 77, and the Dictionary word, Section 207 and FIG. 77, could be displayed separately from the command section (203, FIG. 77) (e.g., at the bottom of the display) and the sequence section 205, FIG. 74, and the letter lines, Section 206, FIG. 74. The sequence lines display the sequences in the order of their frequency of use, with a high priority given for those sequences, which only need one more letter to become a completed word. For instance, if the letters, "e," "f" was the first input and "h," "o" was the second input, then the sequence lines after the second input would show after the second input and in anticipation of the third input, that "fo" should be on the top line and "eo" on the second line because the program can determine that the three-letter words beginning "fo," such as "foe" and "for," have a higher priority than the three letter words beginning with "eo," such as "eon." If there are no three letter words beginning with "eo" or "fo," in the dictionary list, then the program would search the longer words which match the input entered, until word(s) are found in the dictionary list and their order of priority will determine the order that the sequences are listed in the sequence lines.

Figure 76:
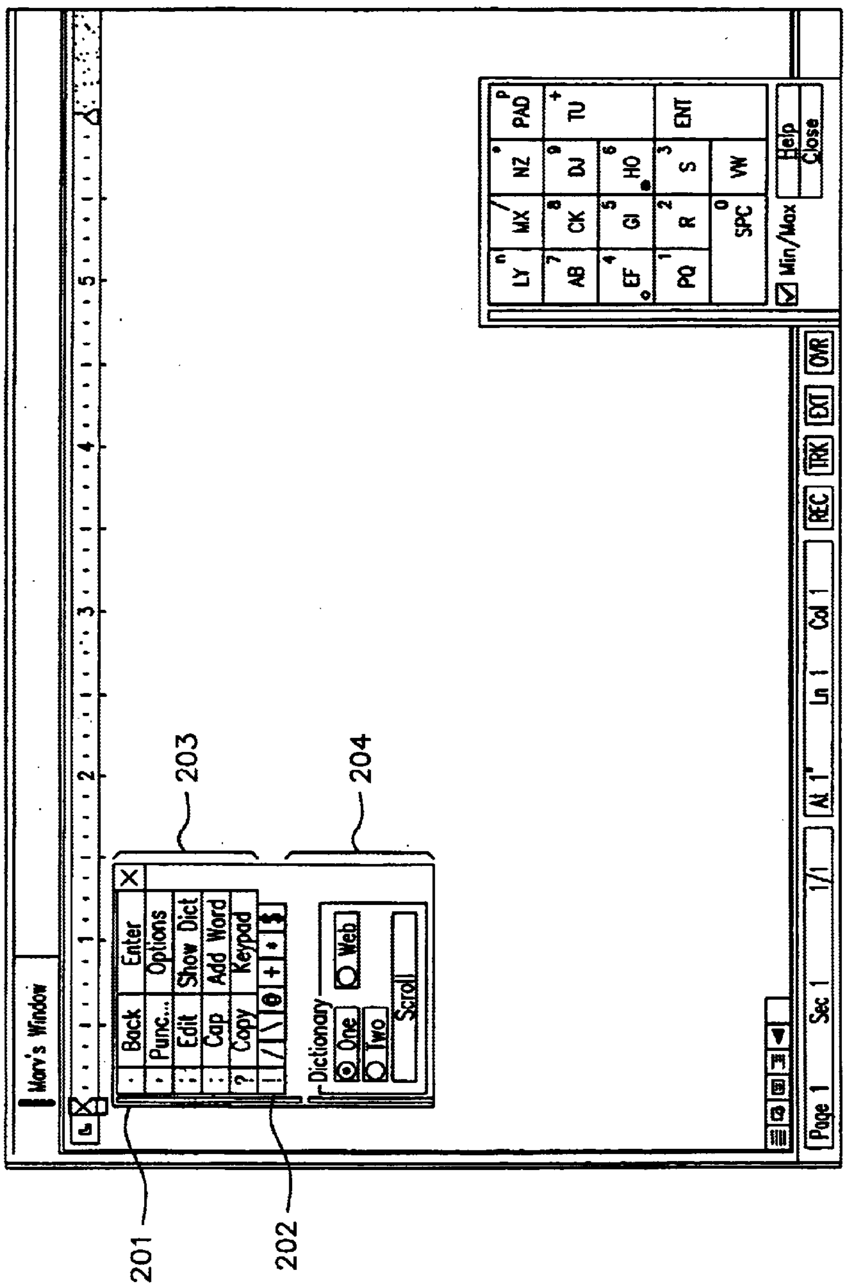
Figure 77:
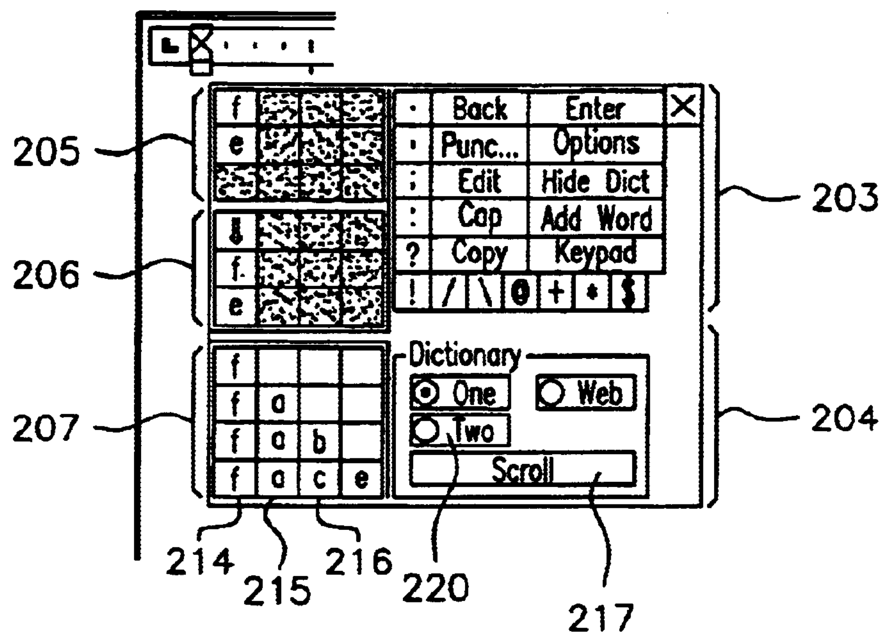
Figure 78:
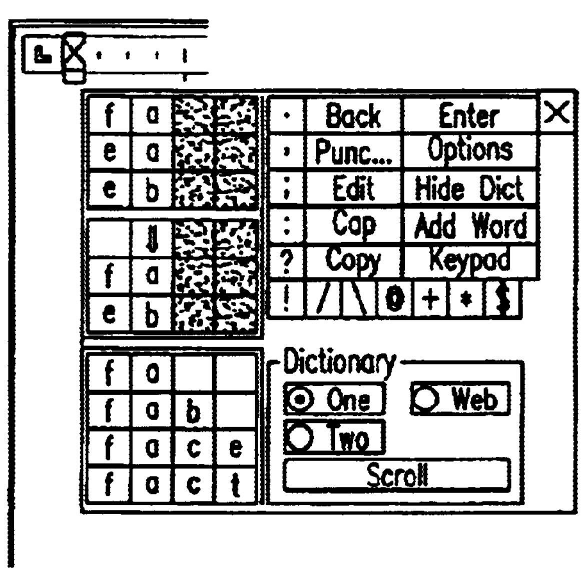
Figure 79:
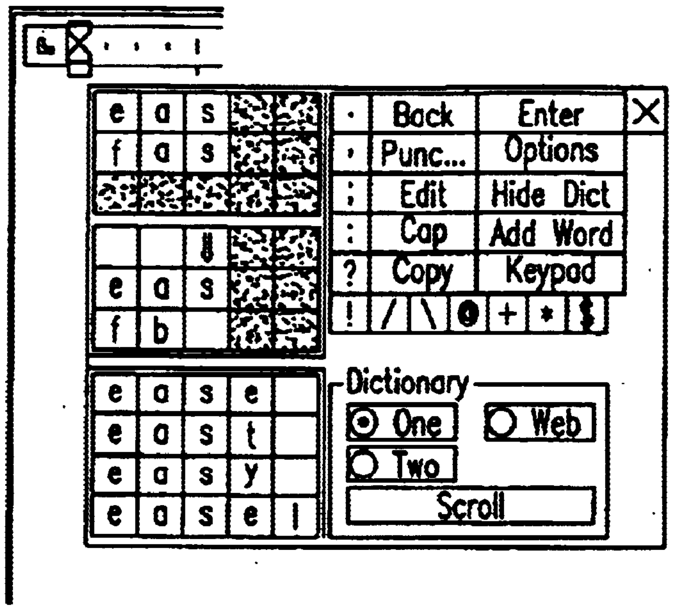

The buttons in Section 204, FIG. 77, give the user the option of displaying words from either dictionary one, dictionary two, or the dictionary of web domain addresses. A scroll button (222, FIG. 77) is also shown, which, if clicked, will cause the scrolling of the words in the dictionary word lines, Section 207, FIG. 77. The words which would scroll would be those which are displayed in the four lines of the dictionary lines, 207, FIG. 76, and other words which are listed in the dictionary which begin with the letters displayed in the top line of the sequence lines. The program may provide for additional lines for the dictionary lines which may be dynamic, i.e., lines would be added as needed during the input.

Figure 80:
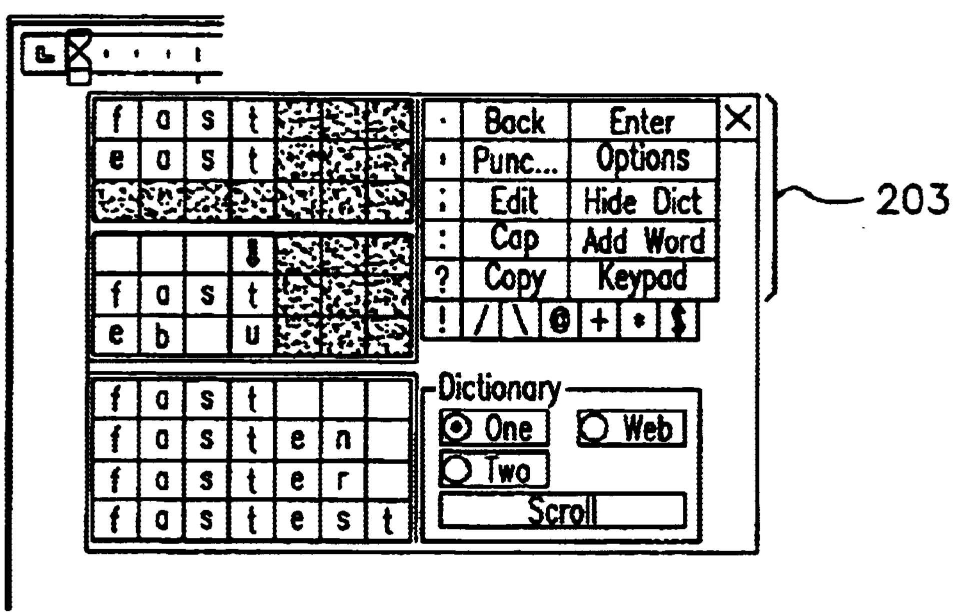

The dictionary lines will be displayed after clicking on the button labeled "show dict." The name tag assigned to that button changes to "Hide Dict," when the dictionary lines are displayed. See FIG. 77, Section 203. By clicking on "Hide Dict," or by pressing a key assigned to "Hide the Dictionary," the dictionary lines and the dictionary control section are removed from the display and will not be displayed until the user clicks on "Show Dictionary" or the key assigned that function. For example, if the dictionary lines are as shown in FIG. 80, and the user clicks on "Hide Dict" in Section 203, FIG. 80, then the display will change to that shown in FIG. 74.

FIG. 77 thru FIG. 80, show the display in the Dynamic window when the user is typing the word "fast," and the dictionary lines are displaying words which begin with the letters displayed in the top sequence line.

Figure 81:
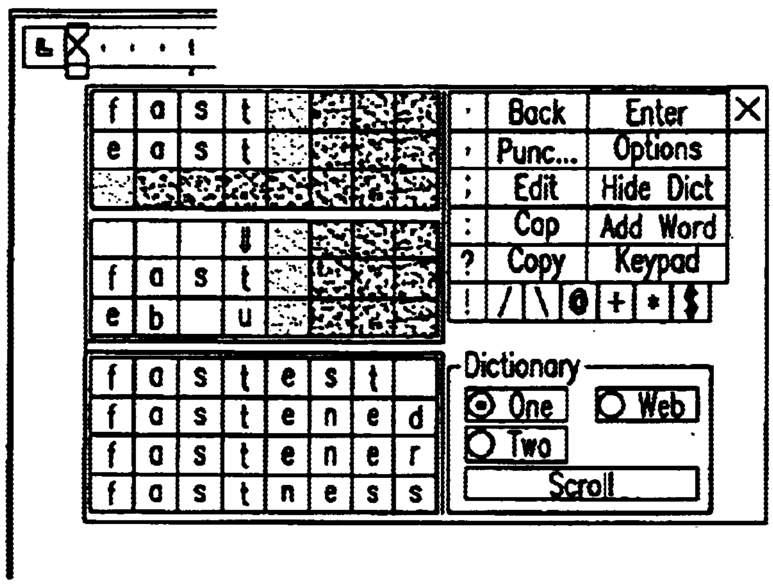
Figure 82:
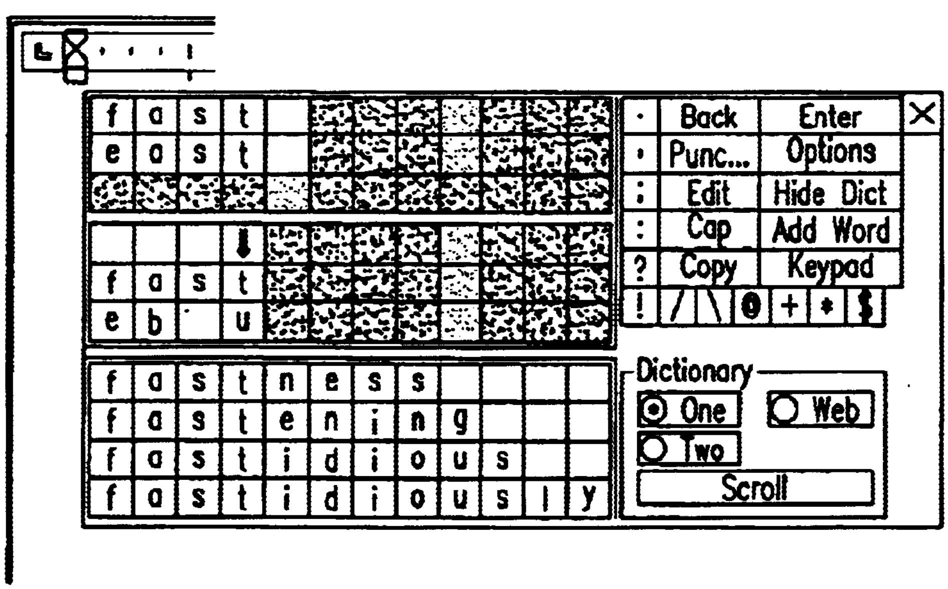

These figures show progressively longer words in alphabetical order. The program could also be written to show the words in alphabetical order without regard to the length of the word. If the user desired that the dictionary words displayed begin with the letters displayed in a sequence below the top line, he would scroll that sequence to the top line of the sequence lines and the words displayed in the dictionary lines would change to begin with the letters then displayed in the top sequence line (See FIG. 79). FIGS. 80 through 82, show the dictionary words which begin with the letters "fast." The dictionary lines may be scrolled by clicking in Section 204 on the "scroll" button, 222, FIG. 77, or by right clicking on the second line of the dictionary lines. If the user right clicks on any other line, that line will move to the top line of the dictionary lines.

Figure 83:
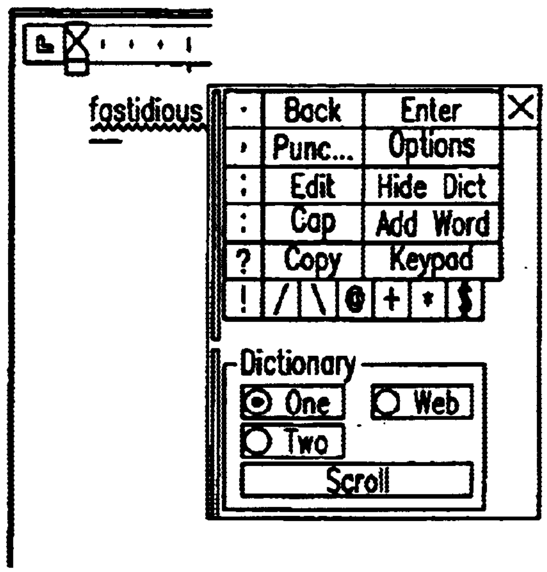
Figure 84:
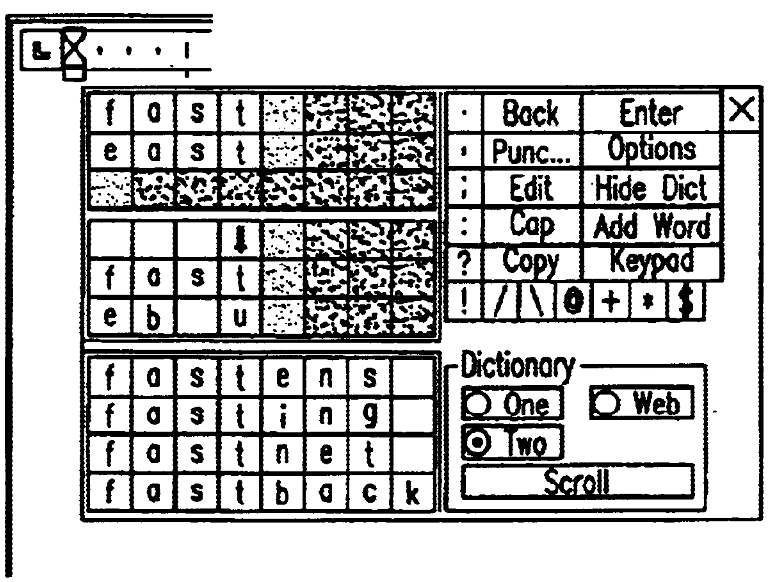
Figure 85:
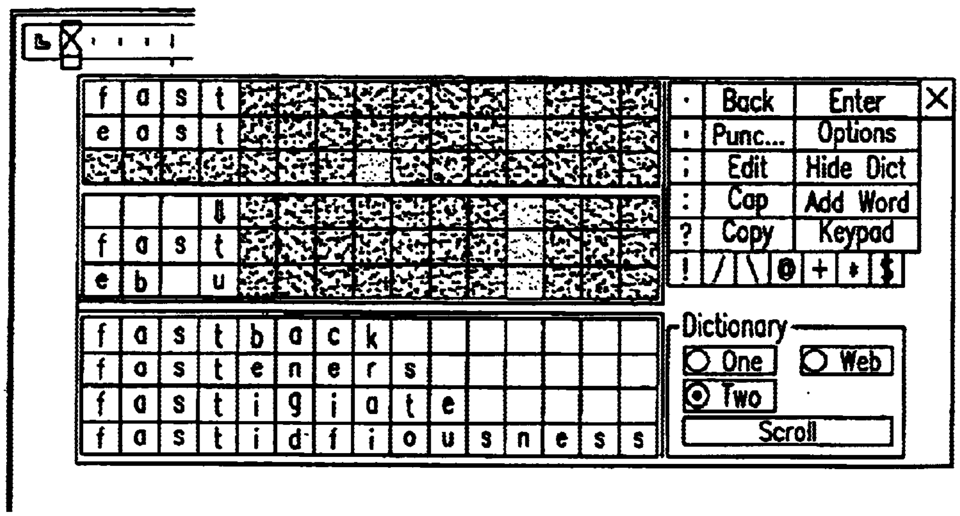

The user can left click on any word in the dictionary lines and it will move to the word document, for example, the word "fastidious" is moved to the word document (See FIG. 83). The user can click on the number one or two in the word dictionary section, 204, FIG. 77, and cause the words displayed in the dictionary lines be either from dictionary one or dictionary two. Words from dictionary two are displayed in FIGS. 84 and 85 for the words beginning with the letters "FAST." The program may be written which provides that if a word is not found in dictionary one for the letters displayed in the top sequence line, then the user may have the option that the words in dictionary two would be displayed automatically.

In FIG. 76, starting at 202, there is a square grid with an exclamation mark (!) displayed in it. There is a column of grids above grid 202 and a row of grids to the right of grid 202, each of which is assigned a punctuation mark or symbol. The user can enter these by placing the pointer on the desired mark or symbol and then making a left click on the mouse button. In addition, in Section 203 of FIG. 76, there is an "x" in a square grid in the top right corner and ten rectangular buttons, which are assigned the following identifications, "Back," "Punc," "Edit," "CAP," "Copy," "Enter," "Options," "Show Dict," "Add Word," and "Keypad." When the user clicks on these buttons, he then has available programs which will be described in detail later in this disclosure.

Figure 72:
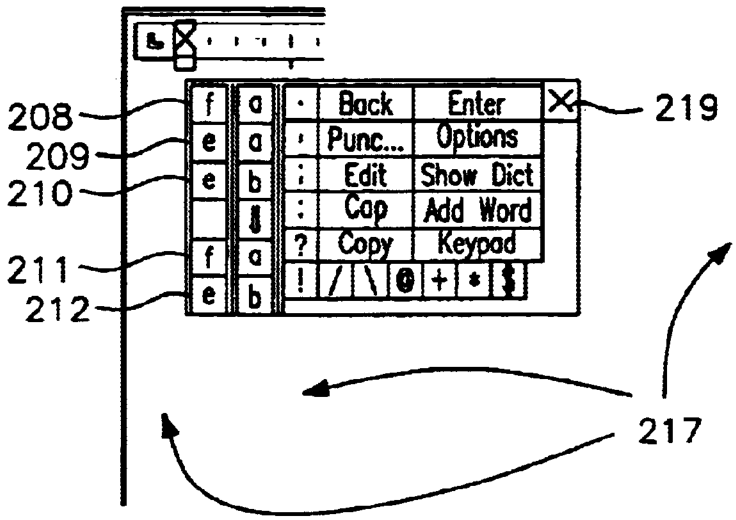
Figure 73:
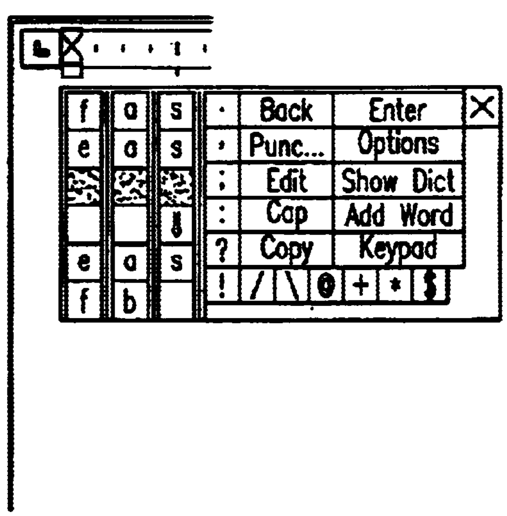

FIGS. 71 thru 74 show the letters displayed in the dynamic window after each input element is entered for the word "fast." FIG. 72, lines 208, 209 and 210, are the lines referred to as the sequence lines. The program may be designed with more or less sequence lines than shown in FIG. 72. FIG. 72, lines 211 and 212 are the letter lines, which are defined in the same previous disclosure. Only two lines are required for the letter lines if no more than two letters are assigned to each key (e.g., as with keyboards shown in FIGS. 70 to 75 attached). If more than two letters are assigned to a key, the number of lines is increased (this increase could be dynamic). The area referred to as the word document is all the area in the display outside of the dynamic window (see 217, FIG. 72). The text may be entered directly by input from the Qwerty keyboard and number pad to the word document or it may be entered from the Qwerty keyboard and/or the number pad or any other keypad into the dynamic window and then transferred to the word document.

Figure 63:
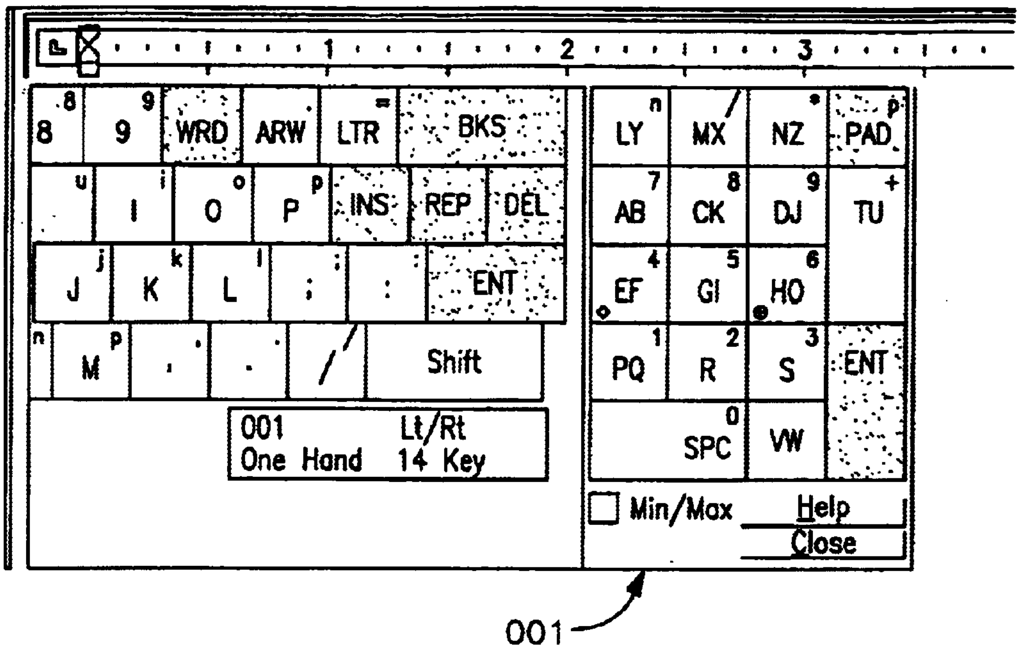

FIGS. 71 through 75 show the steps in the entry of the word "fast," or "east" using keyboard 001 (see FIG. 63). Keyboard 001 has the letters "e" and "f" assigned to the same key. As a result, the words "fast" and "east" result from the same input. If the word "fast" has a higher order of priority than the word "east," then the display as each letter is entered would appear as shown in FIGS. 71 to 74. The user can left click on any line of the sequence lines and thereby cause whatever is displayed on that line (whether it is a letter, a series of letters or a word) to move to the word document, See FIGS. 74, 75A and 75B. Whatever is displayed on any sequence line can be moved to the top sequence line by either right clicking on that line, or by pressing a key assigned the word scroll function one time for each line it is below the top line. The user can cause a letter, a series of letters, or a completed word to move from the top line of the sequence lines (in this case, the word "fast") to the world document, see FIGS. 74 and 75A, by either (a) pressing on the key assigned the space bar function, or (b) left clicking on the top sequence line. The user could elect to first change the letters in the top line of the sequence lines by the methods listed below, and then either press the space bar or left click on the top sequence line so that letters displayed on that line move to the word document.

The methods which the user may use to move letters displayed below the top line of the sequence lines to the top line of the sequence lines are: (a) The user can press a word scroll key that number of times which causes the letter(s) displayed in each row of the sequence lines to scroll so that the entire display on a sequence line can be moved to the top sequence line. The display may be one letter, a series of letters or a word. (b) The user can right click on a sequence on any line below the top line, which causes the entire display then shown on that line (which may be a letter, a series of letters or a word) to move to the top line with one click.

Figure 86:
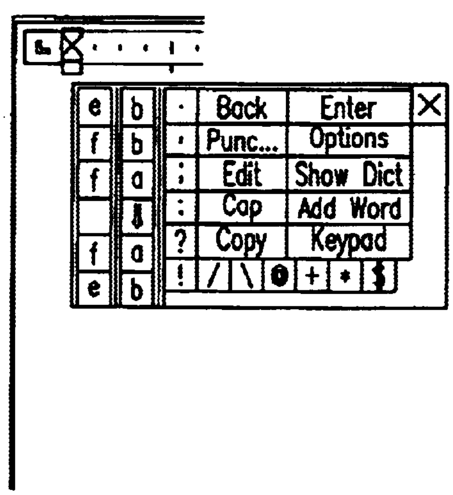

See FIG. 72, which shows the letters "eb" on the third sequence line. After right clicking on that line, the display changes to that shown in FIG. 86, which shows "eb" on the top line.

Figure 87:
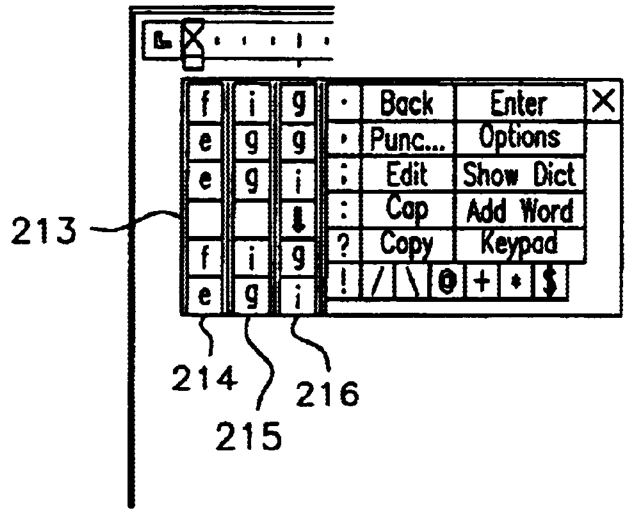
Figure 88:
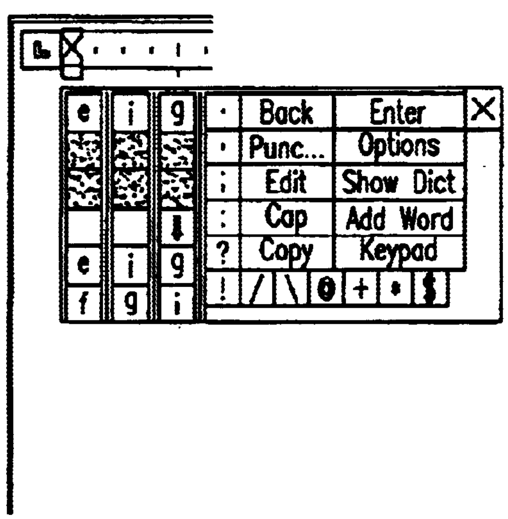
Figure 89:
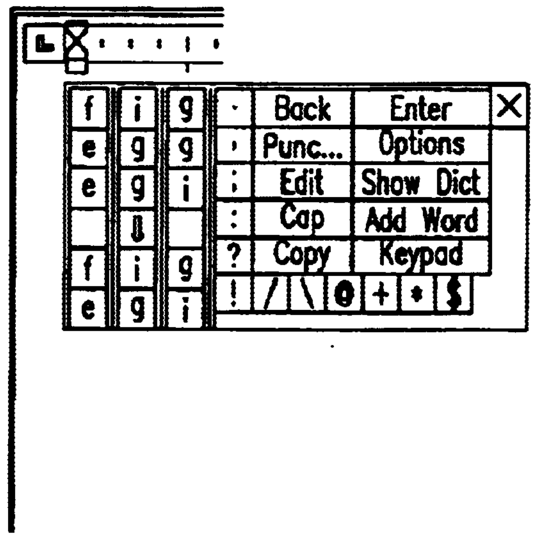
Figure 90:
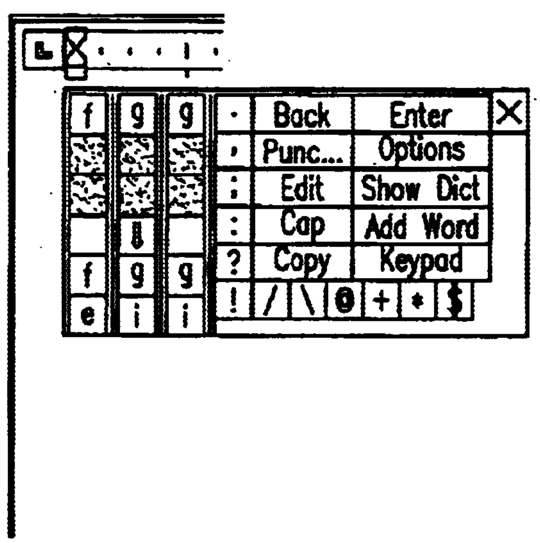

(c) the user can change the letters displayed in the letter lines which causes a corresponding change in the top sequence line. To change the letter lines, the user may use the following methods: (1) The user can left click on the desired letter(s) in the letter lines, so that the desired letter(s) move(s) to the top line of the letter lines. Selecting a letter to be displayed in the top line of the letter lines will cause that letter to be displayed in the top line of the sequence lines. For example, FIG. 87 shows the word "Fig," in the top sequence line. A left click is made on the letter line in column 214. FIG. 88 shows that the letters in the letter lines changed from "f" in the top line and "e" in the bottom line to the reverse order and the sequence lines now show the "e" in the top line in column 214, FIG. 88, or (2) the user can scroll the letters in the letter lines by (a) pressing the arrow key so that the arrow (see FIG. 87, Row 213) is above the column of letters which the user desires to scroll (this step is not necessary if the down arrow is already above the column of letters to be scrolled) and then by pressing the letter scroll key (the key assigned the function of causing the letters to scroll when pressed) the letters in the column where the down arrow is then located will scroll and thereby, the desired letter moves to the top line of the letter lines and as a result, the desired letter moves to the top line of the sequence lines. For example, FIG. 87, shows the letter "i" in the top sequence line of column 215. The key for the down arrow in row 213, FIG. 87, is pressed so that the down arrow moves from column 216 to column 215, see FIG. 89. The letter scroll key is then pressed and the letters in the letter lines and sequence lines change (see FIG. 90) which shows the top line of the sequence line in column 215 changed to a "g."

The "Home" position for the down arrow is above the column where the next letter will be entered and remains there until the arrow moves by pressing the arrow key or by right clicking on a column of letters in the letter lines. It returns to the "Home" position after letter(s) are moved to the word document. The "Home" position for the mouse cursor is at the bottom of the column next to section 207, section 213, and is shown on FIG. 87, at the bottom of column 216, which is then next to 202. The position of the down arrow permits the user to scroll the letter lines for the last letter entered by pressing the letter scroll key and the position of the curser permits the last letters entered to scroll by a left click.

Figure 91:
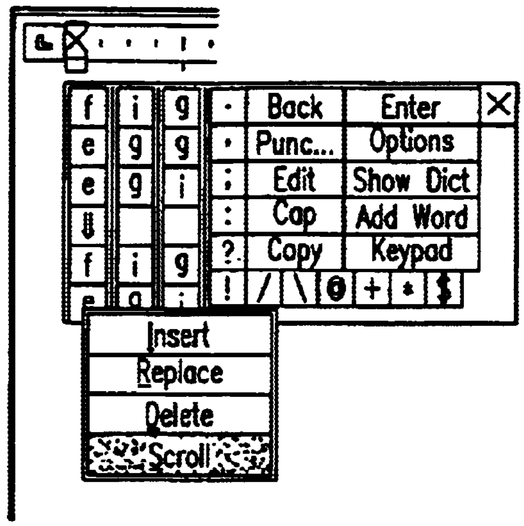
Figure 92:
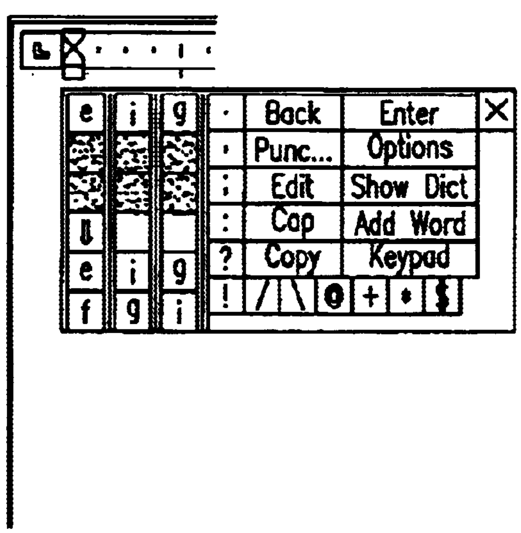

Or (3) by right clicking on the letter lines on the column of letters to be changed, the user can then have available the following procedure to scroll the letters in the letter lines and thereby change the sequence lines. After right clicking on a column of letters, the down arrow is moved automatically above that column which confirms to the user which column of letters will be changed and a menu of commands is displayed (insert, delete, replace, and scroll are in that menu) the user then left clicks on the command that seems most appropriate for the change required. If the user has decided to scroll the letters in the column where the change is required, the user would left click on the command "scroll"

that number of times which causes the desired letter to scroll to the top line of that column. If only two letters are assigned to a key, only one click is required. FIG. 91, shows the display after right clicking on column 214, FIG. 91. After left clicking on the scroll command, the display will be as shown in FIG. 92.

The software program provides that when a letter is moved to the top line of the letter lines, the top line of the sequence lines will also display that letter.

(4) The user can cause all the letters entered in the dynamic window to be deleted by clicking on the "x" in the top right corner of the dynamic window (see FIG. 76, Section 203) or by clicking anywhere on the word document, See FIG. 70, 217. The user can then retype the word.

Or (5) The user can delete each column of letters in the sequence, letter and dictionary lines starting with the last column of letters entered, by pressing a key assigned the function of the backspace key, or by a left click on "Back" on the left section, top row, of Section 203, FIG. 76. The letters displayed in each column of the sequence and letter lines, starting with the last column of letters entered are deleted by each press of the backspace key or each left click on "Back." The user can then enter the additional letters required to complete the word.

Figure 93:
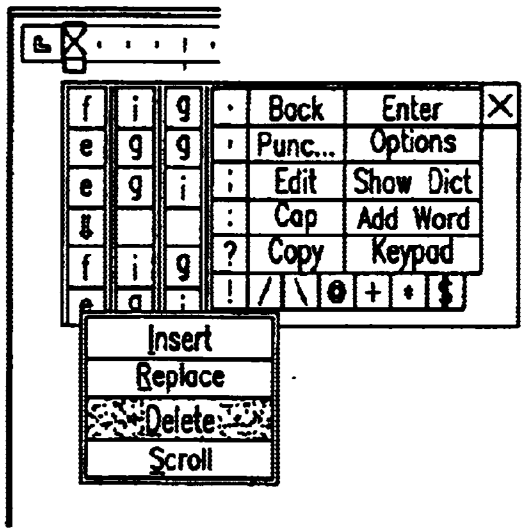
Figure 94:
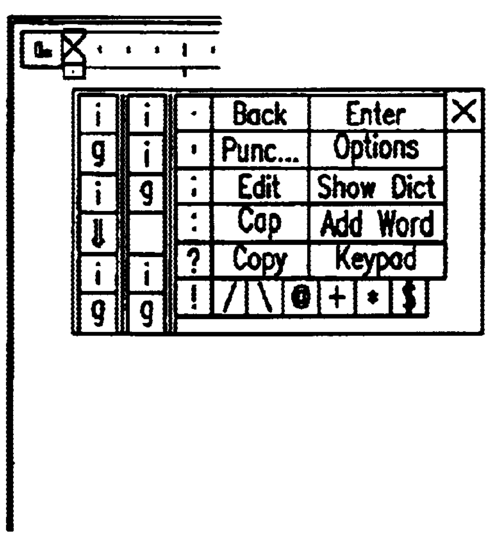

(6) The user can delete any column of letters in the letter lines, as follows: (1) the user right clicks on the column of letters selected to be deleted, which causes a menu of commands to be displayed, which includes the command "delete" and the down arrow is moved automatically above that column, which confirms to the user which column of letters will be deleted; (2) The user then left clicks on the command "delete" and the letters in that column are deleted and the dynamic window simultaneously closes the space caused by the removal of those letters. FIG. 93 shows the display of the letters in the letter and sequence lines after right clicking on column 211, FIG. 87. FIG. 94 shows the change in the letter and sequence lines after one left click on the command "delete."

(7) The user may press the down arrow key so that the down arrow moves to the column of letters where the letters are to be deleted. The user then presses a delete key assigned to delete letters where the down arrow is pointing and the letters are removed and the space is simultaneously closed.

Figure 95:
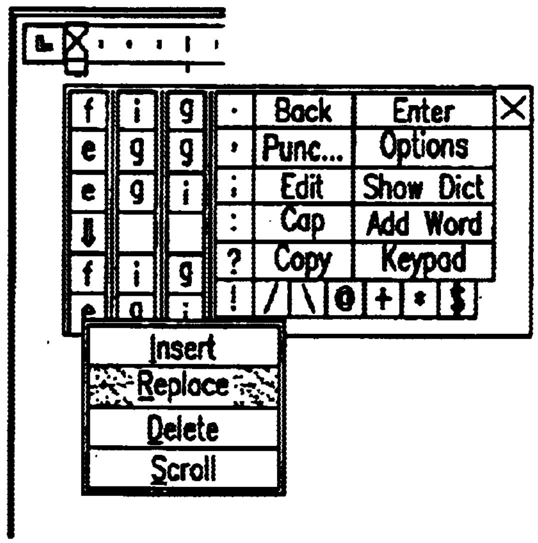
Figure 96:
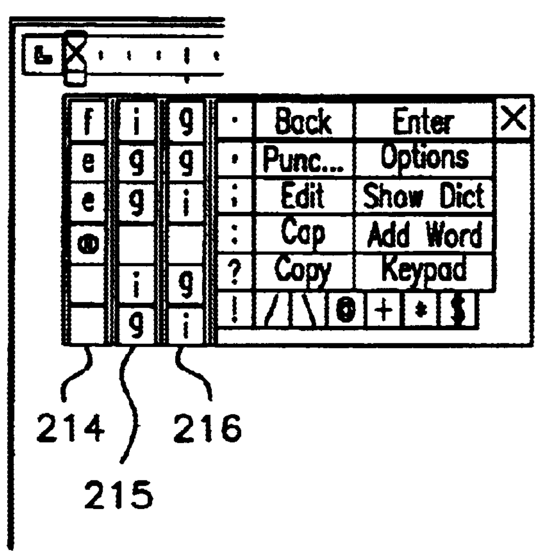
Figure 97:
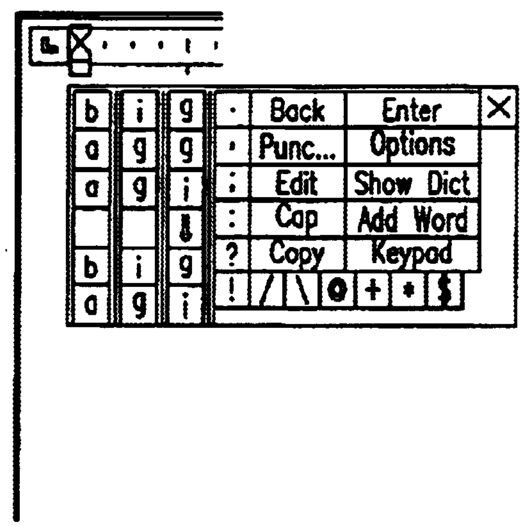

(8) The user may decide to replace a letter(s) in the letter and sequence lines with another letter. The user then right clicks on a column of letters in the letter lines, a menu appears with the choice of command's: Insert, Replace, Delete, and Scroll (See FIGS. 95, 96 and 97). Simultaneously, the down arrow (See row 213, FIG. 87) moves above that column of letters which the user right clicked. The user then left clicks on "replace" in the menu. The letters in that column are then removed and the letter "R" appears above that column (which indicates that the "Replace" command was received) and the letters in that column are deleted (see FIG. 96, column 214). The user then selects another letter by pressing on a key which is assigned the desired letter. The letter(s) associated with that key are then displayed in the letter and sequence lines in that column displayed in the grid(s) where the letter(s) were just removed. In FIGS. 95, 96 and 97, the above procedure is followed in replacing the letter "f" in column 214 with the letter "b."

(9) The user may press the down arrow key that number of times so that down arrow is pointing on the column of letters where letter(s) are to be either inserted, replaced, deleted, or scrolled. The user then presses a key assigned the desired command. If he presses the replacement key, the letters in that column are removed and the letter "R" appears above the column. The user then presses the key with the desired letters assigned to it and these letters are then displayed in that column in the dynamic window.

Figure 98:
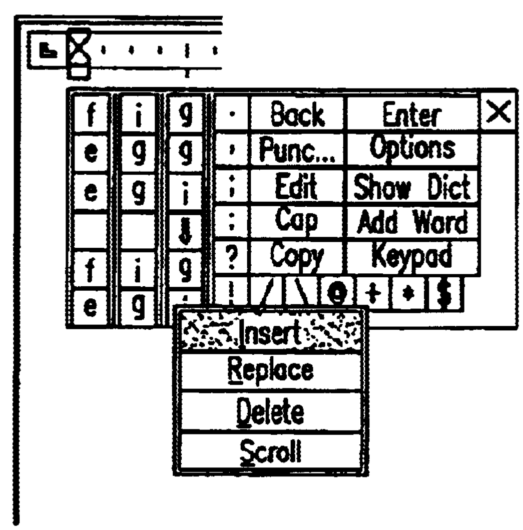
Figure 99:
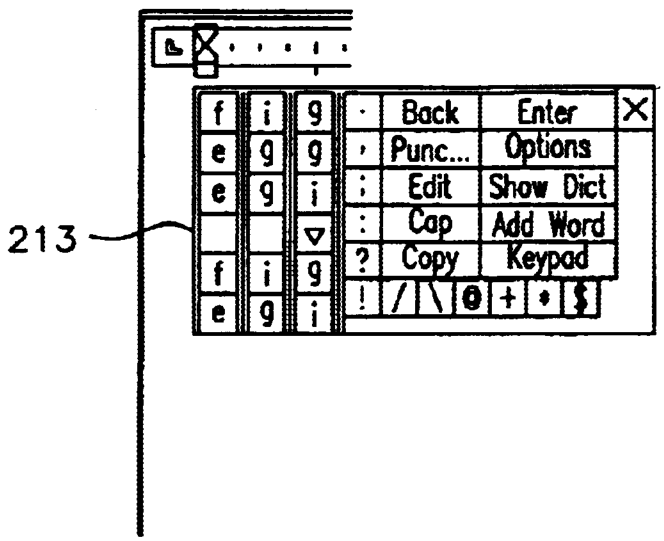
Figure 100:
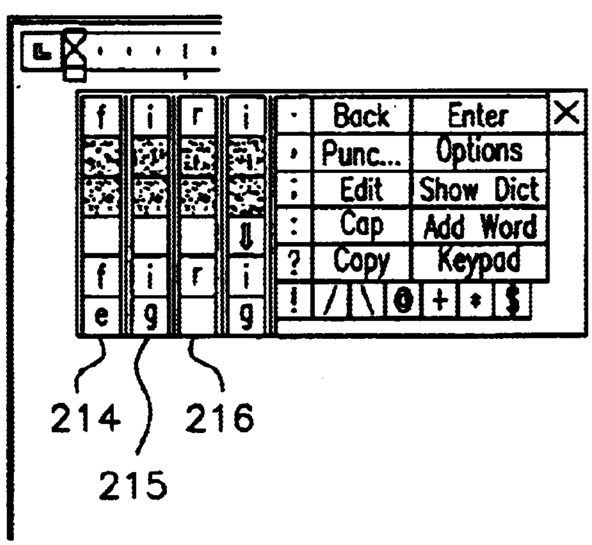

(10) The user may desire to insert letter(s) between two letters displayed in the sequence lines. The user would right click on the column of letters which is displayed in a grid which is after the location where the letter is to be inserted. The menu with the choice insert, replace, delete, and scroll are displayed and simultaneously the down arrow appears above that column. The user then left clicks on the command "insert," which is displayed in the menu. A down arrow of a different design replaces the previous down arrow, which indicates that the command insert was entered (See FIG. 99, Row 213). The user then presses a key assigned the desired letter which causes the letter(s) associated with that key to be inserted and displayed in the column to the left of the arrow. See FIGS. 98, 99, 100 which causes the above procedure when inserting the letter "R" in column 216, FIG. 100. (8) The user may elect to press keys rather than use the mouse as described above. In that case, he would press the down arrow key that number of times so that the down arrow is pointing on the column of letters which is after the column where the letter is to be inserted. The user then presses the key assigned the "insert" function. The down arrow changes its design, which indicates that the "insert" command was entered and the user then presses a key assigned the desired letter, which is then displayed in the column of grids, in the letter and sequence lines, which is to the left of the column, where the down arrow was located.

Figure 101:
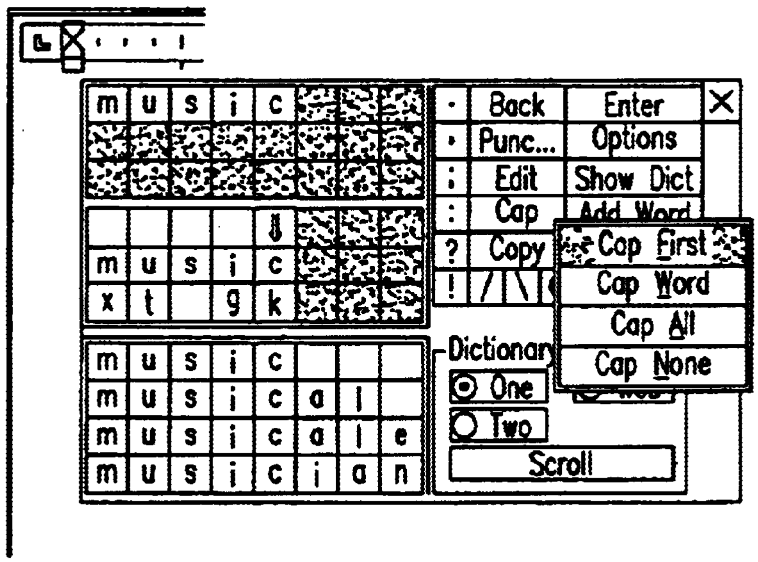
Figure 102:
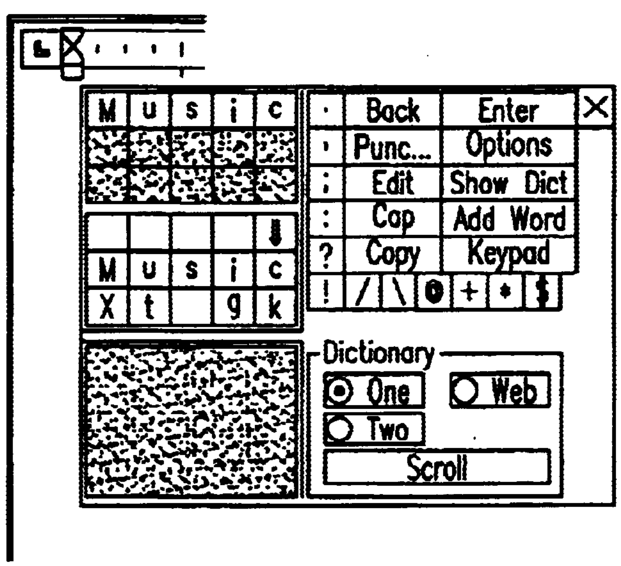
Figure 103:
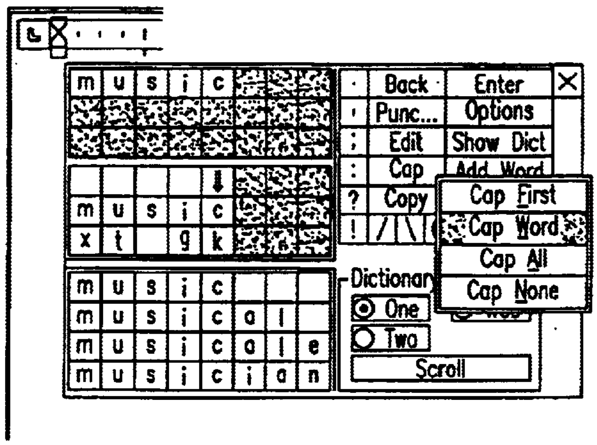
Figure 104:
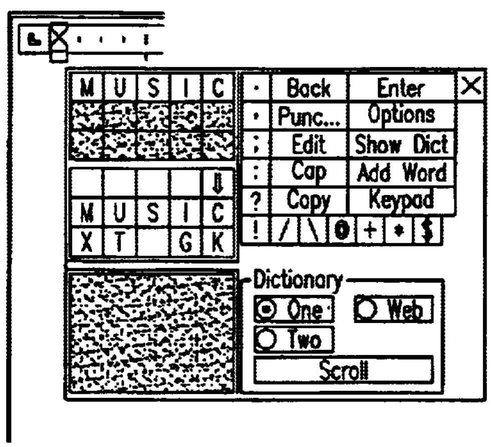
Figure 105:
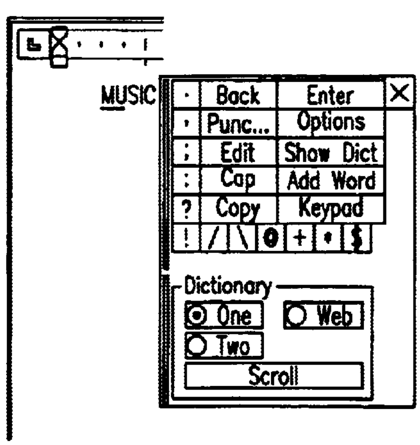

The user can implement capitalization by clicking on the function key "CAP," FIG. 76, Section 203, which causes a menu to appear as shown in FIG. 101, which displays the commands, "CAP First," "CAP Word," "CAP All" and "CAP None." By clicking on "CAP First," the user can cause the first letter of a sequence either about to be displayed, partially displayed, or entirely displayed in Marv's window, to be capitalized. For example, FIGS. 101 and 102 show the letter "m" which is the first letter of a series of letters changed to a capital "M" by clicking on "CAP First". By clicking on "CAP Word," the entire series of letters displayed in the dynamic window is capitalized (See FIGS. 103 and 104).

After that letter or series of letters moves to the word document that capitalization stops until the user clicks on "CAP word" again.

By clicking on "CAP All," all letters displayed thereafter in the dynamic window will be capitalized for successive entries into the word document until the user clicks on "CAP None."

Figure 110:
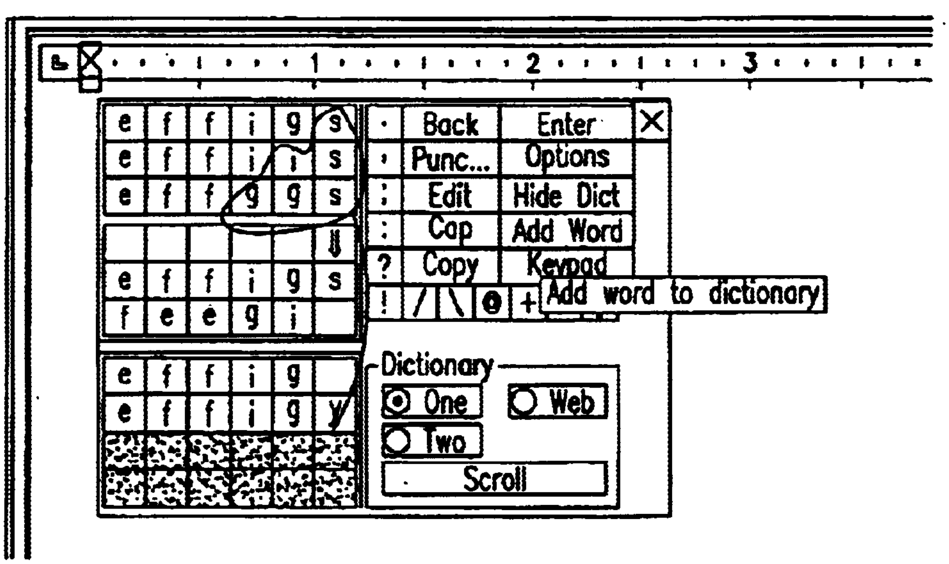
Figure 111:
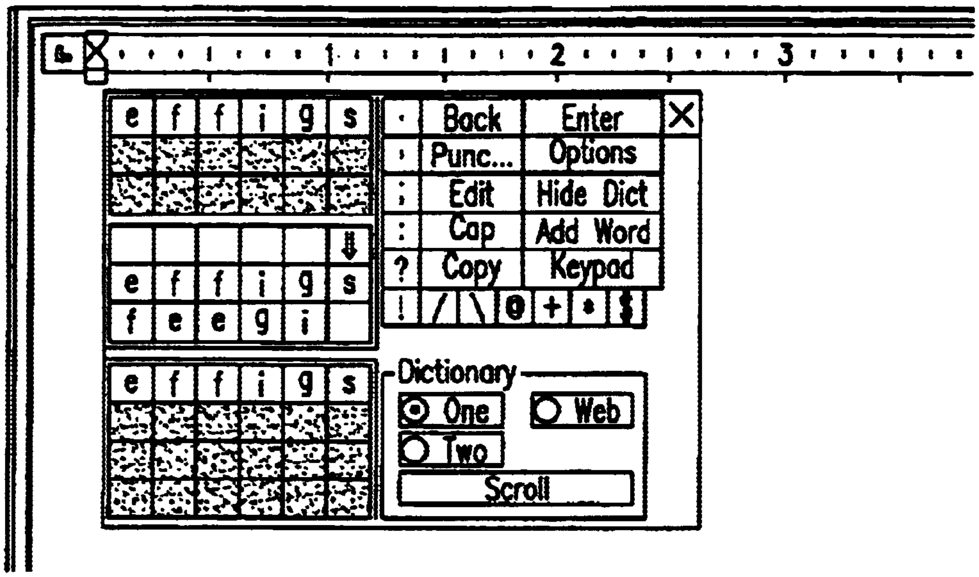

If the user enters letters and a match is found in the dictionary, for the series of letters entered, then those letters are displayed in black type as each letter is entered. However, if letters are added to that series and no match is found, for those letters, then those letters would be displayed in red as they are entered. The user may decide to add that word to the dictionary. By default, this word would be added to dictionary one unless the user clicked on dictionary button "two" (See 220, FIG. 77) in order to add the word to dictionary two. In both cases, the user would click on "Add Word" in Section 203 of FIG. 70 and the word would be entered into the dictionary chosen by the user. Thereafter, the entire word would appear in black type as it is entered. See FIGS. 109, 110, and 111.

Figure 106:
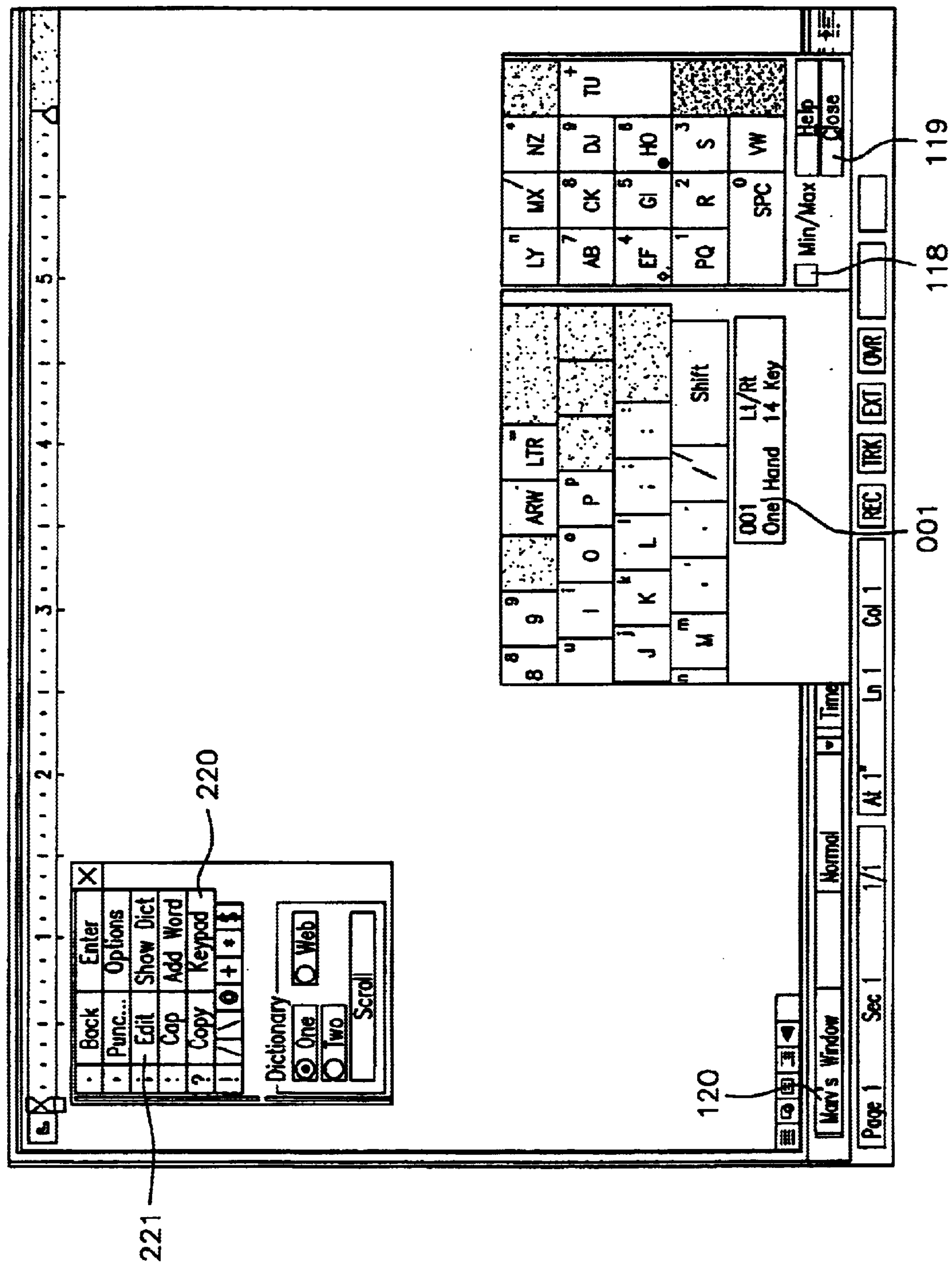

The keyboard layout, 001, shown in FIG. 106.

Figure 107:
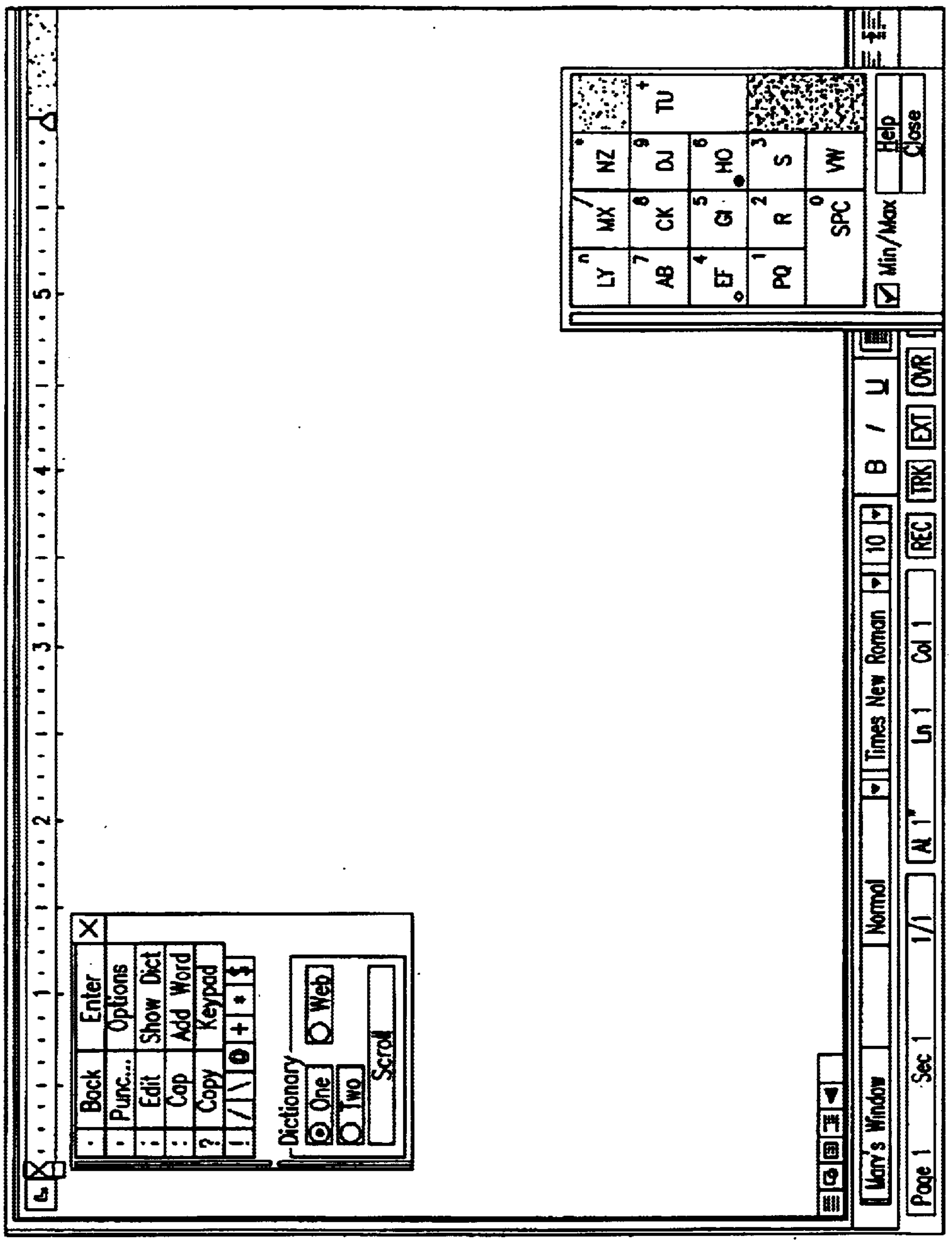
Figure 108:
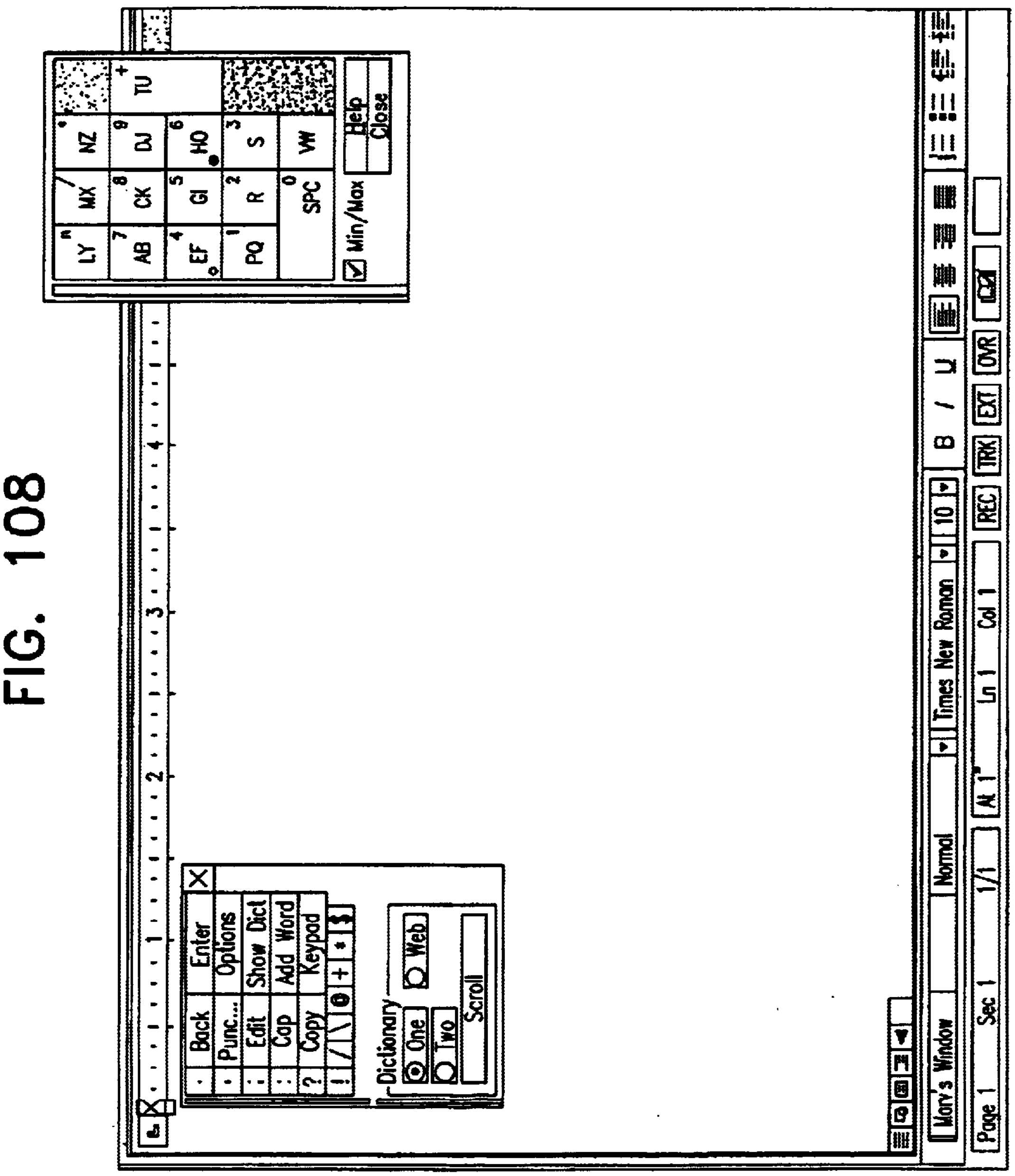

By clicking on the Min/Max box located on the bottom of each keyboard, e.g., see 118 on FIG. 106, the user can eliminate part of the display and the layout then appears as shown in FIG. 107. The user can cause the entire keyboard layout not to be displayed by left clicking on "Close," 119, on FIG. 106. The keyboard layout will reappear by left clicking on the "keypad" button, 120, FIG. 106. The user can cause the keyboard layout to move to the top of the screen or to the bottom by left clicking on the "keypad" button, 120, FIG. 106. See FIGS. 107 and 108.

The dynamic window can be removed from the screen by either (1) left clicking on the word document, or (2) left clicking on the "X" in the top right corner of the dynamic window, See 219, FIG. 72. The user can place the window in any location on the screen by (a) first removing the dynamic window from the screen by the method described above and then (b) moving the insertion pointer to the desired location vertically by pressing the enter key and horizontally by pressing the space bar. The backspace key can be used to reverse this change. After such change, by left clicking on the button "Marv's Window, the dynamic window is then displayed so that the top line of the window is to the right and adjacent to the insertion pointer, see 201, FIG. 70. The button Marv's window, is displayed on the left side of the screen on the same line as (or under) the formatting toolbar, Section 220 on FIG. 106.

Punctuation symbols and numbers can be entered next to the insertion pointer in the word document by the following methods:

(1) By left clicking on a mark or symbol shown in the border of Marv's window, See FIG. 76, above and to the right of 202, where the marks are . , j : ? !/\ @ + * $, are shown in a grid.

Figure 135:
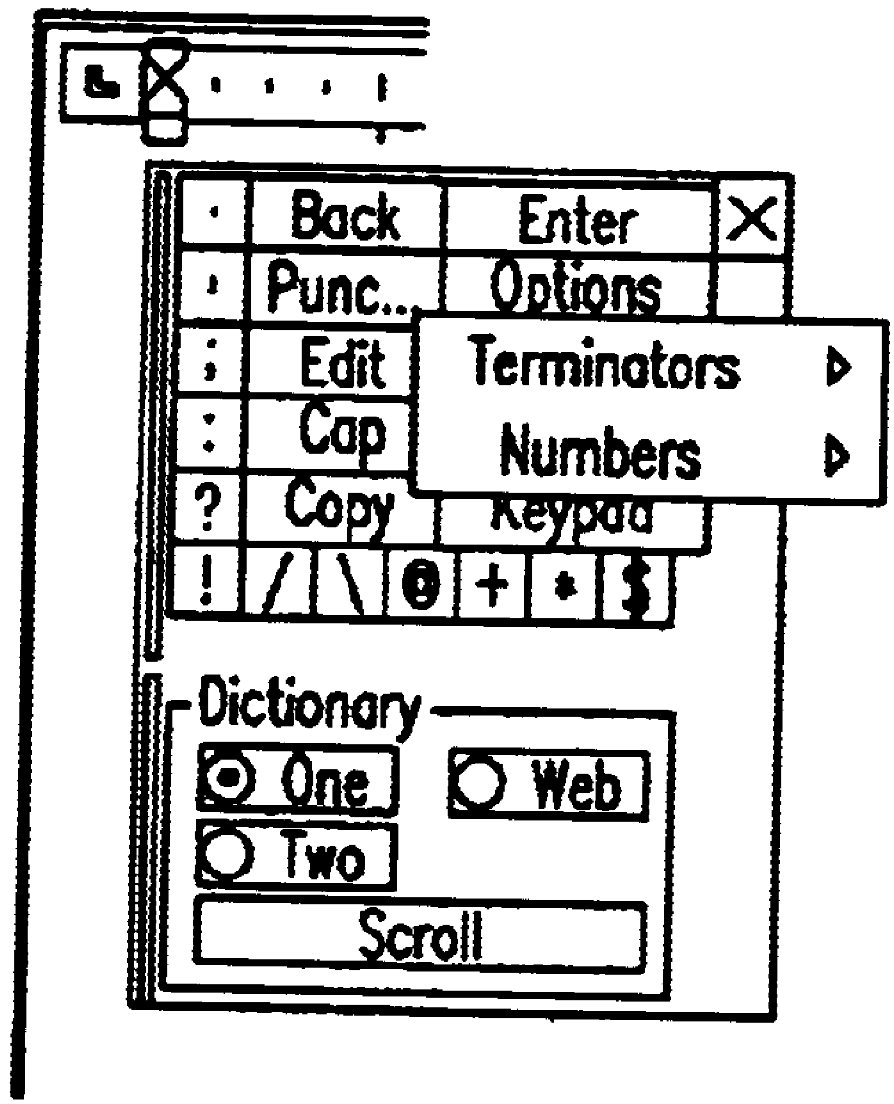
Figure 136:
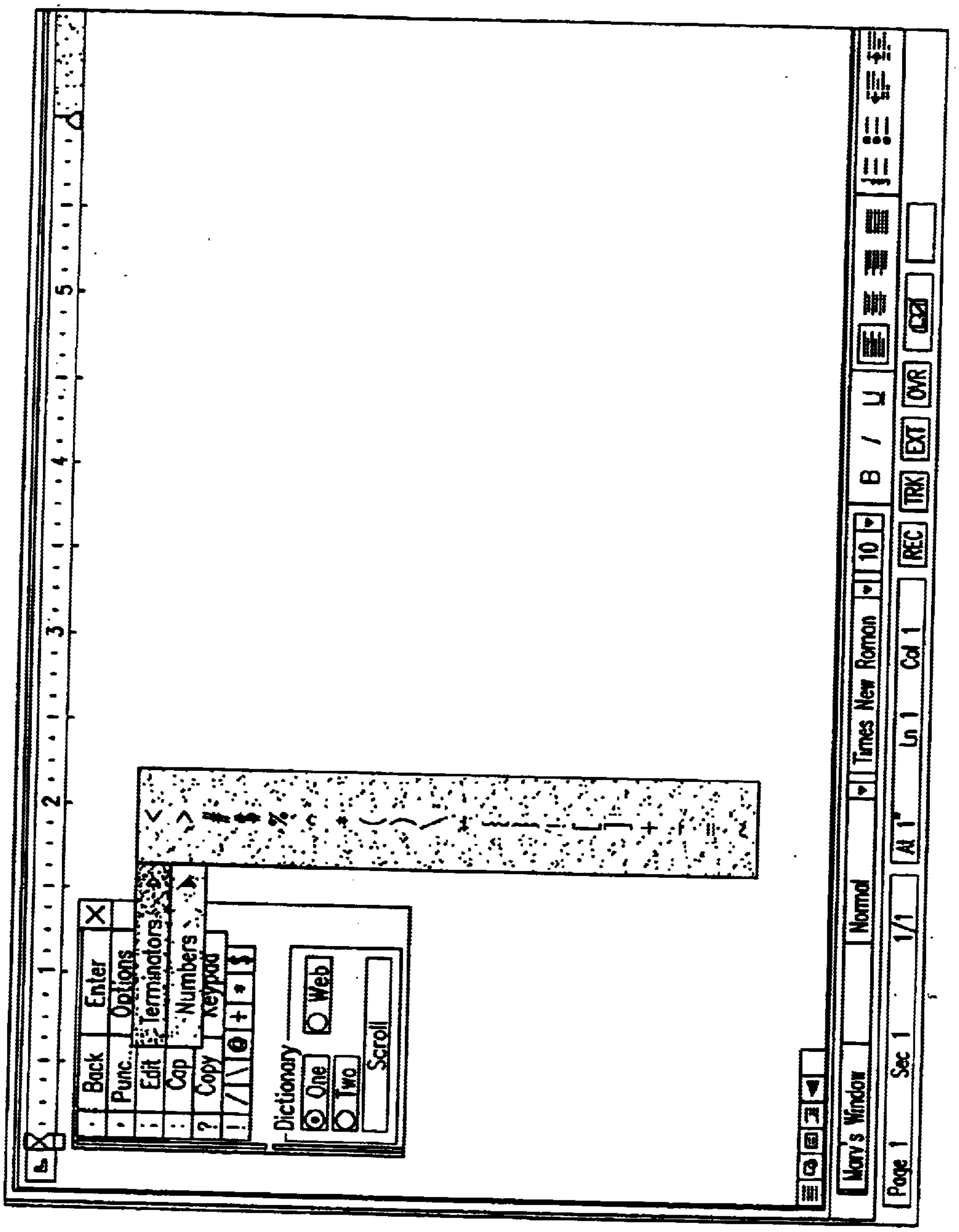
Figure 137:
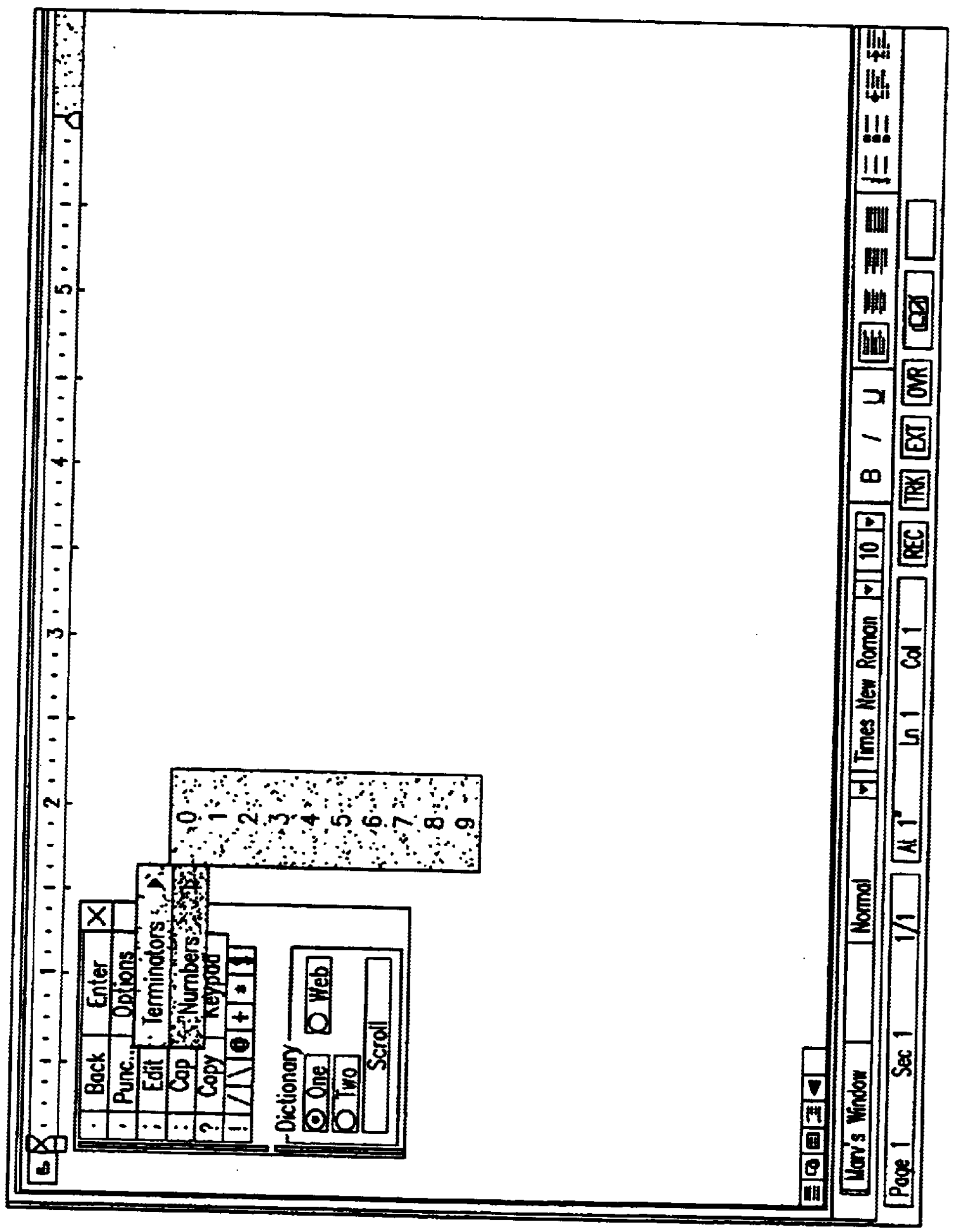
Figure 138:
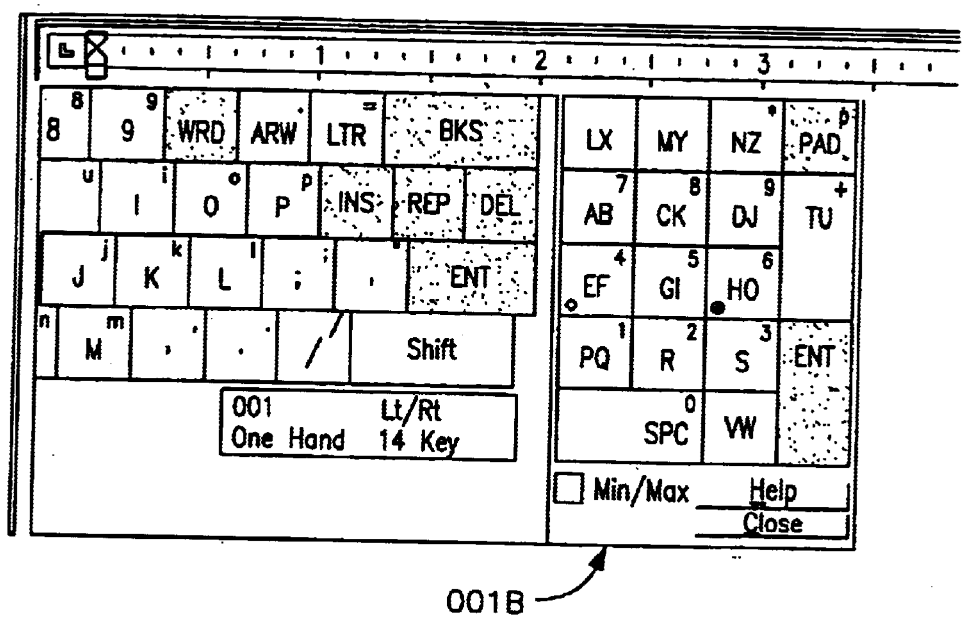
Figure 139:
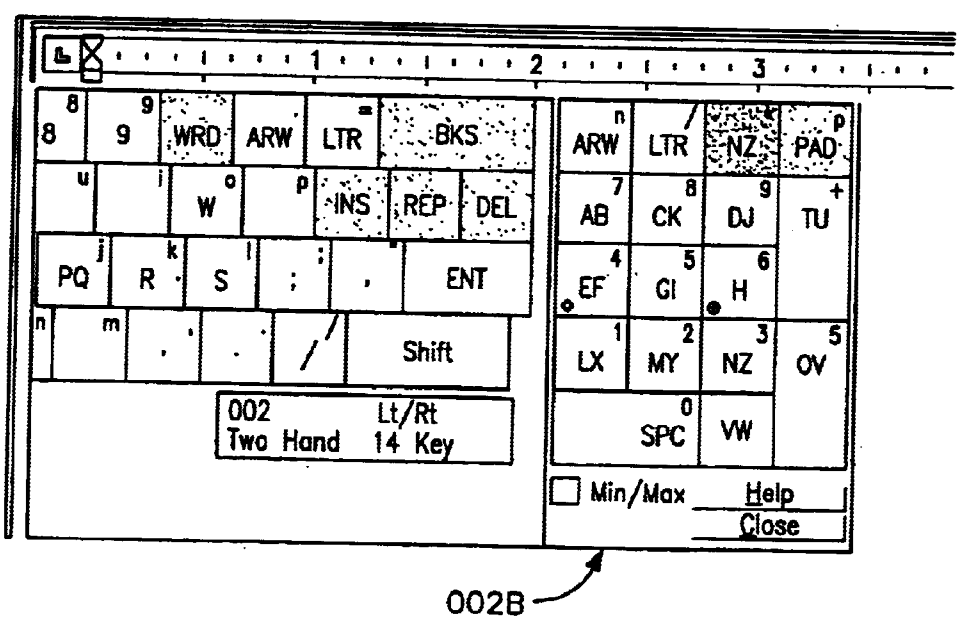
Figure 140:
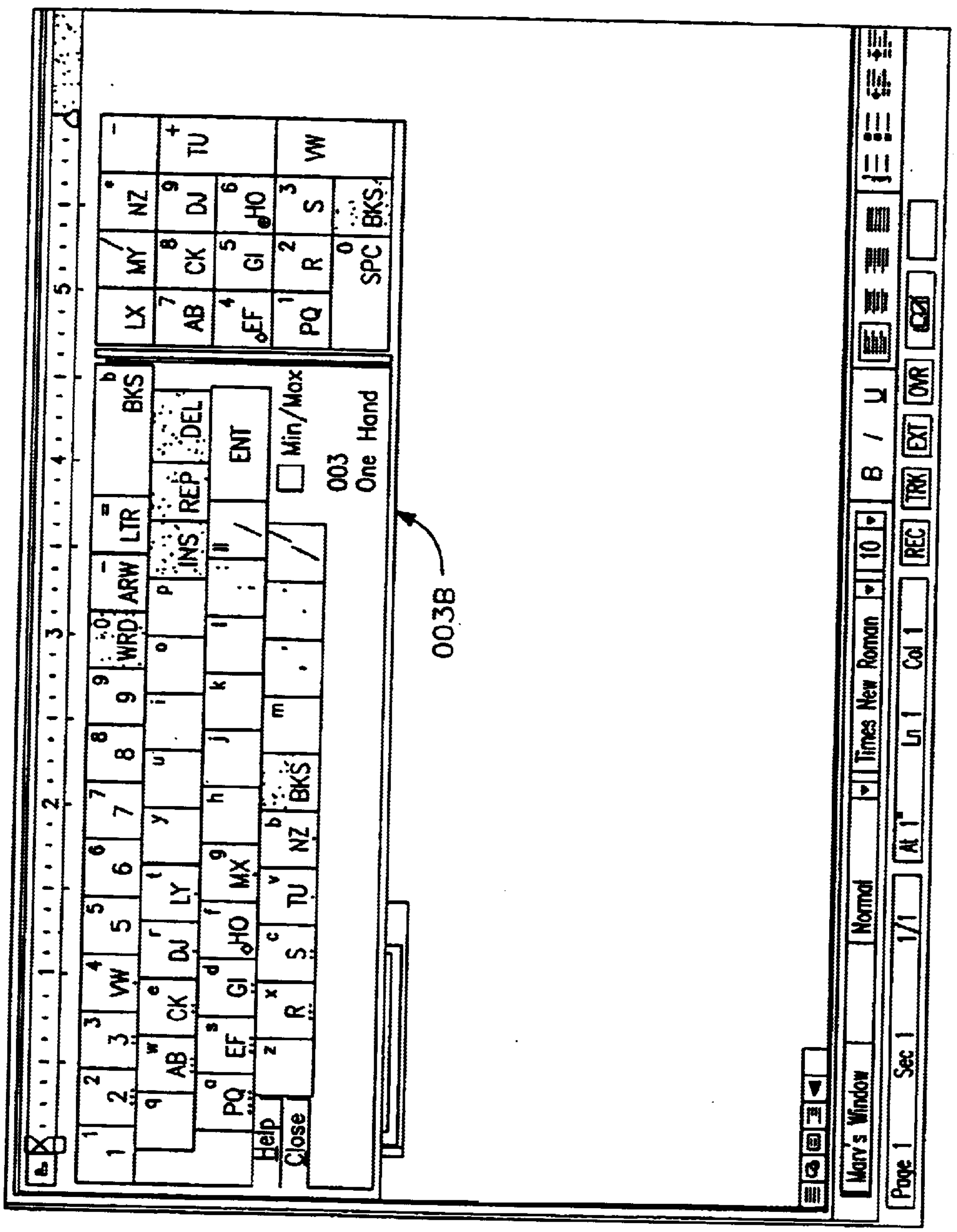
Figure 141:
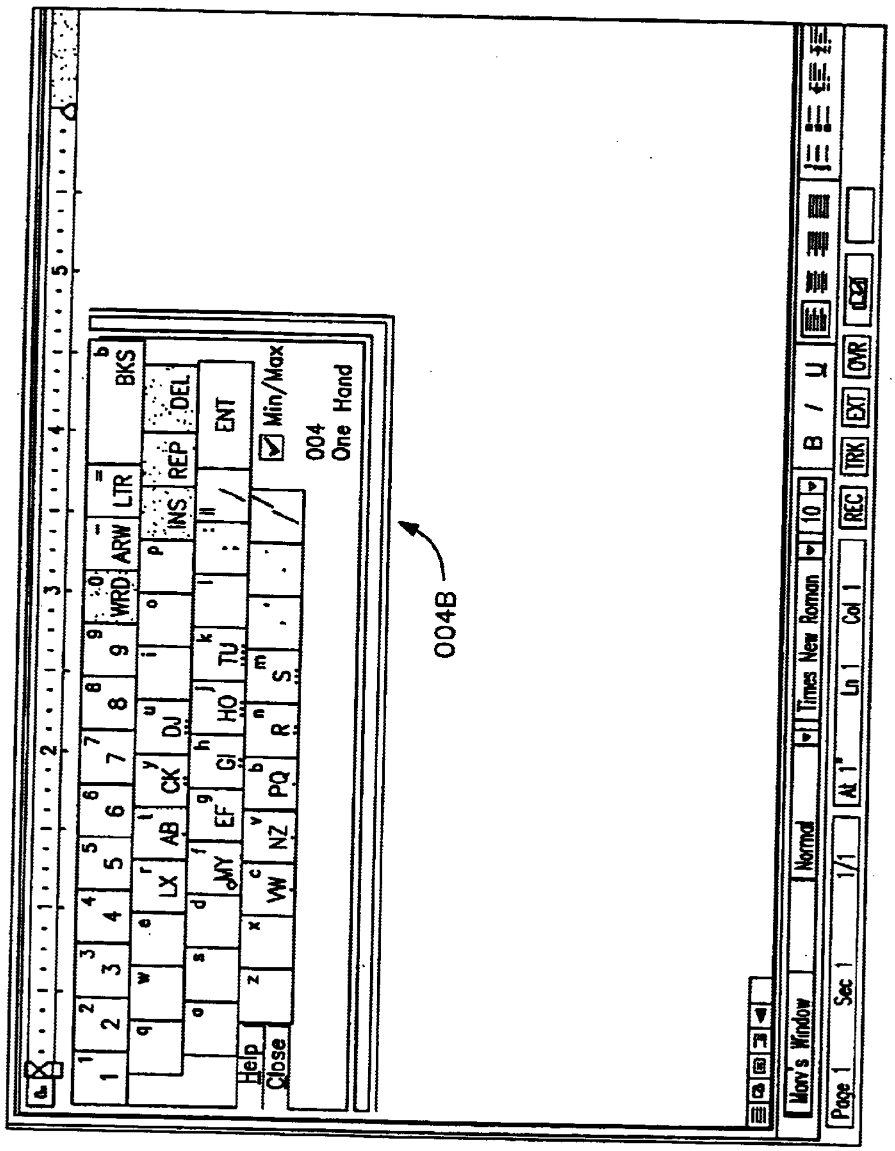
Figure 142:
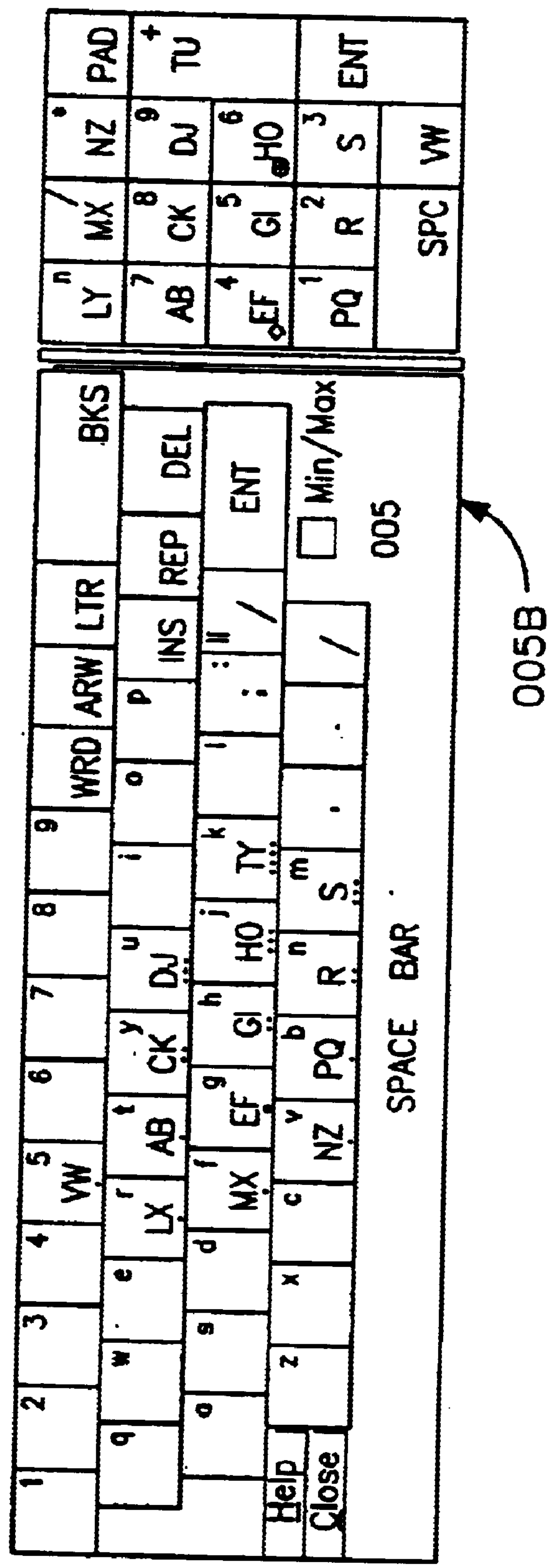
Figure 143:
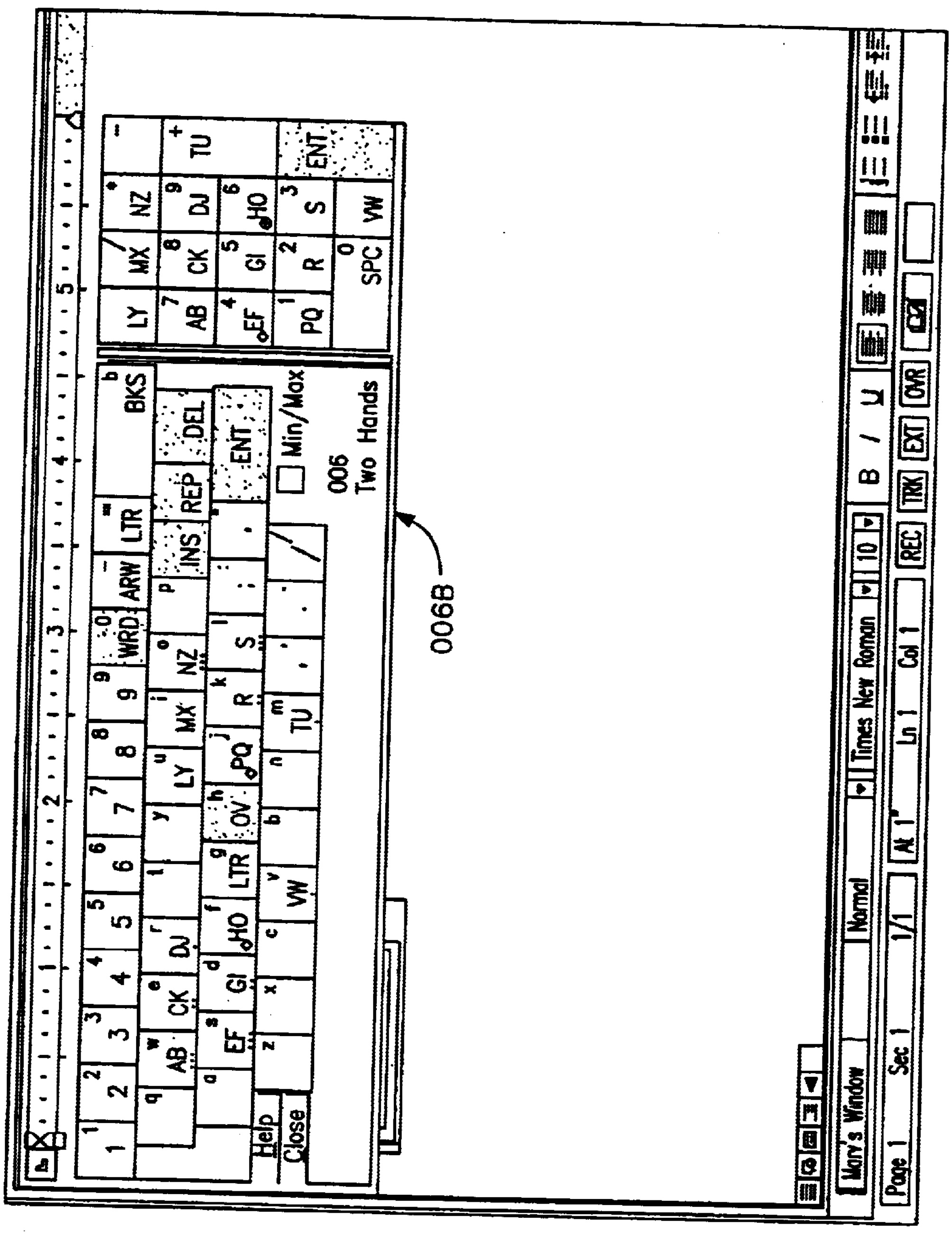
Figure 144:
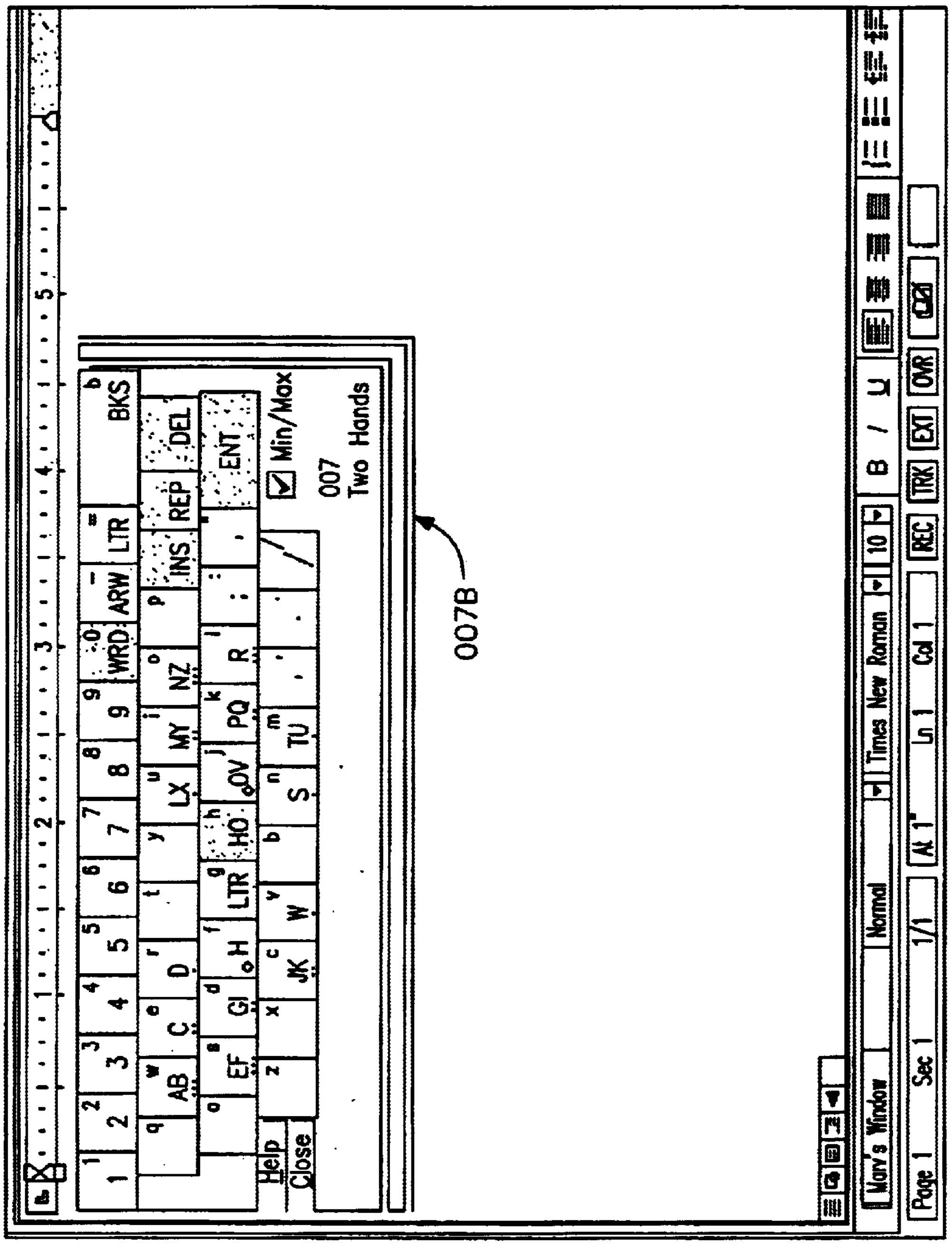
Figure 145:
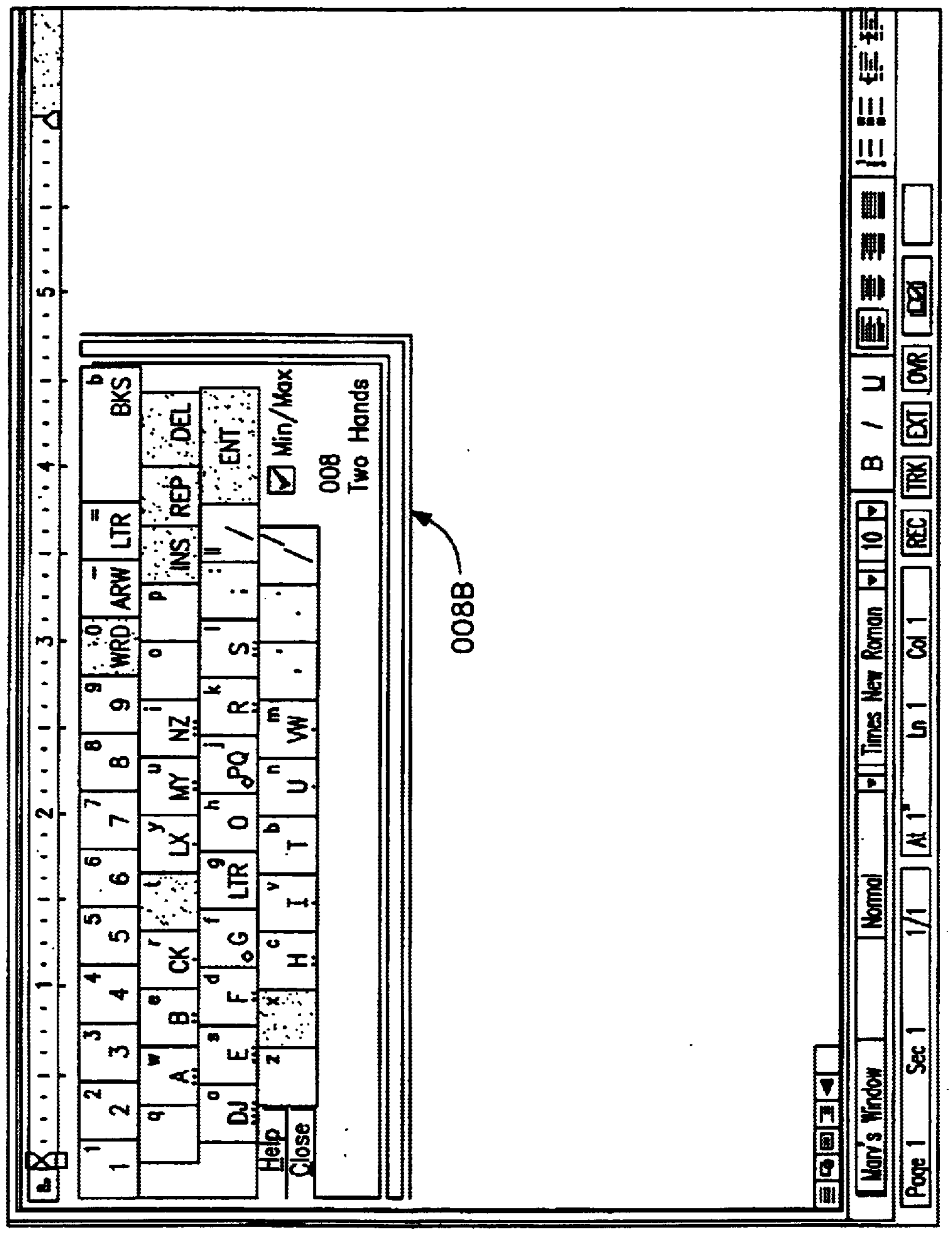

(2) By clicking on "Punc," see FIG. 135, the menu headed Terminators and Numbers are displayed. The user can then either (i) left click on "Terminators" and the list of symbols will be displayed, see FIG. 136. The user then clicks on the desired mark on that list and it will be displayed or (ii) the user can then left click on "Numbers," and the list of numbers, 0 thru 9, see FIG. 137, will be displayed. The user then clicks on the desired number and it will be displayed in the word document.

(3) by pressing a key where marks and symbols or numbers are assigned on the Qwerty keyboard and on the number pad (See Keyboards 998, 041, 042, 043, and 044, on FIGS. 130–134)

Figure 74:
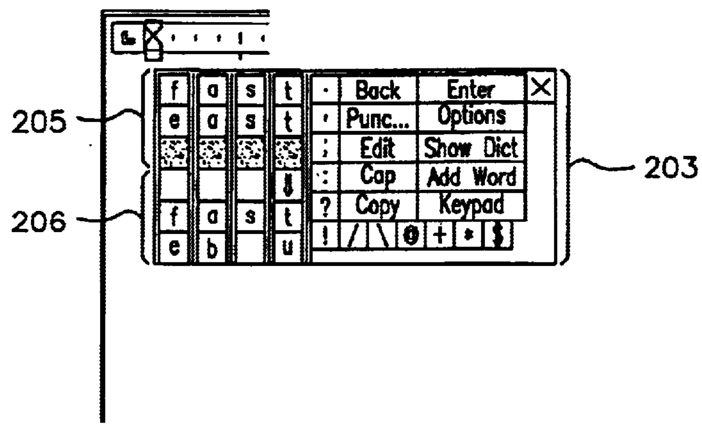
Figure 75A:
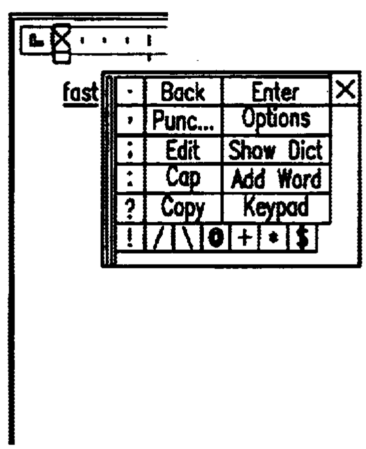
Figure 75B:
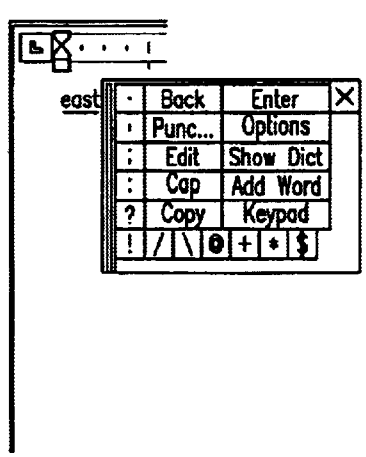

If the user has entered text and wishes to copy it, he clicks on "copy" in Section 203 of FIG. 74. He then selects the document to which he desires to copy this text, where it is to be copied and presses "Edit" and then "Paste" and the entire text is then copied into that document.

Figure 112:
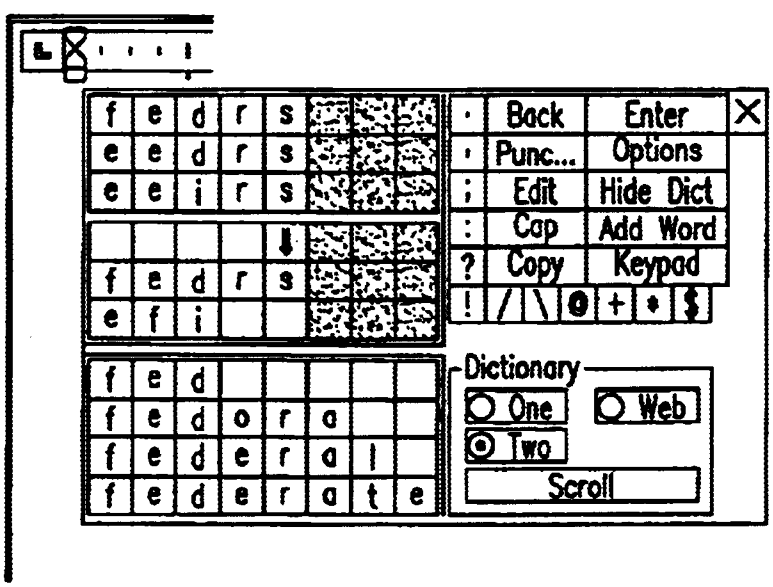
Figure 113:
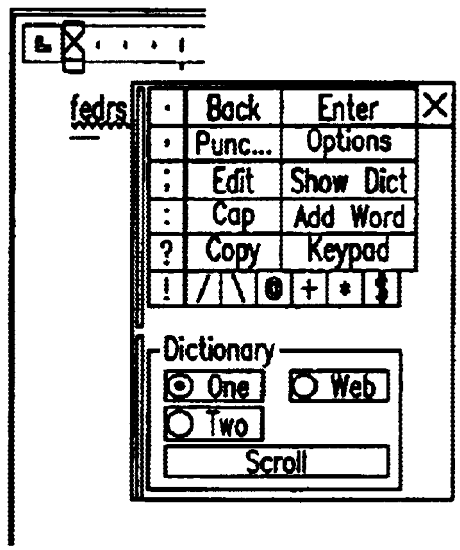
Figure 114:
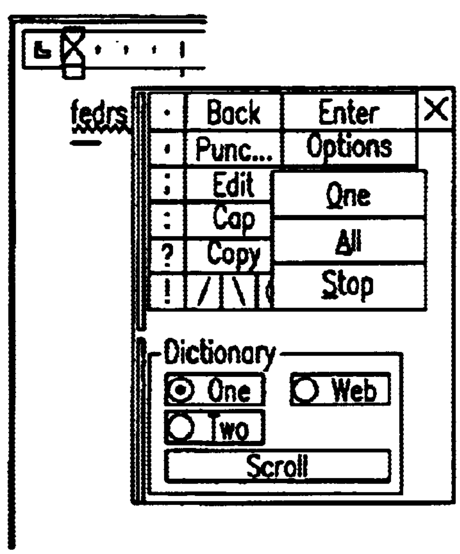
Figure 115:
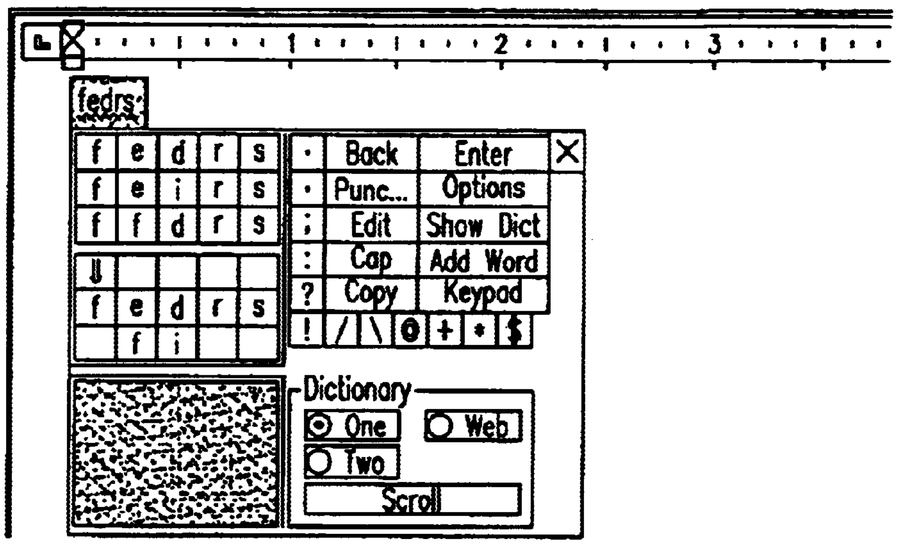
Figure 116:
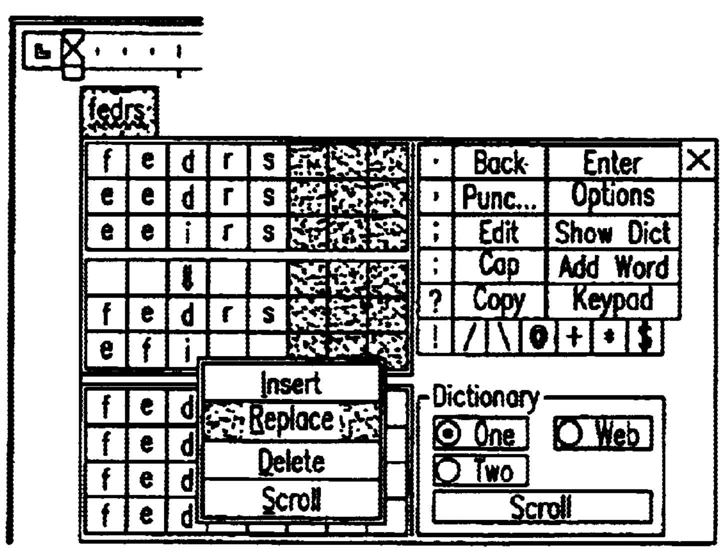
Figure 117:
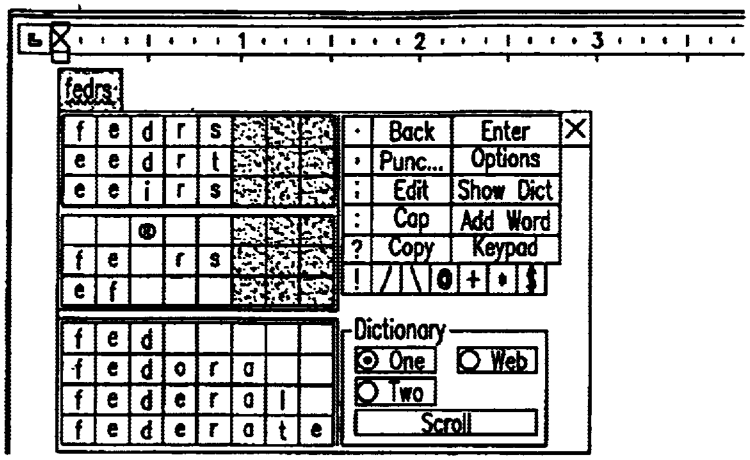
Figure 118:
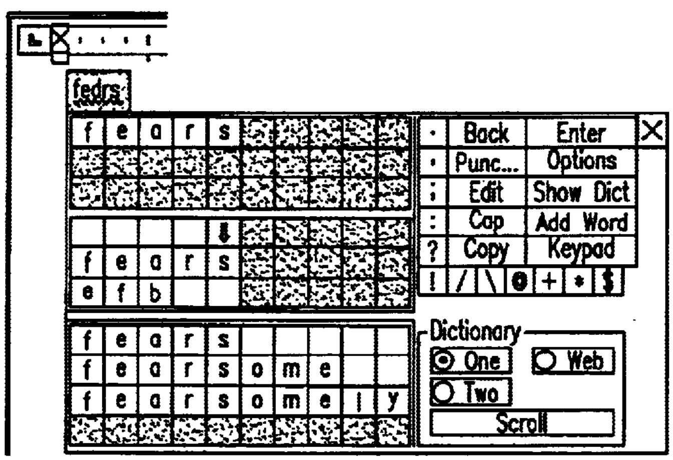
Figure 119:
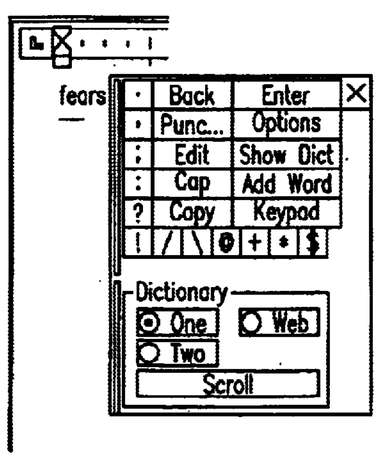

The previously designated function key for the Edit mode referred to previously is now referred to as the "Edit" button, Sect. 203, FIG. 77. If the user typed the word shown in the dynamic window in FIG. 112 and then pressed the space bar, the sequence would be entered into the word document as shown in FIG. 113. If the user had not entered the word into the word document, he could have immediately corrected the word while still in the dynamic window. By clicking on "Edit One" the word adjacent to the window, in the word document, is re-entered into the dynamic window and is displayed on the top line of the sequence lines in the dynamic window (see FIGS. 114 and 115). The third letter is corrected by replacing it with the letter "a" and the word "fears," a word for which there is a match in the dictionary, and it is entered into the word document. See FIGS. 116 to 119.

The "delay edit mode" is also an edit mode of a section of text after it has been entered. However, the step of pressing a function key to put the program in the Delay Edit Mode as previously described is deleted. Instead, the user could type and press the space bar after each series of letter without correcting for mistakes or choosing between words in the sequence lines, which resulted from the same input. Words appearing in red (or just underlined in red) indicate a misspelled word or a word for which no match was found in the dictionary. In this case, "MATCH" includes matching with respect to the number of letters. Words appearing in green (or underlined in green) would be words for which there was more than one word for which a match was found but was entered by pressing the space bar without the user previously showing a preference for one of the words in the sequence lines by using a scroll key or some other key selection method.

When the user decides to edit the text, he wold click on the "Edit" button, Section 203, FIG. 77. He could then move the insertion pointer after any word he wished to edit and then click on "Edit One" and then he could move the curser to the next word which requires editing. The user could decide to edit successively many words. In that case, he could click on "Edit All." In the preferred method, the Dynamic window then moves to the far right side of the screen so that it does not block the user's view of the text. In the alternative, it does not move to the far right side, but moves from word to word that requires editing after each word is edited. The first word that requires editing (that is, it is either red or green) would move automatically into the dynamic window. After each word is edited, the user presses the space bar, the word in the text is corrected and the next word that requires editing is moved into the dynamic window automatically. The Dynamic window stays on the far right side of the screen, with the top line of the window on the same line as the words then being edited. ("Automatically" means no input is required by the user, that is, the software program has programmed this step.)

Figure 120:
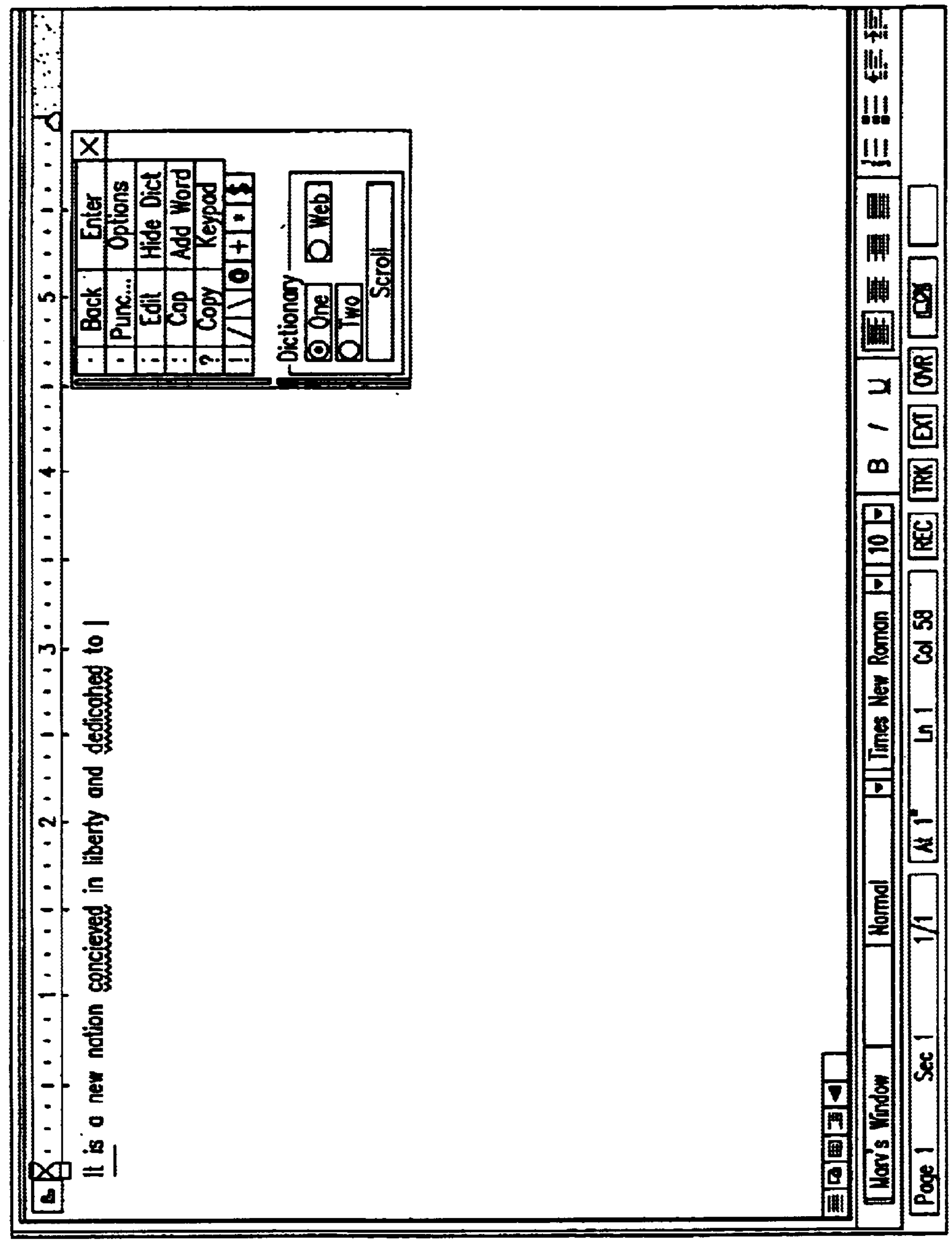
Figure 121:
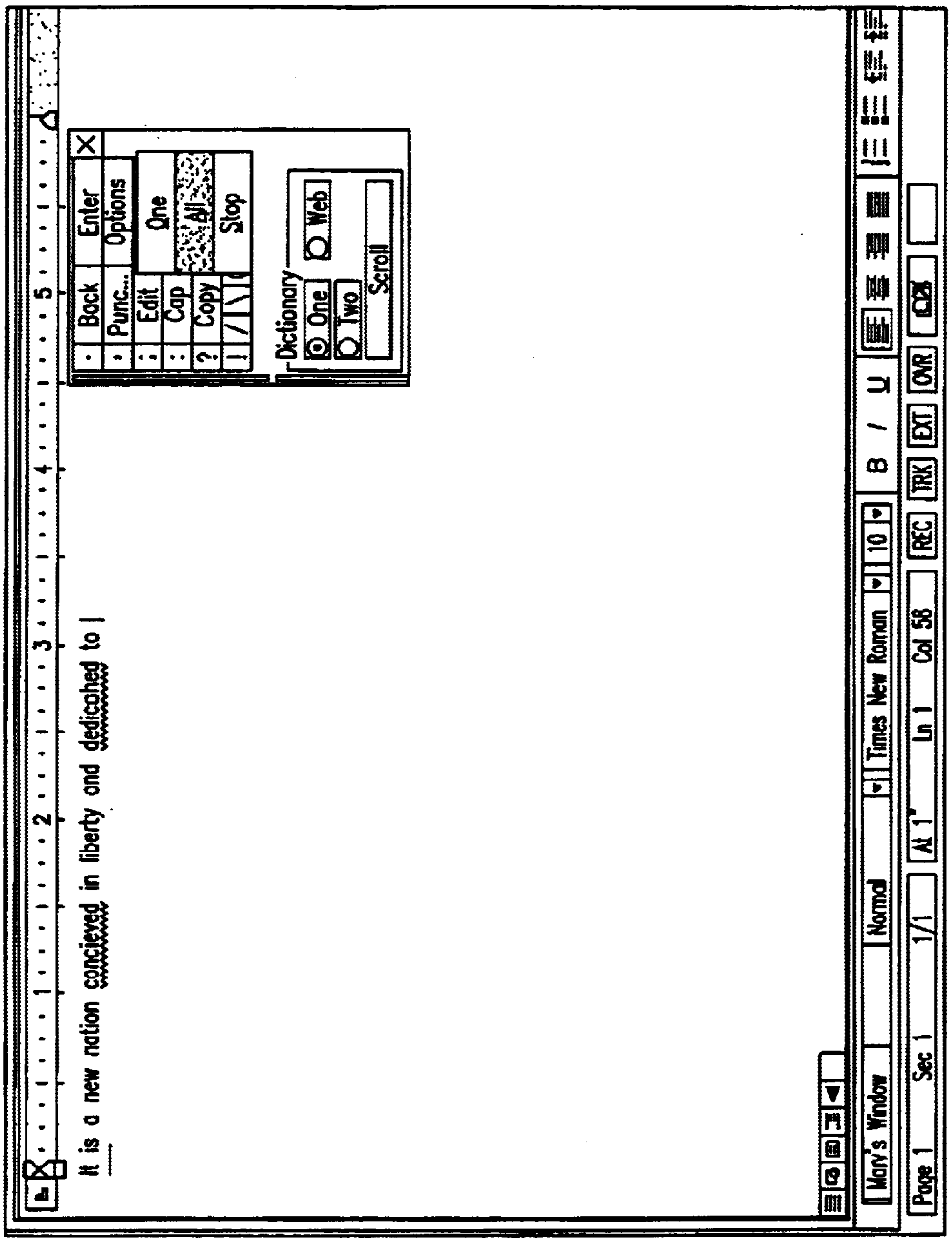
Figure 122:
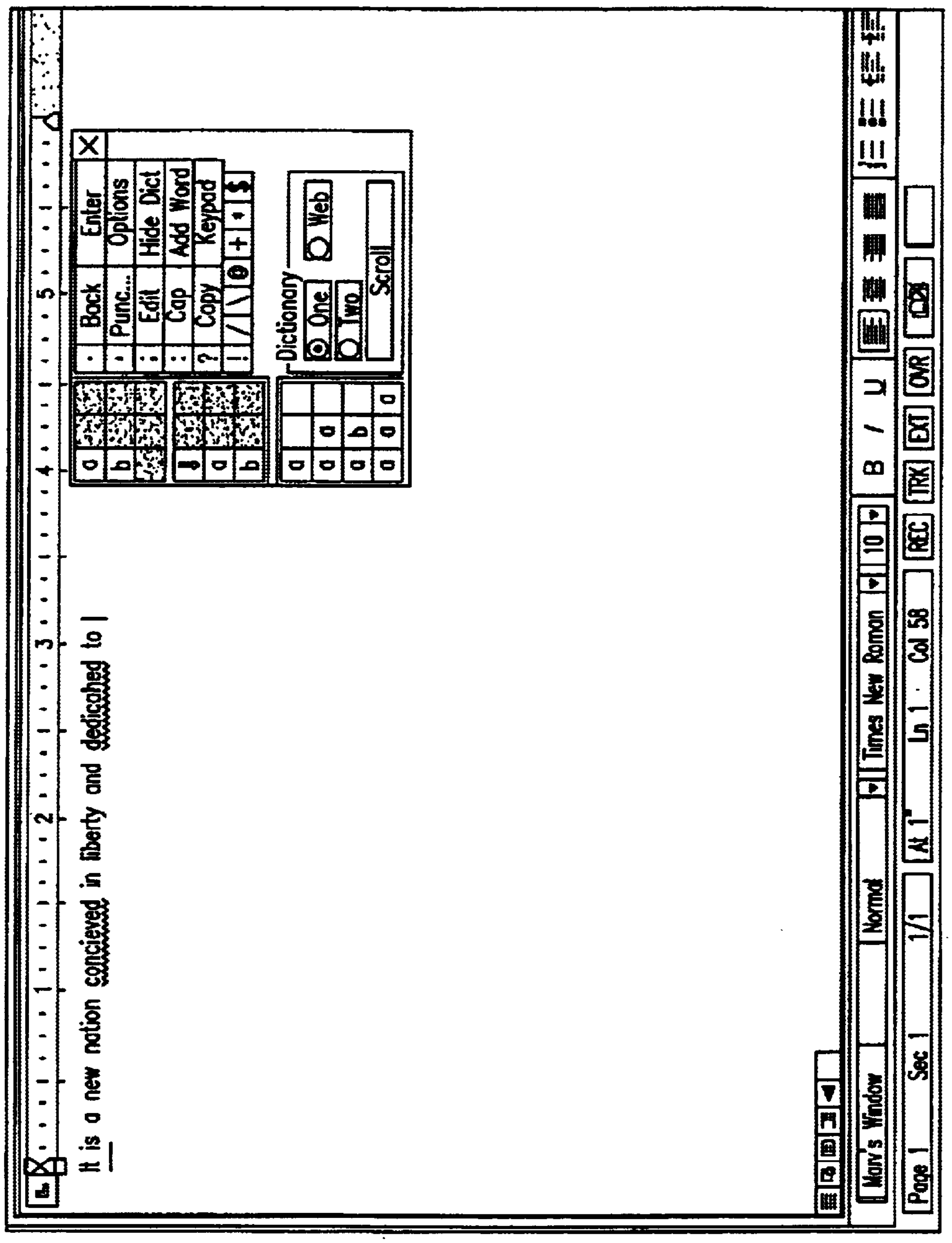
Figure 123:
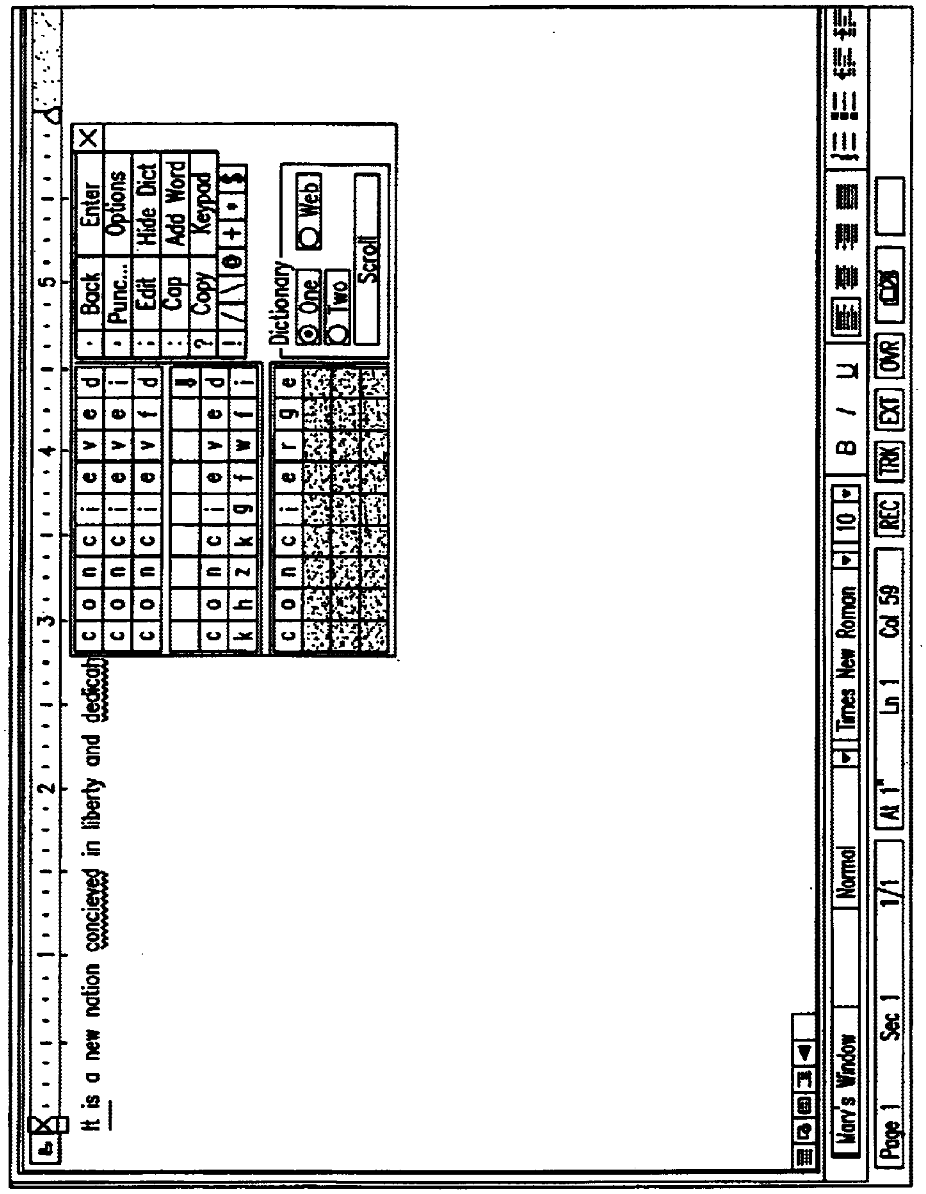
Figure 124:
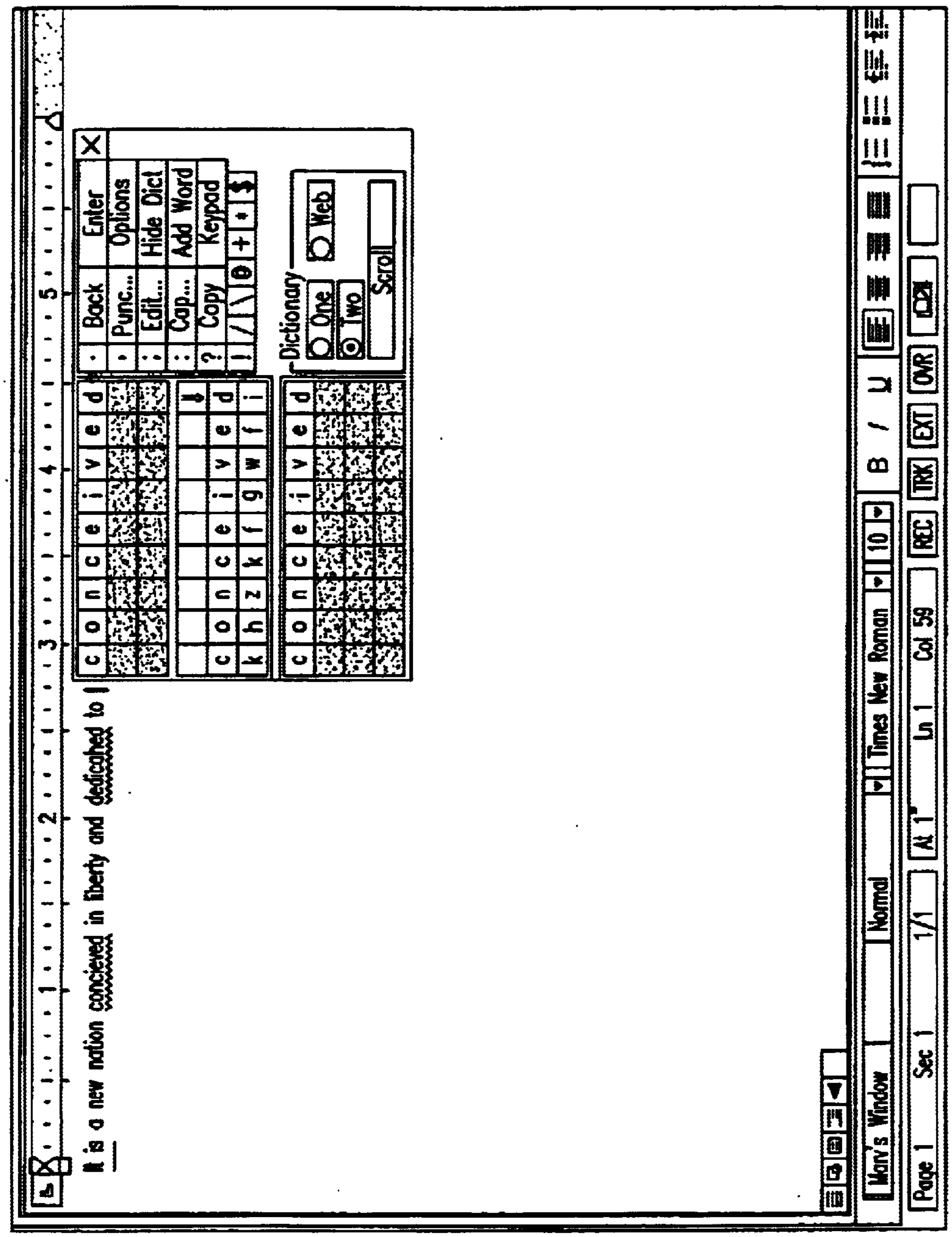
Figure 125:
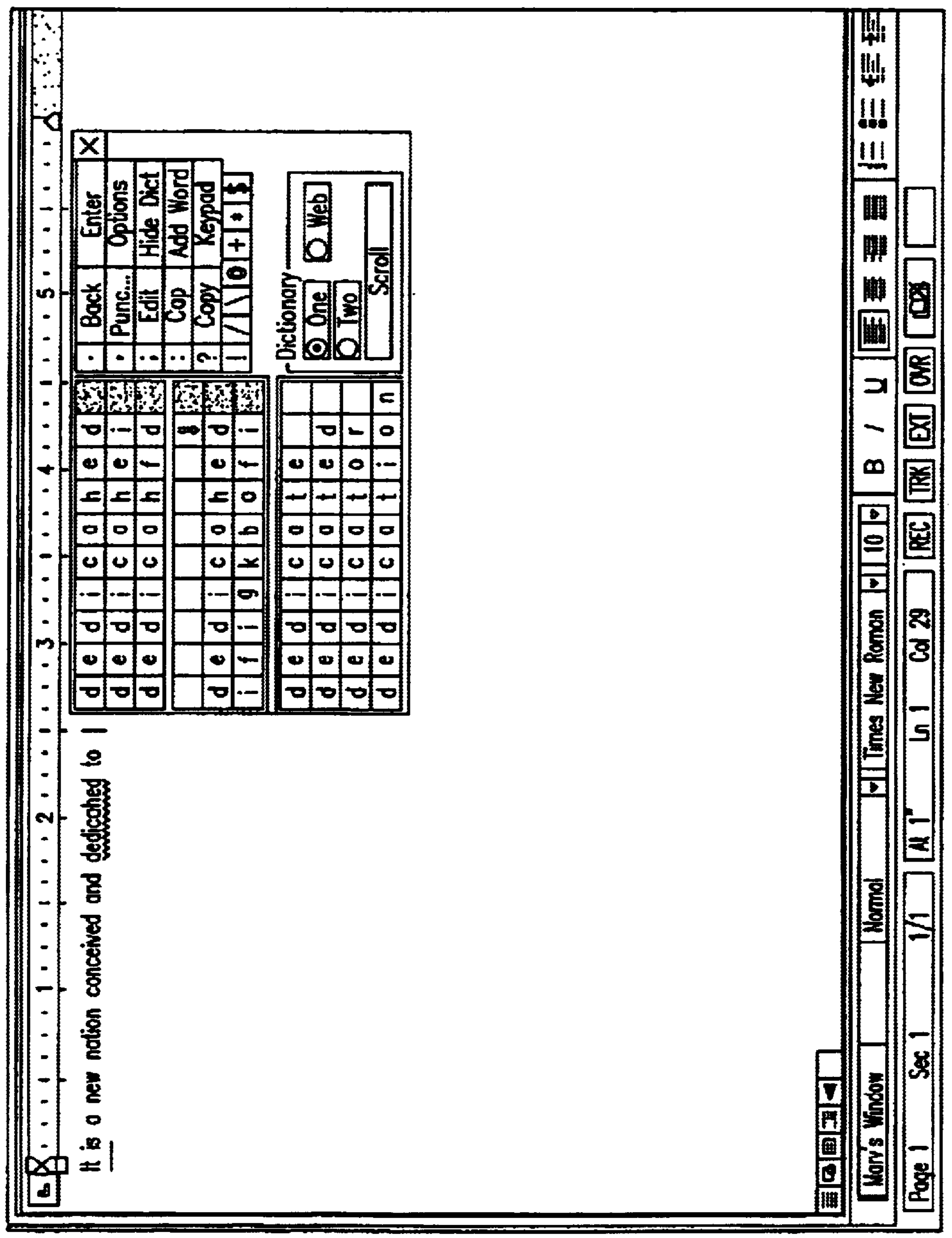

FIG. 120, shows a sentence entered into the text which requires editing. The words "a" and "to" are in green and the words "conceived" and dedicated" are misspelled and are in red. FIG. 121 shows that a left click was made on "Edit" and then on "Edit All." The first word, "a" moved automatically into the window, FIG. 122, shows that there was a choice on the sequence lines between "a" and "b." The user could then press the space bar and the letter "a" would be displayed in black, see FIG. 123.

Figure 126:
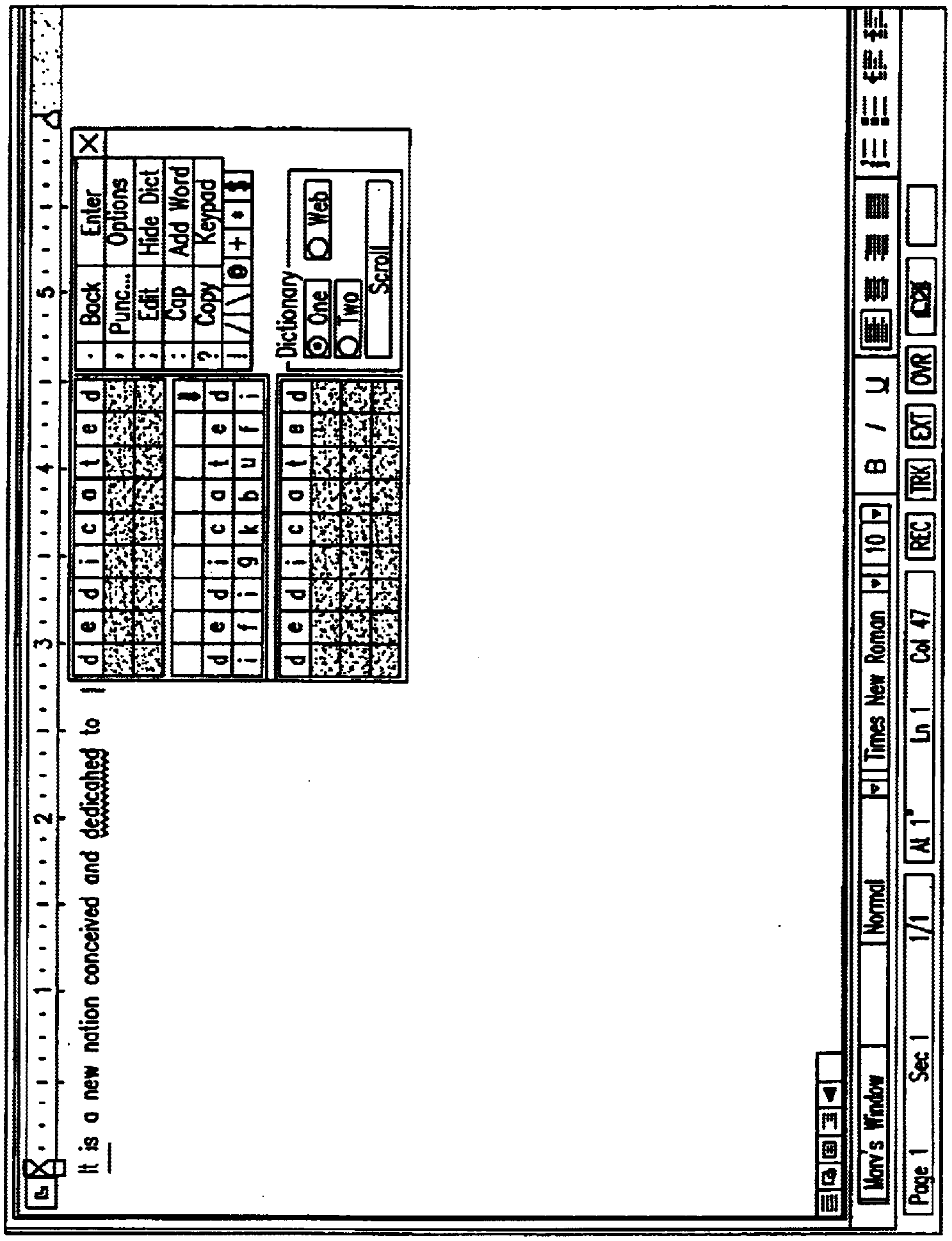
Figure 127:
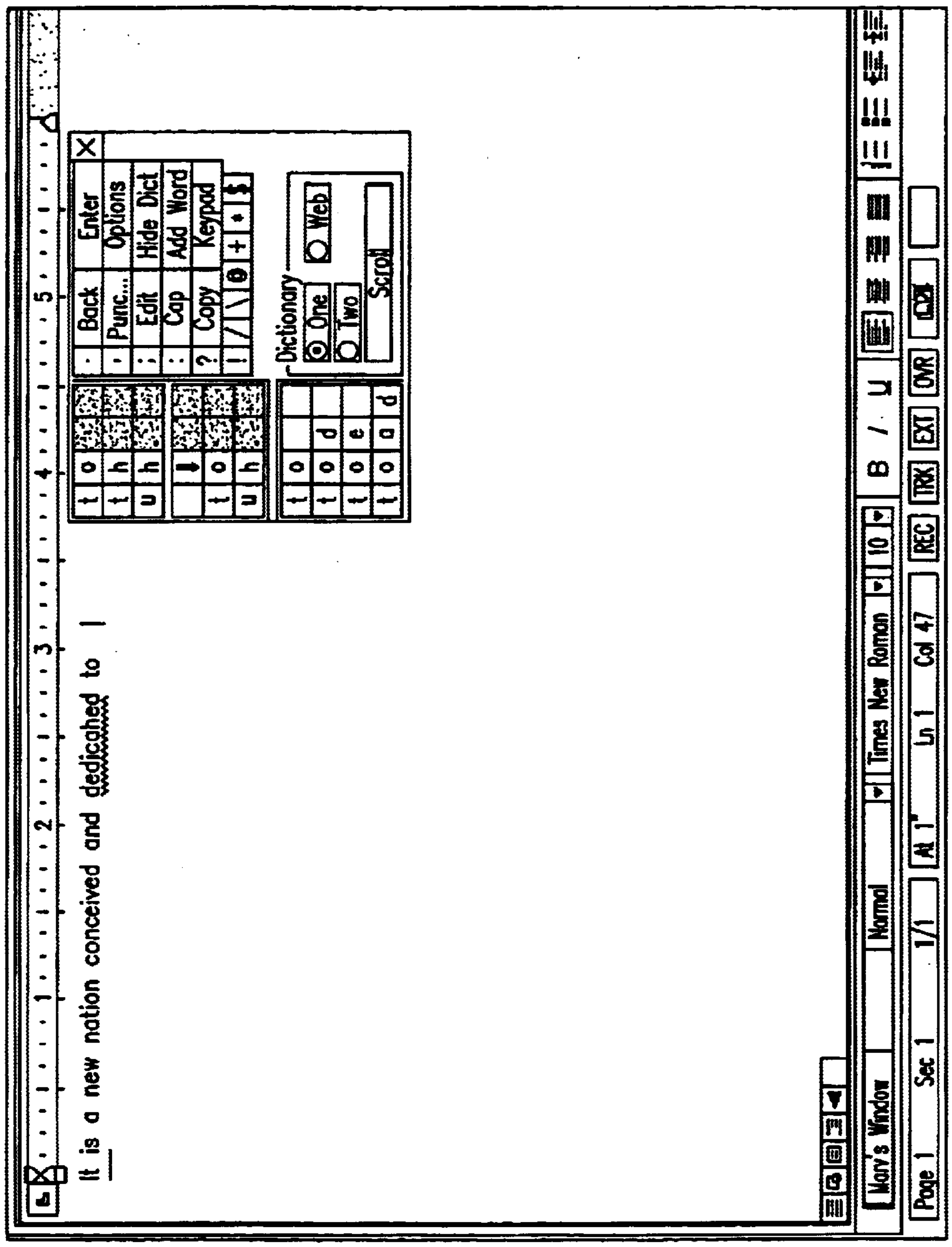
Figure 128:
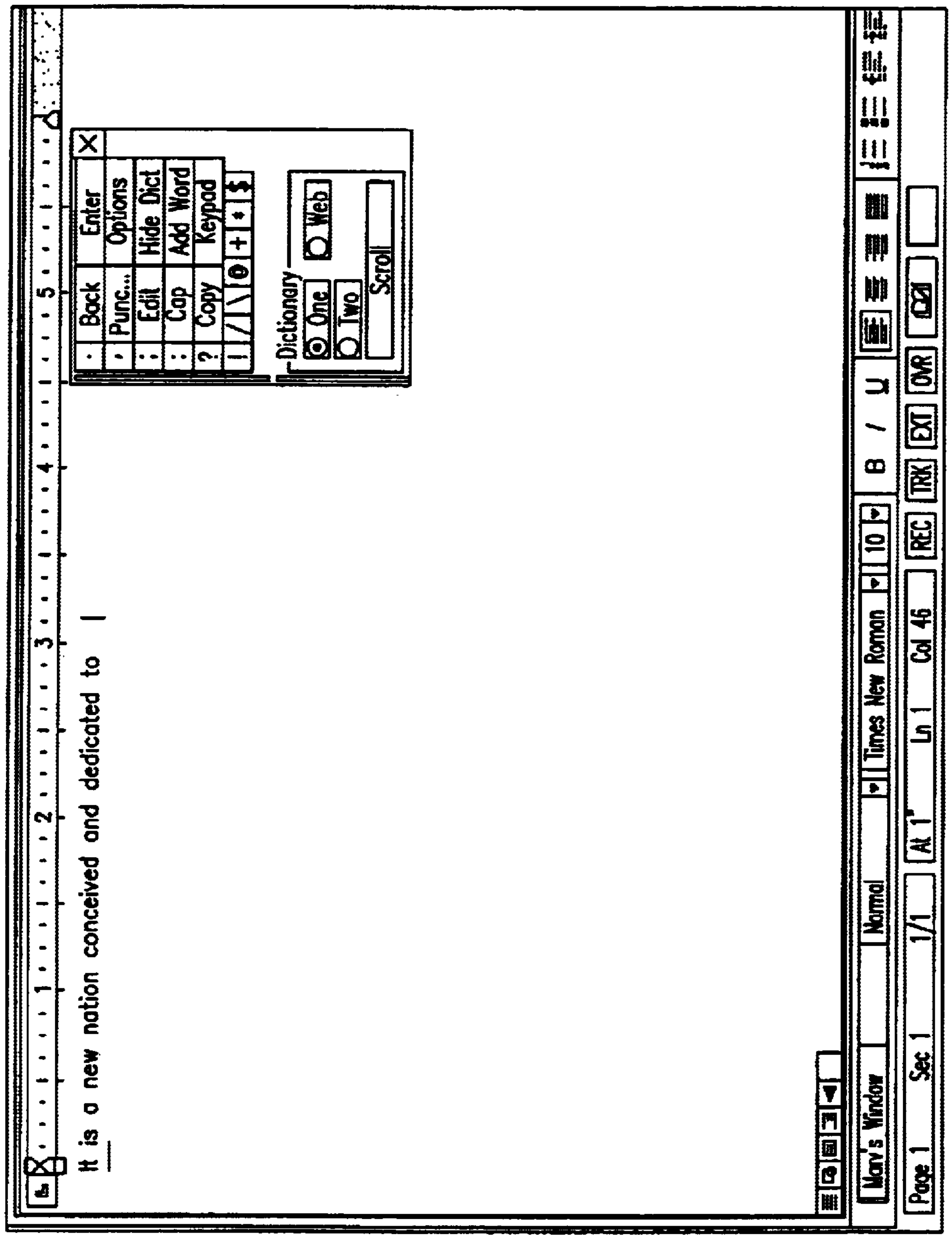

The word "conceived" was automatically moved into the window (which remained on the right side of the display). FIG. 24 shows that the misspelling was corrected ("ie" replaced by "ei"). FIG. 25, indicates that the space bar had been pressed and the text for the word conceived was corrected and "dedicated" was displayed automatically in the dynamic window. FIG. 126, shows that the spelling for that word was corrected. FIG. 127 indicates that the space bar was pressed and "dedicated" has been corrected in the word document and the word "to" is displayed in the window. The space bar is then pressed. All the words are now displayed in black in the window.

At any time during the editing process, the user can click on the "Edit" menu and then click on the command "Stop," listed in the menu. The "Edit All" program will stop and the user can then enter additional text.

The program described in this disclosure, with the sequence lines, letter lines, and dictionary lines and the Edit All program makes it practical for the user to type and enter no more than a certain number of letters for each word (i.e., less than all the letters are entered). After some text is entered, the user could use the "Edit All" program and choose words presented in the dictionary lines. The practicality of the system depends on the speed of presenting the dictionary list to the user and the feasibility of the user being able to choose the desired word in the dictionary list quickly. An alternative to this is to press a key which is not assigned a letter, but indicates by successive presses the number of additional letters there are in the word. An asterisk may be displayed for each press of that key.

The system becomes more practical if the number of ambiguities is reduced. Therefore, the number of letters assigned to each key should be no more than two for most of the keys. The system must be designed so that the display of the dictionary lines is extremely fast so that there is a minimum delay in presenting the dictionary words to the user which results from the input.

For some words, if the user's input is only four letters, the list of possible words would be very long. When that occurs, the user could type some additional letters and thereby reduce the list or by the input of the "asterisk" as described above the list is reduced.

If the user enters a minimum of five letters for words that exceed five letters in length, the list of words presented to the user is less than if the minimum is set at four letters for words that exceed four letters in length.

Also, a combination of lengths could be used. For instance, the user could input a minimum of three letters for words of less than five and a minimum of five letters for words that exceed five letters.

The keyboards shown in FIGS. 63 to 68 have different keyboard arrangements. These five keyboards each have 14 keys which are assigned letters. Each keyboard has twelve keys which are assigned two letters each and two keys which are assigned one letter each. The selection of the two letters assigned to the twelve keys is the same for these five keyboards. These letter assignments are as shown on FIG. 62. Keyboard 001, FIG. 63, has the letters assigned to the number pad. This number pad is the type found on the usual desktop keyboard. The assignment of the letters to the keypad 001 is for one-handed typing with either the left or right hand.

Figure 64:
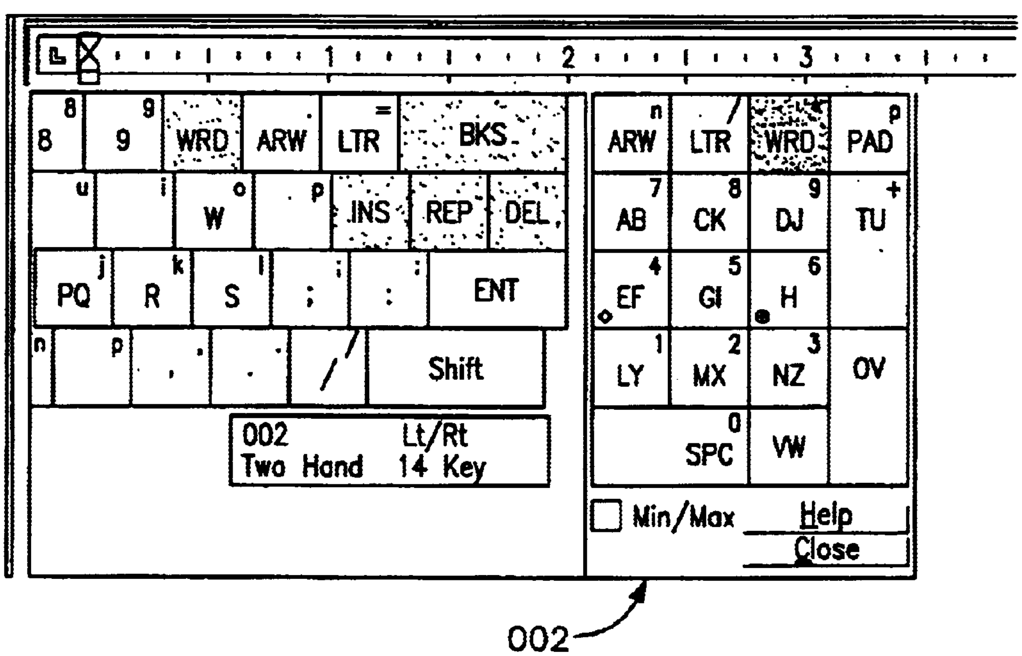
Figure 65:
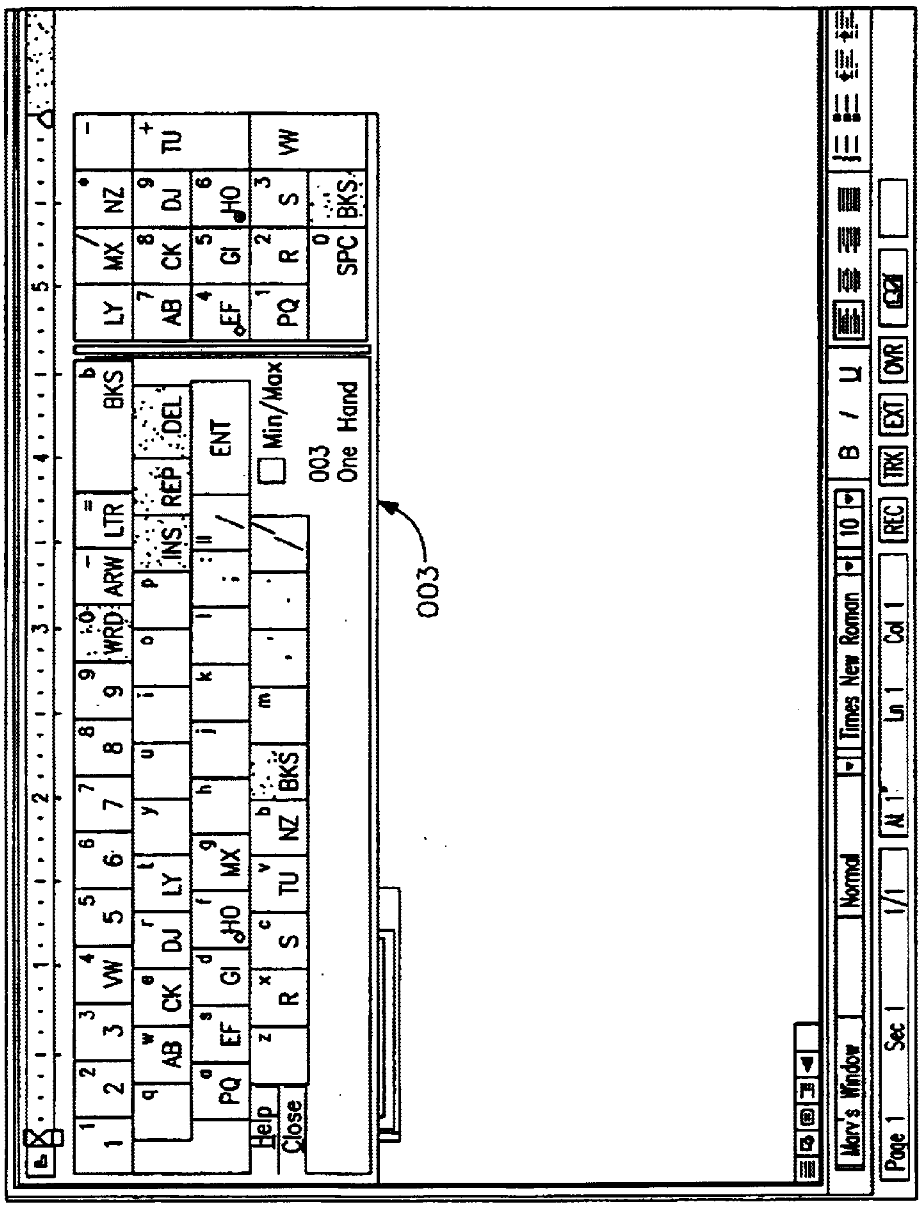
Figure 66:
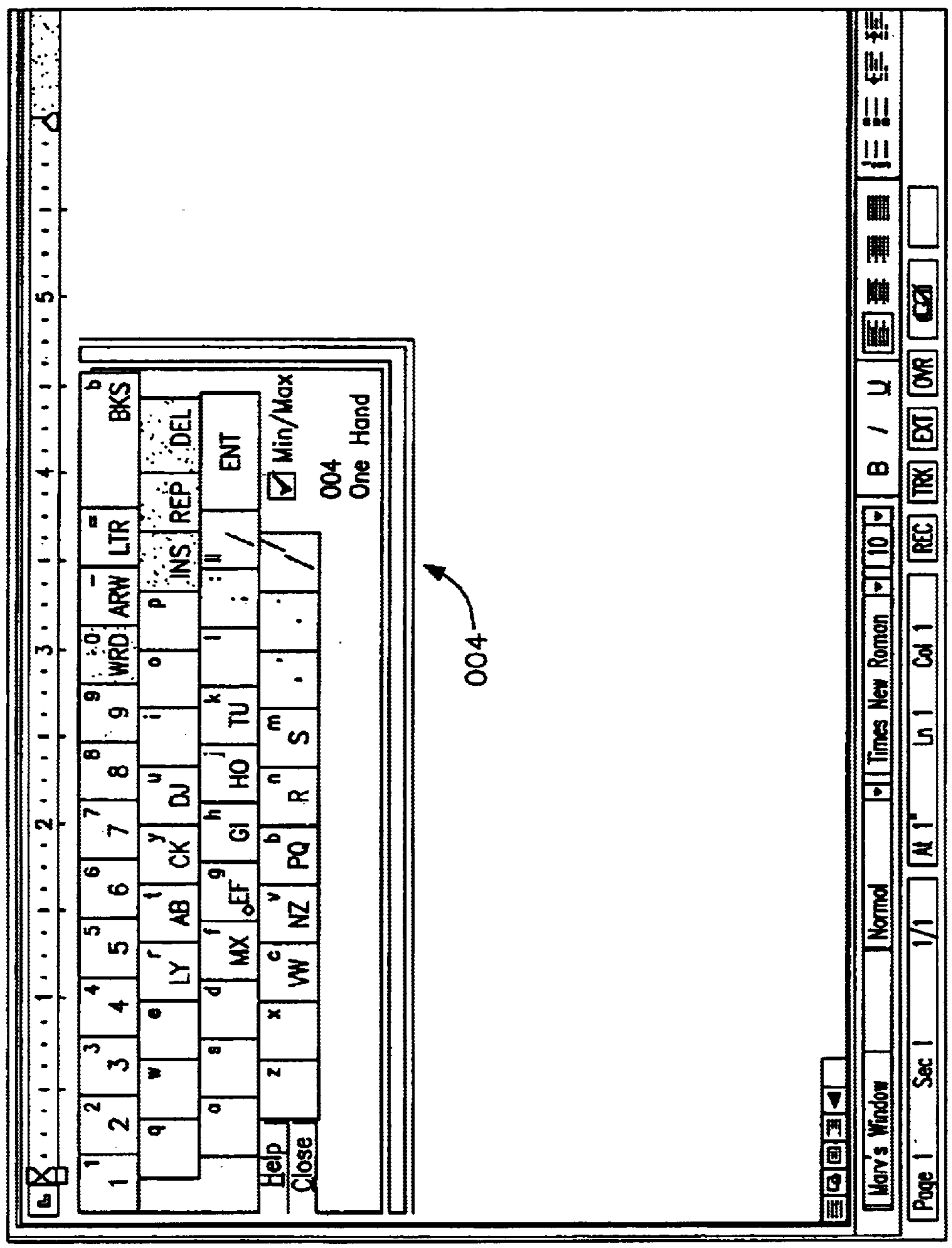
Figure 67:
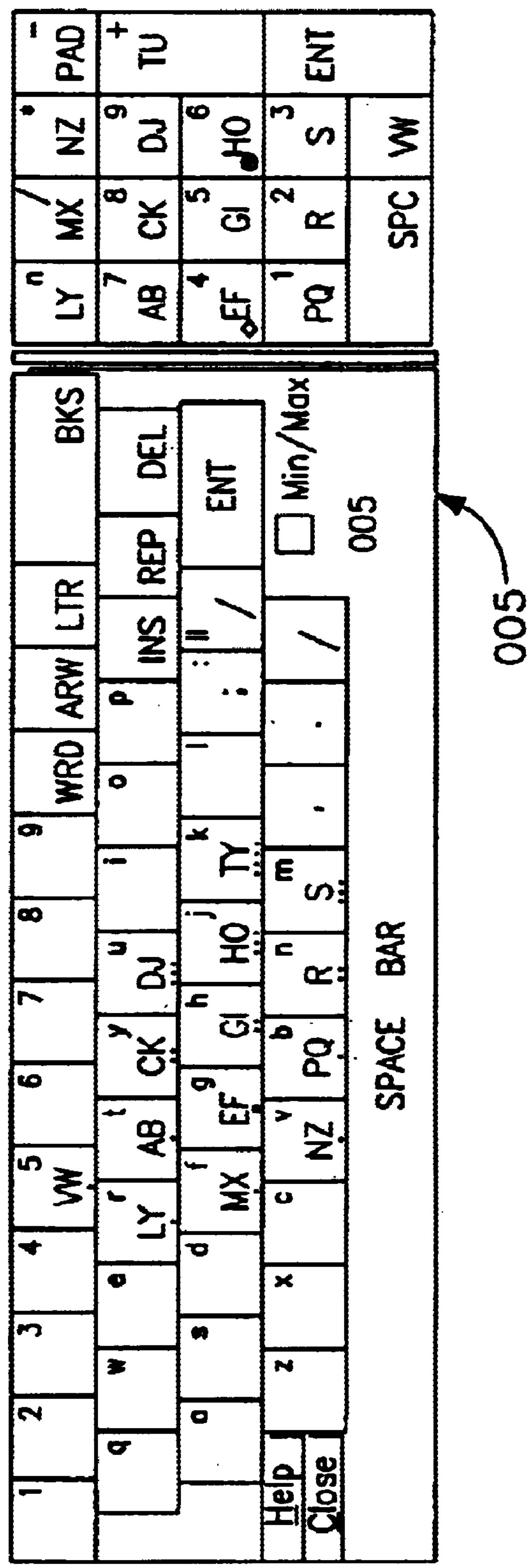
Figure 68:
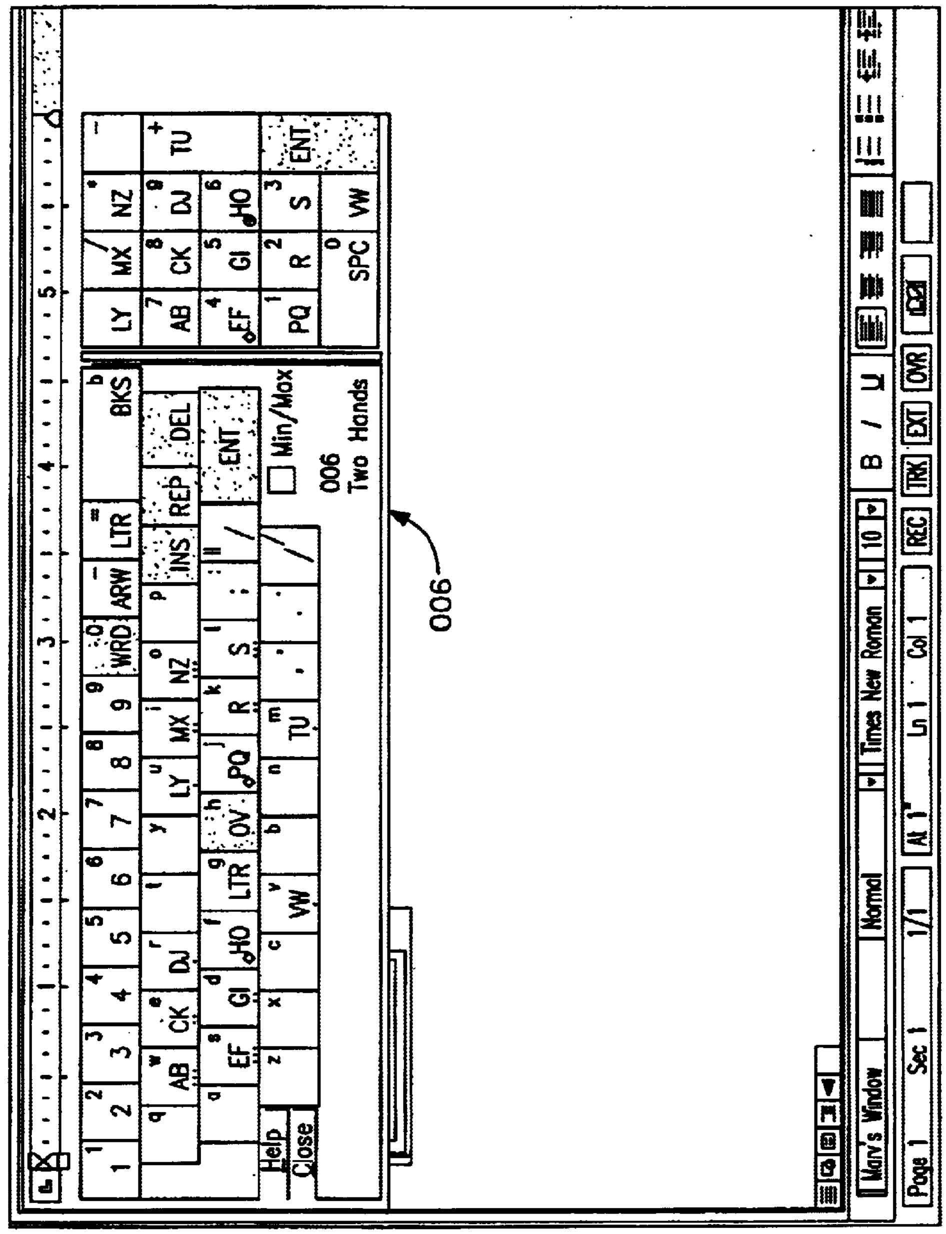

Keyboard 002, FIG. 64, has three keys to which letters are assigned on the Qwerty side of the keyboard for the left hand and eleven keys to which letters are assigned to the number pad for the right hand.

This arrangement for each keyboard facilitates memorizing the keyboards. The combination of letters chosen to be on the same key is such that the number of words which are not intended (because of two letters being assigned to a key) when an intended word is entered is only 201 words when using a dictionary with 41,790 words.

Figure 129:
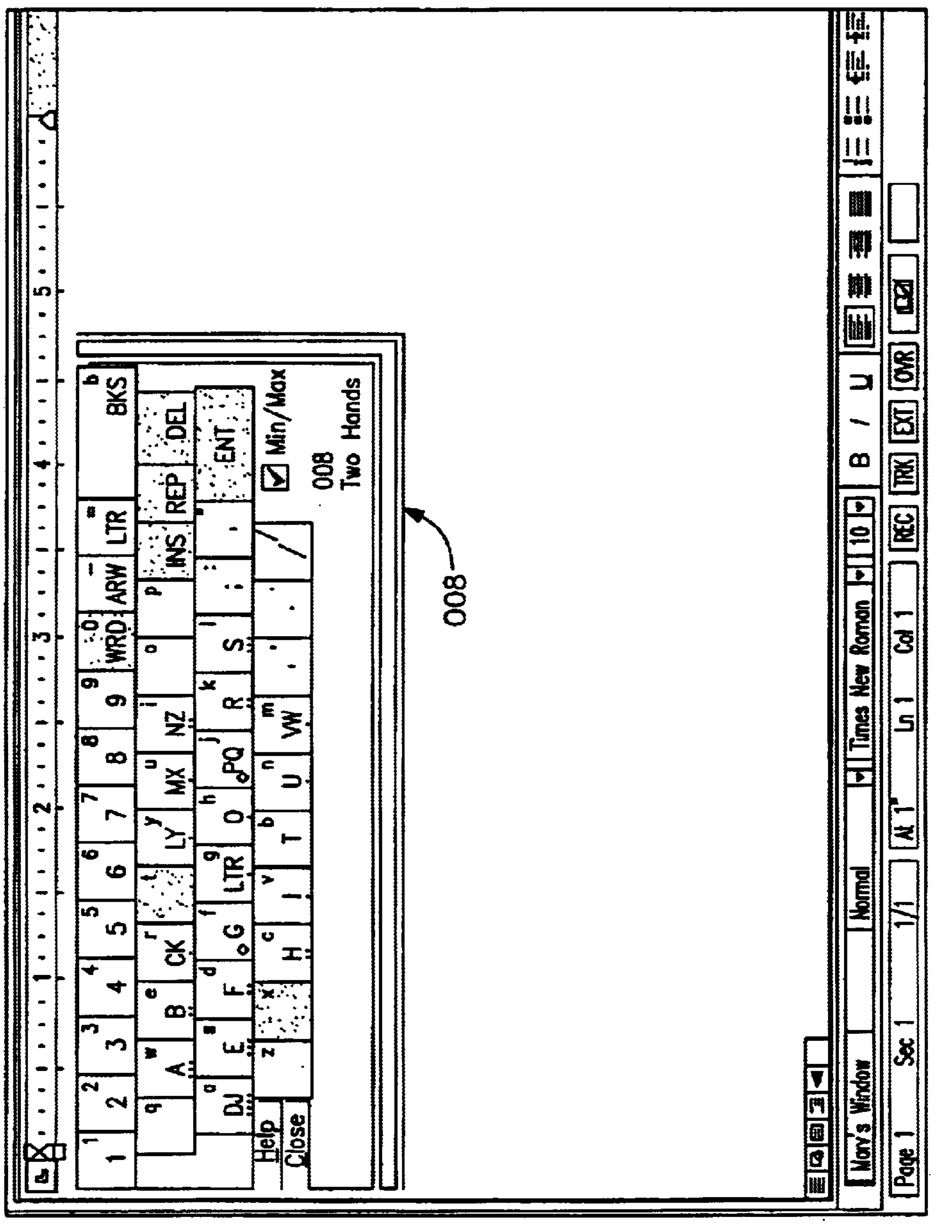
Figure 130:
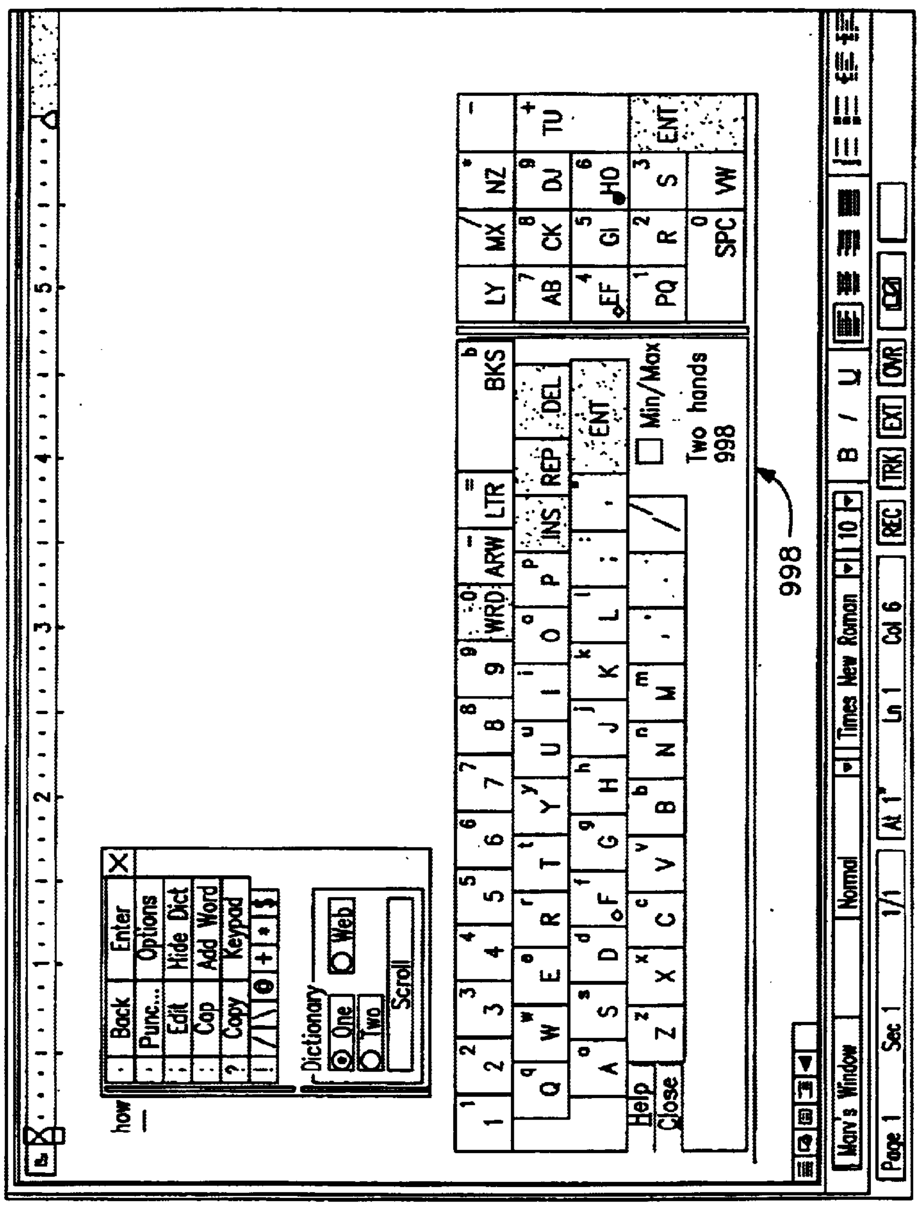
Figure 131:
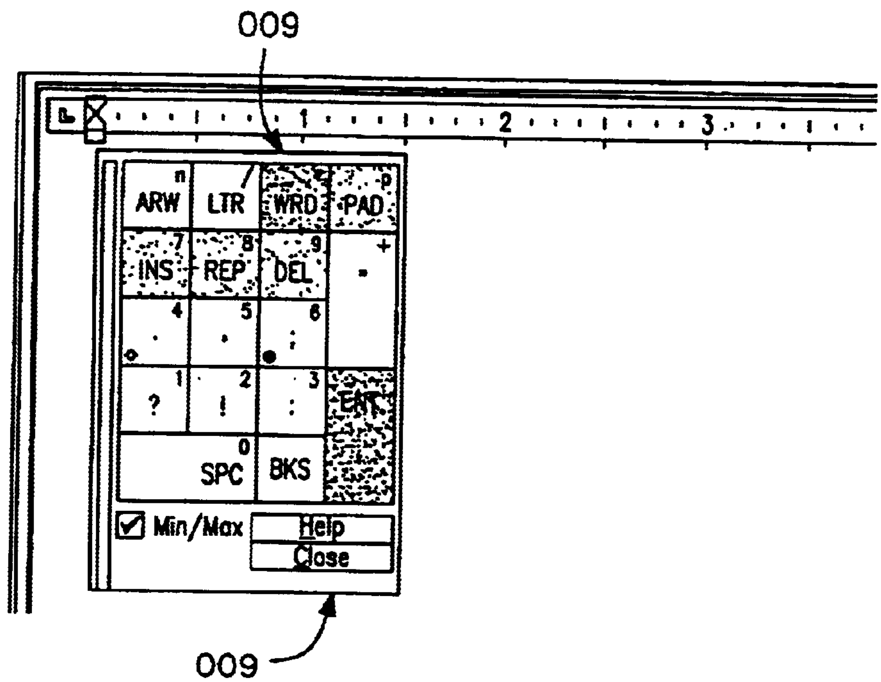
Figure 132:
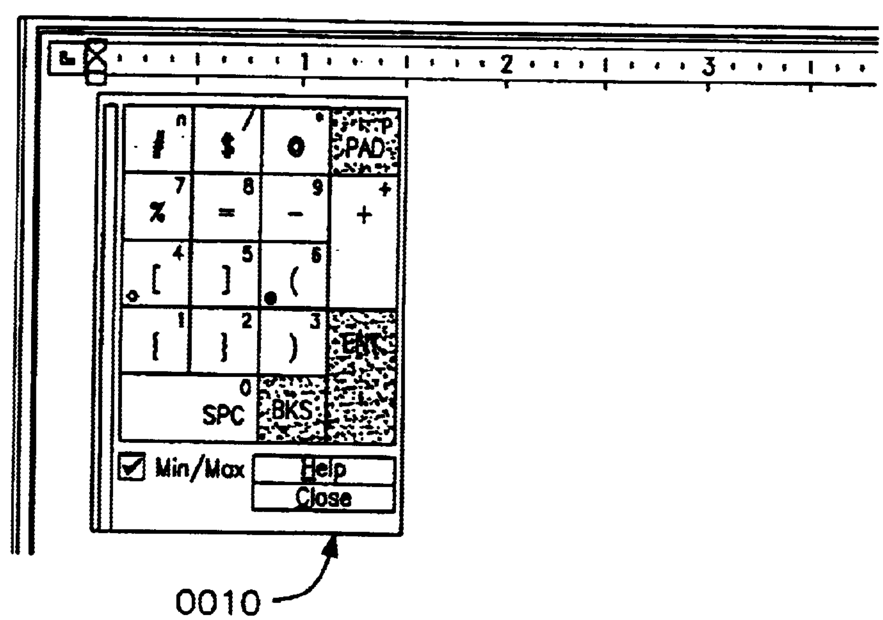
Figure 133:
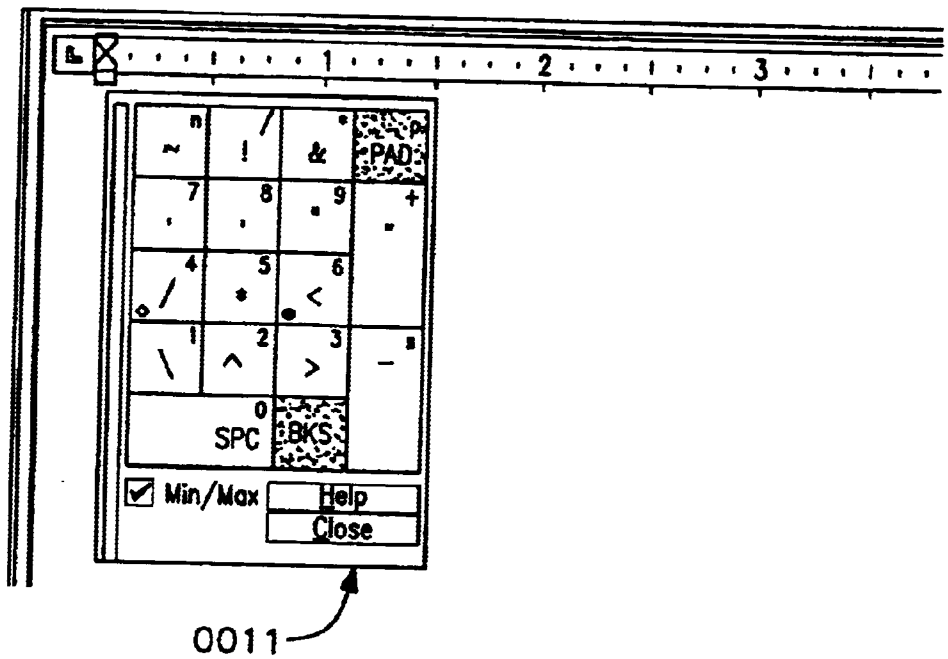
Figure 134:
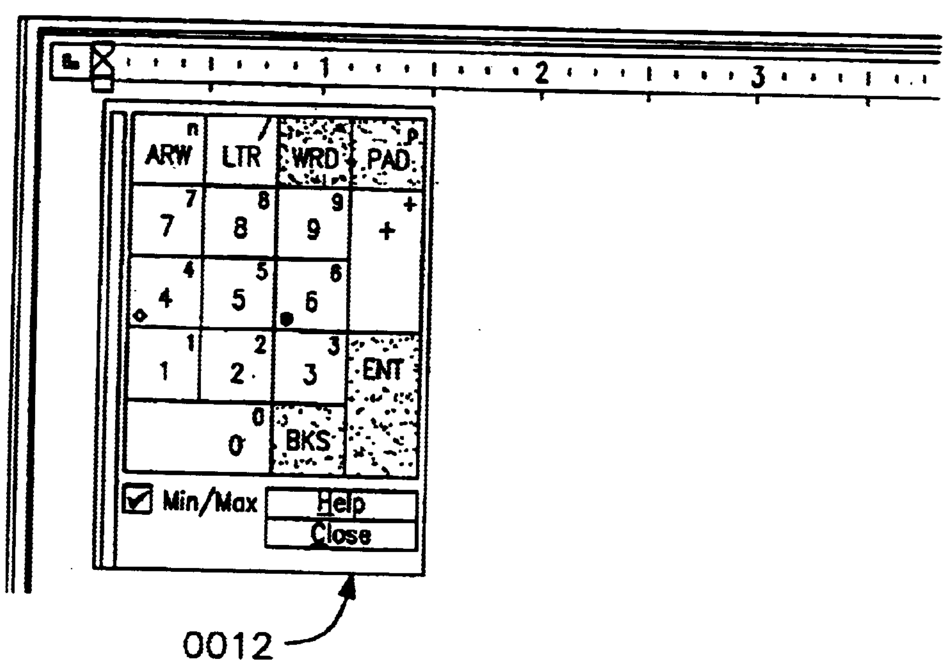

Keyboard 003 (FIG. 65) has the letters assigned to the Qwerty Keyboard for one-handed typing, using the left hand. Keyboards 004 and 005, FIGS. 66 and 67, have 14 keys to which letters are reassigned to the Qwerty keyboard for one handed typing, using the right hand. Keyboard 006 (FIG. 68) has the letters assigned to the Qwerty keyboard, configured for two-handed typing. Keyboard 007 (FIG. 69) and Keyboard 008 (FIG. 129) have the letters assigned to 16 and 19 keys, respectively, on the Qwerty keyboard, and are configured for two-handed typing. Since these keyboards have more keys and as a result, more single letters assigned to a key, there are fewer unintended words. All the keyboards have letter arrangements which have strings of alphabetical arrangements, such as on adjacent keys the letters

| |
|---|
| AB, C, D |
| EF, G, H |
| L, M, N |
| PQ, R, S |

Also, the vowels (a, e, i, o, u) are, with a few exception, on adjacent keys in alphabetical order. When the user is typing using letter assignments for keyboards 003, 004, 005, 006, 007, he can also use the number pad for one-handed typing using Keyboard 001.

FIGS. 131 to 134 show the control keys, punctuation marks, and symbols which are available to the user by pressing the Pad Scroll Key (PAD) in the upper right corner of the number pad. These keyboards are especially useful when using keyboard 001.

If the user is using keypad 001 and wishes to enter a punctuation mark, symbol or to use a control key e.g., the period, he can press the pad scroll key one time, and the keypad 009 is available. If the user presses the key assigned the period, or any other key assigned a punctuation mark on keypad 009 or 0010, the keypad scrolls automatically (i.e., without the user having to press the pad scroll key) back to 001. The user can then continue to enter text thru keypad 001.

The user can scroll from keypad 001 to 009 with one press on the pad scroll key and each additional press will make available keypads 0010, 0011, and 0012. If the user is on keypad 0010 or 0011, one press on the pad scroll key will return the program to keypad 001. If the user is using the numeric keypad 0012, the user must press the pad scroll key one time to return to keypad 001.

The letter arrangement shown in FIG. 62 which has twelve combinations of two letters and two individual letters requires fourteen keys to which letters are assigned. This is the preferred arrangement. When these letter assignments are applied to a keyboard with a rectangular grid (see keyboard 001 & 002) or a staggered grid for one handed keyboards (see keyboards 003, 004 and 005) or a two handed keyboard (see keyboard 006) the alphabetical pattern of the layouts which is readily seen in certain groups of letters & in the alphabetical arrangement of the vowels makes them easier to remember. At the same time, there is a low level of unintended words which result from the input of the keys which are assigned two letters. (See FIG. 62)

The letter combinations Ly, Mx and Nz have been selected for these keyboard layouts. An alternate layout is LX, MY and NZ. These combinations result in more unintended words but the arrangement on the keys is more alphabetical for the letters x, y and z. There is an advantage in having the letters "L" and "Y" on the same key when typing words with an "Ly" ending. The preferred arrangement also has the advantage of having the most often used letters in the "home" position for the fingers. The choice between these advantages and disadvantages is very close. For that reason all the keyboards are submitted in the alternate as well as the preferred layout for keyboard 001 through 008. See keyboards 001B through 008B in FIGS. 138 through 145.

Figure 146:
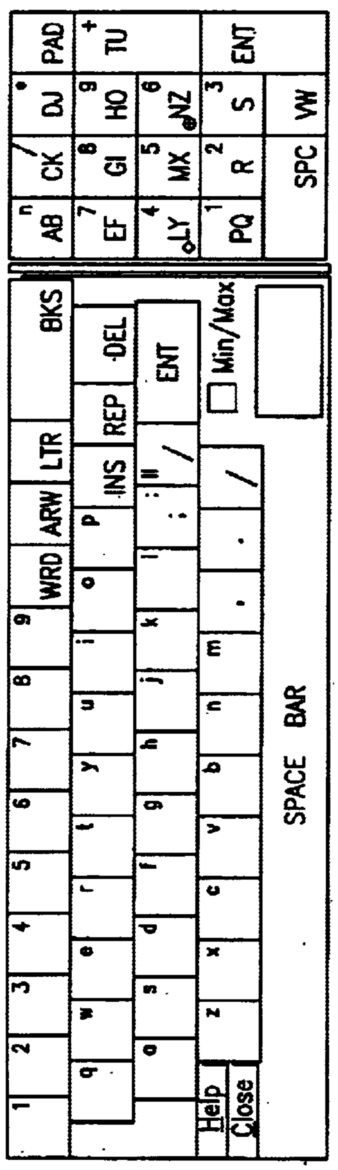

Keyboard 001 could be made more alphabetical in its arrangement by moving the letters in the third row containing EF, GI, HO to the top row and moving the letters, LY, MX, NZ in the third row, see keyboard 001D, FIG. 146. The preferred layout, with EF, GI and HO in the third row, has the advantage of having letters which are more often used on keys which are the "home" position for the fingers.

Figure 147:
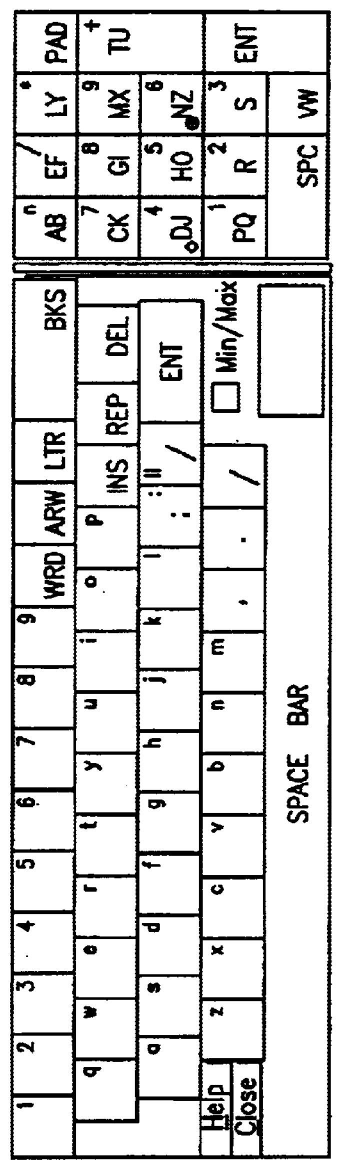
Figure 148:
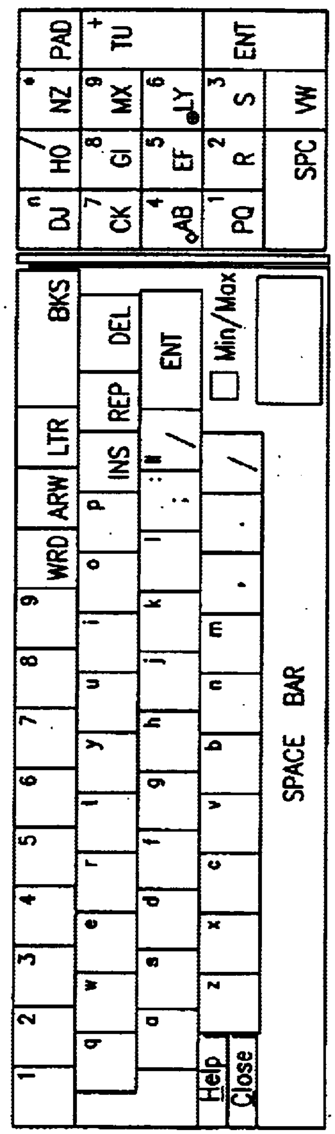
Figure 149:
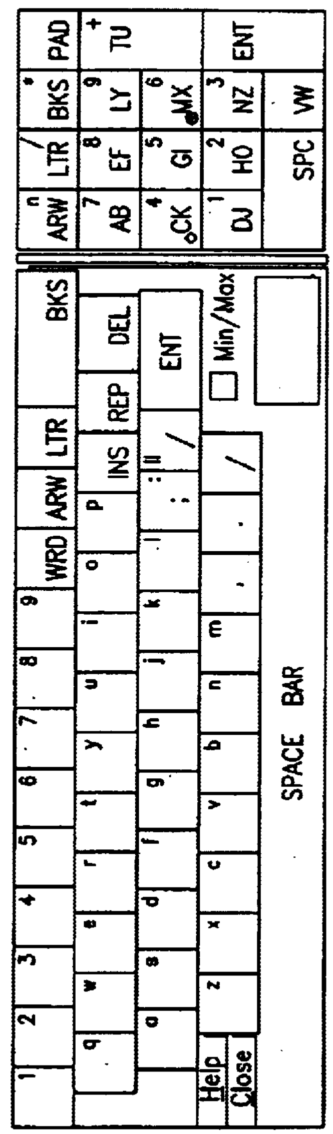
Figure 150:
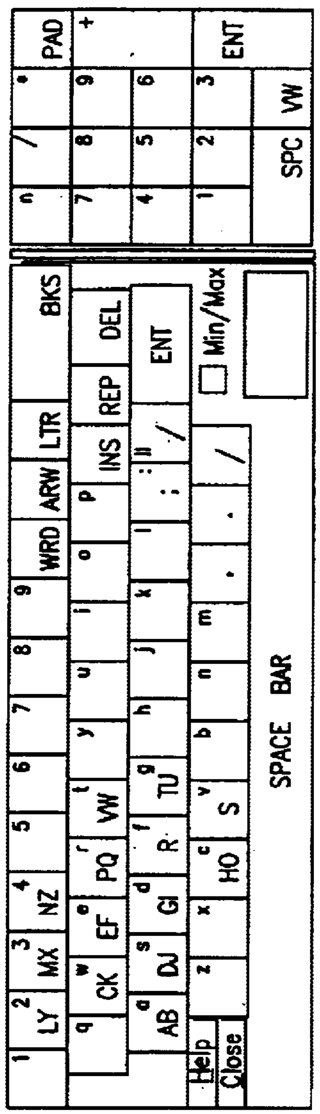
Figure 151:
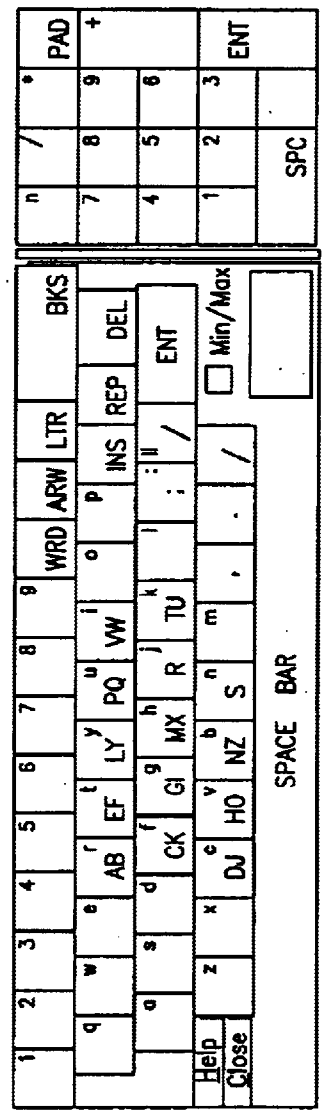
Figure 152:
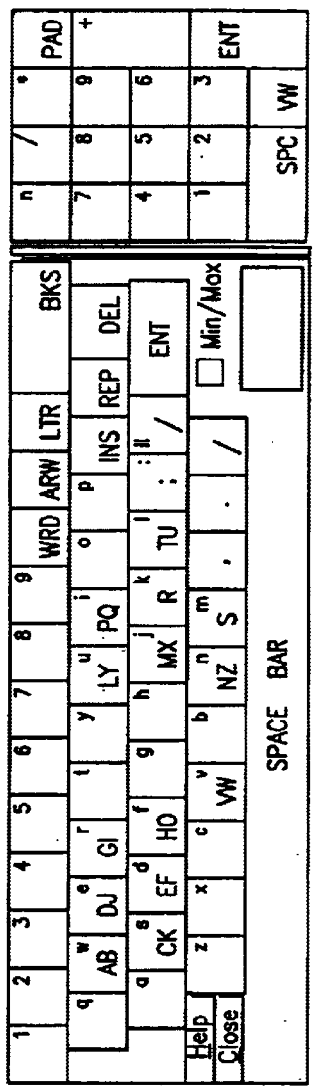

The keyboard layouts, 001 through 008, (except for the letters LY, MX, NZ on keyboard layouts 003, 004 and 005) position the alphabetical order, in most cases; horizontally. (The combinations AB, CK, DJ; EF, GI, HO; LY, MX, NZ; and PQ, R, S are in rows) In the alternate, they could be designed vertically, see keyboards 00C1 and 00C2 on FIGS. 147 and 148; 002B on FIG. 149, 003B on FIG. 150; 005B on FIG. 151 and 006B on FIG. 152.

Figure 69:
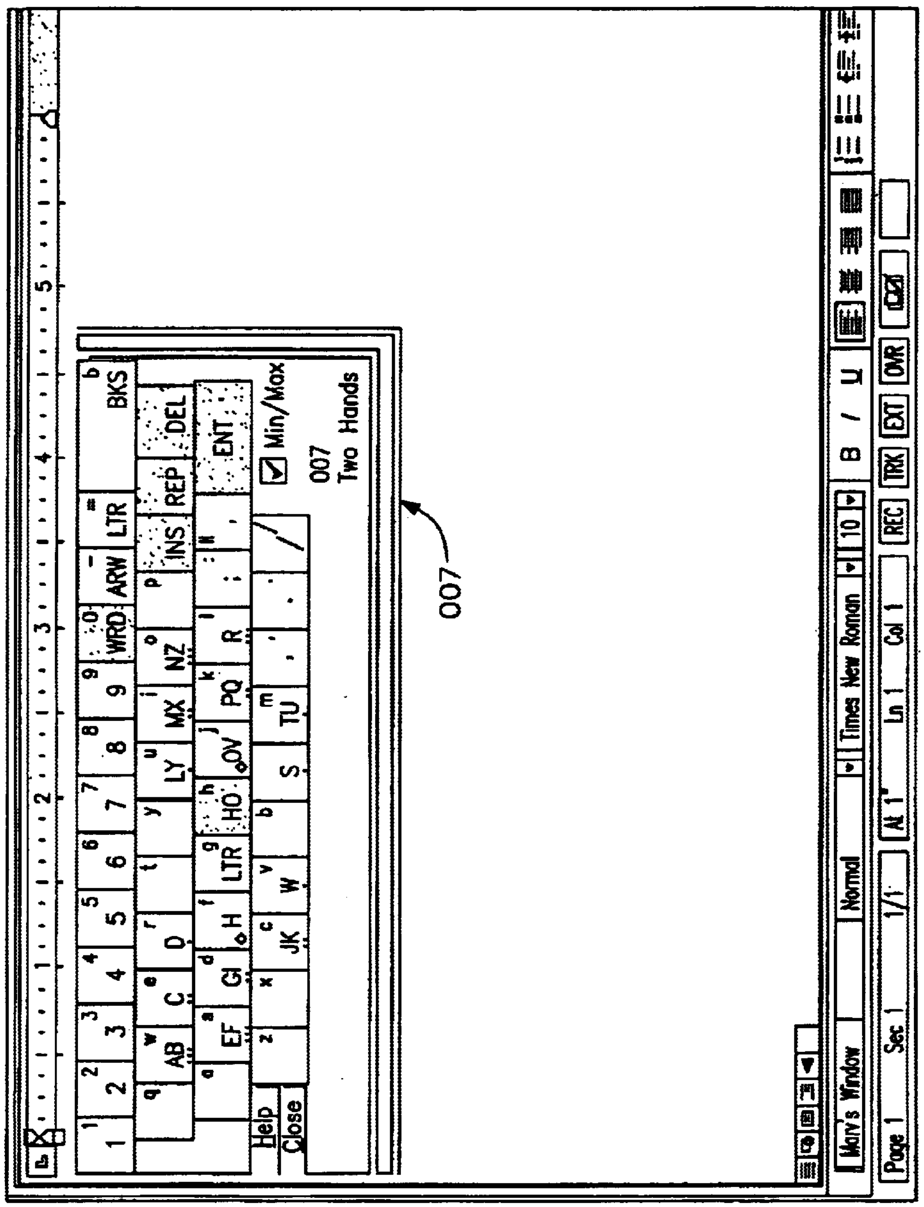
Figure 153:
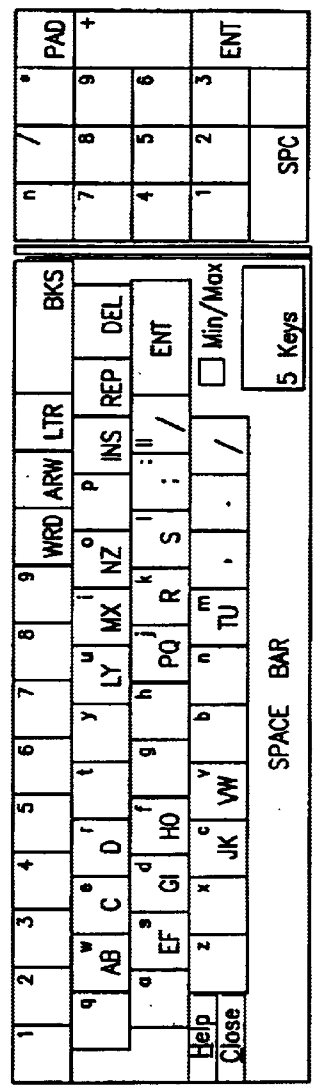
Figure 154:
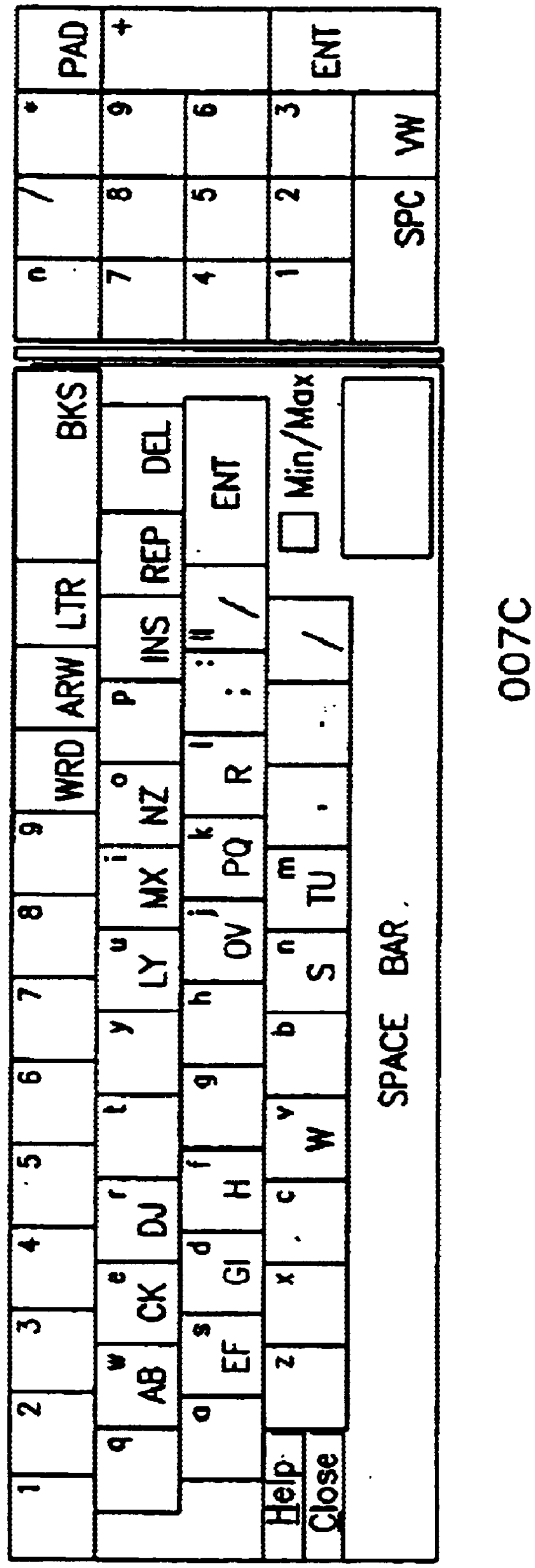

Keyboard 007, FIG. 69, has a total of 16 keys. There are more single letters then with the layout using 14 keys and the two letter combinations are the same as the layout using 14 keys except the “O” is placed with the letter “V” instead of the “H”. The “OV” combination results in fewer unintended words then the “OH” combination. As a result there are fewer unintended words. The layout shown is the preferred arrangement with 16 keys. However, in the alternate the “OH” combination might be substituted for the “OV” combination and keyboards using 15 keys are arranged as shown in layout 007B, FIG. 153. Also, a keyboard layout using 15 keys is arranged using the “OU”, “CK” and “DJ” combination, see layout 007C, FIG. 154.

This disclosure makes use of the following letter combinations:

| | | |
|---|---|---|
| AB | LY | PQ |
| CK | LX | TU |
| DJ | My | JI |
| EF | MX | OV |
| GI | NZ | |
| HO | | |

to construct keyboard layouts in a vertical or horizontal patter using 14 to 16 keys. The letters selected preferably to be single letters on a key are the “R” and “S”. On the keyboard layouts the abbreviations used are:

| |
|---|
| ARW for Down Arrow or Arrow Key |
| LTR for Letter Scroll Key |
| BKS for Back-Space Key |
| INS for Insert Key |
| REP for Replace Key |
| ENT for Enter Key |
| PAD for Pad Scroll Key |
| SPC for Space Bar |

The basic assignments of letters which are made to keys with one or two letters assigned to 14 keys is as shown in FIG. 162 and the distribution of those assignments to the keys is as shown in Keyboards such as 001 to 008.

Some possible changes over what is shown are:

(1) separating the letters J and K from the C and D keys and putting the J and K on a single key or other keys (2) placing the “O” with the “G” and the “I” with the “H”

(3) separating the Y, X and Z from their assignments to L, M and N and assigning them to other keys or assigning the M to one key (4) placing the letter “U” with another letter (instead of the “T”)

(5) placing the Q with another letter instead of the P (6) placing the V and W on separate keys or reassigning them to other keys Some of the above changes can result in the keyboard layouts shown in column II and III below.

However, deviating from the basic layout disclosed here would be done in ways they can be anticipated and are disclosed here.

| 14 LETTER ASSIGNMENTS SHOWN ON KEYBOARD 001 | 16 LETTER ASSIGNMENTS | 13 LETTER ASSIGNMENTS |
|---|---|---|
| AB | AB | ABK |
| CK | C | CD |
| DJ | D | |
| EF | EF | EF |
| GL | GO | GI |
| HO | HI | HO |
| LY | JK | LX |
| | L | |
| MX | M | MY |
| NZ | N | NZ |
| PQ | XYZ | PQ |
| R | P | RJ |
| S | RU | S |
| TU | QS | TU |
| VW | T | VW |
| | VW | |

The basic concept includes using no more than two letters on most or all of the keys, with a low level of entering unintended words and placing most of the letters in an order and which is obviously alphabetical and placing most of the letters so that at least three adjacent keys have a letter which is in alphabetical order to a letter on an adjacent key, and placing the vowels in an order which is mostly alphabetical, and the letters a, e. i, b, u are mostly on adjacent keys and are mostly intertwined with the alphabetical arrangement of the consonants and placing most of the letters on keys which are easy to reach and the letters which are most often used are placed on keys which are among those on the keyboard that are the easy ones to reach.

The foregoing description should be considered as illustrative only of the principles of the invention. Since numerous modifications and changes will readily occur to those skilled in the art, it is not desired to limit the invention to the exact construction and operation shown and described, and, accordingly, all suitable modifications and equivalents may be resorted to, falling within the scope of the invention.

I claim:

1. A method for entering letters of an alphabet using a computer having a display device, memory storage and operator-selectable input elements, the method comprising assigning more than one letter to at least one input element such that more than one series of letters results from a single selection of input elements, storing words in the memory storage, and displaying on the display device for each entered input element, a series of letters that form at least one valid combination, said at least one valid combination being determined from said stored words in the memory storage for a same number of the input elements thus far selected.

2. The method of claim 1, further comprising displaying series of letters associated with the selected input elements that match a word or words stored in the memory storage and selecting one of the displayed words.

3. The method of claim 1, wherein when a match is found in the memory storage, removing from the display, series of letters associated with the input elements selected by the operator for which no match was found with words in the memory storage when the operator subsequently selects an input element.

4. The method of claim 1, further comprising defining a new word and storing the new word in the memory storage.

5. The method of claim 1, wherein at least one of the input elements is associated with a single letter.

6. The method of claim 1, wherein most of the input elements are associated with no more than two letters.

7. The method of claim 1, wherein all of the input elements are associated with two letters.

8. The method of claim 1, wherein the step of assigning comprises assigning vowels alphabetically on input elements mostly adjacent to each other in alphabetical order and the consonants are so placed that the vowels and consonants are substantially in alphabetical order.

9. The method of claim 1, wherein if there are no words located in the memory storage formed by the selected series of input elements, then displaying each of the letter or letters associated with each selected input element.

10. The method of claim 9, further comprising selecting displayed letters to form a word not previously stored in memory storage and storing that word in memory storage.

11. The method of claim 10, further comprising appending letter or letters associated with subsequently selected input elements only to the previously selected series of letters and displaying those appended series of selected letters.

12. The method of claim 1, wherein the step of displaying comprises displaying in a dynamic window.

13. The method of claim 1, wherein a match is found when letters associated with the input element(s) thus far selected correspond with letter(s) of a word stored in the memory storage in an identical order, the match starting with a letter associated with the first selected input element of the series of selected input elements through a last selected input element of the series of selected input elements.

14. The method of claim 13, wherein if an input element is associated with more than one letter, each letter is matched separately.

15. The method of claim 1, wherein if a match is found in the memory storage, then appending each letter associated with a subsequently selected input element separately to each series of letters displayed immediately prior to selection of the subsequently selected input element, and displaying on the display device the series of letters associated with the input elements thus far selected.

16. The method of claim 1, wherein if there are no words located in the memory storage formed by the selected series of input elements, then displaying one or more closest series of letters.

17. The method of claim 1, further comprising selecting one of the displayed series of letters and removing the unselected series of letters from the display device.

18. The method of claim 17, further comprising re-displaying on the display device the removed unselected series of letters.

19. The method of claim 17, further comprising appending letter or letters associated with subsequently selected input elements only to the previously selected series of letters and displaying those appended series of selected letters.

20. The method of claim 1, further comprising selecting one of the displayed series of letters, eliminating the non-selected series from the display, and appending further selected input elements only to the selected series of letters.

21. The method of claim 17, wherein a default series of letters is selected upon the operator selecting a space bar or punctuation.

22. The method of claim 21, wherein a space is automatically inserted after the default series of letters is displayed.

23. The method of claim 1, wherein one of the displayed series of letters is displayed in a home line, and the other displayed series of letters are displayed in successive rows below the home line.

24. The method of claim 23, wherein a series of letters displayed below the home line may be scrolled into the home line.

25. The method of claim 23, further comprising displaying a number adjacent to each series of letters displayed below the home line and selecting a series of letters by selecting the number adjacent to the series of letters.

26. The method of claim 25, further comprising adding a space after the selected series of letters and eliminating the unselected series of letters from the display.

27. The method of claim 25, further comprising eliminating the unselected series of letters from the display.

28. The method of claim 23, further comprising selecting a series of letters displayed in a first line below the home line by selecting a first select key.

29. The method of claim 28, wherein the first select key automatically inserts a space after the selected series of letters.

30. The method of claim 28, wherein the first select key automatically adds a space after the selected series of letters only when the selected series of letters comprises more than one letter.

31. The method of claim 23, wherein the operator may scroll a letter or series of letters from below the home line to the home line.

32. The method of claim 28, further comprising selecting a series of letters displayed in a second line below the home line by selecting a second select key.

33. The method of claim 23, further comprising the step of enabling the operator to select one of the displayed series of letters.

34. The method of claim 33, further comprising adding a space after the selected series of letters.

35. The method of claim 23, further comprising selecting a series of letters by using a mouse.

36. The method of claim 23, further comprising the step of enabling the operator to enter a delay mode in which selection of a series of letters is delayed.

37. The method of claim 36, wherein the delay mode allows the operator to edit a previously selected series of letters.

38. The method of claim 23, wherein the series of letters displayed in the home line is based upon statistical use.

39. The method of claim 38, wherein the statistical use is based upon a number of possible words associated with a series of letters thus far selected.

40. The method of claim 38, wherein the statistical use provides that after a consonant is selected by the operator, a vowel has higher priority than another consonant.

41. The method of claim 38, wherein the statistical use provides that after a vowel is selected by the operator, a consonant has higher priority than another vowel.

42. The method of claim 1, wherein the step of assigning comprises assigning indicators to the input elements, the indicators indicating which finger is to be placed on each input element.

43. The method of claim 23, wherein the series of letters displayed in the home line is selected by default upon entry of a space bar, punctuation mark or select entry key.

44. The method of claim 43, wherein the series of letters displayed in the home line is selected by default upon the operator selecting a space bar or punctuation.

45. The method of claim 44, further comprising the step of adding a space after the selected series of letters by the selection of the space bar, punctuation or input element select key.

46. The method of claim 1, wherein if no series of letters possibly forms a word, then displaying each letter associated with each input element of the series of selected input elements, either from the beginning of the series of letters or from the last selected input element in the series of letters associated with a possible word in memory storage.

47. The method of claim 1, wherein none of the displayed words are a desired word, then displaying each letter associated with each input element of the series of selected input elements, either from the beginning of the series of letters or from the last selected input element in the series of letters associated with a possible word in memory storage.

48. The method of claim 1, wherein when no match is found, selecting one displayed letter for each of the selected input elements to form a word.

49. The method of claim 48, further comprising storing the formed word in the memory storage.

50. The method of claim 46, wherein for each selected input element one of the displayed letters is displayed in a home line and the remaining letters are displayed in successive rows beneath the home line.

51. The method of claim 50, wherein the operator may move any of the displayed letters into the home line.

52. The method of claim 1, wherein the step of assigning comprises assigning more than one letter to at least one input element so that more than one possible word may result from a single series of selected input elements.

53. The method of claim 1, wherein the step of determining the completion of a word includes actuation of an actuation mechanism.

* * * * *